(12) United States Patent
Kim et al.

(10) Patent No.: US 10,348,448 B2
(45) Date of Patent: Jul. 9, 2019

(54) TRANSMITTER AND REPETITION METHOD THEREOF

(71) Applicant: SAMSUNG ELECTRONICS CO., LTD., Suwon-si (KR)

(72) Inventors: Kyung-joong Kim, Seoul (KR); Se-ho Myung, Yongin-si (KR); Hong-sil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 15/003,969

(22) Filed: Jan. 22, 2016

(65) Prior Publication Data

US 2016/0218824 A1    Jul. 28, 2016

Related U.S. Application Data

(60) Provisional application No. 62/113,025, filed on Feb. 6, 2015, provisional application No. 62/106,308, filed on Jan. 22, 2015.

(30) Foreign Application Priority Data

Jan. 22, 2016    (KR) .................. 10-2016-0008221

(51) Int. Cl.
*H04L 1/00* (2006.01)
*H03M 13/00* (2006.01)
*H03M 13/11* (2006.01)

(52) U.S. Cl.
CPC ........ *H04L 1/0041* (2013.01); *H03M 13/005* (2013.01); *H03M 13/1102* (2013.01); *H04L 1/007* (2013.01); *H04L 1/0068* (2013.01); *H04L 1/0071* (2013.01)

(58) Field of Classification Search
CPC ..... H04L 1/0041; H04L 1/0068; H04L 1/007; H04L 1/0071; H03M 13/005; H03M 13/1102

See application file for complete search history.

(56) References Cited

U.S. PATENT DOCUMENTS

| | | | | |
|---|---|---|---|---|
| 2007/0260772 A1* | 11/2007 | Garmonov | .......... | H03M 13/1131 710/33 |
| 2008/0204286 A1* | 8/2008 | Kose | .................. | H03M 13/1102 341/67 |
| 2009/0161742 A1* | 6/2009 | Ivory | .................... | H04L 1/0045 375/225 |
| 2009/0175298 A1* | 7/2009 | Yun | ........................ | H03M 13/11 370/476 |

(Continued)

*Primary Examiner* — Kyle Vallecillo
(74) *Attorney, Agent, or Firm* — Sughrue Mion, PLLC

(57) ABSTRACT

A transmitter is provided. The transmitter includes at least one processor configured to implement: a Low Density Parity Check (LDPC) encoder which encodes input bits to generate an LDPC codeword including the input bits and parity bits; a puncturer which calculates a number of bits to be punctured in the parity bits and punctures the parity bits based on the calculated number of bits; and a repeater which selects at least a part of bits of the LDPC codeword based on a repetition pattern, and repeats the selected bits after the parity bits, wherein the repetition pattern is a pattern for selecting at least one bit group including the selected bits among a plurality of bit groups configuring the LDPC codeword.

14 Claims, 34 Drawing Sheets

(56) References Cited

U.S. PATENT DOCUMENTS

| | | | |
|---|---|---|---|
| 2009/0204868 A1* | 8/2009 | Park | H04L 1/0057 714/752 |
| 2011/0119568 A1* | 5/2011 | Jeong | H03M 13/1185 714/790 |
| 2012/0185757 A1* | 7/2012 | Jeong | H03M 13/2906 714/801 |
| 2016/0173812 A1* | 6/2016 | Suh | H04N 21/4622 725/32 |
| 2016/0261370 A1* | 9/2016 | Jeong | H03M 13/1148 |

* cited by examiner

TRANSMITTER AND REPETITION METHOD THEREOF

CROSS-REFERENCE TO THE RELATED APPLICATIONS

This application claims priority from U.S. Provisional Applications 62/106,308 and 62/113,025 filed on Jan. 22, 2015 and Feb. 6, 2015, and Korean Patent Application No. 10-2016-0008221, filed on Jan. 22, 2016, in the Korean Intellectual Property Office, respectively, the disclosures of which are incorporated herein in their entirety by reference.

BACKGROUND

1. Field

Apparatuses and methods consistent with exemplary embodiments of the inventive concept relate to a transmitter and a repetition method thereof, and more particularly, to a transmitter processing and transmitting input bits and a method of repeating bits to be transmitted by the transmitter.

2. Description of the Related Art

Broadcast communication services in information oriented society of the 21$^{st}$ century are entering an era of digitalization, multi-channelization, bandwidth broadening, and high quality. In particular, as a high definition digital television (TV), a personal media player (PMP), and portable broadcasting devices are widespread, digital broadcasting services have an increased demand for supporting improved transmitting and receiving schemes.

Therefore, a method for providing better signal transmission and reception services satisfying user's needs has been required.

SUMMARY

Exemplary embodiments of the inventive concept may overcome disadvantages of the related art apparatuses and methods. However, the exemplary embodiments are not required to overcome such disadvantages, and may not overcome any of the disadvantages.

The exemplary embodiments provide a transmitter and a signal repetition method thereof capable of selecting at least some bits of a Low Density Parity Check (LDPC) codeword using a specific pattern and transmitting repeatedly the selected some bits.

According to an aspect an exemplary embodiment, there is provided a transmitter which may include: a Low Density Parity Check (LDPC) encoder which encodes input bits to generate an LDPC codeword including the input bits and parity bits; a puncturer which calculates a number of bits to be punctured in the parity bits and punctures the parity bits based on the calculated number of bits; and a repeater which selects at least a part of bits of the LDPC codeword based on a repetition pattern, and repeats the selected bits after the parity bits, wherein the repetition pattern is a pattern for selecting at least one bit group including the selected bits among a plurality of bit groups configuring the LDPC codeword.

The puncturer may puncture the parity bits as many as the calculated number $N_{punc}$ of bits to be punctured in the parity bits when the calculated number $N_{punc}$ of bits to be punctured is a positive integer and does not perform the puncturing when the calculated number $N_{punc}$ of bits to be punctured is a negative integer.

The repeater may determine $-N_{punc}$ bits as the number of bits to be repeated when the $N_{punc}$ is a negative integer, and selects bits as many as the determined number from the LDPC codeword as the bits to be repeated in the LDPC codeword.

The repeater may calculate the a number $N_{rep}$ of bit groups, of which all bits are to be repeated, from among the plurality of bit groups configuring the LDPC codeword based on Equation 4.

The repetition pattern may be defined by Table 1.

The repeater may select bits included in a $\pi_R(0)$-th bit group, a $\pi_R(1)$-th bit group, ..., a $\pi_R(N_{rep}-1)$-th bit group among the plurality of bit groups as at least a part of the bits to be repeated, based on the repetition pattern.

The repeater may select $N_{repeat}-360 \times N_{rep}$ bits from a first bit of the $\pi_R(N_{rep})$-th bit group as another part of the bits to be repeated.

According to an aspect another exemplary embodiment, there is provided a repetition method of a transmitter. The method may include: encoding input bits to generate an LDPC codeword including the input bits and parity bits; calculating a number of bits to be punctured in the parity bits and punctures the parity bits based on the calculated number of bits; and at least a part of bits of the LDPC codeword based on a repetition pattern, and repeating the selected bits after the parity bits, wherein the repetition pattern is a pattern for selecting at least one bit group including the selected bits among a plurality of bit groups configuring the LDPC codeword.

In the puncturing, when the calculated number $N_{punc}$ of bits to be punctured is a positive integer, the parity bits as many as the calculated number $N_{punc}$ of bits to be punctured may be punctured, and when the calculated number $N_{punc}$ of bits to be punctured is a negative integer, the puncturing may not be performed.

In the repeating, when the $N_{punc}$ is negative integer, $-N_{punc}$ bits may be determined as the number of bits to be repeated, and bits as many as the determined number may be selected from the LDPC codeword as the bits to be repeated in the LDPC codeword.

In repeating, a number $N_{rep}$ of bit groups, of which all bits are to be repeated, from among the plurality of bit groups configuring the LDPC codeword is calculated based on Equation 4.

The repetition pattern may be defined by Table 1.

In the repeating, bits included in a $\pi_R(0)$-th bit group, a $\pi_R(1)$-th bit group, ..., a $\pi_R(N_{rep}-1)$-th bit group among the plurality of bit groups may be selected as at least a part of the bits to be repeated, based on the repetition pattern.

In the repeating, $N_{repeat}-360 \times N_{rep}$ bits from a first bit of the $\pi_R(N_{rep})$-th bit group may be selected as another part of the bits to be repeated.

As described above, according to various exemplary embodiments, some of bits in an LDPC codeword may be additionally transmitted to improve a decoding performance of a receiver.

BRIEF DESCRIPTION OF THE DRAWINGS

The above and/or other aspects of the inventive concept will be more apparent by describing certain exemplary embodiments with reference to the accompanying drawings, in which.

DETAILED DESCRIPTION OF THE EXEMPLARY EMBODIMENTS

Hereinafter, exemplary embodiments will be described in more detail with reference to the accompanying drawings.

A transmitter according to an exemplary embodiment may transmit data (for example, broadcasting data) and L1 signaling required for processing the data to a receiver.

For this purpose, the transmitter according to the exemplary embodiment may include components for the data and the L1 signaling. Hereinafter, a method for processing the data and the L1 signaling will be described in more detail.

Figure 1:
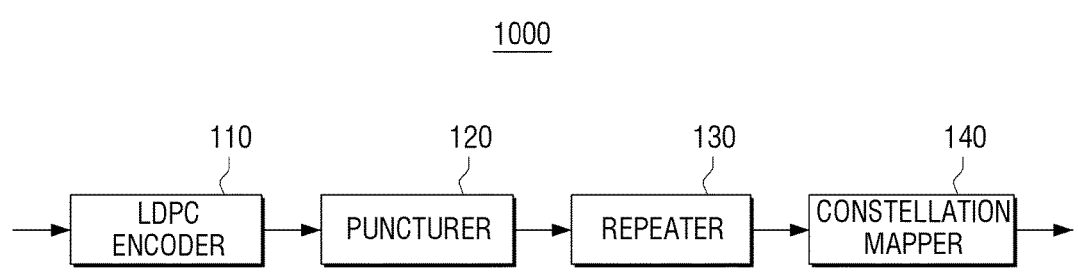
FIG. 1 is a block diagram for describing a configuration of a transmitter according to an exemplary embodiment.

FIG. 1 is a block diagram for describing a configuration of a transmitter according to an exemplary embodiment.

Referring to FIG. 1, a transmitter 1000 includes a Low Density Parity Check (LDPC) encoder 110, a puncturer 120, a repeater 130, and a constellation mapper 140.

The LDPC encoder 110 may encode input bits. In other words, the LDPC encoder 110 may perform LDPC encoding on the input bits to generate parity bits, that is, LDPC parity bits.

Here, the input bits are LDPC information bits for the LDPC encoding and may include outer-encoded bits and zero bits (that is, bits having a 0 value), in which the outer-encoded bits include information bits and parity bits (or parity check bits) generated by outer-encoding the information bits.

The information bits may be the L1 signaling. For example, the information bits may include information required to process other L1 signaling or data transmitted from the transmitter 1000.

The outer encoding is performed before inner coding in a concatenated coding operation, and may use various encoding schemes such as Bose, Chaudhuri, Hocquenghem (BCH) encoding and/or cyclic redundancy check (CRC) encoding. In this case, the LDPC encoding may be the inner encoding.

For LDPC encoding, a specific number of LDPC information bits depending on a code rate and a code length are required. Therefore, when the number of outer-encoded bits generated by outer-encoding the information bits is less than the required number of LDPC information bits, an appropriate number of zero bits are padded to meet the required number of LDPC information bits for the LDPC encoding. Therefore, the outer-encoded bits and the padded zero bits may configure the LDPC information bits as many as the number of bits required for the LDPC encoding.

Figure 25:
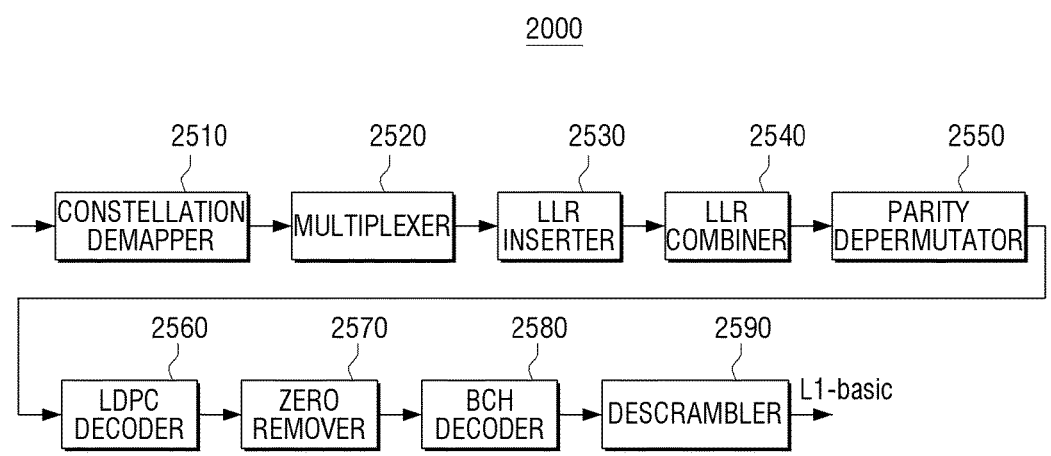
FIGS. 25 to 27 are block diagrams for describing a configuration of a receiver according to exemplary embodiments.
Figure 26:
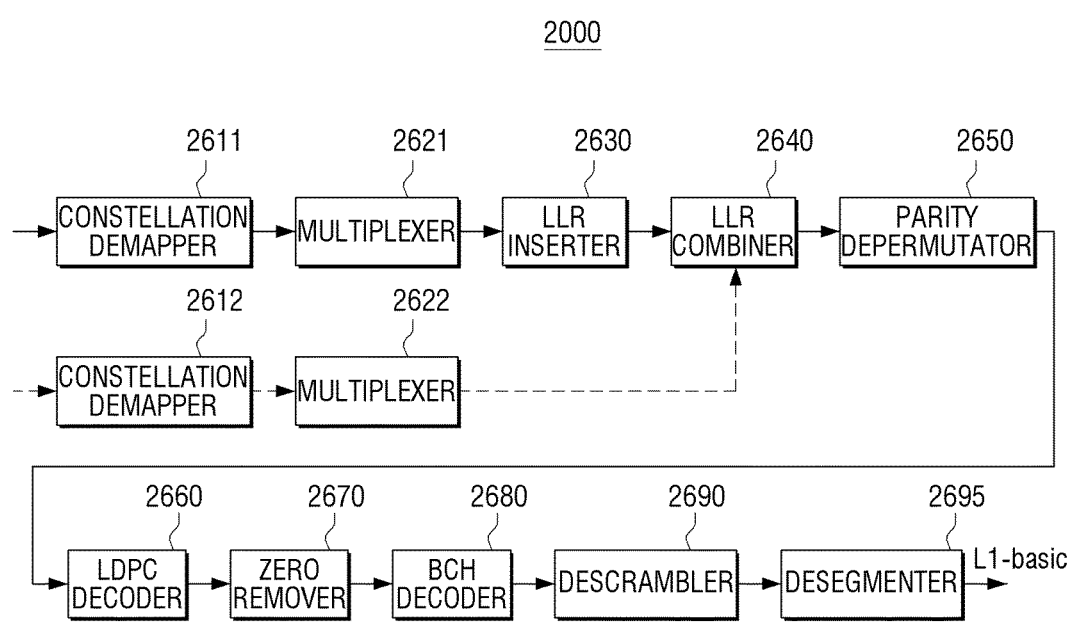
Figure 27:
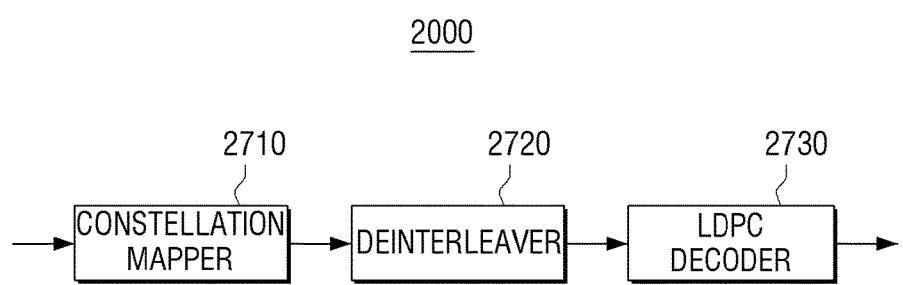

Meanwhile, since the padded zero bits are bits required only to meet the specific number of bits for the LDPC encoding, the padded zero bits are LDPC-encoded and then are not transmitted to a receiver 2000 (FIGS. 25-27). As such, a procedure of padding zero bits or a procedure of padding zero bits, and then, not transmitting the padded zero bits to the receiver 2000 may be called shortening. In this case, the padded zero bits may be called shortening bits (or shortened bits).

For example, it is assumed that the number of information bits is $K_{sig}$ and the number of bits when $M_{outer}$ parity bits are added to the information bits by the outer encoding, that is, the number of outer-encoded bits including the information bits and the parity bits is $N_{outer}$ ($=K_{sig}+M_{outer}$).

In this case, when the number $N_{outer}$ of outer-encoded bits is less than the number $K_{ldpc}$ of LDPC information bits, $K_{ldpc}-N_{outer}$ number of zero bits are padded so that the outer-encoded bits and the padded zero bits may configure the LDPC information bits together.

Meanwhile, the foregoing example describes that zero bits are padded, which is only one example.

When the information bits are formed of just signaling for data or a service data, a length of the information bits may vary depending on the amount of the data. Therefore, when the number of information bits is greater than the number of LDPC information bits required for the LDPC encoding, the information bits may be segmented below a specific value.

Therefore, when the number of information bits or the number of segmented information bits is less than a number obtained by subtracting the number of parity bits generated by the outer encoding from the number of LDPC information bits, zero bits are padded as many as the number obtained by subtracting the number of outer-encoded bits from the number of LDPC information bits, such that the LDPC information bits may be formed of the outer-encoded bits and the padded zero bits.

However, when the number of information bits or the number of segmented information bits are equal to the number obtained by subtracting the number of parity bits generated by the outer encoding from the number of LDPC information bits, the LDPC information bits may be formed of the outer-encoded bits without the padded zero bits.

Further, the foregoing example describes that the information bits are outer-encoded, which is only one example. However, the information bits may not be outer-encoded and configure the LDPC information bits along with the zero bits padded depending on the number of information bits or only the information bits may configure the LDPC information bits without separately padding.

Meanwhile, for convenience of explanation, the outer encoding will be described below under the assumption that it is performed by the BCH encoding.

Specifically, the input bits will be described under the assumption that they include BCH encoded bits and zero bits, the BCH encoded bits including the information bits and BCH parity-check bits (or BCH parity bits) generated by BCH-encoding the information bits.

That is, it is assumed that the number of information bits is $K_{sig}$ and the number of bits when $M_{outer}$ BCH parity check bits by the BCH encoding are added to the information bits, that is, the number of BCH encoded bits including the information bits and the BCH parity check bits is $N_{outer}$ ($=K_{sig}+M_{outer}$). Here, $M_{outer}=168$.

Further, the foregoing example describes that zero bits, which will be shortened, are padded, which is only one example. That is, since zero bits are bits having a value preset by the transmitter 1000 and the receiver 2000 and padded only to form LDPC information bits along with information bits including information to be substantially transmitted to the receiver 2000, bits having another value (for example, 1) preset by the transmitter 1000 and the receiver 2000 instead of zero bits may be padded for the shortening.

The LDPC encoder 110 may systematically encode the LDPC information bits to generate LDPC parity bits, and output an LDPC codeword (or LDPC-encoded bits) formed of the LDPC information bits and the LDPC parity bits. That is, an LDPC code is a systematic code, and therefore, the LDPC codeword may be formed of the LDPC information bits before being LDPC-encoded and the LDPC parity bits generated by the LDPC encoding.

For example, the LDPC encoder 110 may LDPC-encode $K_{ldpc}$ LDPC information bits $i=(i_0, i_1, \ldots i_{K_{ldpc}-1})$ to generate $N_{ldpc\_parity}$ LDPC parity bits $(p_0, p_1, \ldots, p_{N_{ldpc}-K_{ldpc}-1})$ and output an LDPC codeword $\Lambda=(c_0, c_1, \ldots, c_{N_{inner}-1})=(i_0, i_1, \ldots, i_{K_{ldpc}-1}, p_0, p_1, \ldots, p_{N_{inner}-K_{ldpc}-1})$ formed of $N_{inner}$ ($=K_{ldpc}+N_{ldpc\_parity}$) bits.

In this case, the LDPC encoder 110 may perform LDPC encoding on the input bits (i.e., LDPC information bits) at various code rates to generate an LDPC codeword having a predetermined length.

For example, the LDPC encoder 110 may perform the LDPC encoding at various code rates such as 2/15, 3/15, 4/15, 5/15, 6/15, 7/15, 8/15, 9/15, 10/15, 11/15, 12/15, and 13/15 to generate the LDPC codeword formed of 16200 bits.

In this case, the number of input bits may have various values according to the code rates.

For example, the LDPC encoder 110 may perform the LDPC encoding on 3240 input bits at a code rate of 3/15 to generate an LDPC codeword formed of 16200 bits and the LDPC encoding on 6480 input bits at a code rate of 6/15 to generate an LDPC codeword formed of 16200 bits.

A code rate and a code length at which the input bits are LDPC-encoded may be preset.

As described above, the LDPC encoder 110 may encode the input bits at various code rates to generate the LDPC codeword formed of the input bits and the LDPC parity bits.

The puncturer 120 punctures at least some of the LDPC parity bits.

Here, puncturing means that the at least some of the LDPC parity bits are not transmitted to a receiver (not shown).

Therefore, when performing the puncturing, the puncturer 120 may remove the punctured LDPC parity bits or output only the remaining bits other than the punctured LDPC parity bits in the LDPC codeword.

Specifically, the puncturer 120 calculates the number (that is, $N_{punc}$) of bits to be punctured in the parity bits, and performs puncturing on the parity bits based on the calculated number of bits.

That is, when the calculated number of bits to be punctured is a positive integer, the puncturer 120 may puncture bits as many as the calculated number in the parity bits, and when the calculated number of bits to be punctured is a negative integer, the puncturer may not perform puncturing.

For this purpose, the puncturer 120 may calculate the number of LDPC parity bits to be punctured.

First, the puncturer 120 may calculate a temporary number of LDPC parity bits to be punctured based on following Equation 1.

$$N_{punc\_temp} = \lfloor A \times (K_{ldpc} - N_{outer}) \rfloor + B \quad (1)$$

In above Equation 1, $N_{punc\_temp}$ represents the temporary number of LDPC parity bits to be punctured, and $K_{ldpc}$ represents the number of LDPC information bits. Further, $N_{outer}$ represents the number of outer-encoded bits. Here, when the outer encoding is performed by the BCH encoding, the $N_{outer}$ represents the number of BCH encoded bits.

Further, A means a ratio of the number of LDPC parity bits to be punctured to the number of zero bits to be shortened, and B means a length of bits to be punctured even when a shortening length is 0. The A and B values may be preset in a system including the transmitter 1000 and the receiver 2000.

Further, the puncturer 120 calculates $N_{FEC}$, the number of LDPC codeword bits after puncturing, based on following Equation 2.

$$N_{FEC} = \left\lceil \frac{N_{FEC\_temp}}{\eta_{MOD}} \right\rceil \times \eta_{MOD} \quad (2)$$

In above Equation 2, $N_{FEC}=N_{outer}+N_{ldpc\_parity}-N_{punc\_temp}$.

Further, $N_{FEC\_temp}=N_{outer}+N_{ldpc\_parity}-N_{punc\_temp}$ and $\eta_{MOD}$ is a modulation order. For example, when an LDPC codeword is modulated by QPSK, 16-QAM, 64-QAM, or 256-QAM, $\eta_{MOD}$ may be 2, 4, 6 or 8, respectively. As a result, the $N_{FEC}$ may be an integer multiple of the modulation order.

Next, the puncturer 120 calculates $N_{punc}$ based on following Equation 3.

$$N_{punc} = N_{punc\_temp} - (N_{FEC} - N_{FEC\_temp}) \quad (3)$$

In above Equation 3, $N_{punc}$ represents the number of LDPC parity bits to be punctured.

Further, the puncturer 120 may perform the puncturing on the LDPC parity bits based on the calculated number of LDPC parity bits to be punctured.

Specifically, when the calculated number $N_{punc}$ of LDPC parity bits to be punctured is a positive integer, the puncturer 120 may puncture $N_{punc}$ bits at a back portion of the LDPC parity bits. That is, the puncturer 120 may puncture the $N_{punc}$ bits from a last LDPC parity bit, remove and output the punctured $N_{punc}$ bits from the LDPC codeword, or output the remaining bits other than the punctured $N_{punc}$ bits from the LDPC codeword.

However, when the calculated number $N_{punc}$ of LDPC parity bits to be punctured is a negative integer, the puncturer 120 may not perform puncturing but output the LDPC codeword which is not subjected to puncturing.

The repeater 130 selects at least some bits from the LDPC codeword including the input bits and the parity bits based on a repetition pattern and adds the selected some bits after the parity bits.

Here, adding represents attaching the selected bits after the LDPC parity bits so that the bits are repeated. These bits selected and attached after the LDPC parity bits are referred to as "repetition bits" or "repeated bits."

That is, the repeater 130 selects at least some bits of the LDPC codeword so that the at least some bits of the LDPC codeword are transmitted while being repeated in a current frame, thereby repeating the selected bits in the LDPC codeword.

Specifically, the repeater 130 may select a specific number of bits from the LDPC codeword and add the selected bits after the LDPC parity bits. Therefore, the selected bits may be repeated after the LDPC parity bits.

Therefore, since the specific number of bits are repeated within the LDPC codeword, and thus, these repeated bits are additionally transmitted to the receiver 2000, the foregoing operation may be called repetition.

For this purpose, the repeater 130 may calculate the number of bits to be repeated in the LDPC codeword.

Specifically, when the $N_{punc}$ is a negative integer, the repeater 130 may determine $-N_{punc}$ bits as the number (that is, $N_{repeat}$) of repetition bits, and select as many as the determined number of bits from the LDPC codeword.

As such, when the calculated number of bits to be punctured is a negative integer, the repetition may be performed. However, when the calculated number of bits to be punctured is a positive integer, the repetition may be omitted.

Meanwhile, a method for selecting, by the repeater 130, $N_{repeat}$ bits to be repeated from an LDPC codeword is as follows.

First, the repeater 130 may divide the LDPC codeword into a plurality of bit groups.

Specifically, the repeater 130 may divide the LDPC codeword into the plurality of bit groups such that the number of bits included in each bit group is 360.

For example, when the LDPC codeword is formed of 16200 bits, the repeater 130 may divide the LDPC codeword into 45 (16200/360) bit groups, and when the LDPC codeword is formed of 64800 bits, the repeater 130 may divide the LDPC codeword into 180 (=64800/360) bit groups.

Further, the repeater 130 may calculate the number $N_{rep}$ of bit groups of which all bits are to be repeated among the plurality of bit groups configuring the LDPC codeword, based on following Equation 4.

$$N_{rep} = \left\lfloor \frac{N_{repeat}}{360} \right\rfloor \quad (4)$$

In above Equation 4, $N_{repeat}$ is the number of repetition bits and $N_{repeat}=-N_{punc}$.

The repeater 130 may determine a bit group in which all bits included therein are to be repeated, based on a repetition pattern.

Here, the repetition pattern is a pattern for selecting a bit group to be repeated among the plurality of bit groups configuring the LDPC codeword and may be defined as following Table 1, for example.

TABLE 1

| $\pi_R(j)$ | | | | | | | | |
|---|---|---|---|---|---|---|---|---|
| $\pi_R(0)$ | $\pi_R(1)$ | $\pi_R(2)$ | $\pi_R(3)$ | $\pi_R(4)$ | $\pi_R(5)$ | $\pi_R(6)$ | $\pi_R(7)$ | $\pi_R(8)$ |
| $\pi_R(9)$ | $\pi_R(10)$ | $\pi_R(11)$ | $\pi_R(12)$ | $\pi_R(13)$ | $\pi_R(14)$ | $\pi_R(15)$ | $\pi_R(16)$ | $\pi_R(17)$ |
| $\pi_R(18)$ | $\pi_R(19)$ | $\pi_R(20)$ | $\pi_R(21)$ | ... | | | | |
| 5 | 6 | 0 | 1 | 3 | 7 | 8 | 2 | 10 |
| 9 | 11 | 0 | 1 | 2 | 3 | 22 | 31 | 15 |
| 4 | 5 | 6 | 7 | ... | | | | |

Here, $\pi_s(j)$ represents a repetition pattern order of a j-th bit group.

Specifically, the repeater 130 may determine a $\pi_R(0)$-th bit group, a $\pi_R(1)$-th bit group, ..., a $\pi_R(N_{rep}-1)$-th bit group among the plurality of bit groups as bit groups of which all bits are to be repeated, based on the repetition pattern. Further, the repeater 130 may select all bits included in the $\pi_R(0)$-th bit group, the $\pi_R(1)$-th bit group, ..., the $\pi_R(N_{rep}-1)$-th bit group as bits to be repeated.

Further, the repeater 130 may additionally select bits to be repeated based on the repetition pattern.

Specifically, the repeater 130 may additionally select $N_{repeat}-360 \times N_{rep}$ bits from a first bit of the $\pi_R(N_{rep})$-th bit group as additional repetition bits.

Further, the repeater 130 may add the bits selected as the repetition bits after the LDPC parity bits.

Specifically, the repeater 130 may add all bits included in the $\pi_R(0)$-th bit group, the $\pi_R(1)$-th bit group, ..., the $\pi_R(N_{rep}-1)$-th bit group after the LDPC parity bits, and also, add the $N_{repeat}-360 \times N_{rep}$ bits from the first bit of the $\pi_R(N_{rep})$-th bit group. Here, all bits included in the $\pi_R(0)$-th bit group, the $\pi_R(1)$-th bit group, ..., the $\pi_R(N_{rep}-1)$-th bit group may be added to the LDPC codeword before the $N_{repeat}-360 \times N_{rep}$ bits from the first bit of the $\pi_R(N_{rep})$-th bit group are added to the LDPC codeword, or vice versa.

As a result, the repeated LDPC codeword may be configured of LDPC information bits, LDPC parity bits, a $\pi_R(0)$-th bit group, a $\pi_R(1)$-th bit group, ..., a $\pi_R(N_{rep}-1)$-th bit group, and $N_{repeat}-360 \times N_{rep}$ bits from first bits of a $\pi_R(N_{rep})$-th bit group in order.

Hereinafter, a method for selecting the bits to be repeated, for example, when $K_{ldpc}=3240$, $N_{inner}=16200$, $N_{repeat}=3000$ and the repetition pattern is defined as above Table 1 will be described in detail.

In this case, since the LDPC codeword may be divided into 45 (=16200/360) bit groups, a 0-th bit group to a 8-th bit group correspond to the LDPC information bits and a 9-th bit group to a 44-th bit group correspond to the LDPC parity bits.

First, the repeater 130 may calculate the number of bit groups in which all bits are to be repeated as $$8 = N_{rep} = \left\lfloor \frac{3000}{360} \right\rfloor.$$

Further, the repeater 130 may determine a fifth bit group ($=\pi_R(0)$-th bit group), a sixth bit group ($=\pi_R(1)$-th group), ..., a second bit group ($=\pi_R(7)$-th bit group) as bit groups in which all bits are to be repeated based on the repetition pattern, and select all bits included in each of these bit groups as the repetition bits.

Further, the repeater 130 may additionally select 120 (=3000−360×8) bits at a front portion of a tenth bit group ($=\pi_R(8)$-th bit group) as additional repetition bits based on the repetition pattern. Therefore, a first bit to a 120-th bit in the tenth bit group may be additionally selected.

Next, the repeater 130 may add the bits selected as the repetition bits after the LDPC parity bits.

That is, the repeater 130 may add the bits included in the fifth bit group ($=\pi_R(0)$-th bit group), the sixth bit group ($=\pi_R(1)$-th bit group), ..., the second bit group ($=\pi_R(7)$-the bit group) after the LDPC parity bits and add the first bit to the 120-th bit of the tenth bit group ($\pi_R(8)$-the bit group) after the added second bit group (=$\pi_R(7)$-the bit group).

Meanwhile, above Table 1 is only an example of the repetition pattern, and according to other exemplary embodiments, the repetition pattern may be defined variously.

For example, in above Table 1, although the repetition pattern is defined as $\pi_R(0)$=5, $\pi_R(1)$=6, . . . but the repeater 130 may also select repetition bits based on a repetition pattern defined as $\pi_R(0)$=0, $\pi_R(1)$=1, . . . . However, this is only an example, and the repetition pattern may be defined variously.

Further, in the repetition pattern as above Table 1, repetition bits are selected from different bit groups. However, this is only one example, and the repeater 130 may select repetition bits based on a repetition pattern by which repetition bits are selected from at least two same bit groups.

For example, the repeater 130 may also select the repetition bits based on a repetition pattern defined as $\pi_R(0)$=1, $\pi_R(1)$=0, . . . .

The constellation mapper 140 may map the LDPC codeword to constellation points.

For example, the constellation mapper 140 may map the repeated and punctured LDPC codeword bits to the constellation points.

Specifically, when the puncturing is performed on the LDPC parity bits depending on the calculated number of punctured bits, the repetition is not performed. In this case, the constellation mapper 140 may modulate the remaining LDPC codeword bits other than the punctured LDPC codeword, that is, the punctured bits by various modulation schemes such as QPSK, 16-QAM, 64-QAM, and 256-QAM and map the modulated bits to the constellation points.

However, when the puncturing is not performed on the LDPC parity bits depending on the calculated number of punctured bits, the repetition is performed. In this case, the constellation mapper 140 may modulate the repeated LDPC codeword, that is, the LDPC codeword bits to which the repeated bits are added by various modulation schemes such as QPSK, 16-QAM, 64-QAM, and 256-QAM and map the modulated LDPC codeword bits to the constellation points.

In this case, the scheme of modulating LDPC codeword bits may be established in advance.

In these cases, the transmitter 1000 may map the constellation symbols corresponding to the constellation points to the frame, which may then be transmitted to the receiver 2000.

Meanwhile, as described above, since the information bits are the L1 signaling including signaling information for data, the transmitter 1000 may map the data to the frame along with the signaling for processing the corresponding data and transmit the mapped data to the receiver 2000.

Specifically, the transmitter 1000 may process the data in a specific scheme to generate the constellation symbols and map the generated constellation symbols to data symbols of each frame. Further, the transmitter 1000 may map the L1 signaling for the data mapped to each frame to a preamble of the corresponding frame. For example, the transmitter 1000 may map the L1 signaling including the signaling information for the data mapped to the i-th frame to the i-th frame.

As a result, the receiver 2000 may use the signaling acquired from the frame to acquire and process the data from the corresponding frame.

Meanwhile, according to the exemplary embodiment, the foregoing information bits may be implemented by L1-basic signaling and L1-detail signaling. Therefore, the transmitter 1000 may perform the repetition on the L1-basic signaling and the L1-detail signaling by using the foregoing method and transmit them to the receiver 2000.

Here, the L1-basic signaling and the L1-detail signaling may be signaling defined in an advanced television system committee (ATSC) 3.0 standard.

Specifically, a mode of processing the L1-basic signaling is divided into 7. The transmitter 1000 according to the exemplary embodiment may perform the repetition according to the foregoing method when an L1-basic mode 1 of the 7 modes processes the L1-basic signaling.

Further, a mode of processing the L1-detail signaling is also divided into 7. The transmitter 1000 according to the exemplary embodiment may perform the repetition according to the foregoing method when an L1-detail mode 1 of the 7 modes processes the L1-detail signaling.

Meanwhile, the transmitter 1000 may process each of the L1-basic signaling and the L1-detail signaling with other modes using a specific scheme, in addition to the L1-basic mode 1 and the L1-detail mode 1 and transmit them to the receiver 2000.

Meanwhile, a detailed method for processing the L1-basic signaling and the L1-detail signaling will be described below.

The transmitter 1000 may map the L1-basic signaling and the L1-detail signaling to the preamble of the frame and map data to the data symbols and transmit them to the receiver 2000.

Figure 2:
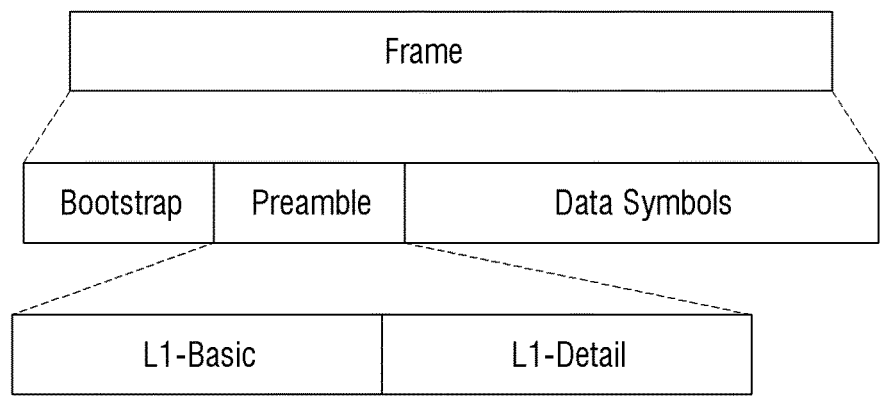
FIG. 2 is a diagram for describing a frame structure according to an exemplary embodiment.

Referring to FIG. 2, the frame may be configured of three parts, that is, a bootstrap part, a preamble part, and a data part.

The bootstrap part is used for initial synchronization and the receiver 2000 provides a basic parameter for decoding the L1 signaling. Further, the bootstrap part may include information on the mode of processing, by the transmitter 1000, the L1-basic signaling, that is, information on by what mode the transmitter 1000 processes the L1-basic signaling.

The preamble part includes the L1 signaling and may be configured of two parts, that is, the L1-basic signaling and the L1-detail signaling.

Here, the L1-basic signaling may include the information on the L1-detail signaling and the L1-detail signaling may include the information on the data (here, data is broadcasting data for providing broadcasting services and may be transmitted through at least one physical layer pipes (PLPs)).

Specifically, the L1-basic signaling includes information (for example, information on a mode of processing, by the transmitter 1000, the L1-detail signaling, that is, information on by what mode the transmitter 1000 processes the L1-detail signaling) required for the transmitter 2000 to process the L1-detail signaling, information on the length of the L1-detail signaling, information on an additional parity mode (that is, information on a K value used to generate, by the transmitter 1000, the additional parity bits using L1B_L1_Detail_additional_parity_mode (here, when the L1B_L1_Detail_additional_parity_mode is set as '00', K=0 and the additional parity bits are not used), and information on a length of total cells). Further, the L1-basic signaling may include basic signaling information of the system such as a fast Fourier transform (FFT) size, a guard interval, and a pilot pattern.

Further, the L1-detail signaling includes information (for example, start positions of cells mapped to data symbols for each PLP, PLP ID, a size of the PLP, a modulation scheme, a code rate, etc.) required for the receiver 2000 to decode the PLPs.

Therefore, the receiver 2000 may acquire frame synchronization, acquire the L1-basic signaling and the L1-detail signaling from the preamble, and receive broadcasting data required by a user from the data symbols using the L1-detail signaling.

Meanwhile, a method for processing L1-basic signaling and L1-detail signaling will be described below in more detail with reference to the accompanying drawings.

Figure 3:
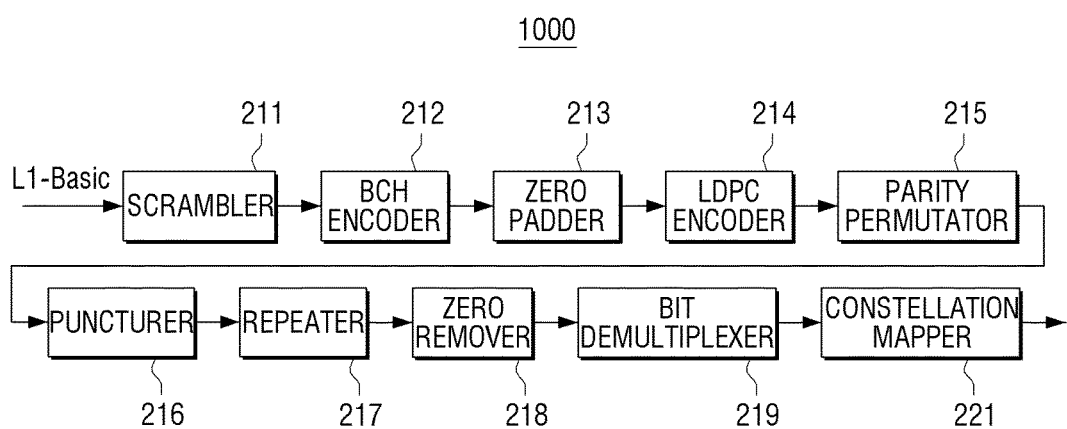
FIGS. 3 and 4 are block diagrams for describing a detailed configuration of a transmitter according to exemplary embodiments.
Figure 4:
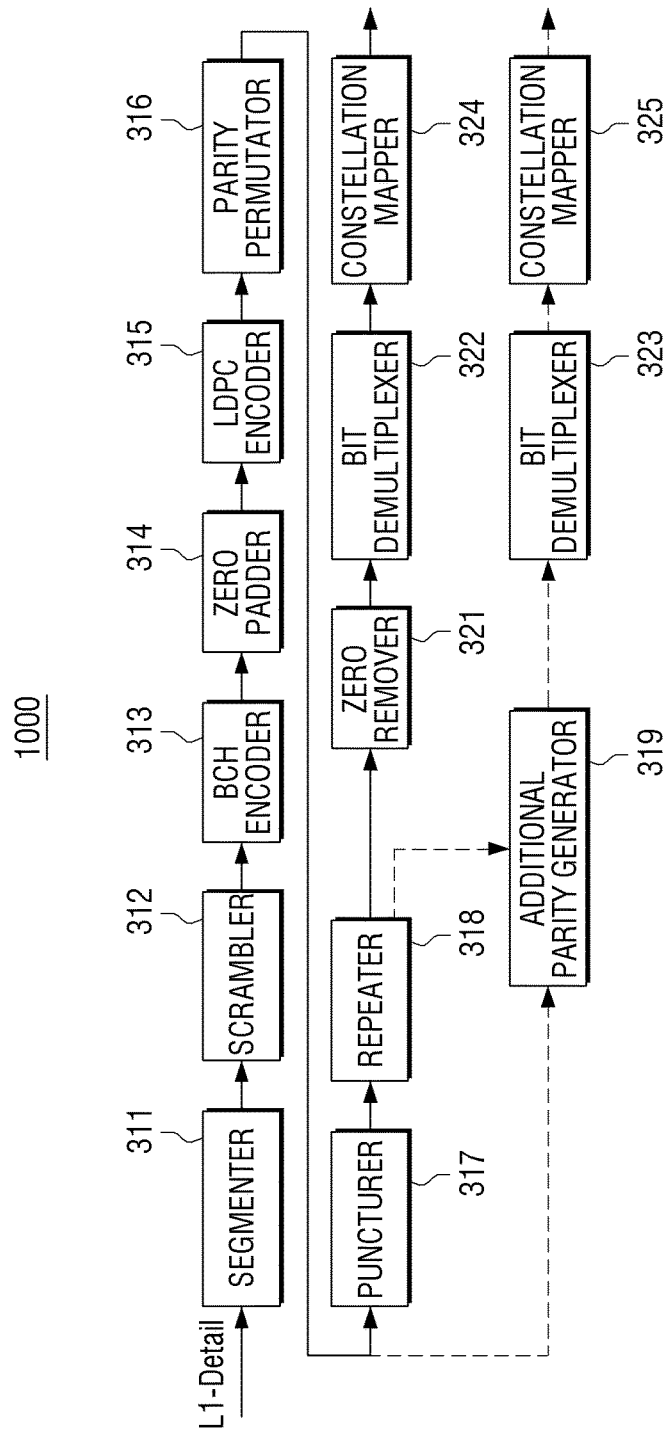

FIGS. 3 and 4 are block diagrams for describing a detailed configuration of a transmitter according to an exemplary embodiment.

Specifically, as shown in FIG. 3, to process the L1-basic signaling, the transmitter 1000 may include a scrambler 211, a BCH encoder 212, a zero padder 213, an LDPC encoder 214, a parity permutator 215, a puncturer 216, a repeater 216, a zero remover 218, a bit demultiplexer 219, and a constellation mapper 221.

Further, as shown in FIG. 4, to process the L1-detail signaling, the transmitter 1000 may include a segmenter 311, a scrambler 312, a BCH encoder 313, a zero padder 314, an LDPC encoder 315, a parity permutator 316, a puncturer 317, a repeater 318, an additional parity generator 319, a zero remover 321, bit demultiplexers 322 and 323, and constellation mappers 324 and 325.

Here, components shown in FIGS. 3 and 4 are components for performing encoding and modulation on the L1-basic signaling and the L1-detail signaling, which is only one example. In some cases, some of the components shown in FIGS. 3 and 4 may be omitted or changed and other components may also be added.

Meanwhile, the LDPC encoders 214 and 315, the puncturers 216 and 317, the repeaters 217 and 318, and the constellation mappers 221, 324, and 325 shown in FIGS. 3 and 4 may perform the operations performed by the LDPC encoder 110, the puncturer 120, the repeater 130, and the constellation mappers 140 shown in FIG. 1.

Meanwhile, in describing FIGS. 3 and 4, for convenience, components for performing common functions will be described together.

Meanwhile, to provide various robustness level appropriate for a wide SNR range, a protection level of the L1-basic signaling and the L1-detail signaling may be divided into 7 modes. That is, the protection level of the L1-basic signaling and the L1-detail signaling may be divided into the 7 modes based on the LDPC code, the modulation order, the shortening/puncturing parameters (that is, a ratio of the number of punctured bits to the number of shortened bits), and the number of basically punctured bits (that is, when the number of shortened bits is 0, the number of basically punctured bits). In each mode, at least one different combination of the LDPC code, the modulation order, the constellation, and the shortening/puncturing pattern may be used.

Meanwhile, by what mode the transmitter 1000 processes the signaling may be set in advance depending on the system. Therefore, the transmitter 1000 may determine parameters (for example, modulation and code rate (ModCod) for each mode, parameter for the BCH encoding, parameter for the zero padding, shortening pattern, code rate/code length of the LDPC code, group-wise interleaving pattern, parameter for repetition, parameter for puncturing, and modulation scheme, etc.) for processing the signaling depending on the set mode and may process the signaling based on the determined parameters and transmit the processed signaling to the receiver 2000. For this purpose, the transmitter 1000 may pre-store the parameters for processing the signaling depending on the mode.

Modulation and code rate configurations (ModCod configurations) for the 7 modes for processing the L1-basic signaling and the 7 modes for processing the L1-detail signaling are as following Table 2. The transmitter 1000 may encode and modulate the signaling based on the ModCod configurations defined in following Table 2 depending on the modes. That is, the transmitter 1000 may determine the encoding and modulation scheme for the signaling in each mode based on following Table 2 and may encode and modulate the signaling depending on the determined scheme. In this case, even when modulating the L1 signaling by the same modulation scheme, the transmitter 1000 may also use different constellations.

TABLE 2

| Signaling | FEC Type | $K_{sig}$ | Code Length | Code Rate | Constellation |
|---|---|---|---|---|---|
| L1-Basic | Mode 1 | 200 | 16200 | 3/15 | QPSK |
|  | Mode 2 |  |  | (Type A) | QPSK |
|  | Mode 3 |  |  |  | QPSK |
|  | Mode 4 |  |  |  | NUC_16-QAM |
|  | Mode 5 |  |  |  | NUC_64-QAM |
|  | Mode 6 |  |  |  | NUC_256-QAM |
|  | Mode 7 |  |  |  | NUC_256-QAM |
| L1-Detail | Mode 1 | 400~2352 |  |  | QPSK |
|  | Mode 2 | 400~3072 |  |  | QPSK |
|  | Mode 3 | 400~6312 |  | 6/15 | QPSK |
|  | Mode 4 |  |  | (Type B) | NUC_16-QAM |
|  | Mode 5 |  |  |  | NUC_64-QAM |
|  | Mode 6 |  |  |  | NUC_256-QAM |
|  | Mode 7 |  |  |  | NUC_256-QAM |

Meanwhile, in above Table 2, $K_{sig}$ represents the number of information bits for a coded block. That is, since the L1 signaling bits having a length of the $K_{sig}$ are encoded to generate the coded block, a length of the L1 signaling in one coded block becomes the $K_{sig}$. Therefore, the L1 signaling bits having the size of the $K_{sig}$ may be considered as corresponding to one LDPC coded block.

Referring to above Table 2, the $K_{sig}$ value for the L1-basic signaling is fixed as 200. However, since the amount of L1-detail signaling bits varies, the $K_{sig}$ value for the L1-detail signaling varies.

Specifically, in the case of the L1-detail signaling, the number of L1-detail signaling bits varies, and therefore when the number of L1-detail signaling bits is larger than the preset value, the L1-detail signaling may be segmented to have a length which is equal to or less than the preset value.

In this case, each size of the segmented L1-detail signaling blocks (that is, segment of the L1-detail signaling) may have the $K_{sig}$ value defined in above Table 2. Further, each of the segmented L1-detail signaling blocks having the size of the $K_{sig}$ may correspond to one LDPC coded block.

However, when the number of L1-detail signaling bits is equal to or less than the preset value, the L1-detail signaling is not segmented. In this case, the size of the L1-detail signaling may have the $K_{sig}$ value defined in above Table 2. Further, the L1-detail signaling having the size of the $K_{sig}$ may correspond to one LDPC coded block.

Hereinafter, a method for segmenting L1-detail signaling will be described in detail.

The segmenter 311 segments the L1-detail signaling. Specifically, since the length of the L1-detail signaling varies, when the length of the L1-detail signaling is larger than the preset value, the segmenter 311 may segment the L1-detail signaling to have the number of bits which are equal to or less than the preset value and output each of the segmented L1-detail signalings to the scrambler 312.

However, when the length of the L1-detail signaling is equal to or less than the preset value, the segmenter 311 does not perform a separate segmentation operation.

Meanwhile, a method for segmenting, by the segmenter 311, the L1-detail signaling is as follows.

The amount of L1-detail signaling bits varies and mainly depends on the number of PLPs. Therefore, to transmit all the L1-detail signaling, at least one forward error correction (FEC) frame is required. Here, the FEC frame may represent the form that the L1-detail signaling is encoded and thus the parity bits depending on the encoding are added to the L1-detail signaling.

Specifically, when the L1-detail signaling is not segmented, the L1-detail signaling goes through the BCH encoding and the LDPC encoding to generate one FEC frame and therefore one FEC frame is required for the L1-detail signaling transmission. On the other hand, when the L1-detail signaling is segmented into at least two, at least two segmented L1-detail signalings each go through the BCH encoding and the LDPC encoding to generate at least two FEC frames and therefore at least two FEC frames are required for the L1-detail signaling transmission.

Therefore, the segmenter 311 may calculate the number $N_{LID\_FECFRAME}$ of FEC frames for the L1-detail signaling based on following Equation 5. That is, the number $N_{LID\_FECFRAME}$ of FEC frames for the L1-detail signaling may be determined based on following Equation 5.

$$N_{L1D\_FECFRAME} = \left\lceil \frac{K_{L1D\_ex\_pad}}{K_{seg}} \right\rceil \quad \text{[Equation 5]}$$

In above Equation 5, $\lceil x \rceil$ represents a minimum integer which is equal to or larger than x.

Figure 5:
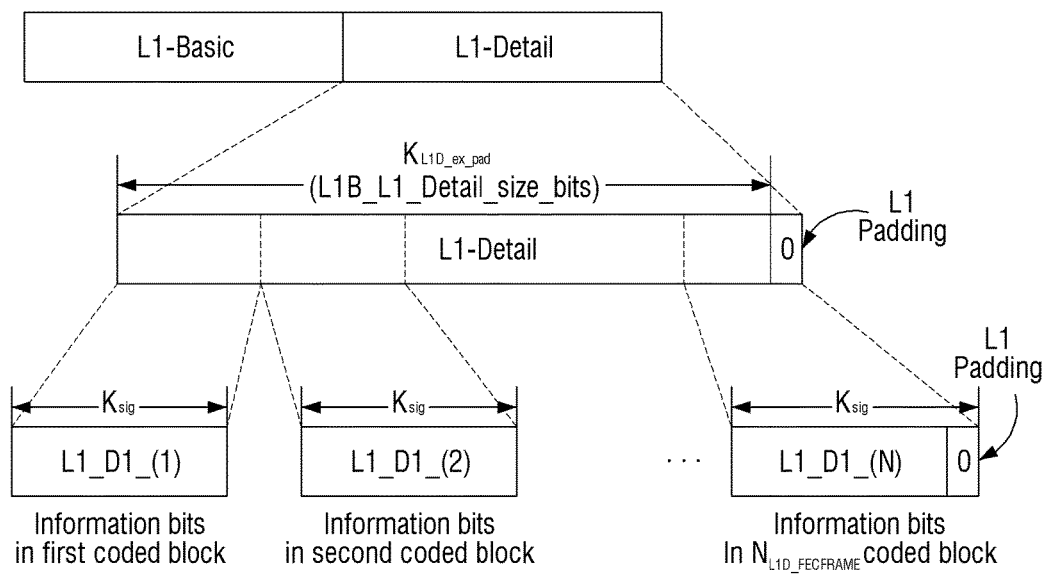
FIGS. 5 to 9 are diagrams for describing a method for processing signaling according to exemplary embodiments.

Further, $K_{LID\_ex\_pad}$ represents the length of the L1-detail signaling other than L1 padding bits as shown in FIG. 5 and may be determined by a value of an L1B_L1_Detail_size_bits field included in the L1-basic signaling.

Further, $K_{seg}$ represents a threshold number for segmentation defined based on the number $K_{ldpc}$ of information bits input to the LDPC encoder 315, that is, the LDPC information bits. Further, the $K_{seg}$ may be defined based on the number of BCH parity check bits of the BCH code and a multiple value of 360.

Meanwhile, after the $K_{seg}$ is segmented, the number $K_{sig}$ of information bits in the coded block is set to be equal to or less than ($K_{ldpc}-M_{outer}$). Specifically, when the L1-detail signaling is segmented based on the $K_{seg}$, since the length of segmented L1-detail signaling does not exceed the $K_{seg}$, the length of the segmented L1-detail signaling is set to be equal to or less than ($K_{ldpc}-M_{outer}$) when the $K_{seg}$ is set like above Table 3.

Here, the Mouter and the Kldpc are as following Tables 4 and 5. Meanwhile, for sufficient robustness, the $K_{seg}$ value for the L1 detail mode 1 may be set to be ($K_{ldpc}-M_{outer}-720$).

Meanwhile, the $K_{seg}$ for each mode of the L1-detail signaling may be defined as following Table 3. In this case, the segmenter 311 may determine the $K_{seg}$ depending on the mode as shown in following Table 3.

TABLE 3

| L1-Detail | $K_{seg}$ |
|---|---|
| Mode 1 | 2352 |
| Mode 2 | 3072 |
| Mode 3 | 6312 |
| Mode 4 | |
| Mode 5 | |
| Mode 6 | |
| Mode 7 | |

Meanwhile, as shown in FIG. 5, all the L1-detail signaling may be configured of the L1-detail signaling and the L1 padding bits.

In this case, the segmenter 311 may calculate a length of a L1_PADDING field for the L1-detail signaling, that is, the number $K_{LID\_PAD}$ of the L1 padding bits based on following Equation 6.

However, calculating the $K_{LID\_PAD}$ based on following Equation 6 is only one example. That is, the segmenter 311 may calculate the length of the L1_PADDING field for the L1-detail signaling, that is, the number $K_{LID\_PAD}$ of the L1 padding bits based on $K_{LID\_ex\_pad}$ and $N_{LID\_FECFRAME}$ values. As one example, the $K_{LID\_PAD}$ value may be obtained based on following Equation 6. That is, following Equation 6 is only one example of a method for obtaining a $K_{LID\_PAD}$ value and therefore another method based on the $K_{LID\_ex\_pad}$ and $N_{LID\_FECFRAME}$ values may be applied to yield the equivalent result.

$$K_{L1D\_PAD} = \left\lceil \frac{K_{L1D\_ex\_pad}}{K_{L1D\_FECFRAME}} \right\rceil \times N_{L1D\_FECFRRAME} - K_{L1D\_ex\_pad} \quad \text{[Equation 6]}$$

Further, the segmenter 311 may fill the L1_PADDING part with $K_{LID\_PAD}$ zero bits (that is, bits having a 0 value). Therefore, as shown in FIG. 5, the $K_{LID\_PAD}$ zero bits may be filled in the L1_PADDING part.

As such, by calculating the length of the L1_PADDING field and padding the zero bits as much as the calculated length to the L1_PADDING part, each of the L1-detail signalings may be segmented into the plurality of blocks formed of the same number of bits when the L1-detail signaling is segmented.

Next, the segmenter 311 may calculate a final length $K_{LID}$ of all the L1-detail signaling including the zero padding bits based on following Equation 7.

$$K_{L1D}=K_{L1D\_ex\_pad}+K_{L1D\_PAD} \quad \text{[Equation 7]}$$

Further, the segmenter 311 may calculate the number $K_{sig}$ of information bits in each of the $N_{LID\_FECFRAME}$ blocks based on following Equation 8.

$$K_{sig} = \frac{K_{L1D}}{N_{L1D\_FECFRAME}} \quad \text{[Equation 8]}$$

Next, the segmenter 311 may segment all the L1-detail signalings as many as the number of $K_{sig}$ bits.

Specifically, as shown in FIG. 5, when the $N_{LID\_FECFRAME}$ is larger than 1, the segmenter 311 may segment all the L1-detail signalings as many as the number of $K_{sig}$ bits to segment all the L1-detail signalings into the $N_{LID\_FECFRAME}$ blocks.

Therefore, the L1-detail signaling may be segmented into the $N_{LID\_FECFRAME}$ blocks and the number of L1-detail signaling bits in each of the $N_{LID\_FECFRAME}$ blocks may be $K_{sig}$. Further, each of the segmented L1-detail signalings is encoded. As the encoded result, the coded block, that is, the FEC frame is formed, such that the number of L1-detail signaling bits in each of the $N_{LID\_FECFRAME}$ coded blocks may be $K_{sig}$.

However, when the L1-detail signaling is not segmented, $K_{sig}=K_{LID\_ex\_pad}$.

Meanwhile, the segmented L1-detail signaling blocks may be encoded by the following procedure.

Specifically, all bits of each of the L1-detail signaling blocks having the size of the information of $K_{sig}$ may be scrambled. Next, each of the scrambled L1-detail signaling blocks may be encoded by the concatenation of the BCH outer code and the LDPC inner code.

Specifically, each of the L1-detail signaling blocks goes through the BCH encoding, and thus $M_{outer}$ (=168) BCH parity check bits may be added to the $K_{sig}$ L1-detail signaling bits of each block and then the concatenation of the L1-detail signaling bits and the BCH parity check bits of each block may be encoded by the shortened and punctured 16K LDPC code. Meanwhile, the detailed content of the BCH code and the LDPC code will be described below. However, the present disclosure describes only the case in which $M_{outer}=168$, but it is apparent that $M_{outer}$ may be changed into an appropriate value depending on the requirements of the system.

The scramblers 211 and 312 scramble the L1-basic signaling and the L1-detail signaling. Specifically, the scramblers 211 and 312 may randomize the L1-basic signaling and the L1-detail signaling and output the randomized L1-basic signaling and L1-detail signaling to the BCH encoders 212 and 313.

In this case, the scramblers 211 and 312 may scramble the information bits every $K_{sig}$.

That is, since the number of L1-basic signaling bits transmitted to the receiver 2000 through each frame is 200, the scrambler 211 may scramble the L1-basic signaling bits every $K_{sig}$ (=200).

Meanwhile, since the number of L1-detail signaling bits transmitted to the receiver 2000 through each frame varies, in some cases, the L1-detail signaling may be segmented by the segmenter 311. Further, the segmenter 311 may output the L1-detail signaling formed of the $K_{sig}$ bits or the segmented L1-detail signaling to the scrambler 312. As a result, the scrambler 312 may scramble the L1-detail signaling bits every $K_{sig}$ which are output from the segmenter 311.

The BCH encoders 212 and 313 perform the BCH encoding on the L1-basic signaling and the L1-detail signaling to generate the BCH parity check bits.

Specifically, the BCH encoders 212 and 313 may perform the BCH encoding on the L1-basic signaling and the L1-detail signaling output from the scramblers 211 and 313 to generate the BCH parity check bits and output the BCH encoded bits in which the BCH parity check bits are added to each of the L1-basic signaling and the L1-detail signaling to the zero padders 213 and 314.

For example, the BCH encoders 212 and 313 may perform the BCH encoding on the input $K_{sig}$ bits to generate the $M_{outer}$ (that is, $K_{sig}=K_{payload}$) BCH parity check bits and output the BCH encoded bits formed of $N_{outer}$ (=$K_{sig}+M_{outer}$) bits to the zero padders 213 and 314.

Meanwhile, the parameters for the BCH encoding may be defined as following Table 4.

TABLE 4

| Signaling FEC Type | | $K_{sig}=$ $K_{payload}$ | $M_{outer}$ | $N_{outer}=$ $K_{sig}+M_{outer}$ |
|---|---|---|---|---|
| L1-Basic | Mode 1 | 200 | 168 | 368 |
| | Mode 2 | | | |
| | Mode 3 | | | |
| | Mode 4 | | | |
| | Mode 5 | | | |
| | Mode 6 | | | |
| | Mode 7 | | | |
| L1-Detail | Mode 1 | 400~2352 | | 568~2520 |
| | Mode 2 | 400~3072 | | 568~3240 |
| | Mode 3 | 400~6312 | | 568~6480 |
| | Mode 4 | | | |
| | Mode 5 | | | |
| | Mada 6 | | | |
| | Mode 7 | | | |

Meanwhile, referring to FIGS. 3 and 4, it may be appreciated that the LDPC encoders 214 and 315 are disposed after the BCH encoders 212 and 313.

Therefore, the L1-basic signaling and the L1-detail signaling may be protected by the concatenation of the BCH outer code and the LDPC inner code.

Specifically, the L1-basic signaling and the L1-detail signaling go through the BCH encoding, and thus the BCH parity check bits for the L1-basic signaling are added to the L1-basic signaling and the BCH parity check bits for the L1-detail signaling are added to the L1-detail signaling. Further, the concatenated L1-basic signaling and BCH parity check bits are additionally protected by the LDPC code and the concatenated L1-detail signaling and BCH parity check bits may be additionally protected by the LDPC code.

Here, since the LDPC code is a 16K LDPC code, in the BCH encoders 212 and 213, a systematic BCH code for $N_{inner}=16200$ (that is, the code length of the 16K LDPC is 16200 and the LDPC codeword generated by the LDPC encoding may consist of 16200 bits) may be used to perform the outer encoding of the L1-basic signaling and the L1-detail signaling.

The zero padders 213 and 314 pad the zero bits. Specifically, in the case of the LDPC code, since the specific number of LDPC information bits defined depending on the code rate and the code length is required, the zero padders 213 and 314 may pad the zero bits for the LDPC encoding to generate the specific number of LDPC information bits formed of the BCH encoded bits and the zero bits and output the generated bits to the LDPC encoders 214 and 315 when the number of BCH encoded bits is less than the number of LDPC information bits. Meanwhile, when the number of BCH encoded bits is equal to the number of LDPC information bits, the zero bits are not padded.

Here, the zero bits padded by the zero padders 213 and 314 are padded for the LDPC encoding and therefore the zero bits padded depending on the shortening are not transmitted to the receiver 200.

For example, when the number of LDPC information bits of the 16K LDPC code is $K_{ldpc}$, to fill the $K_{ldpc}$ LDPC information bits, the zero bits may be padded to some of the LDPC information bits.

Specifically, when the number of BCH encoded bits is $N_{outer}$, the number of LDPC information bits of the 16K LDPC code is $K_{ldpc}$, and $N_{outer}<K_{ldpc}$, the zero padders 213 and 314 may pad the $K_{ldpc}-N_{outer}$ zero bits to some of the LDPC information bits and use the $N_{outer}$ BCH encoded bits as the remaining portion of the LDPC information bits to generate the LDPC information bits formed of the $K_{ldpc}$ bits. However, when $N_{outer}=K_{ldpc}$, the zero bits are not padded.

For this purpose, the zero padders 213 and 314 may divide the LDPC information bits into the plurality of bit groups.

For example, the zero padders 213 and 314 may divide the $K_{ldpc}$ LDPC information bits ($i_0, i_1, \ldots, i_{K_{ldpc}-1}$) into $N_{info\_group}(=K_{ldpc}/360)$ bit groups based on following Equation 9 or 10. That is, the zero padders 213 and 314 may divide the LDPC information bits into the plurality of bit groups so that the number of bits included in each bit group is 360.

$$Z_j = \left\{ i_k \mid j = \left\lfloor \frac{k}{360} \right\rfloor, 0 \leq k < K_{ldpc} \right\} \text{ for } 0 \leq j < N_{info\_group} \quad \text{[Equation 9]}$$

$$Z_j = \{ i_k \mid 360 \times j \leq k < 360 \times (j+1) \} \text{ for } 0 \leq j < N_{info\_group} \quad \text{[Equation 10]}$$

In above Equations 9 and 10, $Z_j$ represents a j-th bit group.

Meanwhile, parameters Nouter, Kldpc, and Ninfo_group for the zero padding for the L1-basic signaling and the L1-detail signaling may be defined as shown in following Table 5. In this case, the zero padders 213 and 314 may determine parameters for the zero padding depending on the mode as shown in following Table 5.

TABLE 5

| Signaling FEC Type | $N_{outer}$ | $K_{ldpc}$ | $N_{info\_group}$ |
|---|---|---|---|
| L1-Basic (all modes) | 368 | 3240 | 9 |
| L1-Detail Mode 1 | 568~2620 | | |
| L1-Datail Mode 2 | 568~3240 | | |
| L1-Detail Mode 3 | 568~6480 | 6480 | 18 |
| L1-Detail Mode 4 | | | |
| L1-Detail Mode 5 | | | |
| L1-Detail Mode 6 | | | |
| L1-Detail Mode 7 | | | |

Figure 6:
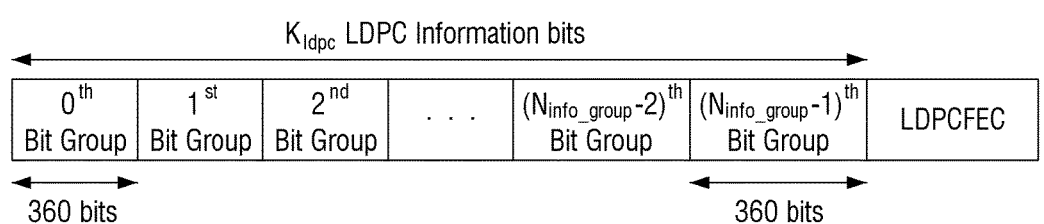

Further, for $0 \leq j < N_{info\_group}$, each bit group $Z_j$ as shown in FIG. 6 may consist of 360 bits.

Specifically, FIG. 6 shows a data format after the L1-basic signaling and the L1-detail signaling each go through the LDPC encoding. In FIG. 6, the LDPC FEC added to the $K_{ldpc}$ LDPC information bits represents the LDPC parity bits generated by the LDPC encoding.

Referring to FIG. 6, the $K_{ldpc}$ LDPC information bits are divided into the $N_{info\_group}$ bit groups and each bit group may consist of 360 bits.

Meanwhile, when the number $N_{outer}(=K_{sig}+M_{outer})$ of BCH encoded bits for the L1-basic signaling and the L1-detail signaling is less than the $K_{ldpc}$, that is, $N_{outer}(=K_{sig}+M_{outer})<K_{ldpc}$, for the LDPC encoding, the $K_{ldpc}$ LDPC information bits may be filled with the $N_{outer}$ BCH encoded bits and the $K_{ldpc}-N_{outer}$ zero-padded bits. In this case, the padded zero bits are not transmitted to the receiver 2000.

Hereinafter, the shortening procedure performed by the zero padders 213 and 314 will be described in more detail.

The zero padders 213 and 314 may calculate the number of padded zero bits. That is, to fit the number of bits required for the LDPC encoding, the zero padders 213 and 314 may calculate the number of zero bits to be padded.

Specifically, the zero padders 213 and 314 may calculate the number of bits as much as the difference between the number of LDPC information bits and the number of BCH encoded bits as the number of padded zero bits. That is, for the given $N_{outer}$, the zero padders 213 and 314 may calculate the number of padded zero bits as $K_{ldpc}-N_{outer}$.

Further, the zero padders 213 and 314 may calculate the number of bit groups to which all the bits are padded. That is, the zero padders 213 and 314 may calculate the number of bit groups in which all the bits within the bit group are padded to the zero bits.

Specifically, the zero padders 213 and 314 may calculate the number $N_{pad}$ of groups to which all the bits are padded based on following Equation 11 or 12.

$$N_{pad} = \left\lfloor \frac{K_{ldpc} - N_{outer}}{360} \right\rfloor \quad \text{[Equation 11]}$$

$$N_{pad} = \left\lfloor \frac{(K_{ldpc} - M_{outer}) - K_{sig}}{360} \right\rfloor \quad \text{[Equation 12]}$$

Next, the zero padders 213 and 314 may determine the bit groups in which the zero bits are padded among the plurality of bit groups based on the shortening pattern and may pad the zero bits to all bits within some of the determined bit groups and some bits within the remaining bit groups.

In this case, the shortening pattern of the padded bit group may be defined as shown in following Table 6. In this case, the zero padders 213 and 314 may determine the shortening patterns depending on the mode as shown in following Table 6.

TABLE 6

| Signaling FEC Type | $N_{info\_group}$ | $\pi_S(0)$ $\pi_S(9)$ | $\pi_S(1)$ $\pi_S(10)$ | $\pi_S(2)$ $\pi_S(11)$ | $\pi_S(3)$ $\pi_S(12)$ | $\pi_S(4)$ $\pi_S(13)$ | $\pi_S(5)$ $\pi_S(14)$ | $\pi_S(6)$ $\pi_S(15)$ | $\pi_S(7)$ $\pi_S(16)$ | $\pi_S(8)$ $\pi_S(17)$ |
|---|---|---|---|---|---|---|---|---|---|---|
| L1-Basic (for all modes) | 9 | 4 — | 1 — | 5 — | 2 — | 8 — | 6 — | 0 — | 7 — | 3 — |
| L1-Detail Mode 1 | | 7 | 8 | 5 | 4 | 1 | 2 | 6 | 3 | 0 |
| | | — | — | — | — | — | — | — | — | — |
| L1-Detail Mode 2 | | 6 | 1 | 7 | 8 | 0 | 2 | 4 | 3 | 5 |
| | | — | — | — | — | — | — | — | — | — |
| L1-Detail Mode 3 | 18 | 0 | 12 | 15 | 13 | 2 | 5 | 7 | 9 | 8 |
| | | 6 | 16 | 10 | 14 | 1 | 17 | 11 | 4 | 3 |
| L1-Detail Mode 4 | | 0 | 15 | 5 | 16 | 17 | 1 | 6 | 13 | 11 |
| | | 4 | 7 | 12 | 8 | 14 | 2 | 3 | 9 | 10 |
| L1-Detail Mode 5 | | 2 | 4 | 5 | 17 | 9 | 7 | 1 | 6 | 15 |
| | | 6 | 10 | 14 | 16 | 0 | 11 | 13 | 12 | 3 |
| L1-Detail Mode 6 | | 0 | 15 | 5 | 16 | 17 | 1 | 6 | 13 | 11 |
| | | 4 | 7 | 12 | 8 | 14 | 2 | 3 | 9 | 10 |
| L1-Detail Mode 7 | | 15 | 7 | 8 | 11 | 5 | 10 | 16 | 4 | 12 |
| | | 3 | 0 | 6 | 9 | 1 | 14 | 17 | 2 | 13 |

Here, $\pi_s(j)$ is the index of the j-th padded bit group. That is, the $\pi_s(j)$ represents a shortening pattern order of the j-th bit group. Further, $N_{info\_group}$ is the number of plural bit groups configuring the LDPC information bits.

Specifically, the zero padders 213 and 314 may determine $Z_{\pi_j(0)}, Z_{\pi_j(1)}, \ldots, Z_{\pi_j(N_{pm}-1)}$, as the bit group in which all the bits within the bit group are padded to the zero bits based on the shortening pattern and pad the zero bits to all the bits of the corresponding bit group. That is, the zero padders 213 and 314 may pad the zero bits to all the bits of a $\pi_s(0)$-th bit group, a $\pi_s(1)$-th bit group, . . . a $\pi_s(N_{pad}-1)$-th bit group among the plurality of bit groups based on the shortening pattern.

As such, when the $N_{pad}$ is not 0, the zero padders 213 and 314 may determine a list of the $N_{pad}$ bit groups, that is, $Z_{\pi_j(0)}, Z_{\pi_j(1)}, \ldots, Z_{\pi_j(N_{pm}-1)}$ based on above Table 6 and pad zero bits to all the LDPC information bits within the determined bit group.

However, when the $N_{pad}$ is 0, the foregoing procedure may be omitted.

Meanwhile, since the number of all the padded zero bits is $(K_{ldpc}-N_{outer})$ and the number of zero bits padded to the $N_{pad}$ bit groups is $(360 \times Npad)$, the zero padders 213 and 314 may additionally pad the zero bits to $(K_{ldpc}-N_{outer}-360 \times N_{pad})$ LDPC information bits.

In this case, the zero padders 213 and 314 may determine the bit group to which the zero bits are additionally padded based on the shortening pattern and may additionally pad the zero bits from a head portion of the determined bit group.

Specifically, the zero padders 213 and 314 may determine $Z_{\pi_j(N_{pm})}$ as the bit group to which the zero bits are additionally padded based on the shortening pattern and may additionally pad the zero bits to the $(K_{ldpc}-N_{outer}-360 \times N_{pad})$ bits positioned at the head portion of $Z_{\pi_j(N_{pm})}$. Therefore, the $(K_{ldpc}-N_{outer}-360 \times N_{pad})$ zero bits may be padded from a first bit of the $\pi_s(N_{pad})$-th bit group.

As a result, in the case of $Z_{\pi_j(N_{pm})}$, zeros may be additionally padded to the $(K_{ldpc}-N_{bch}-360 \times N_{pad})$ LDPC information bits positioned at the head portion of the $Z_{\pi_j(N_{pm})}$.

Meanwhile, the foregoing example describes that the $(K_{ldpc}-N_{outer}-360 \times N_{pad})$ zero bits are padded from a first bit of the $Z_{\pi_j(N_{pm})}$, which is only one example. Therefore, the position at which the zero bits in the $Z_{\pi_j(N_{pm})}$ are padded may be changed. For example, the (Kldpc–Nouter–360×Npad) zero bits may be padded to an intermediate portion or a final portion of the $Z_{\pi_j(N_{pm})}$ or may also be padded at any position of the $Z_{\pi_j(N_{pm})}$.

Next, the zero padders 213 and 314 may map the BCH encoded bits to the positions at which bits are not padded among the LDPC information bits to configure the LDPC information bits.

Therefore, the $N_{outer}$ BCH encoded bits are sequentially mapped to the bit positions at which the zero bits in the $K_{ldpc}$ LDPC information bits $(i_0, i_1, \ldots, i_{K_{ldpc}-1})$ are not padded and thus the $K_{ldpc}$ LDPC information bits may consist of the $N_{outer}$ BCH encoded bits and the $(K_{ldpc}-N_{outer})$ information bits.

Meanwhile, the padded zero bits are not transmitted to the receiver 2000. As such, a procedure of padding the zero bits or a procedure of padding the zero bits and then not transmitting the padded zero bits to the receiver 2000 after the LDPC encoding may be called shortening.

The LDPC encoders 214 and 315 perform the LDPC encoding on the L1-basic signaling and the L1-detail signaling.

Specifically, the LDPC encoders 214 and 315 may perform the LDPC encoding on the LDPC information bits output from the zero padders 213 and 31 to generate the LDP parity bits and output the LDPC codeword formed of the LDPC information bits and the LDPC parity bits to the parity permutators 215 and 316.

That is, the $K_{ldpc}$ bits output from the zero padder 213 may include the $K_{sig}$ L1-basic signaling bits, the $M_{outer}$ $(=N_{outer}-K_{sig})$ BCH parity check bits, and the $(K_{ldpc}-N_{outer})$ padded zero bits, which may configure the $K_{ldpc}$ LDPC information bits $I=(i_0, i_1, \ldots, i_{K_{ldpc}-1})$ for the LDPC encoder 214.

Further, the $K_{ldpc}$ bits output from the zero padder 314 may include the $K_{sig}$ L1-detail signaling bits, the $M_{outer}$ $(=N_{outer}-K_{sig})$ BCH parity check bits, and the $(K_{ldpc}-N_{outer})$ padded zero bits, which may configure the $K_{ldpc}$ LDPC information bits $I=(i_0, i_1, \ldots, i_{K_{ldpc}-1})$ for the LDPC encoder 316.

In this case, the LDPC encoders 214 and 315 may systematically perform the LDPC encoding on the $K_{ldpc}$ LDPC information bits to generate the LDPC codeword $\Lambda=(c_0, c_1, \ldots, c_{N_{inner}-1})=(i_0, i_1, \ldots, i_{K_{ldpc}-1}, p_0, p_1, \ldots, p_{N_{inner}-K_{ldpc}-1})$ formed of the $N_{inner}$ bits.

Meanwhile, in the case of the L1-basic modes and the L1-detail modes 1 and 2, the LDPC encoders 214 and 315 may encode the L1-basic signaling and the L1-detail signaling at the code rate of 3/15 to generate 16200 LDPC codeword bits. Further, in the case of the L1-detail modes 3, 4, 5, 6, and 7, the LDPC encoder 315 may encode the L1-detail signaling at the code rate of 6/15 to generate the 16200 LDPC codeword bits. Meanwhile, the code rate and the code length for the L1-basic signaling and the L1-detail signaling are shown in above Table 2 and the number of LDPC information bits are shown as in above Table 2.

The parity permutators 215 and 316 perform the parity permutation. That is, the parity permutators 215 and 316 may perform the permutation only on the LDPC parity bits except for the LDPC information bits.

Specifically, the parity permutators 215 and 316 may perform the permutation only on the LDPC parity bits among the LDPC codewords output from the LDPC encoders 214 and 315 and output the parity permutated LDPC codeword to the puncturers 216 and 317. Meanwhile, the parity permutator 316 may output the parity permutated LDPC codeword to an additional parity generator 319. In this case, the additional parity generator 319 may use the parity permutated LDPC codeword output from the parity permutator 316 to generate the additional parity bits.

For this purpose, the parity permutators 215 and 316 may include a parity interleaver (not shown) and a group-wise interleaver (not shown).

First, the parity interleaver (not shown) may interleave only the LDPC parity bits among the LDPC information bits and the LDPC parity bits configuring the LDPC codeword. However, the parity interleaver (not shown) may perform the parity interleaving only in the case of the L1-detail modes 3, 4, 5, 6, and 7. That is, since the L1-basic modes and the L1-detail modes 1 and 2 include the parity interleaving as a portion of the LDPC encoding process, in the case of the L1-basic modes and the L1-detail modes 1 and 2, the parity interleaver (not shown) may not perform the parity interleaving.

Meanwhile, in the case of the mode of performing the parity interleaving, the parity interleaver (not shown) may interleave the LDPC parity bits based on following Equation 13.

$u_i = c_i$ for $0 \leq i < K_{ldpc}$ (information bits are not interleaved.)

$u_{K_{ldpc}+360t+s} = c_{K_{ldpc}+27s+t}$ for $0 \leq s < 360$, $0 \leq t < 27$    [Equation 13]

Specifically, depending on above Equation 13, the LDPC codeword $(c_0, c_1, \ldots, c_{N_{inner}-1})$ is parity-interleaved by the parity interleaver (not shown) and an output of the parity interleaver (not shown) may be represented by $U = (u_0, u_1, \ldots, u_{N_{inner}-1})$.

Meanwhile, since the L1-basic modes and the L1-detail modes 1 and 2 do not use the parity interleaver (not shown), an output $U = (u_0, u_1, \ldots, u_{N_{inner}-1})$ of the parity interleaver (not shown) may be represented as following Equation 14.

$u_i = c_i$ for $0 \leq i < N_{inner}$    [Equation 14]

Meanwhile, the group-wise interleaver (not shown) may perform the group-wise interleaving on the output of the parity interleaver (not shown).

Here, as described above, the output of the parity interleaver (not shown) may be the LDPC codeword parity-interleaved by the parity interleaver (not shown) or may be the LDPC codeword which is not parity-interleaved by the parity interleaver (not shown).

Therefore, when the parity interleaving is performed, the group-wise interleaver (not shown) may perform the group-wise interleaving on the parity-interleaved LDPC codeword and when the parity interleaving is not performed, the group-wise interleaver (not shown) may perform the group-wise interleaving on the LDPC codeword.

Specifically, the group-wise interleaver (not shown) may interleave the output of the parity interleaver (not shown) in a bits group wise.

For this purpose, the group-wise interleaver (not shown) may divide the LDPC codeword output from the parity interleaver (not shown) into a plurality of bit groups. As a result, the LDPC parity bits output from the parity interleaver (not shown) may be divided into the plurality of bit groups.

Specifically, the group-wise interleaver (not shown) may divide the LDPC encoded bits $(u_0, u_1, \ldots, u_{N_{inner}-1})$ output from the parity interleaver (not shown) into the $N_{group}$ $(=N_{inner}/360)$ bit groups based on following Equation 15.

$X_j = \{u_k | 360 \times j \leq k < 360 \times (j+1), 0 \leq k < N_{inner}\}$ for $0 \leq j < N_{group}$    [Equation 15]

In above Equation 15, $X_j$ represents the j-th bit group.

Figure 7:
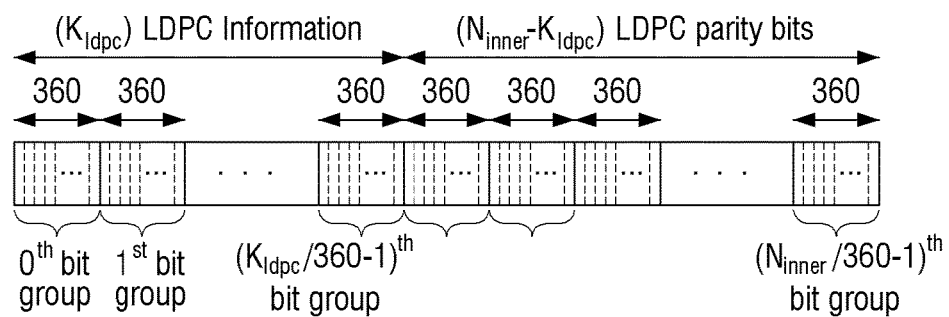

FIG. 7 shows an example of dividing the LDPC codeword output from the parity interleaver (not shown) into the plurality of bit groups.

Referring to FIG. 7, the LDPC codeword is divided into the $N_{group}(=N_{inner}/360)$ bit groups and each bit group $X_j$ for $0 \leq j < N_{group}$ is formed of 360 bits.

As a result, the LDPC information bits formed of the $K_{ldpc}$ bits may be divided into $(K_{ldpc}/360)$ bit groups and the LDPC parity bits formed of $N_{inner} - K_{ldpc}$ bits may be divided into $(N_{inner} - K_{ldpc})/360$ bit groups.

Further, the group-wise interleaver (not shown) performs the group-wise interleaving on the LDPC codeword output from the parity interleaver (not shown).

In this case, the group-wise interleaver (not shown) does not perform the interleaving on the LDPC information bits and may perform the interleaving only on the LDPC parity bits to change the order of the plurality of bit groups configuring the LDPC parity bits.

As a result, the LDPC information bits among the LDPC bits may not be interleaved by the group-wise interleaver (not shown) but the LDPC parity bits among the LDPC bits may be interleaved by the group-wise interleaver (not shown). In this case, the LDPC parity bits may be interleaved in a group unit.

Specifically, the group-wise interleaver (not shown) may perform the group-wise interleaving on the LDPC codeword output from the parity interleaver (not shown) based on following Equation 16.

$Y_j = X_j$, $0 \leq j < K_{ldpc}/360$ $Y_j = X_{\pi_p(j)}$, $K_{ldpc}/360 \leq j < N_{group}$ Here, $X_j$ represents the j-th bit group among the plurality of bit groups configuring the LDPC codeword, that is, the j-th bit group which does not go through the group-wise interleaving and $Y_j$ represents the group-wise interleaved j-th bit group. Further, (j) represents a permutation order for the group-wise interleaving.

Meanwhile, the permutation order may be defined based on following Table 7 and Table 8. Here, above Table 7 represents the group-wise interleaving pattern of the parity portion for the L1-basic modes and the L1-detail modes 1 and 2 and above Table 8 represents the group-wise interleaving pattern of the parity portion for the L1-detail modes 3, 4, 5, 6, and 7.

In this case, the group-wise interleaver (not shown) may determine the group-wise interleaving pattern depending on the mode shown in following Tables 7 and 8.

TABLE 7

| Signaling FEC Type | $N_{group}$ | \multicolumn{12}{c}{Order of group-wise interleaving $\pi_p(j)$ ($9 \leq j < 45$)} | | | | | | | | | | | |
|---|---|---|---|---|---|---|---|---|---|---|---|---|---|
| | | $\pi_p(9)$ $\pi_p(21)$ $\pi_p(33)$ | $\pi_p(10)$ $\pi_p(22)$ $\pi_p(34)$ | $\pi_p(11)$ $\pi_p(23)$ $\pi_p(35)$ | $\pi_p(12)$ $\pi_p(24)$ $\pi_p(36)$ | $\pi_p(13)$ $\pi_p(25)$ $\pi_p(37)$ | $\pi_p(14)$ $\pi_p(26)$ $\pi_p(38)$ | $\pi_p(15)$ $\pi_p(27)$ $\pi_p(39)$ | $\pi_p(16)$ $\pi_p(28)$ $\pi_p(40)$ | $\pi_p(17)$ $\pi_p(29)$ $\pi_p(41)$ | $\pi_p(18)$ $\pi_p(30)$ $\pi_p(42)$ | $\pi_p(19)$ $\pi_p(31)$ $\pi_p(43)$ | $\pi_p(20)$ $\pi_p(32)$ $\pi_p(44)$ |
| L1-Basic (all modes) | 45 | 20 14 21 | 23 15 44 | 25 26 43 | 32 40 35 | 38 33 42 | 41 19 36 | 18 28 12 | 9 34 13 | 10 16 29 | 11 39 22 | 31 27 37 | 24 30 17 |
| L1-Detail Mode 1 | | 16 9 11 | 22 10 24 | 27 17 29 | 30 18 34 | 37 21 36 | 44 33 13 | 20 35 40 | 23 14 43 | 25 28 31 | 32 12 26 | 36 15 39 | 41 19 42 |
| L1-Detail Mode 2 | | 9 26 22 | 31 18 40 | 23 37 19 | 10 15 32 | 11 13 38 | 25 17 41 | 43 35 30 | 29 21 33 | 36 20 14 | 16 24 28 | 27 44 39 | 34 12 42 |

TABLE 8

| Signaling FEC Type | $N_{group}$ | Order of group-wise interleaving $\pi_p(j)$ (18 ≤ j < 45) | | | | | | |
|---|---|---|---|---|---|---|---|---|
| | | $\pi_p(18)$ $\pi_p(32)$ | $\pi_p(19)$ $\pi_p(33)$ | $\pi_p(20)$ $\pi_p(34)$ | $\pi_p(21)$ $\pi_p(35)$ | $\pi_p(22)$ $\pi_p(36)$ | $\pi_p(23)$ $\pi_p(37)$ | $\pi_p(24)$ $\pi_p(38)$ |
| L1-Detail Mode 3 | 45 | 19 26 | 37 35 | 30 39 | 42 20 | 23 18 | 44 43 | 27 31 |
| L1-Detail Mode 4 | | 20 41 | 35 40 | 42 38 | 39 36 | 26 34 | 23 33 | 30 31 |
| L1-Detail Mode 5 | | 19 21 | 37 39 | 33 25 | 26 42 | 40 34 | 43 18 | 22 32 |
| L1-Detail Mode 6 | | 20 41 | 35 40 | 42 38 | 39 36 | 26 34 | 23 33 | 30 31 |
| L1-Detail Mode 7 | | 44 43 | 23 30 | 29 25 | 33 35 | 24 20 | 28 34 | 21 39 |

| Signaling FEC Type | $N_{group}$ | Order of group-wise interleaving $\pi_p(j)$ (18 ≤ j < 45) | | | | | | |
|---|---|---|---|---|---|---|---|---|
| | | $\pi_p(25)$ $\pi_p(39)$ | $\pi_p(26)$ $\pi_p(40)$ | $\pi_p(27)$ $\pi_p(41)$ | $\pi_p(28)$ $\pi_p(42)$ | $\pi_p(29)$ $\pi_p(43)$ | $\pi_p(30)$ $\pi_p(44)$ | $\pi_p(31)$ |
| L1-Detail Mode 3 | 45 | 40 36 | 21 38 | 34 22 | 25 33 | 32 28 | 29 41 | 24 |
| L1-Detail Mode 4 | | 18 29 | 28 25 | 37 24 | 32 22 | 27 21 | 44 19 | 43 |
| L1-Detail Mode 5 | | 29 38 | 24 23 | 35 30 | 44 28 | 31 36 | 27 41 | 20 |
| L1-Detail Mode 6 | | 18 29 | 28 25 | 37 24 | 32 22 | 27 21 | 44 19 | 43 |
| L1-Detail Mode 7 | | 27 36 | 42 19 | 18 41 | 22 40 | 31 26 | 32 38 | 37 |

Hereinafter, for the group-wise interleaving pattern for the L1-detail mode 2 as an example, an operation of the group-wise interleaver (not shown) will be described.

In the case of the L1-detail mode 2, the LDPC encoder 315 performs the LDPC encoding on 3240 LDPC information bits at the code rate of 3/15 to generate 12960 LDPC parity bits. In this case, the LDPC codeword may consist of 16200 bits.

Meanwhile, each bit group is formed of 360 bits and as a result the LDPC codeword formed of 16200 bits is divided into 45 bit groups.

Here, since the LDPC information bits are 3240 and the LDPC parity bits are 12960, a 0-th bit group to an 8-th bit group correspond to the LDPC information bits and a 9-th bit group to a 44-th bit group correspond to the LDPC parity bits.

In this case, the parity interleaver (not shown) does not perform the parity interleaving, the group-wise interleaver (not shown) does not perform the interleaving on the bit group configuring the LDPC information bits, that is, a 0-th bit group to a 8-th bit group based on above Equation 16 and Table 7 but may interleave a bit group configuring the LDPC parity bits, that is, a 9-th bit group to a 44-th bit group in a group unit to change an order of the 9-th bit group to the 44-th bit group.

Specifically, in the case of the L1-detail mode 2 in above Table 7, above Equation 16 may be represented like $Y_0=X_0$, $Y_1=X_1$, ..., $Y_7=X_7$, $Y_8=X_8$, $Y_9=X_{\pi_p(9)}=X_9$, $Y_{10}=X_{\pi_p(10)}=X_{31}$, $Y_{11}=X_{\pi_p(11)}=X_{23}$, ..., $Y_{42}=X_{\pi_p(42)}=X_{28}$, $Y_{43}=X_{\pi_p(43)}=X_{39}$, $Y_{44}=X_{\pi_p(44)}=X_{42}$.

Therefore, the group-wise interleaver (not shown) does not change an order from the 0-th bit group to the 8-th bit group including the LDPC information bit but may change an order from the 9-th bit group to the 44-th bit group including the LDPC parity bits.

Specifically, the group-wise interleaver (not shown) may change the order of the bit group from the 9-th bit group to the 44-th bit group so that a 9-th bit group is positioned at a 9-th position, a 31-th bit group is positioned at a 10-th position, a 23-th bit group is positioned at a 11-th position, ..., a 28-th bit group is positioned at a 42-th position, a 39-th bit group is positioned at a 43-th position, a 42-th bit group is positioned at a 44-th position.

The puncturers 216 and 317 and the repeaters 217 and 318 are described above in FIG. 1 and therefore the detailed description thereof will be omitted.

However, the repetition may be performed only on the L1-basic mode 1 and the L1-detail mode.

Further, the repeater 318 may also output the repeated LDPC codeword to the additional parity generator 319. In this case, the additional parity generator 319 may use the repeated LDPC codeword to generate the additional parity bits.

Meanwhile, the foregoing example describes that the puncturing is performed and then the repetition is performed, which is only one example. In some cases, after the repetition is performed, the puncturing may also be performed.

The additional parity generator 319 may select the bits from the LDPC parity bits to generate the additional parity (AP) bits.

In this case, the additional parity bits may be selected from the LDPC parity bits generated based on the L1-detail signaling transmitted in the current frame to be transmitted to the receiver 2000 through a frame before the current frame, that is, the previous frame.

Specifically, the L1-detail signaling goes through the LDPC encoding and the LDPC parity bits generated by the LDPC encoding are added to the L1-detail signaling to configure the LDPC codeword.

Further, the puncturing and the shortening are performed on the LDPC codeword and the punctured and shortened LDPC codeword may be mapped to the frame to be transmitted to the receiver 2000. Here, when the repetition is performed depending on the mode, the punctured and shortened LDPC codeword may include the repeated LDPC parity bits.

In this case, the L1-detail signaling corresponding to each frame may be transmitted to the receiver 2000 through each frame, along with the LDPC parity bits. For example, the punctured and shortened LDPC codeword including the L1-detail signaling corresponding to an (i−1)-th frame may be mapped to the (i−1)-th frame to be transmitted to the receiver 2000 and the punctured and shortened LDPC codeword including the L1-detail signaling corresponding to the i-th frame may be mapped to the i-th frame to be transmitted to the receiver 2000.

Meanwhile, the additional parity generator 319 may select at least some of the LDPC parity bits generated based on the L1-detail signaling transmitted in the i-th frame to generate the additional parity bits.

Specifically, some of the LDPC parity bits generated by performing the LDPC encoding on the L1-detail signaling are punctured and then are not transmitted to the receiver 2000. In this case, the additional parity generator 319 may select at least some of the punctured LDPC parity bits among the LDPC parity bits generated by performing the LDPC encoding on the L1-detail signaling transmitted in the i-th frame, thereby generating the additional parity bits.

Further, the additional parity generator 319 may select at least some of the LDPC parity bits transmitted to the receiver 2000 through the i-th frame to generate the additional parity bits.

Specifically, the LDPC parity bits included in the punctured and shortened LDPC codeword mapped to the i-th frame may be configured of only the LDPC parity bits generated by the encoding depending on the mode or the LDPC parity bits generated by the encoding and the repeated LDPC parity bits.

In this case, the additional parity generator 319 may select at least some of the LDPC parity bits included in the punctured and shortened LDPC codeword mapped to the i-th frame to generate the additional parity bits.

Meanwhile, the additional parity bits may be transmitted to the receiver 2000 through the frame before the i-th frame, that is, the (i−1)-th frame.

That is, the transmitter 1000 may not only transmit the punctured and shortened LDPC codeword including the L1-detail signaling corresponding to the (i−1)-th frame but also transmit the additional parity bits generated based on the L1-detail signaling transmitted in the i-th frame to the receiver 2000 through the (i−1)-th frame.

Meanwhile, in some cases, the additional parity generator 319 may not generate the additional parity bits.

In this case, the transmitter 1000 may transmit the information on whether additional parity bits for a L1-detail signaling of a next frame are transmitted through the current frame to the receiver 2000 using the L1-basic signaling transmitted through the current frame.

The zero removers 218 and 321 may remove the zero bits padded by the zero padders 213 and 314 from the LDPC codewords output from the repeaters 217 and 318 and output the remaining bits to the bit demultiplexers 219 and 322.

Here, the removal does not remove the padded zero bits but may include outputting only the remaining bits other than the padded zero bits in the LDPC codewords as well as removing the padded zero bits.

Specifically, the zero removers 218 and 321 may remove the $K_{ldpc}-N_{outer}$ zero bits padded by the zero padders 213 and 314. Therefore, the $K_{ldpc}-N_{outer}$ padded zero bits are removed and thus may not be transmitted to the receiver 2000.

As such, when the zero bits are removed, a word formed of the $K_{sig}$ information bits (that is, $K_{sig}$ L1-basic signaling bits and $K_{sig}$ L1-detail signaling bits), 168 BCH parity check bits, and $(N_{inner}-K_{ldpc}-N_{punc})$ or $(N_{inner}-K_{ldpc}-+N_{repeat})$ bits may remain.

That is, when the repetition is performed, the lengths of all the LDPC codewords become $N_{FEC}+N_{repeat}$. Here, $N_{FEC}=N_{outer}+N_{ldpc\_parity}-N_{punc}$. However, when the repetition is not performed, the lengths of all the LDPC codewords become $N_{FEC}=N_{outer}+N_{ldpc\_parity}-N_{punc}$.

The bit demultiplexers 219 and 322 may interleave the bits output from the zero removers 218 and 321, demultiplex the interleaved bits, and then output them to the constellation mappers 221 and 324.

For this purpose, the bit demultiplexers 219 and 322 may include a block interleaver (not shown) and a demultiplexer (not shown).

Figure 8:
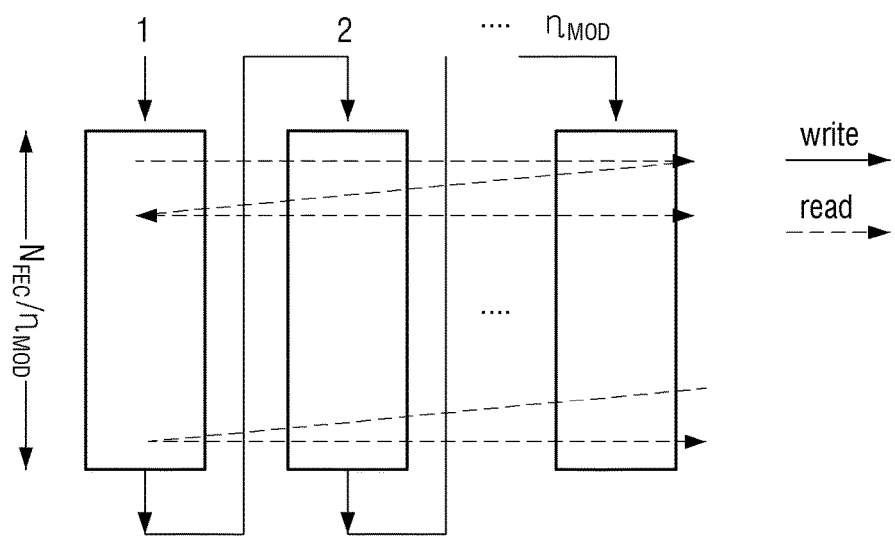

First, a block interleaving scheme performed in the block interleaver (not shown) is as in FIG. 8.

Specifically, the bits of the $N_{FEC}$ or $(N_{FEC}+N_{repeat})$ length after the zero bits are removed may be column-wisely serially written in the block interleaver (not shown). Here, the number of columns of the block interleaver (not shown) is equivalent to the modulation order and the number of rows is $N_{FEC}/\eta_{MOD}$ or $(N_{FEC}+N_{repeat})/\eta_{MOD}$.

Further, in a read operation, the bits for one constellation symbol may be row-wisely sequentially read to be input to the demultiplexer (not shown). The operation may be continued to the final row of the column.

That is, the $N_{FEC}$ or $(N_{FEC}+N_{repeat})$ bits may be written in the plurality of columns in a column direction from the first row of the first column and the bits written in the plurality of columns are sequentially read from the first row to the final row of the plurality of columns in a row direction. In this case, the bits read in the same row may configure one modulation symbol.

Meanwhile, the demultiplexer (not shown) may demultiplex the bits output from the block interleaver (not shown).

Specifically, the demultiplexer (not shown) may demultiplex each of the block-interleaved bit groups, that is, the bits output while being read in the same row of the block interleaver (not shown) within the bit group bit-by-bit, before the bits go through the constellation mapping.

In this case, two mapping rules may be present depending on the modulation order.

Specifically, in the case of the QPSK, since reliability of the bits within the constellation symbols is the same, the demultiplexer (not shown) does not perform the demultiplexing operation on the bit group. Therefore, the bit group read and output from the block interleaver (not shown) may be mapped to the QPSK symbol without going through the demultiplexing operation.

However, in the case of high order modulation, the demultiplexer (not shown) may perform the demultiplexing on the bit group read and output from the block interleaver (not shown) based on following Equation 17. That is, the bit group may be mapped to the QAM symbol depending on following Equation 17.

$$S_{demux\_in(i)}=\{b_i(0),b_i(2),\ldots,b_i(\eta_{MOD}-1)\},$$

$$S_{demux\_out(i)}=\{c_i(0),c_i(2),\ldots,c_i(\eta_{MOD}-1)\},$$

$$c_i(0)=b_i(i\ \%\ \eta_{MOD}), c_i(1)=b_i(i+1)\%\ \eta_{MOD}),\ldots,$$
$$c_i(\eta_{MOD}-1)=b_i((i+\eta_{MOD}-1)\%\ \eta_{MOD})$$

In above Equation 17, % represents the modulo operation and $r_{iMOD}$ is the modulation order.

Further, i is the bit group index corresponding to the row index of the block interleaver (not shown). That is, an output bit group $S_{demux\_out(i)}$ mapped to each of the QAM symbols may be cyclic-shifted in an $S_{demux\_in(i)}$ depending on the bit group index i.

Figure 9:
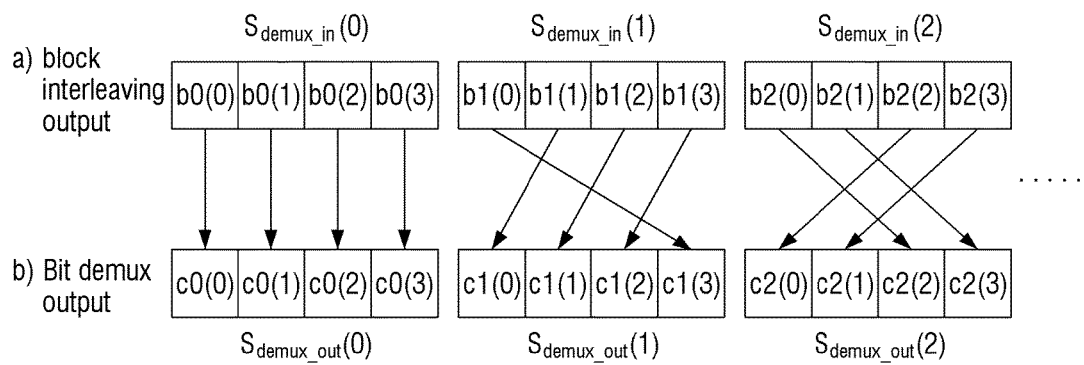

Meanwhile, FIG. 9 shows an example of performing the bit demultiplexing on 16-non uniform constellation (16-NUC), that is, NUC 16-QAM. The operation may be continued until all the bit groups are read in the block interleaver (not shown).

Meanwhile, the bit demultiplexer 323 may perform the same operation as the operations performed by the bit demultiplexers 219 and 322 on the additional parity bits output from the additional parity generator 319 and output the block-interleaved and demultiplexed bits to the constellation mapper 325.

The constellation mappers 221, 324, and 325 may map the bits output from the bit demultiplexers 219, 322, and 323 to the constellation symbols.

That is, the constellation mappers 221, 324, and 325 may map the $S_{demux\_out(i)}$ to a cell word using the constellation depending on the mode. Here, the $S_{demux\_out(i)}$ may be configured of bits having the same number as the modulation order.

Specifically, the constellation mappers 221, 324, and 325 may map bits output from the bit demultiplexers 219, 322, and 323 to the constellation symbols using the QPSK, the 16-QAM, the 64-QAM, the 256-QAM, etc., depending on the mode.

In this case, the constellation mappers 221, 324, and 325 may use the NUC. That is, the constellation mappers 221, 324, and 325 may use the NUC 16-QAM, the NUC 64-QAM, and the NUC 256-QAM. Meanwhile, the modulation scheme applied to the L1-basic signaling and the L1-detail signaling depending on the mode is as above Table 2.

Meanwhile, the transmitter 1000 may map the constellation symbols to the frame and transmit the mapped symbols to the receiver 2000.

Specifically, the transmitter 1000 may map the constellation symbols corresponding to each of the L1-basic signaling and the L1-detail signaling output from the constellation mappers 221 and 324 and map the constellation symbols corresponding to the additional parity bits output from the constellation mapper 325 to the preamble symbol of the frame.

In this case, the transmitter 1000 may map the additional parity bits generated based on the L1-detail signaling transmitted in the current frame to a frame before the corresponding frame.

That is, the transmitter 1000 may map the LDPC codeword bits including the L1-basic signaling corresponding to the (i−1)-th frame to the (i−1)-th frame, maps the LDPC codeword bits including the L1-detail signaling corresponding to the (i−1)-th frame to the (i−1)-th frame, and additionally map the additional parity bits generated by being selected from the LDPC parity bits generated based on the L1-detail signaling corresponding to the i-th frame to the (i−1)-th frame and may transmit the mapped bits to the receiver 2000.

In addition, the transmitter 1000 may map data to the data symbols of the frame in addition to the L1 signaling and transmit the frame including the L1 signaling and the data to the receiver 2000.

In this case, since the L1 signalings include the signaling information on the data, the signaling on the data mapped to each data frame may be mapped to the preamble of the corresponding frame. For example, the transmitter 1000 may map the L1 signaling including the signaling information for the data mapped to the i-th frame to the i-th frame.

As a result, the receiver 2000 may use the signaling acquired from the frame to acquire and process the data from the corresponding frame.

Meanwhile, the method for processing data will be described below.

Figure 10:
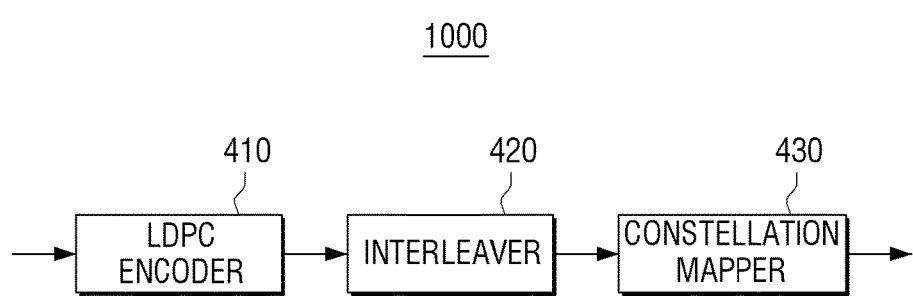
FIG. 10 is a block diagram for describing a configuration of a transmitter according to an exemplary embodiment.

FIG. 10 is a block diagram for describing a configuration of a transmitter according to an exemplary embodiment.

Referring to FIG. 10, a transmitter 1000 includes an LDPC encoder 410, an interleaver 420, a constellation mapper 430.

The LDPC encoder 410 performs the encoding, that is, LDPC encoding on the input bits to generate the parity bits, that is, the LDPC parity bits.

Here, the input bits are LDPC information bits for the LDPC encoding and may include outer-encoded bits, in which the outer-encoded bits include information bits and parity bits (or parity check bits) generated by outer-encoding the information bits. For this purpose, the transmitter 1000 may include the outer encoder (not shown) for outer-encoding the information bits.

Further, the information bits may be data. Further, the information bits may be broadcasting data.

Further, the outer code is a code perform before the inner code in the concatenated code and may use various encoding schemes such as BCH and CRC. In this case, the inner code may be the LDPC code.

In the case, the LDPC code requires the specific number of LDPC information bits depending on a code rate and a code length is required.

Therefore, the transmitter 1000 performs the outer-encoding on the specific number of information bits in consideration of the number of parity bits generated by the outer encoding so that the number of outer-encoded bits may be the number of bits required for the LDPD encoding depending on the code rate and the code length.

However, in some cases, the outer code may be omitted and the LDPC encoder 410 may perform the LDPC encoding on the specific number of information bits required depending on the code rate and the code length.

The LDPC encoder 410 may systematically encode the LDPC information bits to generate the LDPC parity bits and output an LDPC codeword (or LDPC encoded bits) formed of the LDPC information bits and the LDPC parity bits. That is, the LDPC code is a systematic code and therefore the LDPC codeword may consist of the LDPC information bits before being encoded and the LDPC parity bits generated by the encoding.

For example, the LDPC encoder 410 may LDPC-encode the $K_{ldpc}$ LDPC information bits $I=(i_0, i_1, \ldots, i_{K_{ldpc}-1})$ to generate $N_{ldpc\_parity}$ LDPC parity bits $(p_0, p_1, \ldots, p_{N_{ldpc}-K_{ldpc}-1})$ and output the LDPC codeword $A=(c_0, c_1, \ldots, c_{N_{inner}-1})=(i_0, i_1, \ldots, i_{K_{ldpc}-1}, p_0, p_1, \ldots, p_{N_{ldpc}-K_{ldpc}-1})$ formed of $N_{inner}(=K_{ldpc}+N_{ldpc\_parity})$ bits.

In this case, the LDPC encoder 410 may perform the LDPC encoding on the input bits at various code rates to generate an LDPC codeword having a specific length.

For example, the LDPC encoder 410 may perform the LDPC encoding at various code rates such as 2/15, 3/15, 4/15, 5/15, 6/15, 7/15, 8/15, 9/15, 10/15, 11/15, 12/15, and 13/15 to generate the LDPC codeword formed of 16200 bits or 64800 bits.

In this case, the number of input bits may have various values depending on the code rates.

For example, the LDPC encoder 410 may perform the LDPC encoding on 33240 input bits at the code rate of 3/15 to generate an LDPC codeword formed of 16200 bits and the LDPC encoding on 6480 input bits at the code rate of 6/15 to generate an LDPC codeword formed of 16200 bits.

As another example, the LDPC encoder 410 may perform the LDPC encoding on 33240 input bits at the code rate of 3/15 to generate an LDPC codeword formed of 16200 bits and the LDPC encoding on 12960 input bits at the code rate of 3/15 to generate an LDPC codeword formed of 64800 bits.

In this case, a code rate and a code length at which the bits are LDPC-encoded may be preset.

As described above, the LDPC encoder 410 may encode the input bits at various code rates to generate the LDPC codeword formed of the input bits and the LDPC parity bits. The interleaver 420 interleaves the LDPC codeword. That is, the interleaver 420 may interleave the LDPC codeword output from the LDPC encoder 410 based on various interleaving rules.

Figure 11:
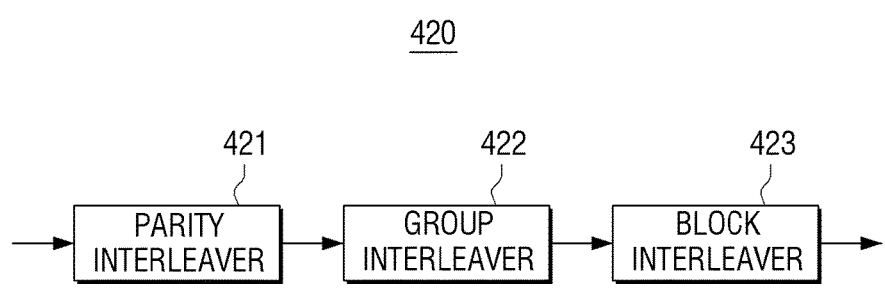
FIG. 11 is a block diagram for describing a configuration of an interleaver according to an exemplary embodiment.

For this purpose, as shown in FIG. 11, the interleaver 420 may include a parity interleaver 421, a group interleaver (or group-wise interleaver 422), and a block interleaver 423.

The parity interleaver 421 interleaves the parity bits configuring the LDPC codeword.

Specifically, the parity interleaver 421 may perform the parity interleaving on the LDPC codeword $c=(c_0, c_1, \ldots, c_{N_{inner}-1})$ to interleave only the LDPC parity bits among the LPDC codewords and output the parity-interleaved $U=(u_0, u_1, \ldots, u_{N_{inner}-1})$.

However, in some cases, the parity interleaver 421 may be omitted.

The group interleaver 422 may divide the parity-interleaved LDPC codeword into the plurality of bit groups and rearrange the order of the plurality of bit groups in a bits group wise. Meanwhile, in some cases, when the parity interleaver 421 is omitted, the group interleaver 422 may divide the LDPC codeword into the plurality of bit groups and rearrange the order of the plurality of bit groups in the bits group wise.

For this purpose, the group interleaver 422 may divide the parity-interleaved LDPC codeword into the plurality of bit groups.

Specifically, the group interleaver 422 may divide the parity-interleaved LDPC codeword into the plurality of bit groups so that the number of bits included in one bit group becomes M (for example, M=360).

Figure 12:
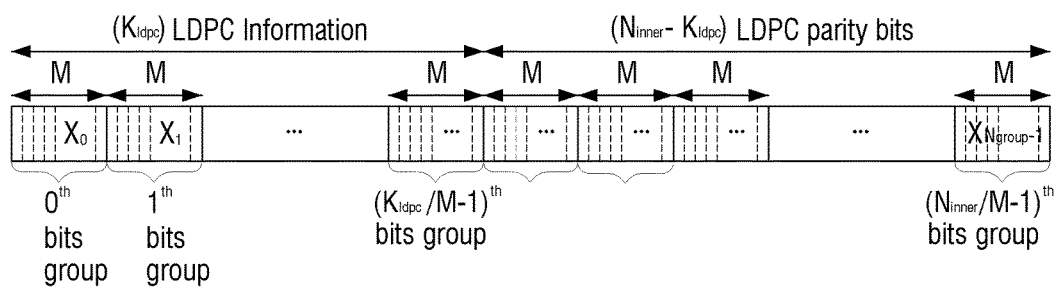
FIGS. 12 to 19 are diagrams for describing an interleaving method according to exemplary embodiments.

That is, as shown in FIG. 12, the LDPC codeword is divided by M bits and therefore, $K_{ldpc}$ information bits are divided into $(K_{ldpc}/M)$ bit groups and $N_{inner}-K_{ldpc}$ parity bits are divided into $(N_{inner}-K_{ldpc})/M$ bit groups. Therefore, the LDPC codeword may be divided into a total of $(N_{inner}/M)$ bit groups.

For example, when M=360 and the length $N_{inner}$ of the LDPC codeword is 16200, the number $N_{group}$ of bit groups configuring the LPDC codeword may be 45 (=16200/360) and when M=360 and the length $N_{inner}$ of the LDPC codeword is 64800, the number $N_{group}$ of bit groups configuring the LPDC codeword may be 180 (=64800/360).

Further, the group interleaver 422 interleaves the LDPC codeword in the bits group wise.

Specifically, the group interleaver 422 may change the positions of the plurality of bit groups configuring the LDPC codeword to rearrange the order of the plurality of bit groups configuring the LDPC codeword in the group unit.

For example, the group interleaver 422 may dispose a bit group present at a specific position (for example, x-th) before the group interleaving at a specific position (for example, y-th) depending on the group interleaving to interleave the plurality of bit groups configuring the LDPC codeword in the group unit.

Meanwhile, at what position the specific bit group before the group interleaving is positioned depending on the group interleaving may be preset within the system, which may be differently preset depending on at least of the code length, the code rate, and the modulation order.

Figure 13:
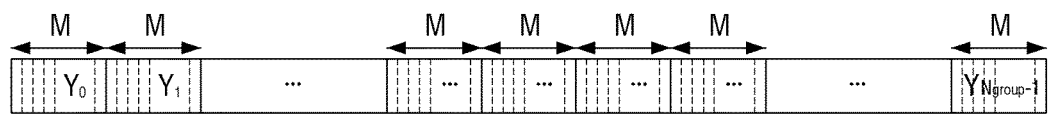

According to the scheme, the group-interleaved LDPC codeword is as shown in FIG. 13. Comparing the LDPC codeword shown in FIG. 13 with the LDPC code before the group interleaving shown in FIG. 12, it may be appreciated that the order of the plurality of bit groups configuring the LDPC codeword is rearranged.

That is, as shown in FIGS. 12 and 13, a bit group $X_0$, a bit group a bit group are disposed in a 0-th bit group to a $(N_{inner}/M-1)$-th bit group configuring the LDPC codeword before the group interleaving. Next, the order of the plurality of bit groups configuring the LDPC codeword is changed in the group unit according to the group interleaving and thus a bit group $Y_0$, a bit group $Y_1$, . . . , a bit group may be disposed in a 0-th bit group to a $(N_{inner}/M-1)$-th bit group configuring the group-interleaved LDPC codeword.

For this purpose, the group interleaver 422 may rearrange the order of the plurality of groups in the bits group wise using the following Equation 18

$$Y_j = X_{\pi(j)} (0 \leq j < N_{group})$$

In the above Equation 18, $X_j$ represents the j-th bit group before the group interleaving and $Y_j$ represents the j-th bit group after the group interleaving. Further, $\pi(j)$ is a parameter representing the interleaving order and may be determined by at least one of the length of the LDPC codeword, the modulation scheme, and the code rate.

Therefore, $X_{\pi(j)}$ represents the $\pi(j)$-th bit group before the group interleaving and the above Equation 18 represents that the $\pi(j)$-th bit group before the interleaving is interleaved and then is interleaved as the j-th bit group.

Meanwhile, a detailed example of the $\pi(j)$ according to the exemplary embodiment of the present invention may be defined as the following Tables 9 to 18.

In this case, the $\pi(j)$ is defined depending on the length of the LDPC codeword, the code rate, and the modulation scheme.

For example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 64800 and modulates bits by the QPSK in the constellation mapper 430.

In this case, the group interleaver 422 may perform the interleaving using $\pi(j)$ defined by the following Table 9.

TABLE 9

| Code Rate | Order of group-wise interleaving $\pi(j)$ ($0 \leq j < 180$) | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | 46 | 47 | 48 | 49 | 50 | 51 | 52 | 53 | 54 | 55 | 56 | 57 |
| | 69 | 70 | 71 | 72 | 73 | 74 | 75 | 76 | 77 | 78 | 79 | 80 |

TABLE 9-continued

|      |   |   |   |   |   |   |   |   |   |   |   |   |
|------|---|---|---|---|---|---|---|---|---|---|---|---|
|      | 92 | 93 | 94 | 95 | 96 | 97 | 98 | 99 | 100 | 101 | 102 | 103 |
|      | 115 | 116 | 117 | 118 | 119 | 120 | 121 | 122 | 123 | 124 | 125 | 126 |
|      | 138 | 139 | 140 | 141 | 142 | 143 | 144 | 145 | 146 | 147 | 148 | 149 |
|      | 161 | 162 | 163 | 164 | 165 | 166 | 167 | 168 | 169 | 170 | 171 | 172 |
| 2/15 | 70 | 149 | 136 | 153 | 104 | 110 | 134 | 61 | 129 | 126 | 58 | 150 |
|      | 123 | 91 | 173 | 57 | 106 | 143 | 151 | 89 | 86 | 35 | 77 | 133 |
|      | 49 | 130 | 128 | 79 | 162 | 32 | 172 | 87 | 131 | 45 | 114 | 93 |
|      | 54 | 111 | 14 | 156 | 8 | 16 | 73 | 2 | 84 | 47 | 42 | 101 |
|      | 97 | 66 | 80 | 11 | 59 | 19 | 115 | 154 | 26 | 147 | 28 | 50 |
|      | 99 | 159 | 148 | 179 | 0 | 146 | 90 | 6 | 100 | 74 | 117 | 48 |
|      | 3 | 163 | 15 | 46 | 21 | 44 | 108 | 34 | 56 | 140 | 127 | 158 |
|      | 43 | 29 | 124 | 22 | 62 | 37 | 40 | 4 | 107 | 166 | 82 | 95 |
| 3/15 | 75 | 170 | 132 | 174 | 7 | 111 | 30 | 4 | 49 | 133 | 50 | 160 |
|      | 153 | 103 | 51 | 58 | 107 | 167 | 39 | 108 | 24 | 145 | 96 | 74 |
|      | 152 | 102 | 38 | 28 | 86 | 162 | 171 | 61 | 93 | 147 | 117 | 32 |
|      | 172 | 115 | 118 | 127 | 6 | 16 | 0 | 143 | 9 | 100 | 67 | 98 |
|      | 12 | 158 | 81 | 20 | 66 | 57 | 121 | 25 | 1 | 90 | 175 | 35 |
|      | 113 | 52 | 109 | 134 | 36 | 176 | 54 | 69 | 146 | 31 | 15 | 71 |
|      | 122 | 21 | 63 | 137 | 120 | 144 | 91 | 157 | 48 | 34 | 46 | 22 |
|      | 138 | 101 | 23 | 11 | 17 | 136 | 128 | 114 | 112 | 165 | 5 | 142 |
| 4/15 | 141 | 86 | 22 | 20 | 176 | 21 | 37 | 82 | 6 | 122 | 130 | 40 |
|      | 163 | 9 | 160 | 73 | 100 | 16 | 153 | 124 | 110 | 49 | 154 | 152 |
|      | 18 | 103 | 1 | 41 | 104 | 144 | 39 | 105 | 131 | 77 | 69 | 108 |
|      | 109 | 75 | 67 | 142 | 96 | 51 | 139 | 31 | 166 | 179 | 89 | 167 |
|      | 174 | 129 | 55 | 98 | 88 | 97 | 146 | 123 | 84 | 111 | 132 | 71 |
|      | 53 | 15 | 52 | 72 | 164 | 150 | 29 | 17 | 91 | 101 | 14 | 38 |
|      | 28 | 65 | 106 | 78 | 47 | 143 | 12 | 169 | 120 | 27 | 74 | 48 |
|      | 32 | 99 | 85 | 175 | 80 | 170 | 5 | 135 | 178 | 11 | 26 | 76 |
| 5/15 | 39 | 47 | 96 | 176 | 33 | 75 | 165 | 38 | 27 | 58 | 90 | 76 |
|      | 146 | 101 | 36 | 0 | 138 | 25 | 77 | 122 | 49 | 14 | 125 | 140 |
|      | 35 | 127 | 156 | 55 | 82 | 85 | 66 | 114 | 8 | 147 | 115 | 113 |
|      | 50 | 9 | 143 | 28 | 160 | 71 | 79 | 43 | 98 | 86 | 94 | 64 |
|      | 56 | 74 | 95 | 29 | 45 | 129 | 120 | 168 | 92 | 150 | 7 | 162 |
|      | 70 | 134 | 40 | 21 | 149 | 80 | 1 | 121 | 59 | 110 | 142 | 152 |
|      | 177 | 131 | 116 | 44 | 158 | 73 | 11 | 65 | 164 | 119 | 174 | 34 |
|      | 109 | 87 | 144 | 135 | 20 | 62 | 81 | 169 | 124 | 6 | 19 | 30 |
| 6/15 | 0 | 14 | 19 | 21 | 2 | 11 | 22 | 9 | 8 | 7 | 16 | 3 |
|      | 49 | 75 | 93 | 127 | 95 | 119 | 73 | 61 | 63 | 117 | 89 | 99 |
|      | 103 | 102 | 81 | 113 | 101 | 97 | 33 | 115 | 59 | 112 | 90 | 51 |
|      | 138 | 140 | 142 | 144 | 146 | 148 | 150 | 152 | 154 | 156 | 158 | 160 |
|      | 10 | 12 | 20 | 6 | 18 | 13 | 17 | 15 | 1 | 29 | 28 | 23 |
|      | 130 | 56 | 128 | 77 | 39 | 94 | 87 | 120 | 62 | 88 | 74 | 35 |
|      | 38 | 72 | 108 | 58 | 43 | 109 | 57 | 105 | 68 | 86 | 79 | 96 |
|      | 143 | 145 | 147 | 149 | 151 | 153 | 155 | 157 | 159 | 161 | 163 | 165 |
| 7/15 | 152 | 172 | 113 | 167 | 100 | 163 | 159 | 144 | 114 | 47 | 161 | 125 |
|      | 57 | 166 | 81 | 133 | 112 | 33 | 151 | 117 | 83 | 52 | 178 | 85 |
|      | 155 | 111 | 153 | 55 | 54 | 176 | 17 | 68 | 169 | 20 | 104 | 38 |
|      | 122 | 110 | 154 | 76 | 64 | 75 | 84 | 162 | 77 | 103 | 156 | 128 |
|      | 78 | 5 | 69 | 175 | 8 | 29 | 106 | 137 | 131 | 43 | 93 | 160 |
|      | 173 | 105 | 9 | 66 | 65 | 92 | 32 | 41 | 72 | 74 | 4 | 36 |
|      | 73 | 79 | 121 | 148 | 95 | 70 | 51 | 53 | 21 | 115 | 135 | 25 |
|      | 165 | 40 | 19 | 60 | 46 | 14 | 49 | 139 | 58 | 101 | 39 | 116 |
| 8/15 | 0 | 2 | 4 | 6 | 8 | 10 | 12 | 14 | 16 | 18 | 20 | 22 |
|      | 46 | 48 | 50 | 52 | 54 | 56 | 58 | 60 | 62 | 64 | 66 | 68 |
|      | 92 | 94 | 96 | 98 | 100 | 102 | 104 | 106 | 108 | 110 | 112 | 114 |
|      | 138 | 140 | 142 | 144 | 146 | 148 | 150 | 152 | 154 | 156 | 158 | 160 |
|      | 5 | 7 | 9 | 11 | 13 | 15 | 17 | 19 | 21 | 23 | 25 | 27 |
|      | 51 | 53 | 55 | 57 | 59 | 61 | 63 | 65 | 67 | 69 | 71 | 73 |
|      | 97 | 99 | 101 | 103 | 105 | 107 | 109 | 111 | 113 | 115 | 117 | 119 |
|      | 143 | 145 | 147 | 149 | 151 | 153 | 155 | 157 | 159 | 161 | 163 | 165 |
| 9/15 | 0 | 2 | 4 | 6 | 8 | 10 | 12 | 14 | 16 | 18 | 20 | 22 |
|      | 46 | 48 | 50 | 52 | 54 | 56 | 58 | 60 | 62 | 64 | 66 | 68 |
|      | 92 | 94 | 96 | 98 | 100 | 102 | 104 | 106 | 108 | 110 | 112 | 114 |
|      | 138 | 140 | 142 | 144 | 146 | 148 | 150 | 152 | 154 | 156 | 158 | 160 |
|      | 5 | 7 | 9 | 11 | 13 | 15 | 17 | 19 | 21 | 23 | 25 | 27 |
|      | 51 | 53 | 55 | 57 | 59 | 61 | 63 | 65 | 67 | 69 | 71 | 73 |
|      | 97 | 99 | 101 | 103 | 105 | 107 | 109 | 111 | 113 | 115 | 117 | 119 |
|      | 143 | 145 | 147 | 149 | 151 | 153 | 155 | 157 | 159 | 161 | 163 | 165 |
| 10/15 | 0 | 2 | 4 | 6 | 8 | 10 | 12 | 14 | 16 | 18 | 20 | 22 |
|      | 46 | 48 | 50 | 52 | 54 | 56 | 58 | 60 | 62 | 64 | 66 | 68 |
|      | 92 | 94 | 96 | 98 | 100 | 102 | 104 | 106 | 108 | 110 | 112 | 114 |
|      | 138 | 140 | 142 | 144 | 146 | 148 | 150 | 152 | 154 | 156 | 158 | 160 |
|      | 5 | 7 | 9 | 11 | 13 | 15 | 17 | 19 | 21 | 23 | 25 | 27 |
|      | 51 | 53 | 55 | 57 | 59 | 61 | 63 | 65 | 67 | 69 | 71 | 73 |
|      | 97 | 99 | 101 | 103 | 105 | 107 | 109 | 111 | 113 | 115 | 117 | 119 |
|      | 143 | 145 | 147 | 149 | 151 | 153 | 155 | 157 | 159 | 161 | 163 | 165 |
| 11/15 | 0 | 14 | 19 | 21 | 2 | 11 | 22 | 9 | 8 | 7 | 16 | 3 |
|      | 49 | 75 | 93 | 127 | 95 | 119 | 73 | 61 | 63 | 117 | 89 | 99 |
|      | 103 | 102 | 81 | 113 | 101 | 97 | 33 | 115 | 59 | 112 | 90 | 51 |
|      | 138 | 140 | 142 | 144 | 146 | 148 | 150 | 152 | 154 | 156 | 158 | 160 |

TABLE 9-continued

|  | 10 | 12 | 20 | 6 | 18 | 13 | 17 | 15 | 1 | 29 | 28 | 23 |
|---|---|---|---|---|---|---|---|---|---|---|---|---|
|  | 130 | 56 | 128 | 77 | 39 | 94 | 87 | 120 | 62 | 88 | 74 | 35 |
|  | 38 | 72 | 108 | 58 | 43 | 109 | 57 | 105 | 68 | 86 | 79 | 96 |
|  | 143 | 145 | 147 | 149 | 151 | 153 | 155 | 157 | 159 | 161 | 163 | 165 |
| 12/15 | 0 | 2 | 4 | 6 | 8 | 10 | 12 | 14 | 16 | 18 | 20 | 22 |
|  | 46 | 48 | 50 | 52 | 54 | 56 | 58 | 60 | 62 | 64 | 66 | 68 |
|  | 92 | 94 | 96 | 98 | 100 | 102 | 104 | 106 | 108 | 110 | 112 | 114 |
|  | 138 | 140 | 142 | 144 | 146 | 148 | 150 | 152 | 154 | 156 | 158 | 160 |
|  | 5 | 7 | 9 | 11 | 13 | 15 | 17 | 19 | 21 | 23 | 25 | 27 |
|  | 51 | 53 | 55 | 57 | 59 | 61 | 63 | 65 | 67 | 69 | 71 | 73 |
|  | 97 | 99 | 101 | 103 | 105 | 107 | 109 | 111 | 113 | 115 | 117 | 119 |
|  | 143 | 145 | 147 | 149 | 151 | 153 | 155 | 157 | 159 | 161 | 163 | 165 |
| 13/15 | 0 | 2 | 4 | 6 | 8 | 10 | 12 | 14 | 16 | 18 | 20 | 22 |
|  | 46 | 48 | 50 | 52 | 54 | 56 | 58 | 60 | 62 | 64 | 66 | 68 |
|  | 92 | 94 | 96 | 98 | 100 | 102 | 104 | 106 | 108 | 110 | 112 | 114 |
|  | 138 | 140 | 142 | 144 | 146 | 148 | 150 | 152 | 154 | 156 | 158 | 160 |
|  | 5 | 7 | 9 | 11 | 13 | 15 | 17 | 19 | 21 | 23 | 25 | 27 |
|  | 51 | 53 | 55 | 57 | 59 | 61 | 63 | 65 | 67 | 69 | 71 | 73 |
|  | 97 | 99 | 101 | 103 | 105 | 107 | 109 | 111 | 113 | 115 | 117 | 119 |
|  | 143 | 145 | 147 | 149 | 151 | 153 | 155 | 157 | 159 | 161 | 163 | 165 |

| Code Rate | Order of group-wise interleaving $\pi(j)$ $(0 \leq j < 180)$ | | | | | | | | | | |
|---|---|---|---|---|---|---|---|---|---|---|---|
|  | 12 | 13 | 14 | 15 | 16 | 17 | 18 | 19 | 20 | 21 | 22 |
|  | 35 | 36 | 37 | 38 | 39 | 40 | 41 | 42 | 43 | 44 | 45 |
|  | 58 | 59 | 60 | 61 | 62 | 63 | 64 | 65 | 66 | 67 | 68 |
|  | 81 | 82 | 83 | 84 | 85 | 86 | 87 | 88 | 89 | 90 | 91 |
|  | 104 | 105 | 106 | 107 | 108 | 109 | 110 | 111 | 112 | 113 | 114 |
|  | 127 | 128 | 129 | 130 | 131 | 132 | 133 | 134 | 135 | 136 | 137 |
|  | 150 | 151 | 152 | 153 | 154 | 155 | 156 | 157 | 158 | 159 | 160 |
|  | 173 | 174 | 175 | 176 | 177 | 178 | 179 |  |  |  |  |
| 2/15 | 177 | 168 | 78 | 71 | 120 | 60 | 155 | 175 | 9 | 161 | 103 |
|  | 31 | 7 | 23 | 51 | 5 | 121 | 83 | 64 | 176 | 119 | 98 |
|  | 96 | 39 | 68 | 105 | 85 | 109 | 13 | 33 | 145 | 18 | 12 |
|  | 63 | 88 | 25 | 52 | 170 | 24 | 69 | 142 | 178 | 20 | 65 |
|  | 160 | 102 | 55 | 139 | 125 | 116 | 138 | 167 | 53 | 169 | 165 |
|  | 75 | 135 | 41 | 137 | 76 | 92 | 164 | 113 | 152 | 72 | 36 |
|  | 94 | 67 | 122 | 1 | 27 | 171 | 30 | 157 | 112 | 81 | 118 |
|  | 10 | 144 | 141 | 132 | 174 | 38 | 17 |  |  |  |  |
| 3/15 | 92 | 106 | 27 | 126 | 116 | 178 | 41 | 166 | 88 | 84 | 80 |
|  | 65 | 8 | 40 | 76 | 140 | 44 | 68 | 125 | 119 | 82 | 53 |
|  | 150 | 26 | 59 | 3 | 148 | 173 | 141 | 130 | 154 | 97 | 33 |
|  | 110 | 2 | 169 | 47 | 83 | 164 | 155 | 123 | 159 | 42 | 105 |
|  | 60 | 79 | 87 | 135 | 10 | 139 | 156 | 177 | 77 | 89 | 73 |
|  | 18 | 95 | 124 | 85 | 14 | 78 | 129 | 161 | 19 | 72 | 13 |
|  | 29 | 104 | 45 | 56 | 151 | 62 | 43 | 94 | 163 | 99 | 64 |
|  | 179 | 37 | 70 | 131 | 55 | 168 | 149 |  |  |  |  |
| 4/15 | 62 | 44 | 24 | 117 | 8 | 145 | 36 | 79 | 172 | 149 | 127 |
|  | 4 | 168 | 54 | 177 | 158 | 113 | 57 | 2 | 102 | 161 | 147 |
|  | 159 | 61 | 45 | 156 | 0 | 83 | 157 | 119 | 112 | 118 | 92 |
|  | 23 | 34 | 60 | 93 | 165 | 128 | 90 | 19 | 33 | 70 | 173 |
|  | 140 | 136 | 10 | 115 | 63 | 46 | 42 | 50 | 138 | 81 | 59 |
|  | 35 | 66 | 64 | 7 | 125 | 151 | 56 | 126 | 171 | 68 | 121 |
|  | 133 | 43 | 116 | 137 | 94 | 3 | 25 | 134 | 13 | 107 | 162 |
|  | 95 | 87 | 155 | 58 | 30 | 148 | 114 |  |  |  |  |
| 5/15 | 17 | 46 | 10 | 91 | 133 | 69 | 171 | 32 | 117 | 78 | 13 |
|  | 93 | 130 | 2 | 104 | 102 | 128 | 4 | 111 | 151 | 84 | 167 |
|  | 5 | 31 | 100 | 106 | 48 | 52 | 67 | 107 | 18 | 126 | 112 |
|  | 3 | 166 | 105 | 103 | 118 | 63 | 51 | 139 | 172 | 141 | 175 |
|  | 153 | 137 | 108 | 159 | 157 | 173 | 23 | 89 | 132 | 57 | 37 |
|  | 15 | 154 | 145 | 12 | 170 | 54 | 155 | 99 | 22 | 123 | 72 |
|  | 83 | 53 | 24 | 42 | 60 | 26 | 161 | 68 | 178 | 41 | 148 |
|  | 163 | 61 | 179 | 136 | 97 | 16 | 88 |  |  |  |  |
| 6/15 | 26 | 24 | 27 | 80 | 100 | 121 | 107 | 31 | 36 | 42 | 46 |
|  | 129 | 52 | 111 | 124 | 48 | 122 | 82 | 106 | 91 | 92 | 71 |
|  | 126 | 85 | 123 | 40 | 83 | 53 | 69 | 70 | 132 | 134 | 136 |
|  | 162 | 164 | 166 | 168 | 170 | 172 | 174 | 176 | 178 | 4 | 5 |
|  | 25 | 67 | 116 | 66 | 104 | 44 | 50 | 47 | 84 | 76 | 65 |
|  | 110 | 131 | 98 | 60 | 37 | 45 | 78 | 125 | 41 | 34 | 118 |
|  | 32 | 114 | 64 | 55 | 30 | 54 | 133 | 135 | 137 | 139 | 141 |
|  | 167 | 169 | 171 | 173 | 175 | 177 | 179 |  |  |  |  |
| 7/15 | 99 | 89 | 179 | 123 | 149 | 177 | 1 | 132 | 37 | 26 | 16 |
|  | 124 | 143 | 28 | 59 | 130 | 31 | 157 | 170 | 44 | 61 | 102 |
|  | 147 | 7 | 174 | 6 | 90 | 15 | 56 | 120 | 13 | 34 | 48 |
|  | 150 | 87 | 27 | 42 | 3 | 23 | 96 | 171 | 145 | 91 | 24 |
|  | 108 | 164 | 12 | 140 | 71 | 63 | 141 | 109 | 129 | 82 | 80 |
|  | 94 | 67 | 158 | 10 | 88 | 142 | 45 | 126 | 2 | 86 | 118 |
|  | 168 | 11 | 136 | 18 | 138 | 134 | 119 | 146 | 0 | 97 | 22 |
|  | 127 | 30 | 98 | 50 | 107 | 35 | 62 |  |  |  |  |

TABLE 9-continued

| | | | | | | | | | | | |
|---|---|---|---|---|---|---|---|---|---|---|---|
| 8/15 | 24 | 26 | 28 | 30 | 32 | 34 | 36 | 38 | 40 | 42 | 44 |
| | 70 | 72 | 74 | 76 | 78 | 80 | 82 | 84 | 86 | 88 | 90 |
| | 116 | 118 | 120 | 122 | 124 | 126 | 128 | 130 | 132 | 134 | 136 |
| | 162 | 164 | 166 | 168 | 170 | 172 | 174 | 176 | 178 | 1 | 3 |
| | 29 | 31 | 33 | 35 | 37 | 39 | 41 | 43 | 45 | 47 | 49 |
| | 75 | 77 | 79 | 81 | 83 | 85 | 87 | 89 | 91 | 93 | 95 |
| | 121 | 123 | 125 | 127 | 129 | 131 | 133 | 135 | 137 | 139 | 141 |
| | 167 | 169 | 171 | 173 | 175 | 177 | 179 | | | | |
| 9/15 | 24 | 26 | 28 | 30 | 32 | 34 | 36 | 38 | 40 | 42 | 44 |
| | 70 | 72 | 74 | 76 | 78 | 80 | 82 | 84 | 86 | 88 | 90 |
| | 116 | 118 | 120 | 122 | 124 | 126 | 128 | 130 | 132 | 134 | 136 |
| | 162 | 164 | 166 | 168 | 170 | 172 | 174 | 176 | 178 | 1 | 3 |
| | 29 | 31 | 33 | 35 | 37 | 39 | 41 | 43 | 45 | 47 | 49 |
| | 75 | 77 | 79 | 81 | 83 | 85 | 87 | 89 | 91 | 93 | 95 |
| | 121 | 123 | 125 | 127 | 129 | 131 | 133 | 135 | 137 | 139 | 141 |
| | 167 | 169 | 171 | 173 | 175 | 177 | 179 | | | | |
| 10/15 | 24 | 26 | 28 | 30 | 32 | 34 | 36 | 38 | 40 | 42 | 44 |
| | 70 | 72 | 74 | 76 | 78 | 80 | 82 | 84 | 86 | 88 | 90 |
| | 116 | 118 | 120 | 122 | 124 | 126 | 128 | 130 | 132 | 134 | 136 |
| | 162 | 164 | 166 | 168 | 170 | 172 | 174 | 176 | 178 | 1 | 3 |
| | 29 | 31 | 33 | 35 | 37 | 39 | 41 | 43 | 45 | 47 | 49 |
| | 75 | 77 | 79 | 81 | 83 | 85 | 87 | 89 | 91 | 93 | 95 |
| | 121 | 123 | 125 | 127 | 129 | 131 | 133 | 135 | 137 | 139 | 141 |
| | 167 | 169 | 171 | 173 | 175 | 177 | 179 | | | | |
| 11/15 | 26 | 24 | 27 | 80 | 100 | 121 | 107 | 31 | 36 | 42 | 46 |
| | 129 | 52 | 111 | 124 | 48 | 122 | 82 | 106 | 91 | 92 | 71 |
| | 126 | 85 | 123 | 40 | 83 | 53 | 69 | 70 | 132 | 134 | 136 |
| | 162 | 164 | 166 | 168 | 170 | 172 | 174 | 176 | 178 | 4 | 5 |
| | 25 | 67 | 116 | 66 | 104 | 44 | 50 | 47 | 84 | 76 | 65 |
| | 110 | 131 | 98 | 60 | 37 | 45 | 78 | 125 | 41 | 34 | 118 |
| | 32 | 114 | 64 | 55 | 30 | 54 | 133 | 135 | 137 | 139 | 141 |
| | 167 | 169 | 171 | 173 | 175 | 177 | 179 | | | | |
| 12/15 | 24 | 26 | 28 | 30 | 32 | 34 | 36 | 38 | 40 | 42 | 44 |
| | 70 | 72 | 74 | 76 | 78 | 80 | 82 | 84 | 86 | 88 | 90 |
| | 116 | 118 | 120 | 122 | 124 | 126 | 128 | 130 | 132 | 134 | 136 |
| | 162 | 164 | 166 | 168 | 170 | 172 | 174 | 176 | 178 | 1 | 3 |
| | 29 | 31 | 33 | 35 | 37 | 39 | 41 | 43 | 45 | 47 | 49 |
| | 75 | 77 | 79 | 81 | 83 | 85 | 87 | 89 | 91 | 93 | 95 |
| | 121 | 123 | 125 | 127 | 129 | 131 | 133 | 135 | 137 | 139 | 141 |
| | 167 | 169 | 171 | 173 | 175 | 177 | 179 | | | | |
| 13/15 | 24 | 26 | 28 | 30 | 32 | 34 | 36 | 38 | 40 | 42 | 44 |
| | 70 | 72 | 74 | 76 | 78 | 80 | 82 | 84 | 86 | 88 | 90 |
| | 116 | 118 | 120 | 122 | 124 | 126 | 128 | 130 | 132 | 134 | 136 |
| | 162 | 164 | 166 | 168 | 170 | 172 | 174 | 176 | 178 | 1 | 3 |
| | 29 | 31 | 33 | 35 | 37 | 39 | 41 | 43 | 45 | 47 | 49 |
| | 75 | 77 | 79 | 81 | 83 | 85 | 87 | 89 | 91 | 93 | 95 |
| | 121 | 123 | 125 | 127 | 129 | 131 | 133 | 135 | 137 | 139 | 141 |
| | 167 | 169 | 171 | 173 | 175 | 177 | 179 | | | | |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 64800 and modulates bits by the 16-QAM in the constellation mapper 430.

In this case, the group interleaver 422 may perform the interleaving using $\pi(j)$ defined by the Table 10.

TABLE 10

| Code Rate | Order of group-wise interleaving $\pi(j)$ ($0 \leq j < 180$) | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | 46 | 47 | 48 | 49 | 50 | 51 | 52 | 53 | 54 | 55 | 56 | 57 |
| | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| 2/15 | 5 | 58 | 29 | 154 | 125 | 34 | 0 | 169 | 80 | 59 | 13 | 42 |
| | 138 | 64 | 136 | 149 | 57 | 18 | 101 | 119 | 35 | 33 | 113 | 75 |
| | 19 | 147 | 111 | 70 | 74 | 79 | 10 | 132 | 1 | 161 | 155 | 90 |
| | 81 | 44 | 63 | 118 | 4 | 158 | 148 | 82 | 69 | 36 | 162 | 86 |
| | 56 | 110 | 21 | 93 | 107 | 85 | 20 | 128 | 109 | 66 | 83 | 12 |
| | 152 | 168 | 14 | 16 | 2 | 137 | 140 | 121 | 173 | 50 | 55 | 94 |
| | 38 | 156 | 131 | 127 | 164 | 102 | 116 | 176 | 30 | 37 | 139 | 95 |
| | 115 | 52 | 6 | 123 | 134 | 31 | 103 | 163 | 65 | 105 | 48 | 25 |

TABLE 10-continued

| | | | | | | | | | | | | |
|---|---|---|---|---|---|---|---|---|---|---|---|---|
| 3/15 | 52 | 92 | 175 | 26 | 45 | 81 | 117 | 74 | 119 | 147 | 120 | 135 |
| | 174 | 79 | 16 | 176 | 44 | 19 | 69 | 11 | 111 | 121 | 37 | 160 |
| | 9 | 93 | 166 | 78 | 73 | 167 | 168 | 40 | 131 | 27 | 89 | 156 |
| | 13 | 105 | 55 | 122 | 132 | 172 | 2 | 58 | 126 | 162 | 30 | 77 |
| | 83 | 60 | 146 | 124 | 178 | 99 | 123 | 108 | 133 | 159 | 151 | 145 |
| | 4 | 155 | 7 | 57 | 95 | 62 | 56 | 65 | 140 | 163 | 148 | 23 |
| | 115 | 32 | 14 | 179 | 85 | 165 | 112 | 25 | 64 | 173 | 10 | 102 |
| | 91 | 1 | 118 | 136 | 18 | 101 | 149 | 130 | 103 | 106 | 38 | 70 |
| 4/15 | 165 | 8 | 136 | 2 | 58 | 30 | 127 | 64 | 38 | 164 | 123 | 45 |
| | 98 | 157 | 57 | 156 | 170 | 46 | 12 | 172 | 29 | 9 | 3 | 144 |
| | 72 | 125 | 36 | 14 | 55 | 48 | 1 | 149 | 33 | 110 | 6 | 130 |
| | 85 | 11 | 28 | 153 | 73 | 62 | 44 | 135 | 116 | 4 | 61 | 117 |
| | 65 | 99 | 126 | 141 | 43 | 15 | 18 | 90 | 35 | 24 | 142 | 25 |
| | 175 | 87 | 21 | 66 | 106 | 82 | 179 | 118 | 41 | 95 | 145 | 37 |
| | 96 | 133 | 100 | 161 | 143 | 119 | 102 | 59 | 20 | 40 | 70 | 79 |
| | 162 | 76 | 42 | 160 | 115 | 71 | 158 | 54 | 137 | 146 | 32 | 169 |
| 5/15 | 129 | 65 | 160 | 140 | 32 | 50 | 162 | 86 | 177 | 57 | 157 | 9 |
| | 148 | 133 | 99 | 18 | 0 | 167 | 101 | 110 | 135 | 124 | 71 | 107 |
| | 117 | 81 | 125 | 59 | 15 | 137 | 170 | 63 | 112 | 88 | 34 | 61 |
| | 64 | 150 | 10 | 128 | 49 | 26 | 75 | 41 | 102 | 28 | 2 | 168 |
| | 173 | 51 | 29 | 147 | 175 | 90 | 164 | 80 | 131 | 58 | 114 | 145 |
| | 138 | 33 | 47 | 116 | 79 | 174 | 74 | 21 | 6 | 130 | 54 | 109 |
| | 154 | 89 | 132 | 67 | 119 | 143 | 40 | 53 | 20 | 136 | 172 | 91 |
| | 48 | 153 | 11 | 166 | 60 | 111 | 14 | 169 | 95 | 118 | 1 | 126 |
| 6/15 | 55 | 146 | 83 | 52 | 62 | 176 | 160 | 68 | 53 | 56 | 81 | 97 |
| | 144 | 57 | 67 | 116 | 59 | 70 | 156 | 172 | 65 | 149 | 155 | 82 |
| | 14 | 37 | 54 | 44 | 63 | 43 | 18 | 47 | 7 | 25 | 34 | 29 |
| | 27 | 38 | 48 | 33 | 22 | 49 | 51 | 60 | 46 | 21 | 4 | 3 |
| | 127 | 101 | 94 | 115 | 105 | 31 | 19 | 177 | 74 | 10 | 145 | 162 |
| | 78 | 171 | 8 | 142 | 178 | 154 | 85 | 107 | 75 | 12 | 9 | 151 |
| | 150 | 110 | 175 | 166 | 131 | 119 | 103 | 139 | 148 | 157 | 114 | 147 |
| | 11 | 92 | 165 | 84 | 168 | 124 | 169 | 2 | 130 | 167 | 153 | 137 |
| 7/15 | 174 | 148 | 56 | 168 | 38 | 7 | 110 | 9 | 42 | 153 | 160 | 15 |
| | 27 | 119 | 118 | 144 | 31 | 80 | 109 | 73 | 141 | 93 | 45 | 16 |
| | 75 | 67 | 5 | 104 | 125 | 140 | 172 | 8 | 39 | 17 | 29 | 159 |
| | 163 | 116 | 94 | 120 | 71 | 158 | 145 | 37 | 112 | 68 | 95 | 1 |
| | 82 | 178 | 176 | 152 | 23 | 115 | 130 | 98 | 123 | 102 | 24 | 129 |
| | 117 | 91 | 157 | 33 | 105 | 155 | 62 | 162 | 40 | 127 | 14 | 165 |
| | 111 | 106 | 76 | 53 | 61 | 147 | 97 | 175 | 32 | 59 | 166 | 179 |
| | 126 | 151 | 84 | 156 | 30 | 138 | 164 | 132 | 12 | 0 | 20 | 63 |
| 8/15 | 71 | 81 | 170 | 101 | 143 | 77 | 128 | 112 | 155 | 41 | 40 | 54 |
| | 92 | 137 | 27 | 122 | 107 | 135 | 82 | 125 | 103 | 74 | 36 | 9 |
| | 102 | 106 | 149 | 24 | 169 | 113 | 127 | 34 | 165 | 100 | 136 | 75 |
| | 130 | 121 | 48 | 53 | 22 | 129 | 99 | 11 | 33 | 124 | 157 | 161 |
| | 144 | 1 | 61 | 65 | 146 | 42 | 172 | 115 | 59 | 76 | 4 | 162 |
| | 104 | 139 | 80 | 6 | 95 | 87 | 90 | 173 | 163 | 69 | 32 | 8 |
| | 5 | 153 | 49 | 78 | 2 | 109 | 147 | 89 | 166 | 152 | 138 | 31 |
| | 105 | 3 | 164 | 51 | 83 | 174 | 108 | 52 | 17 | 64 | 119 | 45 |
| 9/15 | 23 | 89 | 10 | 142 | 19 | 41 | 1 | 146 | 68 | 87 | 9 | 51 |
| | 149 | 110 | 128 | 172 | 28 | 111 | 78 | 82 | 120 | 71 | 52 | 5 |
| | 131 | 164 | 65 | 76 | 125 | 50 | 16 | 130 | 129 | 143 | 133 | 98 |
| | 36 | 167 | 119 | 27 | 86 | 102 | 48 | 115 | 99 | 38 | 163 | 73 |
| | 24 | 44 | 168 | 80 | 15 | 39 | 178 | 45 | 21 | 37 | 11 | 136 |
| | 57 | 171 | 100 | 117 | 46 | 62 | 33 | 175 | 137 | 59 | 103 | 127 |
| | 105 | 159 | 26 | 96 | 169 | 135 | 109 | 47 | 177 | 56 | 116 | 79 |
| | 34 | 165 | 138 | 7 | 91 | 12 | 145 | 58 | 95 | 2 | 144 | 53 |
| 10/15 | 68 | 71 | 54 | 19 | 25 | 21 | 102 | 32 | 105 | 29 | 16 | 79 |
| | 57 | 28 | 76 | 31 | 26 | 96 | 65 | 119 | 114 | 109 | 9 | 125 |
| | 38 | 77 | 115 | 56 | 87 | 113 | 100 | 75 | 72 | 60 | 47 | 92 |
| | 104 | 8 | 34 | 0 | 84 | 111 | 35 | 30 | 64 | 55 | 80 | 40 |
| | 50 | 33 | 7 | 175 | 51 | 131 | 106 | 134 | 88 | 140 | 117 | 132 |
| | 41 | 158 | 5 | 120 | 12 | 52 | 99 | 146 | 144 | 78 | 155 | 128 |
| | 11 | 27 | 160 | 178 | 133 | 142 | 121 | 168 | 173 | 123 | 13 | 15 |
| | 152 | 177 | 137 | 149 | 167 | 1 | 14 | 169 | 124 | 148 | 164 | 130 |
| 11/15 | 21 | 11 | 12 | 9 | 0 | 6 | 24 | 25 | 85 | 103 | 118 | 122 |
| | 80 | 128 | 68 | 129 | 61 | 124 | 36 | 126 | 117 | 114 | 132 | 136 |
| | 18 | 10 | 13 | 16 | 8 | 26 | 27 | 54 | 111 | 52 | 44 | 87 |
| | 56 | 125 | 53 | 89 | 94 | 50 | 123 | 65 | 83 | 133 | 137 | 141 |
| | 1 | 4 | 7 | 15 | 29 | 82 | 32 | 102 | 76 | 121 | 92 | 130 |
| | 69 | 96 | 120 | 42 | 34 | 79 | 35 | 105 | 134 | 138 | 142 | 146 |
| | 14 | 22 | 28 | 23 | 109 | 51 | 108 | 131 | 33 | 84 | 88 | 64 |
| | 74 | 66 | 60 | 67 | 47 | 112 | 90 | 135 | 139 | 143 | 147 | 151 |
| 12/15 | 120 | 32 | 38 | 113 | 71 | 31 | 65 | 109 | 36 | 106 | 134 | 66 |
| | 125 | 107 | 44 | 99 | 75 | 64 | 78 | 51 | 95 | 88 | 49 | 60 |
| | 67 | 92 | 98 | 42 | 77 | 28 | 121 | 87 | 18 | 21 | 93 | 72 |
| | 85 | 104 | 124 | 52 | 20 | 118 | 34 | 5 | 94 | 41 | 68 | 80 |
| | 173 | 165 | 175 | 166 | 169 | 174 | 159 | 148 | 158 | 155 | 145 | 178 |
| | 163 | 152 | 146 | 177 | 103 | 160 | 147 | 76 | 172 | 144 | 150 | 132 |
| | 119 | 114 | 117 | 115 | 84 | 57 | 62 | 13 | 47 | 24 | 0 | 7 |
| | 102 | 15 | 55 | 23 | 25 | 11 | 56 | 45 | 58 | 128 | 43 | 135 |

TABLE 10-continued

| 13/15 | 0 | 4 | 8 | 12 | 16 | 20 | 24 | 28 | 32 | 36 | 40 | 44 |
|---|---|---|---|---|---|---|---|---|---|---|---|---|
| | 92 | 96 | 100 | 104 | 108 | 112 | 116 | 120 | 124 | 128 | 132 | 136 |
| | 5 | 9 | 13 | 17 | 21 | 25 | 29 | 33 | 37 | 41 | 45 | 49 |
| | 97 | 101 | 105 | 109 | 113 | 117 | 121 | 125 | 129 | 133 | 137 | 141 |
| | 10 | 14 | 18 | 22 | 26 | 30 | 34 | 38 | 42 | 46 | 50 | 54 |
| | 102 | 106 | 110 | 114 | 118 | 122 | 126 | 130 | 134 | 138 | 142 | 146 |
| | 15 | 19 | 23 | 27 | 31 | 35 | 39 | 43 | 47 | 51 | 55 | 59 |
| | 107 | 111 | 115 | 119 | 123 | 127 | 131 | 135 | 139 | 143 | 147 | 151 |

| Code Rate | Order of group-wise interleaving $\pi(j)$ $(0 \le j < 180)$ | | | | | | | | | |
|---|---|---|---|---|---|---|---|---|---|---|
| | 12 | 13 | 14 | 15 | 16 | 17 | 18 | 19 | 20 | 21 | 22 |
| | 35 | 36 | 37 | 38 | 39 | 40 | 41 | 42 | 43 | 44 | 45 |
| | 58 | 59 | 60 | 61 | 62 | 63 | 64 | 65 | 66 | 67 | 68 |
| | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| 2/15 | 77 | 167 | 32 | 87 | 24 | 92 | 124 | 143 | 114 | 120 | 166 |
| | 108 | 104 | 3 | 27 | 39 | 172 | 159 | 129 | 62 | 146 | 142 |
| | 15 | 133 | 47 | 112 | 84 | 28 | 160 | 117 | 150 | 49 | 7 |
| | 71 | 22 | 26 | 61 | 40 | 126 | 170 | 177 | 23 | 91 | 68 |
| | 179 | 141 | 97 | 78 | 157 | 72 | 130 | 99 | 165 | 45 | 11 |
| | 144 | 73 | 51 | 98 | 174 | 178 | 17 | 100 | 9 | 122 | 54 |
| | 43 | 135 | 53 | 89 | 106 | 171 | 76 | 175 | 153 | 96 | 151 |
| | 8 | 60 | 67 | 88 | 46 | 41 | 145 | | | | |
| 3/15 | 144 | 87 | 3 | 51 | 20 | 170 | 143 | 125 | 15 | 39 | 5 |
| | 88 | 50 | 76 | 129 | 138 | 157 | 86 | 113 | 164 | 142 | 98 |
| | 177 | 171 | 116 | 152 | 0 | 127 | 36 | 8 | 153 | 59 | 75 |
| | 158 | 17 | 96 | 100 | 42 | 63 | 134 | 154 | 6 | 90 | 128 |
| | 61 | 53 | 68 | 31 | 41 | 94 | 35 | 21 | 49 | 82 | 80 |
| | 161 | 169 | 47 | 67 | 139 | 72 | 43 | 110 | 46 | 150 | 109 |
| | 114 | 71 | 66 | 84 | 24 | 141 | 29 | 104 | 107 | 54 | 12 |
| | 48 | 28 | 137 | 97 | 34 | 22 | 33 | | | | |
| 4/15 | 78 | 17 | 47 | 105 | 159 | 134 | 124 | 147 | 148 | 109 | 67 |
| | 97 | 83 | 151 | 26 | 52 | 10 | 39 | 50 | 104 | 92 | 163 |
| | 140 | 89 | 77 | 22 | 171 | 139 | 112 | 113 | 152 | 16 | 7 |
| | 53 | 111 | 178 | 94 | 81 | 68 | 114 | 173 | 75 | 101 | 88 |
| | 120 | 19 | 154 | 0 | 174 | 93 | 167 | 150 | 107 | 86 | 129 |
| | 23 | 168 | 166 | 49 | 103 | 108 | 56 | 91 | 69 | 128 | 121 |
| | 80 | 51 | 13 | 177 | 131 | 132 | 176 | 155 | 31 | 63 | 5 |
| | 122 | 138 | 84 | 74 | 60 | 34 | 27 | | | | |
| 5/15 | 134 | 104 | 24 | 7 | 122 | 46 | 17 | 77 | 31 | 92 | 163 |
| | 5 | 123 | 69 | 108 | 141 | 179 | 96 | 113 | 83 | 176 | 52 |
| | 106 | 3 | 42 | 100 | 152 | 87 | 171 | 72 | 161 | 4 | 178 |
| | 93 | 156 | 12 | 38 | 45 | 151 | 142 | 44 | 66 | 25 | 139 |
| | 121 | 70 | 115 | 146 | 120 | 55 | 158 | 8 | 39 | 97 | 159 |
| | 76 | 35 | 98 | 155 | 144 | 36 | 94 | 23 | 78 | 165 | 56 |
| | 27 | 13 | 127 | 73 | 105 | 85 | 30 | 103 | 19 | 84 | 37 |
| | 68 | 22 | 149 | 43 | 62 | 16 | 82 | | | | |
| 6/15 | 79 | 113 | 163 | 61 | 58 | 69 | 133 | 108 | 66 | 71 | 86 |
| | 138 | 136 | 141 | 111 | 96 | 170 | 90 | 140 | 64 | 159 | 15 |
| | 30 | 26 | 39 | 16 | 41 | 45 | 36 | 0 | 23 | 32 | 28 |
| | 20 | 13 | 50 | 35 | 24 | 40 | 17 | 42 | 6 | 112 | 93 |
| | 102 | 120 | 126 | 95 | 73 | 152 | 129 | 174 | 125 | 72 | 128 |
| | 77 | 117 | 109 | 80 | 106 | 134 | 98 | 1 | 122 | 173 | 161 |
| | 87 | 158 | 121 | 164 | 104 | 89 | 179 | 123 | 118 | 99 | 88 |
| | 143 | 91 | 100 | 5 | 76 | 132 | 135 | | | | |
| 7/15 | 46 | 21 | 121 | 88 | 114 | 85 | 13 | 83 | 74 | 81 | 70 |
| | 77 | 108 | 57 | 36 | 78 | 124 | 79 | 169 | 143 | 6 | 58 |
| | 86 | 87 | 41 | 99 | 89 | 47 | 128 | 43 | 161 | 154 | 101 |
| | 113 | 64 | 72 | 90 | 92 | 35 | 167 | 44 | 149 | 66 | 28 |
| | 150 | 34 | 136 | 171 | 54 | 107 | 2 | 3 | 60 | 69 | 10 |
| | 26 | 52 | 19 | 48 | 137 | 4 | 22 | 122 | 173 | 18 | 11 |
| | 135 | 177 | 103 | 100 | 139 | 50 | 146 | 134 | 133 | 96 | 49 |
| | 170 | 142 | 65 | 55 | 25 | 51 | 131 | | | | |
| 8/15 | 57 | 28 | 179 | 114 | 97 | 13 | 18 | 151 | 91 | 88 | 79 |
| | 93 | 0 | 86 | 63 | 158 | 148 | 25 | 167 | 116 | 70 | 43 |
| | 134 | 156 | 96 | 84 | 178 | 150 | 140 | 20 | 126 | 73 | 68 |
| | 29 | 123 | 160 | 55 | 26 | 168 | 98 | 67 | 15 | 7 | 94 |
| | 39 | 85 | 12 | 72 | 58 | 44 | 132 | 47 | 141 | 35 | 176 |
| | 154 | 145 | 23 | 177 | 111 | 60 | 38 | 171 | 62 | 46 | 21 |
| | 14 | 131 | 50 | 37 | 16 | 117 | 66 | 19 | 10 | 159 | 142 |
| | 133 | 175 | 110 | 56 | 30 | 120 | 118 | | | | |
| 9/15 | 114 | 92 | 121 | 69 | 107 | 97 | 166 | 162 | 55 | 174 | 126 |
| | 141 | 29 | 30 | 132 | 148 | 72 | 85 | 17 | 160 | 156 | 154 |
| | 0 | 42 | 63 | 83 | 173 | 49 | 74 | 43 | 8 | 147 | 61 |
| | 101 | 4 | 153 | 118 | 90 | 124 | 151 | 66 | 93 | 123 | 157 |

TABLE 10-continued

|       |     |     |     |     |     |     |     |     |     |     |     |
|-------|-----|-----|-----|-----|-----|-----|-----|-----|-----|-----|-----|
|       | 113 | 77  | 122 | 158 | 64  | 81  | 6   | 60  | 54  | 35  | 13  |
|       | 70  | 108 | 88  | 179 | 40  | 112 | 104 | 170 | 140 | 67  | 32  |
|       | 106 | 150 | 25  | 94  | 134 | 152 | 22  | 84  | 176 | 139 | 20  |
|       | 75  | 14  | 155 | 18  | 31  | 3   | 161 |     |     |     |     |
| 10/15 | 53  | 82  | 107 | 91  | 67  | 94  | 85  | 48  | 83  | 58  | 42  |
|       | 81  | 43  | 103 | 93  | 70  | 46  | 89  | 112 | 61  | 45  | 66  |
|       | 36  | 98  | 4   | 59  | 6   | 44  | 20  | 86  | 3   | 73  | 95  |
|       | 97  | 101 | 2   | 69  | 63  | 74  | 62  | 118 | 110 | 159 | 18  |
|       | 147 | 153 | 116 | 161 | 10  | 39  | 126 | 136 | 90  | 37  | 174 |
|       | 165 | 141 | 179 | 150 | 157 | 171 | 143 | 108 | 170 | 22  | 49  |
|       | 154 | 127 | 139 | 151 | 163 | 172 | 138 | 176 | 145 | 129 | 162 |
|       | 17  | 156 | 122 | 23  | 166 | 135 | 24  |     |     |     |     |
| 11/15 | 71  | 101 | 41  | 93  | 55  | 73  | 100 | 40  | 106 | 119 | 45  |
|       | 140 | 144 | 148 | 152 | 156 | 160 | 164 | 168 | 172 | 176 | 20  |
|       | 113 | 115 | 58  | 116 | 49  | 77  | 95  | 86  | 30  | 78  | 81  |
|       | 145 | 149 | 153 | 157 | 161 | 165 | 169 | 173 | 177 | 2   | 17  |
|       | 127 | 62  | 107 | 38  | 46  | 43  | 110 | 75  | 104 | 70  | 91  |
|       | 150 | 154 | 158 | 162 | 166 | 170 | 174 | 178 | 19  | 5   | 3   |
|       | 63  | 59  | 57  | 97  | 98  | 48  | 31  | 99  | 37  | 72  | 39  |
|       | 155 | 159 | 163 | 167 | 171 | 175 | 179 |     |     |     |     |
| 12/15 | 29  | 86  | 136 | 108 | 83  | 70  | 79  | 81  | 105 | 48  | 30  |
|       | 54  | 122 | 140 | 137 | 89  | 74  | 129 | 82  | 164 | 59  | 3   |
|       | 2   | 142 | 112 | 9   | 50  | 8   | 90  | 139 | 14  | 97  | 63  |
|       | 110 | 12  | 133 | 131 | 53  | 116 | 123 | 96  | 61  | 111 | 33  |
|       | 126 | 100 | 154 | 156 | 179 | 157 | 46  | 149 | 171 | 37  | 153 |
|       | 176 | 168 | 167 | 162 | 170 | 138 | 151 | 161 | 40  | 26  | 130 |
|       | 10  | 69  | 19  | 127 | 17  | 16  | 27  | 91  | 4   | 73  | 35  |
|       | 1   | 143 | 141 | 6   | 22  | 101 | 39  |     |     |     |     |
| 13/15 | 48  | 52  | 56  | 60  | 64  | 68  | 72  | 76  | 80  | 84  | 88  |
|       | 140 | 144 | 148 | 152 | 156 | 160 | 164 | 168 | 172 | 176 | 1   |
|       | 53  | 57  | 61  | 65  | 69  | 73  | 77  | 81  | 85  | 89  | 93  |
|       | 145 | 149 | 153 | 157 | 161 | 165 | 169 | 173 | 177 | 2   | 6   |
|       | 58  | 62  | 66  | 70  | 74  | 78  | 82  | 86  | 90  | 94  | 98  |
|       | 150 | 154 | 158 | 162 | 166 | 170 | 174 | 178 | 3   | 7   | 11  |
|       | 63  | 67  | 71  | 75  | 79  | 83  | 87  | 91  | 95  | 99  | 103 |
|       | 155 | 159 | 163 | 167 | 171 | 175 | 179 |     |     |     |     |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 64800 and modulates bits by the 64-QAM in the constellation mapper 430.

In this case, the group interleaver 422 may perform the interleaving using $\pi(j)$ defined by the Table 11.

TABLE 11

| Code Rate | Order of group-wise interleaving $\pi(j)$ (0 ≤ j < 180) | | | | | | | | | | |
|-----------|-----|-----|-----|-----|-----|-----|-----|-----|-----|-----|-----|
|      | 0   | 1   | 2   | 3   | 4   | 5   | 6   | 7   | 8   | 9   | 10  | 11  |
|      | 23  | 24  | 25  | 26  | 27  | 28  | 29  | 30  | 31  | 32  | 33  | 34  |
|      | 46  | 47  | 48  | 49  | 50  | 51  | 52  | 53  | 54  | 55  | 56  | 57  |
|      | 69  | 70  | 71  | 72  | 73  | 74  | 75  | 76  | 77  | 78  | 79  | 80  |
|      | 92  | 93  | 94  | 95  | 96  | 97  | 98  | 99  | 100 | 101 | 102 | 103 |
|      | 115 | 116 | 117 | 118 | 119 | 120 | 121 | 122 | 123 | 124 | 125 | 126 |
|      | 138 | 139 | 140 | 141 | 142 | 143 | 144 | 145 | 146 | 147 | 148 | 149 |
|      | 161 | 162 | 163 | 164 | 165 | 166 | 167 | 168 | 169 | 170 | 171 | 172 |
| 2/15 | 57  | 149 | 83  | 142 | 29  | 20  | 30  | 52  | 5   | 100 | 156 | 22  |
|      | 88  | 162 | 32  | 107 | 3   | 97  | 166 | 125 | 129 | 1   | 6   | 68  |
|      | 75  | 172 | 23  | 154 | 12  | 146 | 19  | 135 | 48  | 170 | 123 | 147 |
|      | 109 | 157 | 177 | 153 | 165 | 66  | 152 | 77  | 98  | 131 | 11  | 81  |
|      | 37  | 63  | 31  | 41  | 140 | 118 | 94  | 27  | 10  | 70  | 56  | 93  |
|      | 161 | 145 | 71  | 114 | 7   | 105 | 133 | 84  | 86  | 17  | 21  | 28  |
|      | 73  | 8   | 116 | 79  | 120 | 69  | 53  | 115 | 67  | 104 | 16  | 173 |
|      | 47  | 103 | 113 | 136 | 168 | 102 | 14  | 45  | 72  | 25  | 50  | 34  |
| 3/15 | 74  | 72  | 104 | 62  | 122 | 35  | 130 | 0   | 95  | 150 | 139 | 151 |
|      | 100 | 115 | 101 | 7   | 21  | 141 | 30  | 8   | 1   | 93  | 92  | 163 |
|      | 144 | 156 | 54  | 164 | 12  | 63  | 39  | 22  | 25  | 137 | 13  | 41  |
|      | 20  | 84  | 58  | 26  | 126 | 170 | 103 | 11  | 33  | 172 | 155 | 116 |
|      | 124 | 6   | 168 | 107 | 60  | 76  | 143 | 121 | 42  | 157 | 65  | 43  |
|      | 73  | 67  | 53  | 61  | 4   | 86  | 99  | 75  | 36  | 15  | 48  | 177 |
|      | 10  | 134 | 147 | 96  | 160 | 50  | 146 | 16  | 38  | 78  | 91  | 152 |
|      | 14  | 40  | 32  | 114 | 106 | 17  | 110 | 140 | 71  | 136 | 112 | 45  |
| 4/15 | 141 | 80  | 47  | 89  | 44  | 7   | 46  | 11  | 175 | 173 | 99  | 2   |
|      | 95  | 92  | 4   | 16  | 49  | 137 | 104 | 29  | 9   | 60  | 167 | 50  |
|      | 114 | 131 | 106 | 76  | 118 | 66  | 24  | 58  | 122 | 150 | 57  | 149 |
|      | 153 | 72  | 36  | 5   | 96  | 120 | 134 | 101 | 61  | 115 | 0   | 28  |
|      | 127 | 151 | 87  | 54  | 20  | 139 | 140 | 152 | 13  | 91  | 111 | 25  |
|      | 148 | 70  | 160 | 51  | 21  | 116 | 48  | 157 | 17  | 125 | 142 | 83  |

TABLE 11-continued

|  | | | | | | | | | | | | |
|---|---|---|---|---|---|---|---|---|---|---|---|---|
|  | 147 | 56 | 100 | 63 | 26 | 169 | 135 | 15 | 75 | 84 | 163 | 79 |
|  | 105 | 158 | 117 | 34 | 109 | 67 | 62 | 32 | 119 | 124 | 171 | 8 |
| 5/15 | 166 | 54 | 6 | 27 | 141 | 134 | 58 | 46 | 55 | 91 | 56 | 100 |
|  | 165 | 17 | 127 | 57 | 88 | 35 | 72 | 5 | 63 | 118 | 1 | 85 |
|  | 59 | 149 | 11 | 8 | 154 | 129 | 33 | 15 | 143 | 4 | 95 | 101 |
|  | 175 | 157 | 41 | 38 | 128 | 161 | 52 | 142 | 7 | 26 | 145 | 2 |
|  | 37 | 74 | 164 | 168 | 160 | 122 | 60 | 32 | 24 | 138 | 75 | 69 |
|  | 124 | 151 | 67 | 13 | 94 | 105 | 133 | 64 | 76 | 153 | 31 | 136 |
|  | 25 | 45 | 22 | 30 | 156 | 158 | 163 | 135 | 21 | 146 | 90 | 169 |
|  | 113 | 162 | 89 | 47 | 43 | 86 | 48 | 107 | 71 | 137 | 51 | 174 |
| 6/15 | 29 | 17 | 38 | 37 | 27 | 43 | 31 | 35 | 16 | 46 | 44 | 9 |
|  | 24 | 56 | 49 | 26 | 42 | 69 | 47 | 59 | 61 | 66 | 52 | 64 |
|  | 160 | 7 | 13 | 55 | 62 | 53 | 63 | 58 | 3 | 167 | 71 | 57 |
|  | 113 | 48 | 88 | 2 | 129 | 137 | 20 | 73 | 166 | 75 | 77 | 142 |
|  | 82 | 176 | 152 | 134 | 139 | 148 | 164 | 99 | 173 | 104 | 83 | 106 |
|  | 110 | 118 | 127 | 84 | 79 | 108 | 126 | 131 | 93 | 111 | 91 | 4 |
|  | 12 | 146 | 96 | 81 | 165 | 8 | 89 | 138 | 105 | 141 | 103 | 6 |
|  | 87 | 33 | 130 | 124 | 175 | 120 | 90 | 102 | 10 | 114 | 159 | 76 |
| 7/15 | 103 | 36 | 155 | 175 | 52 | 130 | 16 | 178 | 141 | 86 | 49 | 129 |
|  | 2 | 17 | 37 | 146 | 169 | 54 | 134 | 101 | 78 | 135 | 70 | 153 |
|  | 59 | 133 | 15 | 79 | 164 | 67 | 50 | 128 | 23 | 34 | 154 | 69 |
|  | 176 | 46 | 13 | 22 | 30 | 163 | 60 | 114 | 11 | 92 | 44 | 157 |
|  | 136 | 64 | 107 | 14 | 99 | 43 | 115 | 71 | 117 | 12 | 26 | 38 |
|  | 75 | 144 | 179 | 51 | 120 | 20 | 80 | 160 | 174 | 106 | 1 | 21 |
|  | 28 | 42 | 161 | 168 | 53 | 7 | 100 | 40 | 145 | 171 | 55 | 3 |
|  | 122 | 93 | 76 | 138 | 166 | 108 | 121 | 97 | 81 | 148 | 65 | 111 |
| 8/15 | 86 | 71 | 51 | 48 | 89 | 94 | 46 | 81 | 67 | 49 | 80 | 37 |
|  | 42 | 91 | 62 | 50 | 90 | 40 | 78 | 53 | 58 | 47 | 85 | 70 |
|  | 77 | 95 | 66 | 59 | 83 | 73 | 17 | 87 | 3 | 75 | 65 | 88 |
|  | 9 | 121 | 108 | 139 | 142 | 24 | 34 | 20 | 157 | 159 | 138 | 143 |
|  | 27 | 26 | 16 | 98 | 102 | 103 | 133 | 161 | 21 | 25 | 107 | 153 |
|  | 68 | 134 | 41 | 74 | 179 | 2 | 129 | 169 | 101 | 99 | 109 | 127 |
|  | 13 | 39 | 7 | 164 | 106 | 172 | 154 | 149 | 10 | 173 | 131 | 167 |
|  | 104 | 124 | 177 | 97 | 130 | 118 | 137 | 111 | 126 | 120 | 105 | 115 |
| 9/15 | 175 | 60 | 133 | 11 | 5 | 4 | 70 | 97 | 131 | 80 | 42 | 136 |
|  | 172 | 23 | 90 | 54 | 160 | 48 | 173 | 27 | 100 | 129 | 14 | 7 |
|  | 105 | 146 | 49 | 93 | 1 | 84 | 81 | 145 | 18 | 15 | 106 | 91 |
|  | 130 | 140 | 8 | 25 | 74 | 134 | 115 | 9 | 171 | 46 | 68 | 33 |
|  | 122 | 118 | 162 | 121 | 16 | 73 | 45 | 53 | 77 | 110 | 30 | 66 |
|  | 98 | 114 | 117 | 152 | 174 | 47 | 62 | 128 | 85 | 155 | 178 | 26 |
|  | 35 | 101 | 149 | 108 | 3 | 154 | 51 | 95 | 132 | 135 | 163 | 137 |
|  | 168 | 55 | 65 | 34 | 6 | 159 | 170 | 57 | 67 | 40 | 89 | 147 |
| 10/15 | 16 | 163 | 92 | 56 | 111 | 141 | 65 | 118 | 78 | 55 | 5 | 148 |
|  | 168 | 20 | 115 | 87 | 122 | 9 | 166 | 27 | 155 | 94 | 134 | 38 |
|  | 34 | 138 | 73 | 154 | 100 | 58 | 103 | 169 | 23 | 117 | 88 | 50 |
|  | 59 | 3 | 139 | 69 | 110 | 77 | 131 | 42 | 142 | 25 | 158 | 80 |
|  | 41 | 51 | 10 | 173 | 63 | 107 | 125 | 48 | 11 | 177 | 24 | 30 |
|  | 119 | 93 | 159 | 36 | 174 | 26 | 112 | 101 | 123 | 44 | 145 | 60 |
|  | 62 | 108 | 95 | 49 | 31 | 147 | 71 | 113 | 89 | 132 | 6 | 144 |
|  | 179 | 28 | 160 | 136 | 121 | 14 | 146 | 15 | 106 | 86 | 129 | 12 |
| 11/15 | 12 | 15 | 2 | 16 | 27 | 50 | 35 | 74 | 38 | 70 | 108 | 32 |
|  | 138 | 144 | 150 | 156 | 162 | 168 | 174 | 0 | 14 | 9 | 5 | 23 |
|  | 81 | 99 | 53 | 55 | 103 | 95 | 133 | 139 | 145 | 151 | 157 | 163 |
|  | 46 | 65 | 129 | 107 | 75 | 119 | 110 | 31 | 43 | 97 | 78 | 125 |
|  | 6 | 8 | 24 | 44 | 101 | 94 | 118 | 130 | 69 | 71 | 83 | 34 |
|  | 153 | 159 | 165 | 171 | 177 | 3 | 20 | 7 | 17 | 25 | 87 | 41 |
|  | 113 | 92 | 51 | 98 | 136 | 142 | 148 | 154 | 160 | 166 | 172 | 178 |
|  | 114 | 93 | 82 | 111 | 109 | 67 | 79 | 123 | 64 | 76 | 33 | 137 |
| 12/15 | 83 | 93 | 94 | 47 | 55 | 40 | 38 | 77 | 110 | 124 | 87 | 61 |
|  | 37 | 10 | 95 | 139 | 131 | 44 | 57 | 97 | 53 | 142 | 0 | 136 |
|  | 101 | 79 | 22 | 68 | 73 | 23 | 18 | 81 | 98 | 112 | 8 | 128 |
|  | 82 | 113 | 134 | 52 | 105 | 78 | 27 | 135 | 96 | 56 | 140 | 64 |
|  | 29 | 133 | 106 | 117 | 127 | 32 | 42 | 58 | 71 | 118 | 51 | 84 |
|  | 116 | 123 | 114 | 70 | 107 | 178 | 145 | 173 | 36 | 144 | 130 | 176 |
|  | 165 | 161 | 151 | 119 | 122 | 152 | 157 | 4 | 137 | 148 | 153 | 170 |
|  | 147 | 146 | 1 | 149 | 158 | 179 | 12 | 5 | 160 | 177 | 60 | 24 |
| 13/15 | 146 | 91 | 63 | 144 | 46 | 12 | 58 | 137 | 25 | 79 | 70 | 33 |
|  | 23 | 133 | 153 | 128 | 86 | 152 | 106 | 53 | 93 | 61 | 5 | 158 |
|  | 151 | 114 | 113 | 43 | 138 | 89 | 159 | 17 | 120 | 136 | 102 | 81 |
|  | 40 | 174 | 6 | 131 | 48 | 18 | 1 | 179 | 34 | 123 | 77 | 26 |
|  | 140 | 87 | 175 | 115 | 4 | 101 | 69 | 80 | 169 | 75 | 49 | 97 |
|  | 42 | 28 | 32 | 171 | 119 | 55 | 94 | 65 | 20 | 165 | 3 | 47 |
|  | 127 | 100 | 110 | 31 | 167 | 13 | 122 | 145 | 71 | 22 | 173 | 116 |
|  | 107 | 9 | 98 | 74 | 45 | 161 | 112 | 50 | 99 | 24 | 35 | 164 |

| Code Rate | Order of group-wise interleaving $\pi(j)$ $(0 \leq j < 180)$ | | | | | | | | | | |
|---|---|---|---|---|---|---|---|---|---|---|---|
|  | 12 | 13 | 14 | 15 | 16 | 17 | 18 | 19 | 20 | 21 | 22 |
|  | 35 | 36 | 37 | 38 | 39 | 40 | 41 | 42 | 43 | 44 | 45 |

TABLE 11-continued

|       | 58  | 59  | 60  | 61  | 62  | 63  | 64  | 65  | 66  | 67  | 68  |
|-------|-----|-----|-----|-----|-----|-----|-----|-----|-----|-----|-----|
|       |     | 81  | 82  | 83  | 84  | 85  | 86  | 87  | 88  | 89  | 90  | 91 |
|       |     | 104 | 105 | 106 | 107 | 108 | 109 | 110 | 111 | 112 | 113 | 114 |
|       |     | 127 | 128 | 129 | 130 | 131 | 132 | 133 | 134 | 135 | 136 | 137 |
|       |     | 150 | 151 | 152 | 153 | 154 | 155 | 156 | 157 | 158 | 159 | 160 |
|       |     | 173 | 174 | 175 | 176 | 177 | 178 | 179 |     |     |     |     |
| 2/15  | 130 | 167 | 121 | 126 | 137 | 158 | 132 | 82  | 138 | 128 | 89  |
|       | 148 | 40  | 87  | 0   | 80  | 49  | 24  | 78  | 101 | 43  | 112 |
|       | 95  | 91  | 13  | 35  | 127 | 61  | 60  | 139 | 44  | 59  | 55  |
|       | 62  | 175 | 141 | 171 | 51  | 155 | 76  | 150 | 174 | 58  | 143 |
|       | 176 | 124 | 151 | 106 | 46  | 163 | 179 | 4   | 18  | 144 | 178 |
|       | 54  | 74  | 65  | 110 | 122 | 169 | 64  | 111 | 119 | 42  | 85  |
|       | 92  | 15  | 159 | 134 | 99  | 96  | 117 | 38  | 9   | 26  | 164 |
|       | 36  | 90  | 160 | 2   | 33  | 39  | 108 |     |     |     |     |
| 3/15  | 133 | 109 | 31  | 59  | 18  | 148 | 9   | 105 | 57  | 132 | 102 |
|       | 108 | 52  | 159 | 24  | 89  | 117 | 88  | 178 | 113 | 98  | 179 |
|       | 44  | 80  | 87  | 111 | 145 | 23  | 85  | 166 | 83  | 55  | 154 |
|       | 169 | 142 | 70  | 161 | 47  | 3   | 162 | 77  | 19  | 28  | 97  |
|       | 173 | 56  | 171 | 90  | 131 | 119 | 94  | 5   | 68  | 138 | 149 |
|       | 167 | 174 | 51  | 176 | 81  | 120 | 158 | 123 | 34  | 49  | 128 |
|       | 46  | 127 | 27  | 175 | 135 | 79  | 125 | 82  | 2   | 129 | 153 |
|       | 64  | 29  | 69  | 118 | 66  | 37  | 165 |     |     |     |     |
| 4/15  | 155 | 52  | 86  | 128 | 174 | 33  | 170 | 31  | 35  | 162 | 64  |
|       | 23  | 43  | 176 | 121 | 71  | 132 | 103 | 144 | 39  | 12  | 90  |
|       | 93  | 53  | 14  | 73  | 165 | 82  | 126 | 97  | 59  | 133 | 154 |
|       | 42  | 18  | 145 | 156 | 85  | 146 | 6   | 161 | 10  | 22  | 138 |
|       | 123 | 77  | 78  | 69  | 3   | 177 | 41  | 81  | 19  | 107 | 45  |
|       | 110 | 37  | 98  | 179 | 129 | 168 | 172 | 1   | 40  | 166 | 159 |
|       | 143 | 113 | 94  | 74  | 102 | 30  | 38  | 178 | 68  | 108 | 136 |
|       | 55  | 65  | 130 | 88  | 112 | 27  | 164 |     |     |     |     |
| 5/15  | 172 | 80  | 18  | 152 | 12  | 108 | 170 | 29  | 144 | 147 | 106 |
|       | 77  | 61  | 62  | 84  | 159 | 92  | 102 | 98  | 177 | 132 | 139 |
|       | 53  | 42  | 40  | 9   | 111 | 130 | 123 | 82  | 81  | 114 | 119 |
|       | 68  | 28  | 126 | 121 | 70  | 16  | 65  | 83  | 125 | 50  | 79  |
|       | 0   | 36  | 97  | 117 | 14  | 109 | 173 | 120 | 112 | 87  | 176 |
|       | 140 | 150 | 39  | 96  | 66  | 3   | 115 | 20  | 99  | 171 | 49  |
|       | 78  | 93  | 178 | 116 | 19  | 155 | 110 | 73  | 104 | 167 | 44  |
|       | 103 | 131 | 179 | 148 | 10  | 23  | 34  |     |     |     |     |
| 6/15  | 23  | 1   | 34  | 45  | 14  | 18  | 156 | 19  | 22  | 40  | 50  |
|       | 65  | 67  | 54  | 170 | 68  | 132 | 51  | 70  | 41  | 21  | 5   |
|       | 151 | 60  | 36  | 25  | 74  | 39  | 32  | 72  | 85  | 86  | 107 |
|       | 174 | 15  | 149 | 28  | 145 | 92  | 169 | 30  | 133 | 163 | 119 |
|       | 112 | 135 | 153 | 0   | 128 | 144 | 98  | 171 | 94  | 97  | 143 |
|       | 125 | 162 | 157 | 158 | 109 | 140 | 123 | 154 | 150 | 80  | 11  |
|       | 100 | 161 | 172 | 78  | 101 | 115 | 179 | 147 | 116 | 136 | 122 |
|       | 177 | 178 | 121 | 168 | 95  | 117 | 155 |     |     |     |     |
| 7/15  | 73  | 84  | 142 | 177 | 110 | 8   | 96  | 77  | 139 | 167 | 109 |
|       | 6   | 29  | 41  | 143 | 63  | 47  | 124 | 90  | 31  | 152 | 98  |
|       | 45  | 9   | 27  | 35  | 156 | 170 | 113 | 127 | 102 | 82  | 149 |
|       | 74  | 48  | 132 | 24  | 87  | 140 | 66  | 118 | 123 | 104 | 89  |
|       | 147 | 62  | 57  | 131 | 94  | 33  | 151 | 172 | 116 | 10  | 25  |
|       | 88  | 137 | 61  | 105 | 5   | 18  | 32  | 158 | 72  | 56  | 125 |
|       | 95  | 83  | 162 | 173 | 119 | 126 | 91  | 39  | 150 | 165 | 112 |
|       | 4   | 19  | 85  | 159 | 68  | 58  | 0   |     |     |     |     |
| 8/15  | 55  | 61  | 36  | 57  | 52  | 92  | 60  | 82  | 76  | 72  | 44  |
|       | 4   | 69  | 43  | 54  | 84  | 93  | 38  | 8   | 64  | 6   | 18  |
|       | 79  | 14  | 151 | 117 | 32  | 22  | 123 | 30  | 33  | 162 | 144 |
|       | 29  | 140 | 163 | 150 | 175 | 114 | 31  | 12  | 35  | 145 | 28  |
|       | 45  | 156 | 23  | 125 | 141 | 56  | 166 | 5   | 1   | 170 | 119 |
|       | 168 | 176 | 11  | 0   | 122 | 110 | 113 | 146 | 132 | 165 | 19  |
|       | 63  | 147 | 155 | 100 | 171 | 158 | 160 | 15  | 178 | 148 | 152 |
|       | 136 | 112 | 96  | 135 | 116 | 174 | 128 |     |     |     |     |
| 9/15  | 50  | 104 | 32  | 75  | 176 | 87  | 109 | 61  | 39  | 107 | 0   |
|       | 142 | 20  | 103 | 38  | 126 | 157 | 144 | 21  | 64  | 44  | 79  |
|       | 12  | 169 | 63  | 71  | 125 | 37  | 120 | 138 | 17  | 113 | 31  |
|       | 116 | 2   | 179 | 52  | 92  | 36  | 78  | 164 | 177 | 24  | 72  |
|       | 29  | 76  | 158 | 148 | 111 | 94  | 43  | 83  | 139 | 10  | 56  |
|       | 96  | 41  | 82  | 150 | 143 | 58  | 69  | 127 | 86  | 13  | 141 |
|       | 28  | 102 | 123 | 112 | 151 | 167 | 59  | 19  | 156 | 119 | 153 |
|       | 165 | 22  | 99  | 124 | 88  | 161 | 166 |     |     |     |     |
| 10/15 | 19  | 153 | 75  | 128 | 32  | 178 | 22  | 156 | 99  | 124 | 4   |
|       | 137 | 67  | 161 | 90  | 127 | 43  | 171 | 64  | 162 | 98  | 133 |
|       | 13  | 175 | 68  | 39  | 102 | 54  | 37  | 149 | 29  | 150 | 104 |
|       | 47  | 35  | 143 | 72  | 151 | 84  | 57  | 8   | 176 | 61  | 46  |
|       | 91  | 76  | 109 | 140 | 74  | 114 | 82  | 120 | 1   | 79  | 66  |
|       | 157 | 97  | 45  | 33  | 167 | 70  | 152 | 85  | 126 | 40  | 135 |
|       | 18  | 105 | 83  | 130 | 2   | 172 | 17  | 164 | 81  | 52  | 7   |
|       | 170 | 21  | 116 | 96  | 53  | 0   | 165 |     |     |     |     |
| 11/15 | 112 | 54  | 30  | 122 | 72  | 116 | 36  | 90  | 49  | 85  | 132 |
|       | 66  | 68  | 52  | 96  | 117 | 84  | 128 | 100 | 63  | 60  | 127 |

TABLE 11-continued

|  | | | | | | | | | | | |
|---|---|---|---|---|---|---|---|---|---|---|---|
| | 169 | 175 | 10 | 22 | 13 | 11 | 28 | 104 | 37 | 57 | 115 |
| | 58 | 134 | 140 | 146 | 152 | 158 | 164 | 170 | 176 | 4 | 19 |
| | 86 | 124 | 48 | 106 | 89 | 40 | 102 | 91 | 135 | 141 | 147 |
| | 120 | 47 | 80 | 59 | 62 | 88 | 45 | 56 | 131 | 61 | 126 |
| | 21 | 18 | 1 | 26 | 29 | 39 | 73 | 121 | 105 | 77 | 42 |
| | 143 | 149 | 155 | 161 | 167 | 173 | 179 | | | | |
| 12/15 | 102 | 76 | 33 | 35 | 92 | 59 | 74 | 11 | 138 | 72 | 67 |
| | 9 | 143 | 86 | 100 | 21 | 15 | 75 | 62 | 19 | 65 | 129 |
| | 103 | 25 | 43 | 126 | 54 | 90 | 28 | 109 | 46 | 91 | 41 |
| | 66 | 89 | 34 | 120 | 108 | 63 | 45 | 69 | 121 | 88 | 39 |
| | 85 | 80 | 104 | 132 | 111 | 30 | 26 | 48 | 50 | 31 | 141 |
| | 171 | 175 | 125 | 99 | 162 | 159 | 20 | 164 | 115 | 169 | 172 |
| | 154 | 166 | 13 | 150 | 16 | 167 | 174 | 163 | 49 | 6 | 168 |
| | 156 | 7 | 155 | 17 | 3 | 2 | 14 | | | | |
| 13/15 | 134 | 148 | 66 | 38 | 163 | 118 | 139 | 130 | 72 | 92 | 160 |
| | 172 | 121 | 135 | 44 | 149 | 168 | 0 | 124 | 143 | 27 | 30 |
| | 170 | 176 | 142 | 104 | 21 | 78 | 155 | 8 | 52 | 95 | 62 |
| | 84 | 157 | 85 | 56 | 147 | 67 | 76 | 162 | 10 | 51 | 103 |
| | 154 | 83 | 14 | 2 | 132 | 96 | 16 | 37 | 166 | 109 | 54 |
| | 90 | 117 | 88 | 177 | 11 | 59 | 68 | 73 | 41 | 150 | 111 |
| | 126 | 141 | 29 | 39 | 178 | 57 | 125 | 36 | 19 | 7 | 156 |
| | 64 | 129 | 15 | 60 | 82 | 108 | 105 | | | | |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 64800 and modulates bits by the 256-QAM in the constellation mapper 430.

In this case, the group interleaver 422 may perform the interleaving using $\pi(j)$ defined by the Table 12.

TABLE 12

| Code Rate | Order of group-wise interleaving $\pi(j)$ ($0 \leq j < 180$) | | | | | | | | | | | | | |
|---|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 2/15 | 112 | 78 | 104 | 6 | 59 | 80 | 49 | 120 | 114 | 27 | 113 | 3 | 109 | 44 |
| | 8 | 47 | 176 | 117 | 68 | 122 | 148 | 79 | 73 | 7 | 166 | 51 | 50 | 116 |
| | 24 | 35 | 55 | 38 | 88 | 54 | 2 | 15 | 19 | 67 | 101 | 74 | 169 | 138 |
| | 135 | 123 | 25 | 140 | 156 | 58 | 33 | 119 | 111 | 146 | 129 | 150 | 147 | 97 |
| | 13 | 5 | 108 | 145 | 23 | 70 | 20 | 173 | 159 | 100 | 128 | 172 | 170 | 1 |
| | 92 | 131 | 75 | 155 | 14 | 9 | 149 | 63 | 11 | 134 | 53 | 99 | 17 | 57 |
| | 124 | 46 | 171 | 141 | 133 | 85 | 177 | 132 | 26 | 160 | 42 | 34 | 82 | 96 |
| | 52 | 28 | 126 | 143 | 167 | 76 | 86 | 130 | 110 | 174 | 16 | 165 | 56 | 84 |
| 3/15 | 136 | 28 | 85 | 38 | 40 | 89 | 133 | 117 | 3 | 58 | 154 | 77 | 14 | 179 |
| | 66 | 109 | 126 | 10 | 155 | 70 | 157 | 105 | 175 | 67 | 158 | 32 | 42 | 147 |
| | 90 | 174 | 13 | 47 | 76 | 88 | 86 | 108 | 27 | 18 | 12 | 8 | 61 | 145 |
| | 98 | 176 | 29 | 68 | 168 | 124 | 21 | 35 | 150 | 131 | 159 | 163 | 84 | 23 |
| | 46 | 94 | 80 | 129 | 142 | 128 | 148 | 111 | 134 | 173 | 60 | 118 | 2 | 170 |
| | 114 | 91 | 78 | 107 | 172 | 25 | 36 | 164 | 149 | 153 | 110 | 44 | 146 | 82 |
| | 79 | 141 | 138 | 122 | 53 | 160 | 81 | 16 | 100 | 130 | 71 | 121 | 132 | 9 |
| | 151 | 161 | 63 | 55 | 139 | 166 | 97 | 19 | 51 | 72 | 167 | 106 | 48 | 144 |
| 4/15 | 13 | 121 | 137 | 29 | 27 | 1 | 70 | 116 | 35 | 132 | 109 | 51 | 55 | 58 |
| | 21 | 127 | 52 | 90 | 22 | 100 | 123 | 69 | 112 | 155 | 92 | 151 | 59 | 5 |
| | 124 | 78 | 166 | 8 | 61 | 97 | 120 | 103 | 4 | 19 | 64 | 79 | 28 | 134 |
| | 17 | 150 | 76 | 42 | 39 | 23 | 153 | 95 | 66 | 50 | 141 | 176 | 34 | 161 |
| | 144 | 54 | 115 | 146 | 101 | 172 | 114 | 119 | 3 | 96 | 133 | 99 | 167 | 164 |
| | 38 | 143 | 159 | 130 | 84 | 169 | 18 | 138 | 102 | 72 | 47 | 32 | 160 | 82 |
| | 62 | 178 | 48 | 163 | 117 | 110 | 91 | 37 | 80 | 105 | 31 | 174 | 111 | 49 |
| | 177 | 154 | 6 | 162 | 129 | 77 | 36 | 165 | 20 | 89 | 140 | 15 | 33 | 104 |
| 5/15 | 39 | 45 | 128 | 84 | 143 | 148 | 2 | 75 | 43 | 50 | 130 | 87 | 137 | 151 |
| | 177 | 37 | 124 | 99 | 83 | 23 | 159 | 0 | 176 | 41 | 121 | 96 | 89 | 30 |
| | 14 | 179 | 62 | 48 | 129 | 105 | 146 | 160 | 16 | 174 | 33 | 54 | 132 | 112 |
| | 165 | 4 | 67 | 36 | 44 | 101 | 81 | 141 | 156 | 3 | 175 | 58 | 47 | 91 |
| | 26 | 167 | 1 | 173 | 38 | 116 | 131 | 107 | 138 | 162 | 8 | 72 | 42 | 115 |
| | 110 | 28 | 147 | 19 | 169 | 61 | 46 | 97 | 106 | 144 | 164 | 5 | 70 | 59 |
| | 126 | 111 | 29 | 155 | 15 | 170 | 57 | 120 | 125 | 80 | 142 | 168 | 11 | 68 |
| | 122 | 93 | 86 | 25 | 163 | 20 | 79 | 35 | 114 | 135 | 109 | 22 | 157 | 12 |
| 6/15 | 99 | 100 | 15 | 107 | 54 | 76 | 153 | 174 | 61 | 0 | 36 | 71 | 62 | 137 |
| | 117 | 35 | 93 | 43 | 90 | 154 | 73 | 150 | 165 | 23 | 16 | 91 | 5 | 169 |
| | 110 | 80 | 58 | 55 | 40 | 103 | 159 | 83 | 127 | 111 | 155 | 167 | 11 | 52 |
| | 6 | 131 | 29 | 51 | 21 | 17 | 45 | 126 | 12 | 3 | 168 | 41 | 30 | 37 |

TABLE 12-continued

| Code Rate | | | | | | | | | | | | | | |
|---|---|---|---|---|---|---|---|---|---|---|---|---|---|---|
| | 14 | 60 | 82 | 134 | 25 | 33 | 50 | 84 | 28 | 105 | 123 | 145 | 7 | 27 |
| | 63 | 101 | 18 | 66 | 129 | 24 | 4 | 119 | 87 | 42 | 170 | 143 | 121 | 38 |
| | 69 | 53 | 130 | 104 | 161 | 75 | 141 | 9 | 47 | 79 | 162 | 146 | 124 | 157 |
| | 13 | 85 | 88 | 135 | 144 | 173 | 163 | 20 | 46 | 97 | 94 | 139 | 172 | 72 |
| 7/15 | 24 | 157 | 0 | 43 | 126 | 172 | 135 | 65 | 32 | 18 | 114 | 42 | 162 | 67 |
| | 58 | 79 | 154 | 3 | 95 | 168 | 73 | 103 | 60 | 84 | 148 | 113 | 40 | 164 |
| | 138 | 53 | 85 | 12 | 117 | 36 | 122 | 66 | 107 | 64 | 28 | 147 | 2 | 90 |
| | 176 | 106 | 59 | 80 | 19 | 6 | 92 | 129 | 174 | 99 | 62 | 82 | 13 | 121 |
| | 159 | 69 | 142 | 52 | 77 | 21 | 119 | 38 | 167 | 178 | 101 | 56 | 87 | 155 |
| | 88 | 165 | 177 | 108 | 47 | 27 | 149 | 115 | 33 | 161 | 72 | 102 | 57 | 86 |
| | 8 | 93 | 130 | 170 | 133 | 44 | 78 | 150 | 118 | 94 | 158 | 76 | 134 | 46 |
| | 17 | 116 | 34 | 125 | 175 | 105 | 45 | 30 | 153 | 10 | 98 | 124 | 74 | 137 |
| 8/15 | 85 | 3 | 148 | 161 | 96 | 99 | 154 | 13 | 78 | 160 | 61 | 36 | 21 | 141 |
| | 139 | 46 | 10 | 56 | 67 | 108 | 134 | 111 | 105 | 66 | 89 | 137 | 130 | 104 |
| | 117 | 146 | 53 | 2 | 60 | 93 | 91 | 71 | 114 | 19 | 47 | 4 | 26 | 75 |
| | 42 | 170 | 62 | 80 | 164 | 65 | 128 | 12 | 142 | 167 | 155 | 88 | 8 | 22 |
| | 102 | 140 | 173 | 147 | 83 | 165 | 30 | 126 | 100 | 138 | 171 | 103 | 45 | 159 |
| | 124 | 94 | 133 | 172 | 149 | 86 | 77 | 25 | 68 | 177 | 64 | 174 | 15 | 0 |
| | 55 | 28 | 101 | 150 | 110 | 18 | 119 | 5 | 29 | 76 | 107 | 136 | 112 | 144 |
| | 166 | 23 | 129 | 79 | 37 | 175 | 152 | 87 | 6 | 58 | 127 | 98 | 123 | 39 |
| 9/15 | 58 | 70 | 23 | 32 | 26 | 63 | 55 | 48 | 35 | 41 | 53 | 20 | 38 | 51 |
| | 104 | 106 | 89 | 27 | 0 | 119 | 21 | 4 | 49 | 46 | 100 | 13 | 36 | 57 |
| | 101 | 15 | 91 | 25 | 93 | 132 | 69 | 87 | 47 | 59 | 67 | 124 | 17 | 11 |
| | 92 | 56 | 30 | 34 | 60 | 107 | 24 | 52 | 94 | 64 | 5 | 71 | 90 | 66 |
| | 28 | 130 | 14 | 162 | 144 | 166 | 108 | 153 | 115 | 135 | 120 | 122 | 112 | 139 |
| | 81 | 105 | 128 | 116 | 150 | 155 | 76 | 18 | 142 | 170 | 175 | 83 | 146 | 78 |
| | 137 | 152 | 3 | 173 | 148 | 72 | 158 | 117 | 1 | 6 | 12 | 8 | 161 | 74 |
| | 160 | 111 | 10 | 149 | 80 | 75 | 165 | 157 | 174 | 129 | 145 | 114 | 125 | 154 |
| 10/15 | 45 | 31 | 67 | 35 | 159 | 157 | 177 | 2 | 44 | 23 | 73 | 148 | 163 | 118 |
| | 3 | 12 | 32 | 140 | 42 | 167 | 166 | 41 | 126 | 13 | 30 | 144 | 57 | 113 |
| | 104 | 174 | 11 | 151 | 71 | 109 | 162 | 79 | 171 | 127 | 46 | 92 | 38 | 132 |
| | 139 | 99 | 125 | 48 | 93 | 135 | 161 | 77 | 110 | 107 | 121 | 18 | 95 | 69 |
| | 86 | 116 | 172 | 130 | 49 | 25 | 40 | 65 | 87 | 108 | 101 | 5 | 21 | 89 |
| | 34 | 160 | 155 | 175 | 124 | 15 | 28 | 134 | 62 | 119 | 145 | 72 | 10 | 58 |
| | 137 | 56 | 165 | 115 | 114 | 0 | 47 | 27 | 22 | 20 | 168 | 154 | 102 | 123 |
| | 90 | 70 | 138 | 84 | 117 | 178 | 122 | 19 | 96 | 156 | 55 | 78 | 158 | 169 |
| 11/15 | 27 | 68 | 35 | 117 | 138 | 83 | 127 | 10 | 60 | 73 | 47 | 115 | 155 | 81 |
| | 161 | 22 | 20 | 39 | 106 | 147 | 90 | 126 | 165 | 23 | 16 | 45 | 113 | 154 |
| | 128 | 163 | 31 | 72 | 33 | 101 | 134 | 80 | 175 | 7 | 61 | 19 | 49 | 111 |
| | 89 | 129 | 8 | 28 | 15 | 34 | 105 | 146 | 84 | 174 | 4 | 32 | 75 | 44 |
| | 141 | 87 | 131 | 157 | 63 | 11 | 48 | 108 | 151 | 79 | 177 | 168 | 26 | 17 |
| | 120 | 153 | 97 | 121 | 0 | 55 | 14 | 46 | 114 | 152 | 91 | 178 | 3 | 30 |
| | 51 | 99 | 144 | 85 | 123 | 162 | 56 | 12 | 53 | 119 | 139 | 78 | 179 | 5 |
| | 69 | 38 | 109 | 143 | 88 | 124 | 160 | 59 | 67 | 41 | 104 | 149 | 98 | 176 |
| 12/15 | 51 | 122 | 91 | 111 | 95 | 100 | 119 | 130 | 78 | 57 | 65 | 26 | 61 | 126 |
| | 14 | 3 | 21 | 71 | 134 | 2 | 0 | 140 | 106 | 7 | 118 | 23 | 35 | 20 |
| | 129 | 107 | 30 | 45 | 137 | 114 | 37 | 87 | 53 | 85 | 101 | 141 | 120 | 99 |
| | 97 | 38 | 124 | 86 | 33 | 74 | 32 | 29 | 128 | 67 | 104 | 80 | 127 | 56 |
| | 54 | 40 | 81 | 103 | 121 | 76 | 44 | 84 | 96 | 123 | 154 | 98 | 82 | 142 |
| | 36 | 59 | 90 | 79 | 52 | 133 | 60 | 92 | 139 | 110 | 27 | 73 | 43 | 77 |
| | 164 | 158 | 157 | 160 | 150 | 171 | 167 | 145 | 151 | 153 | 9 | 155 | 170 | 146 |
| | 148 | 172 | 178 | 24 | 22 | 179 | 4 | 163 | 174 | 173 | 19 | 10 | 177 | 12 |
| 13/15 | 59 | 85 | 108 | 128 | 49 | 91 | 163 | 3 | 58 | 16 | 106 | 126 | 74 | 141 |
| | 42 | 62 | 21 | 102 | 131 | 52 | 142 | 157 | 10 | 55 | 79 | 24 | 130 | 73 |
| | 159 | 43 | 148 | 19 | 23 | 111 | 76 | 135 | 169 | 39 | 63 | 77 | 25 | 117 |
| | 138 | 158 | 38 | 64 | 86 | 105 | 118 | 50 | 137 | 175 | 7 | 144 | 84 | 22 |
| | 51 | 139 | 156 | 37 | 147 | 78 | 103 | 115 | 66 | 97 | 168 | 34 | 60 | 83 |
| | 124 | 71 | 136 | 154 | 0 | 150 | 20 | 101 | 112 | 70 | 96 | 170 | 1 | 149 |
| | 29 | 116 | 72 | 88 | 165 | 8 | 143 | 12 | 31 | 119 | 47 | 89 | 164 | 40 |
| | 15 | 100 | 129 | 67 | 133 | 166 | 41 | 56 | 18 | 32 | 120 | 69 | 132 | 161 |

| Code Rate | Order of group-wise interleaving $\pi(j)$ $(0 \leq j < 180)$ | | | | | | | |
|---|---|---|---|---|---|---|---|---|
| | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |
| | 129 | 130 | 131 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 2/15 | 69 | 164 | 91 | 137 | 39 | 31 | 21 | 127 | 151 |
| | 66 | 152 | 61 | 29 | 107 | 22 | 154 | 118 | 94 |
| | 41 | 162 | 175 | 136 | 62 | 161 | 121 | 163 | 115 |
| | 18 | 60 | 4 | 81 | 168 | 43 | 105 | 36 | 65 |
| | 37 | 83 | 102 | 103 | 157 | 139 | 179 | 32 | 144 |
| | 90 | 30 | 98 | 64 | 40 | 87 | 158 | 77 | 93 |
| | 48 | 10 | 142 | 125 | 178 | 153 | 72 | 45 | 89 |
| | 95 | 0 | 106 | 12 | 71 | | | | |

TABLE 12-continued

| | | | | | | | | | |
|---|---|---|---|---|---|---|---|---|---|
| 3/15 | 96 | 101 | 26 | 169 | 37 | 83 | 162 | 165 | 24 |
| | 140 | 30 | 7 | 92 | 59 | 119 | 56 | 0 | 5 |
| | 75 | 125 | 112 | 69 | 120 | 137 | 116 | 20 | 178 |
| | 123 | 65 | 103 | 93 | 99 | 102 | 31 | 64 | 74 |
| | 135 | 1 | 115 | 143 | 95 | 177 | 73 | 43 | 11 |
| | 127 | 45 | 33 | 50 | 41 | 52 | 156 | 34 | 4 |
| | 22 | 113 | 6 | 152 | 15 | 171 | 17 | 57 | 49 |
| | 87 | 104 | 62 | 54 | 39 | | | | |
| 4/15 | 11 | 67 | 136 | 25 | 145 | 7 | 75 | 107 | 45 |
| | 179 | 44 | 87 | 56 | 139 | 65 | 170 | 46 | 0 |
| | 93 | 86 | 60 | 135 | 126 | 53 | 63 | 14 | 122 |
| | 26 | 106 | 10 | 43 | 85 | 131 | 2 | 147 | 148 |
| | 9 | 142 | 68 | 149 | 94 | 83 | 16 | 175 | 73 |
| | 81 | 168 | 30 | 12 | 173 | 156 | 158 | 125 | 98 |
| | 113 | 108 | 74 | 157 | 128 | 24 | 118 | 40 | 88 |
| | 152 | 71 | 171 | 57 | 41 | | | | |
| 5/15 | 7 | 71 | 55 | 51 | 133 | 90 | 140 | 149 | 6 |
| | 161 | 18 | 172 | 60 | 49 | 134 | 104 | 139 | 166 |
| | 145 | 150 | 9 | 77 | 34 | 117 | 92 | 82 | 136 |
| | 102 | 32 | 158 | 13 | 178 | 63 | 118 | 100 | 85 |
| | 98 | 108 | 24 | 152 | 17 | 171 | 64 | 123 | 94 |
| | 53 | 127 | 88 | 31 | 153 | 10 | 73 | 66 | 119 |
| | 56 | 52 | 95 | 103 | 27 | 154 | 21 | 78 | 40 |
| | 69 | 65 | 74 | 76 | 113 | | | | |
| 6/15 | 108 | 114 | 65 | 98 | 151 | 19 | 112 | 109 | 152 |
| | 175 | 120 | 149 | 26 | 59 | 49 | 56 | 156 | 136 |
| | 116 | 142 | 133 | 1 | 2 | 96 | 77 | 86 | 122 |
| | 64 | 164 | 78 | 8 | 118 | 113 | 39 | 48 | 140 |
| | 34 | 92 | 115 | 147 | 74 | 10 | 68 | 102 | 67 |
| | 57 | 95 | 148 | 89 | 81 | 158 | 171 | 32 | 22 |
| | 70 | 106 | 31 | 132 | 166 | 128 | 138 | 125 | 44 |
| | 160 | 176 | 177 | 178 | 179 | | | | |
| 7/15 | 104 | 61 | 23 | 11 | 4 | 96 | 163 | 75 | 109 |
| | 173 | 143 | 49 | 29 | 156 | 7 | 89 | 132 | 179 |
| | 131 | 70 | 144 | 55 | 26 | 15 | 112 | 35 | 128 |
| | 41 | 127 | 71 | 139 | 63 | 25 | 151 | 9 | 39 |
| | 5 | 91 | 166 | 169 | 146 | 50 | 81 | 20 | 111 |
| | 16 | 110 | 97 | 123 | 68 | 100 | 48 | 31 | 14 |
| | 83 | 152 | 1 | 37 | 160 | 171 | 136 | 54 | 22 |
| | 51 | 120 | 141 | 140 | 145 | | | | |
| 8/15 | 121 | 115 | 82 | 1 | 59 | 72 | 43 | 135 | 168 |
| | 143 | 113 | 11 | 84 | 157 | 32 | 73 | 90 | 38 |
| | 109 | 41 | 50 | 153 | 54 | 163 | 31 | 24 | 106 |
| | 131 | 158 | 33 | 178 | 145 | 70 | 9 | 51 | 69 |
| | 27 | 74 | 97 | 122 | 120 | 16 | 52 | 162 | 132 |
| | 125 | 63 | 35 | 34 | 40 | 179 | 20 | 44 | 7 |
| | 48 | 81 | 57 | 49 | 92 | 95 | 118 | 17 | 156 |
| | 14 | 116 | 169 | 176 | 151 | | | | |
| 9/15 | 61 | 65 | 44 | 29 | 7 | 2 | 113 | 68 | 96 |
| | 98 | 102 | 9 | 42 | 39 | 33 | 62 | 22 | 95 |
| | 31 | 43 | 40 | 37 | 85 | 50 | 97 | 140 | 45 |
| | 103 | 88 | 86 | 84 | 19 | 169 | 159 | 147 | 126 |
| | 151 | 156 | 16 | 172 | 164 | 123 | 99 | 54 | 136 |
| | 109 | 73 | 131 | 127 | 82 | 167 | 77 | 110 | 79 |
| | 143 | 133 | 168 | 171 | 134 | 163 | 138 | 121 | 141 |
| | 118 | 176 | 177 | 178 | 179 | | | | |
| 10/15 | 176 | 4 | 14 | 97 | 142 | 37 | 143 | 149 | 179 |
| | 147 | 173 | 6 | 52 | 24 | 39 | 64 | 80 | 112 |
| | 81 | 120 | 100 | 1 | 53 | 88 | 76 | 60 | 103 |
| | 63 | 83 | 111 | 170 | 7 | 16 | 98 | 141 | 61 |
| | 75 | 43 | 82 | 146 | 105 | 128 | 17 | 29 | 106 |
| | 91 | 74 | 36 | 68 | 150 | 8 | 9 | 54 | 26 |
| | 50 | 94 | 66 | 33 | 85 | 59 | 164 | 131 | 51 |
| | 129 | 133 | 152 | 136 | 153 | | | | |
| 11/15 | 170 | 9 | 65 | 66 | 52 | 112 | 150 | 77 | 171 |
| | 86 | 173 | 158 | 24 | 71 | 40 | 107 | 136 | 94 |
| | 135 | 92 | 130 | 6 | 62 | 74 | 43 | 116 | 133 |
| | 118 | 132 | 96 | 169 | 159 | 58 | 18 | 42 | 100 |
| | 36 | 102 | 137 | 95 | 122 | 1 | 25 | 21 | 50 |
| | 13 | 37 | 103 | 145 | 82 | 125 | 166 | 57 | 76 |
| | 64 | 70 | 54 | 110 | 148 | 93 | 172 | 164 | 29 |
| | 2 | 167 | 156 | 140 | 142 | | | | |
| 12/15 | 105 | 143 | 70 | 132 | 39 | 102 | 115 | 116 | 6 |
| | 17 | 50 | 48 | 112 | 13 | 66 | 5 | 75 | 42 |
| | 88 | 117 | 64 | 28 | 135 | 138 | 108 | 113 | 58 |
| | 34 | 89 | 94 | 49 | 55 | 93 | 136 | 68 | 62 |
| | 46 | 169 | 131 | 72 | 47 | 69 | 125 | 31 | 83 |
| | 109 | 63 | 41 | 168 | 147 | 161 | 165 | 175 | 162 |
| | 166 | 149 | 15 | 159 | 11 | 176 | 152 | 156 | 144 |
| | 16 | 1 | 8 | 18 | 25 | | | | |

TABLE 12-continued

| | | | | | | | | | |
|---|---|---|---|---|---|---|---|---|---|
| 13/15 | 167 | 35 | 57 | 82 | 30 | 123 | 68 | 95 | 160 |
| | 92 | 179 | 2 | 61 | 11 | 104 | 122 | 45 | 140 |
| | 75 | 94 | 155 | 5 | 145 | 14 | 26 | 127 | 46 |
| | 113 | 54 | 98 | 172 | 9 | 146 | 17 | 27 | 114 |
| | 107 | 121 | 48 | 93 | 174 | 33 | 65 | 87 | 99 |
| | 80 | 28 | 125 | 53 | 90 | 173 | 6 | 153 | 13 |
| | 151 | 81 | 109 | 110 | 44 | 134 | 162 | 36 | 152 |
| | 4 | 177 | 176 | 178 | 171 | | | | |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 64800 and modulates bits by the 1024-QAM in the constellation mapper 430.

In this case, the group interleaver 422 may perform the interleaving using $\pi(j)$ defined by the Table 13.

TABLE 13

| Code Rate | Order of group-wise interleaving $\pi(j)$ ($0 \leq j < 180$) | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 2/15 | 157 | 25 | 107 | 160 | 37 | 138 | 111 | 35 | 29 | 44 | 15 | 162 | 66 | 20 |
| | 10 | 164 | 152 | 57 | 110 | 83 | 167 | 169 | 16 | 6 | 172 | 62 | 173 | 7 |
| | 40 | 132 | 42 | 30 | 163 | 161 | 55 | 143 | 63 | 117 | 86 | 121 | 2 | 28 |
| | 46 | 118 | 114 | 127 | 135 | 92 | 76 | 19 | 94 | 179 | 3 | 52 | 101 | 137 |
| | 68 | 82 | 59 | 119 | 64 | 31 | 61 | 105 | 103 | 151 | 124 | 70 | 8 | 155 |
| | 109 | 100 | 125 | 11 | 116 | 34 | 36 | 176 | 170 | 156 | 136 | 171 | 122 | 78 |
| | 165 | 153 | 12 | 81 | 77 | 60 | 93 | 104 | 13 | 5 | 88 | 96 | 141 | 133 |
| | 112 | 65 | 0 | 130 | 32 | 168 | 33 | 131 | 22 | 38 | 56 | 80 | 95 | 71 |
| 3/15 | 113 | 153 | 13 | 8 | 103 | 115 | 137 | 69 | 151 | 111 | 18 | 38 | 42 | 150 |
| | 126 | 106 | 24 | 100 | 93 | 21 | 35 | 143 | 57 | 166 | 65 | 53 | 41 | 122 |
| | 17 | 168 | 56 | 12 | 39 | 176 | 131 | 132 | 51 | 89 | 101 | 160 | 49 | 87 |
| | 46 | 33 | 114 | 108 | 82 | 125 | 109 | 95 | 174 | 62 | 164 | 144 | 16 | 121 |
| | 172 | 112 | 19 | 133 | 102 | 75 | 45 | 86 | 63 | 22 | 54 | 105 | 155 | 77 |
| | 123 | 5 | 34 | 71 | 96 | 175 | 10 | 30 | 72 | 28 | 74 | 154 | 61 | 91 |
| | 147 | 59 | 116 | 120 | 3 | 64 | 140 | 67 | 94 | 27 | 9 | 81 | 43 | 11 |
| | 47 | 1 | 156 | 142 | 170 | 171 | 48 | 177 | 66 | 161 | 79 | 73 | 76 | 173 |
| 4/15 | 114 | 133 | 4 | 73 | 8 | 139 | 7 | 5 | 177 | 88 | 66 | 11 | 24 | 74 |
| | 51 | 68 | 110 | 6 | 1 | 16 | 132 | 130 | 143 | 169 | 2 | 20 | 140 | 94 |
| | 166 | 115 | 106 | 160 | 84 | 136 | 175 | 0 | 26 | 151 | 69 | 174 | 59 | 159 |
| | 33 | 125 | 111 | 63 | 124 | 98 | 40 | 145 | 9 | 39 | 155 | 149 | 147 | 67 |
| | 127 | 13 | 152 | 129 | 123 | 141 | 109 | 89 | 121 | 50 | 10 | 37 | 104 | 144 |
| | 12 | 105 | 41 | 154 | 99 | 25 | 171 | 92 | 17 | 134 | 19 | 61 | 32 | 85 |
| | 36 | 42 | 78 | 31 | 97 | 55 | 58 | 116 | 90 | 168 | 43 | 72 | 15 | 112 |
| | 150 | 77 | 79 | 122 | 47 | 28 | 135 | 100 | 83 | 65 | 131 | 75 | 157 | 62 |
| 5/15 | 128 | 4 | 162 | 8 | 77 | 29 | 91 | 44 | 176 | 107 | 149 | 1 | 150 | 9 |
| | 50 | 174 | 54 | 111 | 40 | 156 | 92 | 46 | 11 | 17 | 52 | 47 | 97 | 179 |
| | 114 | 69 | 96 | 32 | 134 | 55 | 167 | 132 | 123 | 136 | 112 | 102 | 159 | 31 |
| | 85 | 53 | 7 | 39 | 117 | 170 | 138 | 116 | 126 | 161 | 120 | 57 | 13 | 76 |
| | 10 | 103 | 166 | 95 | 125 | 172 | 67 | 30 | 177 | 73 | 151 | 169 | 163 | 23 |
| | 135 | 146 | 72 | 142 | 34 | 133 | 0 | 148 | 89 | 168 | 60 | 109 | 83 | 18 |
| | 21 | 75 | 110 | 80 | 14 | 49 | 82 | 143 | 115 | 178 | 154 | 100 | 59 | 74 |
| | 45 | 164 | 16 | 113 | 79 | 22 | 28 | 66 | 106 | 130 | 171 | 147 | 90 | 144 |
| 6/15 | 66 | 21 | 51 | 55 | 54 | 24 | 33 | 12 | 70 | 63 | 47 | 65 | 145 | 8 |
| | 56 | 2 | 43 | 64 | 58 | 67 | 53 | 68 | 61 | 39 | 52 | 69 | 1 | 22 |
| | 25 | 44 | 136 | 29 | 36 | 26 | 126 | 177 | 15 | 37 | 148 | 9 | 13 | 45 |
| | 178 | 28 | 34 | 106 | 127 | 76 | 131 | 105 | 138 | 75 | 130 | 101 | 167 | 117 |
| | 143 | 81 | 32 | 96 | 3 | 78 | 107 | 86 | 98 | 16 | 162 | 150 | 111 | 158 |
| | 144 | 151 | 90 | 11 | 156 | 100 | 175 | 83 | 155 | 159 | 128 | 88 | 87 | 93 |
| | 141 | 129 | 146 | 122 | 73 | 112 | 132 | 125 | 174 | 169 | 168 | 79 | 84 | 118 |
| | 104 | 134 | 82 | 95 | 133 | 164 | 154 | 120 | 110 | 170 | 114 | 153 | 72 | 109 |
| 7/15 | 117 | 61 | 46 | 179 | 24 | 161 | 142 | 133 | 11 | 6 | 121 | 44 | 103 | 76 |
| | 175 | 18 | 160 | 138 | 147 | 10 | 0 | 125 | 57 | 49 | 75 | 21 | 154 | 140 |
| | 97 | 129 | 30 | 7 | 122 | 54 | 99 | 74 | 19 | 153 | 94 | 128 | 15 | 170 |
| | 2 | 83 | 62 | 45 | 176 | 108 | 71 | 91 | 131 | 34 | 168 | 82 | 56 | 102 |
| | 101 | 178 | 113 | 67 | 98 | 152 | 14 | 5 | 118 | 41 | 104 | 177 | 114 | 70 |
| | 158 | 93 | 149 | 27 | 4 | 86 | 38 | 53 | 77 | 115 | 159 | 143 | 130 | 35 |
| | 16 | 3 | 85 | 37 | 107 | 172 | 116 | 156 | 95 | 144 | 17 | 165 | 81 | 43 |
| | 39 | 47 | 171 | 112 | 69 | 141 | 145 | 28 | 1 | 88 | 42 | 52 | 79 | 25 |
| 8/15 | 77 | 48 | 82 | 51 | 57 | 69 | 65 | 6 | 71 | 90 | 84 | 81 | 50 | 88 |
| | 18 | 38 | 89 | 49 | 93 | 36 | 64 | 47 | 40 | 42 | 76 | 70 | 56 | 3 |

TABLE 13-continued

| Code Rate | | | | | | | | | | | | | |
|---|---|---|---|---|---|---|---|---|---|---|---|---|---|
| | 87 | 67 | 86 | 10 | 1 | 58 | 17 | 14 | 175 | 91 | 68 | 85 | 94 | 15 |
| | 83 | 46 | 44 | 102 | 30 | 112 | 122 | 110 | 29 | 20 | 105 | 138 | 101 | 174 |
| | 28 | 26 | 45 | 24 | 23 | 21 | 157 | 98 | 35 | 95 | 22 | 32 | 103 | 27 |
| | 159 | 155 | 179 | 160 | 161 | 130 | 123 | 172 | 139 | 124 | 153 | 0 | 109 | 167 |
| | 148 | 158 | 129 | 163 | 176 | 151 | 171 | 8 | 106 | 144 | 150 | 169 | 108 | 162 |
| | 142 | 104 | 115 | 135 | 121 | 100 | 12 | 170 | 156 | 126 | 5 | 127 | 154 | 97 |
| 9/15 | 42 | 36 | 135 | 126 | 3 | 17 | 82 | 87 | 172 | 32 | 65 | 70 | 143 | 131 |
| | 128 | 8 | 9 | 146 | 73 | 162 | 164 | 57 | 64 | 139 | 91 | 5 | 110 | 150 |
| | 89 | 78 | 177 | 19 | 46 | 50 | 102 | 103 | 122 | 4 | 74 | 161 | 175 | 34 |
| | 21 | 40 | 61 | 140 | 138 | 113 | 112 | 157 | 151 | 23 | 30 | 69 | 41 | 94 |
| | 92 | 105 | 12 | 13 | 154 | 159 | 178 | 24 | 44 | 49 | 107 | 98 | 16 | 2 |
| | 123 | 160 | 77 | 25 | 170 | 54 | 39 | 90 | 95 | 121 | 11 | 72 | 153 | 169 |
| | 26 | 29 | 37 | 55 | 99 | 142 | 108 | 114 | 86 | 88 | 166 | 163 | 59 | 63 |
| | 53 | 130 | 137 | 125 | 6 | 158 | 84 | 20 | 174 | 38 | 68 | 127 | 106 | 14 |
| 10/15 | 100 | 22 | 60 | 121 | 40 | 44 | 164 | 170 | 176 | 101 | 88 | 26 | 35 | 4 |
| | 112 | 132 | 106 | 42 | 56 | 151 | 147 | 82 | 49 | 91 | 64 | 179 | 89 | 160 |
| | 109 | 96 | 135 | 146 | 55 | 38 | 166 | 117 | 65 | 127 | 120 | 129 | 15 | 136 |
| | 161 | 46 | 51 | 94 | 61 | 83 | 67 | 156 | 33 | 144 | 148 | 163 | 47 | 92 |
| | 7 | 10 | 29 | 19 | 104 | 128 | 142 | 1 | 79 | 107 | 162 | 0 | 118 | 66 |
| | 134 | 41 | 158 | 178 | 138 | 76 | 50 | 78 | 84 | 172 | 48 | 133 | 168 | 125 |
| | 5 | 11 | 68 | 95 | 27 | 110 | 93 | 62 | 102 | 137 | 126 | 150 | 87 | 105 |
| | 70 | 45 | 165 | 111 | 73 | 36 | 157 | 171 | 3 | 20 | 18 | 90 | 12 | 59 |
| 11/15 | 33 | 73 | 90 | 107 | 99 | 94 | 53 | 151 | 124 | 8 | 12 | 117 | 21 | 58 |
| | 62 | 109 | 75 | 42 | 146 | 118 | 153 | 85 | 10 | 131 | 70 | 32 | 41 | 24 |
| | 149 | 161 | 173 | 4 | 28 | 23 | 127 | 148 | 34 | 61 | 96 | 144 | 171 | 140 |
| | 139 | 81 | 47 | 164 | 92 | 63 | 105 | 108 | 170 | 3 | 135 | 101 | 121 | 68 |
| | 22 | 103 | 86 | 169 | 134 | 44 | 175 | 167 | 89 | 128 | 27 | 31 | 56 | 43 |
| | 78 | 154 | 176 | 174 | 5 | 82 | 11 | 25 | 80 | 130 | 163 | 88 | 36 | 166 |
| | 178 | 0 | 98 | 64 | 54 | 100 | 37 | 79 | 69 | 38 | 177 | 136 | 114 | 17 |
| | 76 | 13 | 18 | 115 | 71 | 91 | 179 | 112 | 155 | 15 | 14 | 26 | 60 | 29 |
| 12/15 | 91 | 19 | 11 | 106 | 14 | 40 | 20 | 67 | 32 | 22 | 31 | 23 | 78 | 68 |
| | 133 | 4 | 2 | 21 | 122 | 38 | 12 | 69 | 111 | 81 | 82 | 58 | 46 | 112 |
| | 80 | 76 | 138 | 87 | 85 | 65 | 130 | 57 | 102 | 83 | 64 | 86 | 100 | 39 |
| | 30 | 45 | 94 | 26 | 116 | 98 | 37 | 55 | 44 | 70 | 25 | 7 | 34 | 114 |
| | 29 | 62 | 50 | 139 | 56 | 109 | 77 | 59 | 127 | 142 | 96 | 105 | 99 | 90 |
| | 178 | 129 | 18 | 131 | 42 | 165 | 101 | 134 | 36 | 140 | 132 | 103 | 72 | 164 |
| | 63 | 107 | 162 | 157 | 66 | 104 | 17 | 147 | 167 | 174 | 179 | 3 | 173 | 160 |
| | 16 | 15 | 148 | 5 | 146 | 163 | 172 | 175 | 151 | 169 | 176 | 150 | 153 | 171 |
| 13/15 | 49 | 2 | 57 | 47 | 31 | 35 | 24 | 39 | 59 | 0 | 45 | 41 | 55 | 53 |
| | 23 | 34 | 54 | 1 | 36 | 44 | 52 | 40 | 58 | 122 | 46 | 42 | 30 | 3 |
| | 85 | 147 | 63 | 81 | 77 | 61 | 5 | 26 | 62 | 64 | 74 | 70 | 82 | 149 |
| | 6 | 60 | 154 | 103 | 95 | 101 | 143 | 9 | 89 | 141 | 128 | 97 | 137 | 133 |
| | 88 | 94 | 10 | 8 | 14 | 96 | 104 | 92 | 132 | 142 | 100 | 98 | 12 | 102 |
| | 112 | 114 | 29 | 110 | 134 | 116 | 15 | 127 | 125 | 123 | 120 | 148 | 151 | 113 |
| | 105 | 115 | 111 | 131 | 107 | 121 | 18 | 170 | 164 | 20 | 140 | 160 | 166 | 162 |
| | 157 | 159 | 171 | 161 | 118 | 17 | 163 | 21 | 165 | 19 | 179 | 177 | 167 | 138 |

| Code Rate | Order of group-wise interleaving $\pi(j)$ ($0 \leq j < 180$) | | | | | | | |
|---|---|---|---|---|---|---|---|---|
| | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |
| | 129 | 130 | 131 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 2/15 | 49 | 126 | 89 | 147 | 159 | 174 | 142 | 26 | 146 |
| | 145 | 4 | 67 | 115 | 50 | 39 | 72 | 79 | 74 |
| | 69 | 150 | 24 | 177 | 43 | 158 | 27 | 21 | 128 |
| | 84 | 73 | 108 | 91 | 120 | 47 | 1 | 102 | 58 |
| | 90 | 166 | 41 | 45 | 178 | 113 | 140 | 75 | 148 |
| | 87 | 106 | 123 | 149 | 17 | 99 | 175 | 18 | 9 |
| | 154 | 144 | 48 | 97 | 23 | 14 | 98 | 53 | 134 |
| | 85 | 139 | 129 | 51 | 54 | | | | |
| 3/15 | 179 | 130 | 148 | 6 | 4 | 31 | 44 | 68 | 145 |
| | 7 | 29 | 25 | 136 | 162 | 158 | 26 | 124 | 32 |
| | 14 | 55 | 127 | 37 | 169 | 110 | 83 | 134 | 107 |
| | 58 | 80 | 2 | 163 | 159 | 157 | 90 | 104 | 23 |
| | 178 | 70 | 98 | 40 | 118 | 84 | 78 | 0 | 99 |
| | 85 | 135 | 152 | 15 | 88 | 165 | 60 | 52 | 149 |
| | 167 | 139 | 92 | 129 | 20 | 117 | 128 | 50 | 119 |
| | 97 | 36 | 141 | 146 | 138 | | | | |
| 4/15 | 49 | 45 | 167 | 81 | 117 | 137 | 46 | 22 | 165 |
| | 21 | 91 | 126 | 172 | 27 | 162 | 34 | 113 | 142 |
| | 161 | 170 | 52 | 164 | 80 | 108 | 3 | 23 | 101 |
| | 76 | 48 | 120 | 119 | 53 | 54 | 138 | 179 | 156 |
| | 86 | 178 | 96 | 148 | 128 | 56 | 64 | 153 | 95 |
| | 102 | 14 | 71 | 146 | 163 | 173 | 118 | 57 | 18 |

TABLE 13-continued

|      |     |     |     |     |     |     |     |     |     |
|------|----:|----:|----:|----:|----:|----:|----:|----:|----:|
|      | 93  | 60  | 38  | 103 | 87  | 158 | 35  | 29  | 176 |
|      | 70  | 44  | 30  | 107 | 82  |     |     |     |     |
| 5/15 | 119 | 99  | 71  | 124 | 104 | 41  | 62  | 5   | 118 |
|      | 24  | 153 | 145 | 129 | 2   | 12  | 88  | 101 | 139 |
|      | 87  | 141 | 15  | 61  | 84  | 98  | 37  | 63  | 20  |
|      | 6   | 121 | 155 | 175 | 38  | 158 | 35  | 86  | 78  |
|      | 108 | 43  | 81  | 157 | 58  | 105 | 65  | 26  | 122 |
|      | 27  | 131 | 70  | 56  | 48  | 64  | 93  | 68  | 127 |
|      | 152 | 51  | 137 | 140 | 36  | 42  | 19  | 25  | 94  |
|      | 165 | 3   | 173 | 160 | 33  |     |     |     |     |
| 6/15 | 0   | 57  | 23  | 71  | 59  | 14  | 40  | 42  | 62  |
|      | 31  | 161 | 38  | 30  | 19  | 17  | 18  | 4   | 41  |
|      | 46  | 152 | 50  | 49  | 27  | 77  | 60  | 35  | 48  |
|      | 173 | 113 | 108 | 92  | 135 | 124 | 121 | 97  | 149 |
|      | 172 | 139 | 74  | 142 | 166 | 7   | 5   | 119 | 20  |
|      | 103 | 94  | 140 | 165 | 6   | 137 | 157 | 10  | 85  |
|      | 179 | 147 | 91  | 160 | 163 | 115 | 89  | 80  | 102 |
|      | 171 | 176 | 99  | 116 | 123 |     |     |     |     |
| 7/15 | 22  | 63  | 136 | 151 | 33  | 8   | 123 | 60  | 105 |
|      | 150 | 9   | 169 | 124 | 55  | 48  | 173 | 23  | 157 |
|      | 87  | 59  | 51  | 80  | 111 | 64  | 137 | 146 | 13  |
|      | 72  | 26  | 155 | 92  | 132 | 31  | 166 | 119 | 36  |
|      | 96  | 134 | 32  | 162 | 84  | 40  | 100 | 174 | 110 |
|      | 163 | 89  | 58  | 106 | 73  | 20  | 66  | 90  | 127 |
|      | 50  | 78  | 109 | 68  | 135 | 126 | 29  | 167 | 120 |
|      | 65  | 139 | 148 | 12  | 164 |     |     |     |     |
| 8/15 | 61  | 55  | 53  | 73  | 39  | 13  | 79  | 75  | 41  |
|      | 72  | 2   | 54  | 52  | 145 | 19  | 78  | 80  | 63  |
|      | 43  | 74  | 60  | 66  | 37  | 92  | 4   | 9   | 16  |
|      | 33  | 137 | 136 | 131 | 166 | 59  | 34  | 62  | 125 |
|      | 113 | 31  | 119 | 173 | 168 | 118 | 120 | 114 | 149 |
|      | 128 | 107 | 117 | 147 | 177 | 96  | 164 | 152 | 11  |
|      | 143 | 111 | 141 | 133 | 178 | 134 | 146 | 99  | 132 |
|      | 140 | 116 | 165 | 7   | 25  |     |     |     |     |
| 9/15 | 10  | 1   | 85  | 147 | 31  | 176 | 66  | 47  | 97  |
|      | 83  | 18  | 27  | 48  | 45  | 133 | 132 | 111 | 124 |
|      | 60  | 58  | 136 | 100 | 115 | 118 | 81  | 75  | 28  |
|      | 96  | 7   | 109 | 152 | 149 | 33  | 179 | 71  | 43  |
|      | 76  | 155 | 35  | 168 | 62  | 56  | 129 | 141 | 116 |
|      | 167 | 51  | 67  | 104 | 134 | 0   | 117 | 79  | 80  |
|      | 101 | 93  | 119 | 15  | 144 | 145 | 165 | 22  | 52  |
|      | 120 | 148 | 156 | 171 | 173 |     |     |     |     |
| 10/15| 21  | 173 | 140 | 145 | 175 | 174 | 81  | 28  | 72  |
|      | 52  | 139 | 17  | 97  | 63  | 116 | 131 | 154 | 71  |
|      | 74  | 23  | 98  | 43  | 123 | 130 | 69  | 99  | 143 |
|      | 2   | 122 | 24  | 86  | 75  | 108 | 152 | 14  | 77  |
|      | 54  | 153 | 141 | 9   | 85  | 37  | 32  | 114 | 53  |
|      | 13  | 169 | 25  | 16  | 8   | 124 | 159 | 167 | 58  |
|      | 113 | 30  | 119 | 6   | 103 | 57  | 31  | 149 | 80  |
|      | 39  | 115 | 34  | 177 | 155 |     |     |     |     |
| 11/15| 158 | 77  | 72  | 59  | 123 | 2   | 125 | 157 | 50  |
|      | 143 | 113 | 1   | 93  | 162 | 20  | 35  | 74  | 45  |
|      | 119 | 16  | 126 | 39  | 40  | 57  | 165 | 106 | 172 |
|      | 6   | 111 | 65  | 147 | 150 | 122 | 7   | 84  | 46  |
|      | 102 | 156 | 160 | 141 | 67  | 9   | 110 | 159 | 133 |
|      | 137 | 104 | 48  | 129 | 87  | 95  | 55  | 49  | 145 |
|      | 52  | 19  | 30  | 97  | 51  | 168 | 132 | 138 | 83  |
|      | 116 | 66  | 120 | 142 | 152 |     |     |     |     |
| 12/15| 79  | 141 | 117 | 95  | 88  | 136 | 52  | 121 | 1   |
|      | 60  | 33  | 73  | 53  | 92  | 75  | 48  | 47  | 110 |
|      | 49  | 125 | 108 | 119 | 6   | 118 | 35  | 61  | 71  |
|      | 135 | 128 | 137 | 84  | 51  | 28  | 97  | 27  | 89  |
|      | 13  | 124 | 120 | 115 | 126 | 143 | 149 | 74  | 41  |
|      | 93  | 54  | 166 | 43  | 123 | 113 | 0   | 154 | 10  |
|      | 155 | 161 | 152 | 156 | 177 | 24  | 170 | 9   | 159 |
|      | 158 | 168 | 144 | 8   | 145 |     |     |     |     |
| 13/15| 51  | 37  | 33  | 43  | 56  | 38  | 48  | 32  | 50  |
|      | 75  | 73  | 65  | 145 | 71  | 79  | 67  | 69  | 83  |
|      | 76  | 4   | 78  | 84  | 80  | 86  | 66  | 68  | 72  |
|      | 7   | 13  | 99  | 91  | 93  | 87  | 11  | 136 | 90  |
|      | 152 | 139 | 150 | 106 | 146 | 130 | 27  | 108 | 153 |
|      | 126 | 124 | 135 | 129 | 109 | 25  | 28  | 158 | 117 |
|      | 119 | 155 | 168 | 178 | 22  | 174 | 172 | 176 | 16  |
|      | 173 | 156 | 144 | 169 | 175 |     |     |     |     |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 64800 and modulates bits by the 4096-QAM in the constellation mapper 430.

In this case, the group interleaver 422 may perform the interleaving using $\pi(j)$ defined by the Table 14.

TABLE 14

| Code Rate | Order of group-wise interleaving $\pi(j)$ ($0 \leq j < 180$) | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 2/15 | 14 | 129 | 71 | 96 | 171 | 36 | 144 | 64 | 162 | 4 | 86 | 128 | 113 | 7 |
| | 118 | 158 | 126 | 17 | 55 | 45 | 111 | 138 | 84 | 6 | 52 | 167 | 38 | 20 |
| | 154 | 15 | 146 | 116 | 63 | 1 | 114 | 83 | 124 | 109 | 39 | 75 | 123 | 57 |
| | 99 | 34 | 147 | 166 | 56 | 155 | 176 | 95 | 102 | 119 | 161 | 37 | 159 | 97 |
| | 87 | 103 | 179 | 172 | 66 | 59 | 8 | 145 | 88 | 132 | 110 | 54 | 47 | 153 |
| | 24 | 19 | 53 | 136 | 48 | 76 | 35 | 151 | 173 | 149 | 142 | 160 | 94 | 117 |
| | 60 | 135 | 168 | 23 | 100 | 134 | 90 | 98 | 125 | 85 | 137 | 81 | 41 | 156 |
| | 139 | 93 | 46 | 12 | 175 | 130 | 51 | 178 | 92 | 115 | 174 | 27 | 70 | 58 |
| 3/15 | 136 | 20 | 44 | 36 | 17 | 120 | 89 | 142 | 66 | 35 | 42 | 116 | 14 | 119 |
| | 175 | 41 | 145 | 100 | 131 | 173 | 179 | 16 | 77 | 112 | 40 | 58 | 23 | 82 |
| | 79 | 137 | 53 | 96 | 33 | 70 | 19 | 38 | 121 | 90 | 118 | 126 | 165 | 109 |
| | 134 | 177 | 139 | 3 | 113 | 172 | 9 | 50 | 138 | 61 | 93 | 94 | 88 | 132 |
| | 101 | 155 | 95 | 54 | 85 | 13 | 39 | 15 | 76 | 130 | 97 | 110 | 174 | 72 |
| | 28 | 160 | 149 | 133 | 104 | 81 | 69 | 84 | 4 | 6 | 147 | 48 | 115 | 169 |
| | 171 | 135 | 52 | 5 | 141 | 65 | 75 | 163 | 43 | 144 | 167 | 159 | 129 | 46 |
| | 32 | 18 | 51 | 87 | 114 | 64 | 22 | 164 | 24 | 123 | 27 | 62 | 124 | 152 |
| 4/15 | 91 | 52 | 36 | 30 | 35 | 6 | 121 | 29 | 150 | 47 | 163 | 2 | 89 | 39 |
| | 129 | 10 | 9 | 15 | 162 | 21 | 171 | 43 | 44 | 132 | 158 | 104 | 4 | 72 |
| | 161 | 88 | 148 | 42 | 160 | 109 | 100 | 126 | 138 | 108 | 38 | 25 | 3 | 112 |
| | 178 | 68 | 26 | 130 | 140 | 115 | 152 | 139 | 37 | 22 | 102 | 14 | 118 | 11 |
| | 93 | 7 | 79 | 5 | 137 | 165 | 59 | 77 | 55 | 80 | 117 | 13 | 173 | 144 |
| | 142 | 27 | 136 | 18 | 111 | 175 | 123 | 147 | 114 | 19 | 125 | 166 | 149 | 113 |
| | 170 | 128 | 97 | 16 | 60 | 110 | 156 | 45 | 82 | 105 | 62 | 99 | 23 | 92 |
| | 116 | 75 | 127 | 81 | 67 | 179 | 174 | 70 | 12 | 58 | 87 | 176 | 0 | 51 |
| 5/15 | 146 | 89 | 57 | 16 | 164 | 138 | 91 | 78 | 90 | 66 | 122 | 12 | 9 | 157 |
| | 56 | 61 | 168 | 18 | 161 | 95 | 99 | 139 | 22 | 65 | 130 | 166 | 118 | 150 |
| | 88 | 47 | 0 | 58 | 105 | 43 | 80 | 64 | 107 | 21 | 55 | 151 | 8 | 145 |
| | 3 | 13 | 34 | 160 | 102 | 125 | 114 | 152 | 84 | 32 | 97 | 33 | 60 | 62 |
| | 127 | 132 | 104 | 53 | 162 | 103 | 120 | 54 | 155 | 116 | 48 | 77 | 76 | 73 |
| | 143 | 178 | 108 | 39 | 140 | 106 | 40 | 5 | 25 | 81 | 176 | 101 | 124 | 126 |
| | 170 | 35 | 175 | 137 | 15 | 24 | 69 | 96 | 30 | 117 | 67 | 171 | 149 | 169 |
| | 131 | 85 | 110 | 94 | 135 | 172 | 148 | 50 | 154 | 42 | 70 | 115 | 26 | 83 |
| 6/15 | 66 | 21 | 51 | 55 | 117 | 24 | 33 | 12 | 70 | 63 | 47 | 65 | 145 | 8 |
| | 56 | 2 | 43 | 64 | 58 | 67 | 53 | 68 | 61 | 39 | 52 | 69 | 1 | 22 |
| | 25 | 44 | 136 | 29 | 36 | 26 | 126 | 177 | 62 | 37 | 148 | 9 | 13 | 45 |
| | 178 | 28 | 34 | 106 | 127 | 76 | 131 | 105 | 138 | 75 | 130 | 101 | 167 | 54 |
| | 143 | 81 | 32 | 96 | 3 | 78 | 107 | 86 | 98 | 16 | 162 | 150 | 111 | 158 |
| | 144 | 151 | 90 | 11 | 156 | 100 | 175 | 83 | 155 | 159 | 128 | 88 | 87 | 93 |
| | 141 | 129 | 146 | 122 | 73 | 112 | 132 | 125 | 174 | 169 | 168 | 79 | 84 | 118 |
| | 104 | 134 | 82 | 95 | 133 | 164 | 154 | 120 | 110 | 170 | 114 | 153 | 72 | 109 |
| 7/15 | 59 | 60 | 0 | 48 | 87 | 30 | 29 | 146 | 142 | 8 | 150 | 171 | 20 | 121 |
| | 108 | 165 | 174 | 16 | 85 | 58 | 43 | 161 | 34 | 13 | 92 | 79 | 82 | 175 |
| | 120 | 61 | 73 | 104 | 10 | 38 | 45 | 7 | 173 | 75 | 24 | 77 | 137 | 21 |
| | 140 | 64 | 117 | 158 | 114 | 136 | 112 | 31 | 70 | 134 | 163 | 98 | 91 | 33 |
| | 40 | 66 | 170 | 41 | 74 | 138 | 99 | 179 | 81 | 157 | 32 | 19 | 26 | 62 |
| | 55 | 164 | 153 | 155 | 14 | 42 | 149 | 127 | 133 | 83 | 96 | 139 | 89 | 36 |
| | 101 | 44 | 49 | 177 | 88 | 11 | 105 | 151 | 12 | 132 | 25 | 128 | 119 | 65 |
| | 56 | 124 | 17 | 141 | 72 | 9 | 28 | 5 | 110 | 100 | 47 | 80 | 169 | 116 |
| 8/15 | 77 | 48 | 82 | 51 | 57 | 69 | 65 | 6 | 71 | 90 | 84 | 81 | 50 | 88 |
| | 18 | 38 | 89 | 49 | 93 | 36 | 64 | 47 | 40 | 42 | 76 | 70 | 56 | 3 |
| | 87 | 67 | 86 | 10 | 1 | 58 | 17 | 14 | 175 | 91 | 68 | 85 | 94 | 15 |
| | 83 | 46 | 44 | 102 | 30 | 112 | 122 | 110 | 29 | 20 | 105 | 138 | 101 | 174 |
| | 28 | 26 | 45 | 24 | 23 | 21 | 157 | 98 | 35 | 95 | 22 | 32 | 103 | 27 |
| | 159 | 155 | 179 | 160 | 161 | 130 | 123 | 172 | 139 | 124 | 153 | 0 | 109 | 167 |
| | 148 | 158 | 129 | 163 | 176 | 151 | 171 | 8 | 106 | 144 | 150 | 169 | 108 | 162 |
| | 142 | 104 | 115 | 135 | 121 | 100 | 12 | 170 | 156 | 126 | 5 | 127 | 154 | 97 |
| 9/15 | 67 | 79 | 72 | 175 | 1 | 92 | 63 | 65 | 36 | 73 | 18 | 3 | 43 | 78 |
| | 91 | 93 | 54 | 58 | 60 | 2 | 19 | 66 | 44 | 85 | 48 | 0 | 50 | 166 |
| | 39 | 141 | 34 | 74 | 33 | 45 | 99 | 46 | 10 | 69 | 94 | 101 | 56 | 9 |
| | 62 | 100 | 13 | 32 | 88 | 57 | 127 | 53 | 68 | 146 | 61 | 7 | 107 | 71 |
| | 126 | 87 | 22 | 47 | 27 | 171 | 102 | 6 | 132 | 77 | 90 | 38 | 167 | 4 |
| | 159 | 42 | 110 | 21 | 105 | 148 | 142 | 134 | 23 | 117 | 122 | 160 | 12 | 154 |

TABLE 14-continued

|       | | | | | | | | | | | | | |
|-------|---|---|---|---|---|---|---|---|---|---|---|---|---|
|       | 155 | 178 | 138 | 176 | 147 | 121 | 136 | 165 | 170 | 133 | 149 | 150 | 174 | 168 |
|       | 173 | 112 | 144 | 172 | 123 | 137 | 16 | 120 | 131 | 111 | 135 | 163 | 17 | 130 |
| 10/15 | 36 | 21 | 117 | 71 | 38 | 108 | 42 | 61 | 13 | 88 | 97 | 68 | 2 | 67 |
|       | 78 | 31 | 18 | 103 | 39 | 119 | 25 | 40 | 28 | 72 | 11 | 73 | 86 | 131 |
|       | 93 | 56 | 69 | 96 | 35 | 57 | 116 | 130 | 55 | 74 | 41 | 169 | 54 | 14 |
|       | 101 | 8 | 115 | 118 | 85 | 48 | 112 | 80 | 90 | 32 | 173 | 76 | 33 | 16 |
|       | 7 | 110 | 99 | 53 | 133 | 70 | 87 | 106 | 145 | 4 | 113 | 27 | 59 | 34 |
|       | 155 | 136 | 94 | 43 | 49 | 152 | 161 | 66 | 3 | 121 | 135 | 147 | 17 | 157 |
|       | 177 | 134 | 143 | 176 | 179 | 105 | 172 | 47 | 146 | 160 | 23 | 175 | 141 | 91 |
|       | 151 | 125 | 139 | 150 | 15 | 129 | 162 | 120 | 166 | 156 | 62 | 158 | 178 | 128 |
| 11/15 | 77 | 97 | 3 | 44 | 119 | 72 | 83 | 116 | 40 | 0 | 111 | 8 | 68 | 43 |
|       | 76 | 89 | 118 | 70 | 87 | 15 | 67 | 22 | 59 | 95 | 46 | 38 | 125 | 48 |
|       | 80 | 63 | 62 | 45 | 9 | 25 | 114 | 19 | 82 | 54 | 150 | 121 | 130 | 123 |
|       | 101 | 78 | 5 | 128 | 148 | 57 | 12 | 107 | 36 | 2 | 109 | 52 | 39 | 66 |
|       | 144 | 10 | 94 | 64 | 100 | 86 | 71 | 27 | 30 | 32 | 110 | 33 | 113 | 131 |
|       | 41 | 117 | 69 | 172 | 96 | 149 | 127 | 124 | 173 | 13 | 74 | 105 | 53 | 161 |
|       | 145 | 170 | 135 | 158 | 154 | 162 | 7 | 169 | 99 | 106 | 137 | 165 | 143 | 4 |
|       | 176 | 179 | 142 | 11 | 177 | 153 | 151 | 159 | 132 | 20 | 164 | 6 | 157 | 178 |
| 12/15 | 110 | 16 | 64 | 100 | 55 | 70 | 48 | 26 | 60 | 71 | 93 | 1 | 59 | 88 |
|       | 92 | 9 | 35 | 37 | 113 | 101 | 111 | 8 | 52 | 56 | 19 | 134 | 151 | 84 |
|       | 22 | 116 | 172 | 38 | 95 | 36 | 46 | 141 | 114 | 4 | 106 | 149 | 85 | 86 |
|       | 47 | 123 | 39 | 10 | 148 | 43 | 131 | 147 | 45 | 143 | 5 | 108 | 81 | 2 |
|       | 17 | 30 | 32 | 156 | 133 | 78 | 91 | 161 | 104 | 174 | 53 | 61 | 50 | 74 |
|       | 102 | 20 | 167 | 99 | 122 | 117 | 24 | 98 | 115 | 124 | 42 | 7 | 79 | 75 |
|       | 129 | 142 | 107 | 73 | 175 | 14 | 83 | 150 | 165 | 118 | 89 | 130 | 15 | 163 |
|       | 145 | 0 | 178 | 155 | 157 | 179 | 144 | 158 | 152 | 13 | 25 | 176 | 162 | 169 |
| 13/15 | 87 | 50 | 6 | 42 | 82 | 54 | 96 | 0 | 62 | 124 | 109 | 126 | 23 | 64 |
|       | 128 | 107 | 7 | 28 | 14 | 125 | 136 | 154 | 10 | 92 | 99 | 84 | 86 | 151 |
|       | 35 | 61 | 102 | 132 | 95 | 70 | 40 | 129 | 101 | 36 | 51 | 150 | 142 | 152 |
|       | 112 | 113 | 57 | 77 | 32 | 93 | 49 | 58 | 117 | 78 | 1 | 149 | 37 | 11 |
|       | 91 | 46 | 146 | 21 | 143 | 44 | 110 | 75 | 138 | 16 | 76 | 45 | 114 | 144 |
|       | 71 | 115 | 105 | 90 | 56 | 25 | 103 | 147 | 73 | 60 | 47 | 118 | 27 | 69 |
|       | 3 | 164 | 106 | 134 | 5 | 67 | 80 | 141 | 120 | 98 | 155 | 8 | 156 | 162 |
|       | 127 | 22 | 173 | 157 | 171 | 178 | 158 | 17 | 174 | 179 | 167 | 12 | 172 | 166 |

| Code Rate | Order of group-wise interleaving $\pi(j)$ $(0 \leq j < 180)$ | | | | | | | |
|---|---|---|---|---|---|---|---|---|
|      | 14 | 15 | 16 | 17 | 18 | 19 | 20 | 21 | 22 |
|      | 37 | 38 | 39 | 40 | 41 | 42 | 43 | 44 | 45 |
|      | 60 | 61 | 62 | 63 | 64 | 65 | 66 | 67 | 68 |
|      | 83 | 84 | 85 | 86 | 87 | 88 | 89 | 90 | 91 |
|      | 106 | 107 | 108 | 109 | 110 | 111 | 112 | 113 | 114 |
|      | 129 | 130 | 131 | 132 | 133 | 134 | 135 | 136 | 137 |
|      | 152 | 153 | 154 | 155 | 156 | 157 | 158 | 159 | 160 |
|      | 175 | 176 | 177 | 178 | 179 | | | | |
| 2/15 | 105 | 131 | 2 | 133 | 106 | 79 | 11 | 152 | 26 |
|      | 101 | 31 | 120 | 5 | 112 | 74 | 69 | 121 | 9 |
|      | 49 | 30 | 21 | 40 | 43 | 77 | 157 | 44 | 13 |
|      | 68 | 122 | 163 | 89 | 61 | 107 | 22 | 10 | 127 |
|      | 25 | 32 | 73 | 42 | 148 | 150 | 28 | 91 | 18 |
|      | 169 | 165 | 141 | 80 | 67 | 170 | 164 | 82 | 65 |
|      | 50 | 3 | 29 | 16 | 72 | 177 | 0 | 78 | 62 |
|      | 33 | 104 | 140 | 108 | 143 | | | | |
| 3/15 | 117 | 29 | 47 | 125 | 11 | 158 | 74 | 25 | 37 |
|      | 168 | 106 | 83 | 34 | 49 | 122 | 2 | 157 | 107 |
|      | 154 | 140 | 10 | 178 | 143 | 92 | 63 | 176 | 146 |
|      | 105 | 151 | 170 | 86 | 12 | 1 | 7 | 56 | 59 |
|      | 150 | 55 | 73 | 99 | 111 | 162 | 26 | 21 | 156 |
|      | 127 | 161 | 71 | 68 | 80 | 91 | 98 | 8 | 57 |
|      | 31 | 30 | 166 | 0 | 148 | 128 | 102 | 103 | 60 |
|      | 78 | 108 | 67 | 153 | 45 | | | | |
| 4/15 | 65 | 157 | 64 | 122 | 101 | 40 | 84 | 69 | 90 |
|      | 169 | 177 | 103 | 76 | 28 | 78 | 53 | 1 | 151 |
|      | 17 | 124 | 155 | 172 | 134 | 86 | 119 | 94 | 145 |
|      | 98 | 154 | 61 | 146 | 164 | 107 | 131 | 159 | 63 |
|      | 85 | 153 | 66 | 106 | 49 | 34 | 48 | 41 | 143 |
|      | 46 | 31 | 141 | 120 | 57 | 74 | 8 | 20 | 96 |
|      | 32 | 50 | 73 | 56 | 167 | 95 | 24 | 168 | 33 |
|      | 135 | 83 | 133 | 54 | 71 | | | | |
| 5/15 | 14 | 68 | 112 | 128 | 74 | 45 | 28 | 87 | 158 |
|      | 49 | 142 | 44 | 36 | 1 | 121 | 6 | 46 | 29 |
|      | 163 | 7 | 98 | 123 | 17 | 11 | 153 | 136 | 52 |
|      | 79 | 37 | 129 | 38 | 165 | 71 | 75 | 59 | 144 |
|      | 113 | 119 | 179 | 177 | 41 | 19 | 92 | 109 | 31 |
|      | 72 | 111 | 4 | 173 | 156 | 134 | 86 | 174 | 2 |
|      | 63 | 23 | 20 | 167 | 27 | 147 | 51 | 10 | 82 |
|      | 141 | 100 | 133 | 93 | 159 | | | | |

TABLE 14-continued

| | | | | | | | | |
|---|---|---|---|---|---|---|---|---|
| 6/15 | 0 | 57 | 23 | 71 | 59 | 14 | 40 | 42 | 15 |
| | 31 | 161 | 38 | 30 | 19 | 17 | 18 | 4 | 41 |
| | 46 | 152 | 50 | 49 | 27 | 77 | 60 | 35 | 48 |
| | 173 | 113 | 108 | 92 | 135 | 124 | 121 | 97 | 149 |
| | 172 | 139 | 74 | 142 | 166 | 7 | 5 | 119 | 20 |
| | 103 | 94 | 140 | 165 | 6 | 137 | 157 | 10 | 85 |
| | 179 | 147 | 91 | 160 | 163 | 115 | 89 | 80 | 102 |
| | 171 | 176 | 99 | 116 | 123 | | | | |
| 7/15 | 23 | 122 | 144 | 76 | 162 | 106 | 50 | 39 | 63 |
| | 86 | 69 | 68 | 15 | 113 | 84 | 118 | 27 | 93 |
| | 37 | 46 | 3 | 6 | 168 | 148 | 109 | 123 | 103 |
| | 115 | 95 | 176 | 154 | 107 | 97 | 131 | 111 | 129 |
| | 172 | 78 | 160 | 57 | 22 | 159 | 51 | 135 | 2 |
| | 125 | 130 | 143 | 147 | 67 | 18 | 102 | 94 | 35 |
| | 145 | 4 | 54 | 90 | 71 | 167 | 166 | 1 | 156 |
| | 53 | 152 | 52 | 126 | 178 | | | | |
| 8/15 | 61 | 55 | 53 | 73 | 39 | 13 | 79 | 75 | 41 |
| | 72 | 2 | 54 | 52 | 145 | 19 | 78 | 80 | 63 |
| | 43 | 74 | 60 | 66 | 37 | 92 | 4 | 9 | 16 |
| | 33 | 137 | 136 | 131 | 166 | 59 | 34 | 62 | 125 |
| | 113 | 31 | 119 | 173 | 168 | 118 | 120 | 114 | 149 |
| | 128 | 107 | 117 | 147 | 177 | 96 | 164 | 152 | 11 |
| | 143 | 111 | 141 | 133 | 178 | 134 | 146 | 99 | 132 |
| | 140 | 116 | 165 | 7 | 25 | | | | |
| 9/15 | 5 | 40 | 82 | 20 | 15 | 76 | 28 | 84 | 59 |
| | 89 | 41 | 24 | 83 | 75 | 55 | 64 | 52 | 98 |
| | 97 | 96 | 37 | 14 | 31 | 70 | 106 | 113 | 80 |
| | 51 | 161 | 81 | 49 | 86 | 95 | 103 | 30 | 25 |
| | 35 | 26 | 118 | 140 | 104 | 128 | 179 | 124 | 109 |
| | 114 | 156 | 151 | 145 | 169 | 11 | 139 | 177 | 129 |
| | 125 | 116 | 115 | 164 | 29 | 119 | 153 | 157 | 162 |
| | 152 | 108 | 8 | 158 | 143 | | | | |
| 10/15 | 50 | 64 | 95 | 63 | 100 | 9 | 82 | 51 | 45 |
| | 84 | 111 | 24 | 58 | 60 | 81 | 37 | 89 | 1 |
| | 26 | 65 | 83 | 165 | 107 | 0 | 52 | 144 | 75 |
| | 77 | 164 | 104 | 46 | 20 | 98 | 109 | 29 | 114 |
| | 5 | 102 | 148 | 142 | 79 | 19 | 44 | 159 | 174 |
| | 30 | 153 | 154 | 137 | 168 | 92 | 149 | 171 | 10 |
| | 140 | 163 | 132 | 6 | 126 | 124 | 12 | 170 | 167 |
| | 127 | 22 | 122 | 123 | 138 | | | | |
| 11/15 | 24 | 102 | 49 | 92 | 65 | 31 | 93 | 60 | 17 |
| | 58 | 140 | 104 | 73 | 47 | 14 | 120 | 1 | 50 |
| | 37 | 55 | 23 | 98 | 81 | 122 | 103 | 85 | 126 |
| | 115 | 42 | 156 | 90 | 51 | 91 | 29 | 84 | 18 |
| | 35 | 34 | 112 | 26 | 108 | 16 | 61 | 56 | 75 |
| | 146 | 174 | 79 | 88 | 28 | 129 | 134 | 139 | 136 |
| | 175 | 138 | 133 | 171 | 168 | 147 | 167 | 141 | 163 |
| | 21 | 166 | 155 | 160 | 152 | | | | |
| 12/15 | 97 | 136 | 67 | 94 | 90 | 72 | 49 | 23 | 41 |
| | 126 | 159 | 63 | 44 | 65 | 139 | 31 | 57 | 103 |
| | 66 | 51 | 121 | 105 | 109 | 87 | 6 | 135 | 127 |
| | 140 | 120 | 132 | 76 | 58 | 137 | 18 | 29 | 125 |
| | 77 | 33 | 171 | 138 | 28 | 69 | 112 | 119 | 12 |
| | 128 | 82 | 68 | 80 | 3 | 11 | 54 | 96 | 40 |
| | 34 | 166 | 173 | 146 | 168 | 153 | 154 | 177 | 62 |
| | 164 | 27 | 21 | 160 | 170 | | | | |
| 13/15 | 53 | 20 | 41 | 111 | 145 | 135 | 68 | 2 | 122 |
| | 108 | 24 | 94 | 148 | 29 | 123 | 13 | 88 | 52 |
| | 121 | 131 | 116 | 97 | 104 | 31 | 59 | 137 | 83 |
| | 100 | 85 | 79 | 72 | 66 | 130 | 18 | 63 | 55 |
| | 119 | 38 | 140 | 65 | 30 | 133 | 153 | 33 | 89 |
| | 9 | 74 | 48 | 19 | 39 | 43 | 34 | 81 | 139 |
| | 163 | 165 | 26 | 161 | 168 | 176 | 159 | 170 | 4 |
| | 160 | 177 | 169 | 175 | 15 | | | | |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 16200 and modulates bits by the QPSK in the constellation mapper 430.

In this case, the group interleaver 422 may perform the interleaving using $\pi(j)$ defined by the Table 15.

TABLE 15

| Code Rate | Order of group-wise interleaving $\pi(j)$ ($0 \leq j < 44$) |
|---|---|
| | 0  1  2  3  4  5  6  7  8  9  10  11  12  13  14  15  16  17  18  19  20  21  22 |
| | 23  24  25  26  27  28  29  30  31  32  33  34  35  36  37  38  39  40  41  42  43  44 |

TABLE 15-continued

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
| 2/15  | 0  | 2  | 4  | 6  | 8  | 10 | 12 | 14 | 16 | 18 | 20 | 22 | 24 | 26 | 28 | 30 | 32 | 34 | 36 | 38 | 40 | 42 | 1 |
|       | 3  | 5  | 7  | 9  | 11 | 13 | 15 | 17 | 19 | 21 | 23 | 25 | 27 | 29 | 31 | 33 | 35 | 37 | 39 | 41 | 43 | 44 |   |
| 3/15  | 15 | 22 | 34 | 19 | 7  | 17 | 28 | 43 | 30 | 32 | 14 | 1  | 11 | 0  | 3  | 9  | 10 | 38 | 24 | 4  | 23 | 18 | 27 |
|       | 39 | 29 | 33 | 8  | 2  | 40 | 21 | 20 | 36 | 44 | 12 | 37 | 13 | 35 | 6  | 31 | 26 | 16 | 25 | 42 | 5  | 41 |   |
| 4/15  | 0  | 2  | 4  | 6  | 8  | 10 | 12 | 14 | 16 | 18 | 20 | 22 | 24 | 26 | 28 | 30 | 32 | 34 | 36 | 38 | 40 | 42 | 1 |
|       | 3  | 5  | 7  | 9  | 11 | 13 | 15 | 17 | 19 | 21 | 23 | 25 | 27 | 29 | 31 | 33 | 35 | 37 | 39 | 41 | 43 | 44 |   |
| 5/15  | 35 | 7  | 29 | 11 | 14 | 32 | 38 | 28 | 20 | 17 | 25 | 39 | 19 | 4  | 1  | 12 | 10 | 30 | 0  | 44 | 43 | 2  | 21 |
|       | 5  | 13 | 34 | 37 | 23 | 15 | 36 | 18 | 42 | 16 | 33 | 31 | 27 | 22 | 3  | 6  | 40 | 24 | 41 | 9  | 26 | 8  |   |
| 6/15  | 7  | 4  | 0  | 5  | 27 | 30 | 25 | 13 | 31 | 9  | 34 | 10 | 17 | 11 | 8  | 12 | 15 | 16 | 18 | 19 | 20 | 21 | 22 |
|       | 23 | 1  | 35 | 24 | 29 | 33 | 6  | 26 | 14 | 32 | 28 | 2  | 3  | 36 | 37 | 38 | 39 | 40 | 41 | 42 | 43 | 44 |   |
| 7/15  | 3  | 7  | 1  | 4  | 18 | 21 | 22 | 6  | 9  | 5  | 17 | 14 | 13 | 15 | 10 | 20 | 8  | 19 | 16 | 12 | 0  | 11 | 2 |
|       | 23 | 24 | 25 | 26 | 27 | 28 | 29 | 30 | 31 | 32 | 33 | 34 | 35 | 36 | 37 | 38 | 39 | 40 | 41 | 42 | 43 | 44 |   |
| 8/15  | 0  | 2  | 4  | 6  | 8  | 10 | 12 | 14 | 16 | 18 | 20 | 22 | 24 | 26 | 28 | 30 | 32 | 34 | 36 | 38 | 40 | 42 | 1 |
|       | 3  | 5  | 7  | 9  | 11 | 13 | 15 | 17 | 19 | 21 | 23 | 25 | 27 | 29 | 31 | 33 | 35 | 37 | 39 | 41 | 43 | 44 |   |
| 9/15  | 0  | 1  | 2  | 3  | 4  | 5  | 6  | 7  | 8  | 9  | 10 | 11 | 12 | 13 | 14 | 15 | 16 | 17 | 18 | 19 | 20 | 21 | 22 |
|       | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 0 |
| 10/15 | 1  | 3  | 2  | 8  | 5  | 23 | 13 | 12 | 18 | 19 | 17 | 20 | 24 | 26 | 28 | 30 | 32 | 34 | 36 | 38 | 40 | 42 | 0 |
|       | 4  | 6  | 7  | 21 | 16 | 10 | 15 | 9  | 11 | 22 | 14 | 25 | 27 | 29 | 31 | 33 | 35 | 37 | 39 | 41 | 43 | 44 |   |
| 11/15 | 0  | 2  | 4  | 6  | 8  | 10 | 12 | 14 | 16 | 18 | 20 | 22 | 24 | 26 | 28 | 30 | 32 | 34 | 36 | 38 | 40 | 42 | 1 |
|       | 3  | 5  | 7  | 9  | 11 | 13 | 15 | 17 | 19 | 21 | 23 | 25 | 27 | 29 | 31 | 33 | 35 | 37 | 39 | 41 | 43 | 44 |   |
| 12/15 | 0  | 2  | 4  | 6  | 8  | 10 | 12 | 14 | 16 | 18 | 20 | 22 | 24 | 26 | 28 | 30 | 32 | 34 | 36 | 38 | 40 | 42 | 1 |
|       | 3  | 5  | 7  | 9  | 11 | 13 | 15 | 17 | 19 | 21 | 23 | 25 | 27 | 29 | 31 | 33 | 35 | 37 | 39 | 41 | 43 | 44 |   |
| 13/15 | 26 | 10 | 12 | 38 | 28 | 15 | 0  | 44 | 34 | 24 | 14 | 8  | 40 | 30 | 20 | 13 | 42 | 32 | 22 | 11 | 9  | 36 | 25 |
|       | 7  | 5  | 37 | 27 | 4  | 16 | 43 | 33 | 23 | 2  | 18 | 39 | 29 | 19 | 6  | 41 | 31 | 21 | 3  | 17 | 35 | 1  |   |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 16200 and modulates bits by the 16-QAM in the constellation mapper 430.

In this case, the group interleaver 422 may perform the interleaving using π(j) defined by the Table 16.

TABLE 16

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
|       | 0  | 1  | 2  | 3  | 4  | 5  | 6  | 7  | 8  | 9  | 10 | 11 | 12 | 13 | 14 | 15 | 16 | 17 | 18 | 19 | 20 | 21 | 22 |
|       | 23 | 24 | 25 | 26 | 27 | 28 | 29 | 30 | 31 | 32 | 33 | 34 | 35 | 36 | 37 | 38 | 39 | 40 | 41 | 42 | 43 | 44 |   |
| 2/15  | 5  | 33 | 18 | 8  | 29 | 10 | 21 | 14 | 30 | 26 | 11 | 23 | 27 | 4  | 7  | 6  | 24 | 44 | 38 | 31 | 34 | 43 | 13 |
|       | 0  | 15 | 42 | 17 | 2  | 20 | 12 | 40 | 39 | 35 | 32 | 1  | 3  | 41 | 37 | 9  | 25 | 19 | 22 | 16 | 28 | 36 |   |
| 3/15  | 18 | 16 | 5  | 29 | 26 | 43 | 23 | 6  | 1  | 24 | 7  | 19 | 37 | 2  | 27 | 3  | 10 | 15 | 36 | 39 | 22 | 12 | 35 |
|       | 33 | 4  | 17 | 30 | 31 | 21 | 9  | 11 | 41 | 0  | 32 | 20 | 40 | 25 | 8  | 34 | 38 | 28 | 14 | 44 | 13 | 42 |   |
| 4/15  | 34 | 3  | 19 | 35 | 25 | 2  | 17 | 36 | 26 | 38 | 0  | 40 | 27 | 10 | 7  | 43 | 21 | 28 | 15 | 6  | 1  | 37 | 18 |
|       | 30 | 32 | 33 | 29 | 22 | 12 | 13 | 5  | 23 | 44 | 14 | 4  | 31 | 20 | 39 | 42 | 11 | 9  | 16 | 41 | 8  | 24 |   |
| 5/15  | 3  | 33 | 39 | 2  | 38 | 29 | 0  | 10 | 25 | 17 | 7  | 21 | 44 | 37 | 8  | 34 | 20 | 1  | 4  | 31 | 11 | 42 | 22 |
|       | 13 | 12 | 28 | 26 | 43 | 30 | 14 | 16 | 23 | 24 | 15 | 5  | 18 | 9  | 36 | 6  | 19 | 32 | 40 | 41 | 35 | 27 |   |
| 6/15  | 12 | 13 | 15 | 30 | 27 | 25 | 11 | 34 | 9  | 4  | 31 | 22 | 6  | 32 | 7  | 21 | 17 | 3  | 1  | 26 | 10 | 33 | 19 |
|       | 2  | 18 | 5  | 28 | 35 | 8  | 16 | 29 | 23 | 14 | 0  | 20 | 24 | 36 | 37 | 38 | 39 | 40 | 41 | 42 | 43 | 44 |   |
| 7/15  | 19 | 3  | 32 | 38 | 16 | 17 | 29 | 33 | 14 | 10 | 6  | 2  | 20 | 15 | 40 | 39 | 12 | 22 | 23 | 34 | 31 | 13 | 44 |
|       | 43 | 36 | 24 | 37 | 42 | 0  | 9  | 4  | 21 | 5  | 35 | 26 | 41 | 7  | 28 | 11 | 25 | 8  | 18 | 1  | 30 | 27 |   |
| 8/15  | 36 | 5  | 22 | 26 | 1  | 13 | 3  | 33 | 9  | 6  | 23 | 20 | 35 | 10 | 17 | 41 | 30 | 15 | 21 | 42 | 29 | 11 | 37 |
|       | 4  | 2  | 38 | 44 | 0  | 18 | 19 | 8  | 31 | 28 | 43 | 14 | 34 | 32 | 25 | 40 | 12 | 16 | 24 | 39 | 27 | 7  |   |
| 9/15  | 4  | 6  | 19 | 2  | 5  | 30 | 20 | 11 | 22 | 12 | 15 | 0  | 36 | 37 | 38 | 39 | 26 | 14 | 34 | 35 | 16 | 13 | 18 |
|       | 42 | 7  | 10 | 25 | 43 | 40 | 17 | 41 | 24 | 33 | 31 | 23 | 32 | 21 | 3  | 27 | 28 | 8  | 9  | 29 | 1  | 44 |   |
| 10/15 | 27 | 11 | 20 | 1  | 7  | 5  | 29 | 35 | 9  | 10 | 34 | 18 | 25 | 28 | 6  | 13 | 17 | 0  | 23 | 16 | 41 | 15 | 19 |
|       | 44 | 24 | 37 | 4  | 31 | 8  | 32 | 14 | 42 | 12 | 2  | 40 | 30 | 36 | 39 | 43 | 21 | 3  | 22 | 26 | 33 | 38 |   |
| 11/15 | 2  | 4  | 41 | 8  | 13 | 7  | 0  | 24 | 3  | 22 | 5  | 32 | 10 | 9  | 36 | 37 | 29 | 11 | 25 | 16 | 20 | 21 | 35 |
|       | 34 | 15 | 1  | 6  | 14 | 27 | 30 | 33 | 12 | 17 | 28 | 23 | 40 | 26 | 31 | 38 | 39 | 18 | 19 | 42 | 43 | 44 |   |
| 12/15 | 3  | 6  | 7  | 27 | 2  | 23 | 10 | 30 | 22 | 28 | 24 | 20 | 37 | 21 | 4  | 14 | 11 | 42 | 16 | 9  | 15 | 26 | 33 |
|       | 40 | 5  | 8  | 44 | 34 | 18 | 0  | 32 | 29 | 19 | 41 | 38 | 17 | 25 | 43 | 35 | 36 | 13 | 39 | 12 | 1  | 31 |   |
| 13/15 | 12 | 7  | 20 | 43 | 29 | 13 | 32 | 30 | 25 | 0  | 17 | 18 | 9  | 1  | 41 | 42 | 6  | 33 | 28 | 14 | 16 | 11 | 39 |
|       | 40 | 15 | 4  | 23 | 5  | 2  | 24 | 22 | 38 | 10 | 8  | 19 | 34 | 26 | 36 | 37 | 27 | 21 | 31 | 3  | 35 | 44 |   |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 16200 and modulates bits by the 64-QAM in the constellation mapper 430.

In this case, the group interleaver 422 may perform the interleaving using π(j) defined by the Table 17.

TABLE 17

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 2/15 | 7 | 11 | 4 | 38 | 19 | 25 | 2 | 43 | 15 | 26 | 18 | 14 | 9 | 29 | 44 | 32 | 0 | 5 | 35 | 10 | 1 | 12 | 6 |
| | 36 | 21 | 33 | 37 | 34 | 3 | 31 | 20 | 16 | 40 | 23 | 41 | 22 | 30 | 39 | 13 | 24 | 17 | 42 | 28 | 8 | 27 | |
| 3/15 | 19 | 34 | 22 | 6 | 29 | 25 | 23 | 36 | 7 | 8 | 24 | 16 | 27 | 43 | 11 | 35 | 5 | 28 | 13 | 4 | 3 | 17 | 15 |
| | 38 | 20 | 0 | 26 | 12 | 1 | 39 | 31 | 41 | 44 | 30 | 9 | 21 | 42 | 18 | 14 | 32 | 10 | 2 | 37 | 33 | 40 | |
| 4/15 | 41 | 34 | 32 | 37 | 5 | 8 | 13 | 15 | 30 | 31 | 22 | 25 | 42 | 20 | 23 | 17 | 1 | 40 | 44 | 12 | 6 | 43 | 7 |
| | 29 | 33 | 16 | 11 | 0 | 35 | 4 | 14 | 28 | 21 | 3 | 24 | 19 | 18 | 36 | 10 | 38 | 26 | 2 | 39 | 27 | 9 | |
| 5/15 | 25 | 44 | 8 | 39 | 37 | 2 | 11 | 7 | 0 | 12 | 4 | 31 | 33 | 38 | 43 | 21 | 26 | 13 | 28 | 29 | 1 | 27 | 18 |
| | 17 | 34 | 3 | 42 | 10 | 19 | 20 | 32 | 36 | 40 | 9 | 41 | 5 | 35 | 30 | 22 | 15 | 16 | 6 | 24 | 23 | 14 | |
| 6/15 | 31 | 12 | 39 | 32 | 30 | 24 | 28 | 15 | 38 | 23 | 27 | 41 | 0 | 6 | 17 | 37 | 42 | 20 | 11 | 4 | 40 | 2 | 3 |
| | 26 | 10 | 7 | 13 | 25 | 1 | 18 | 8 | 5 | 14 | 36 | 35 | 33 | 22 | 9 | 44 | 16 | 34 | 19 | 21 | 29 | 43 | |
| 7/15 | 2 | 14 | 10 | 0 | 37 | 42 | 38 | 40 | 24 | 29 | 28 | 35 | 18 | 16 | 20 | 27 | 41 | 30 | 15 | 19 | 9 | 43 | 25 |
| | 3 | 6 | 7 | 31 | 32 | 26 | 36 | 17 | 1 | 13 | 5 | 39 | 33 | 4 | 8 | 23 | 22 | 11 | 34 | 44 | 12 | 21 | |
| 8/15 | 36 | 6 | 2 | 20 | 43 | 17 | 33 | 22 | 23 | 25 | 13 | 0 | 10 | 7 | 21 | 1 | 19 | 26 | 8 | 14 | 31 | 35 | 16 |
| | 5 | 29 | 40 | 11 | 9 | 4 | 34 | 15 | 42 | 32 | 28 | 18 | 37 | 30 | 39 | 24 | 41 | 3 | 38 | 27 | 12 | 44 | |
| 9/15 | 21 | 5 | 43 | 38 | 40 | 1 | 3 | 17 | 11 | 37 | 10 | 41 | 9 | 15 | 25 | 44 | 14 | 27 | 7 | 18 | 20 | 35 | 16 |
| | 0 | 6 | 19 | 8 | 22 | 29 | 28 | 34 | 31 | 33 | 30 | 32 | 42 | 13 | 4 | 24 | 26 | 36 | 2 | 23 | 12 | 39 | |
| 10/15 | 14 | 22 | 18 | 11 | 28 | 26 | 2 | 38 | 10 | 0 | 5 | 12 | 24 | 17 | 29 | 16 | 39 | 13 | 23 | 8 | 25 | 43 | 34 |
| | 33 | 27 | 15 | 7 | 1 | 9 | 35 | 40 | 32 | 30 | 20 | 36 | 31 | 21 | 41 | 44 | 3 | 42 | 6 | 19 | 37 | 4 | |
| 11/15 | 31 | 20 | 21 | 25 | 4 | 16 | 9 | 3 | 17 | 24 | 5 | 10 | 12 | 28 | 6 | 19 | 8 | 15 | 13 | 11 | 29 | 22 | 27 |
| | 14 | 23 | 34 | 26 | 18 | 42 | 2 | 37 | 44 | 39 | 33 | 35 | 41 | 0 | 36 | 7 | 40 | 38 | 1 | 30 | 32 | 43 | |
| 12/15 | 17 | 11 | 14 | 7 | 31 | 10 | 2 | 26 | 0 | 32 | 29 | 22 | 33 | 12 | 20 | 28 | 27 | 39 | 37 | 15 | 4 | 5 | 8 |
| | 13 | 38 | 18 | 23 | 34 | 24 | 6 | 1 | 9 | 16 | 44 | 21 | 3 | 36 | 30 | 40 | 35 | 43 | 42 | 25 | 19 | 41 | |
| 13/15 | 9 | 7 | 15 | 10 | 11 | 12 | 13 | 6 | 21 | 17 | 14 | 20 | 26 | 8 | 25 | 32 | 34 | 23 | 2 | 4 | 31 | 18 | 5 |
| | 27 | 29 | 3 | 38 | 36 | 39 | 43 | 41 | 42 | 40 | 44 | 1 | 28 | 33 | 22 | 16 | 19 | 24 | 0 | 30 | 35 | 37 | |

As another example, it is assumed that the LDPC encoder 410 encodes the LDPC information bits according to the code rate of 2/15, 3/15, 4/15, 5/15, 6/15, 7/15, 8/15, 9/15, 10/15, 11/15, 12/15, and 13/15 to generate the LDPC codeword having a length of 16200 and modulates bits by the 256-QAM in the constellation mapper 430.

In this case, the group interleaver 422 may perform the interleaving using π(j) defined by the Table 18.

TABLE 18

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 2/15 | 31 | 3 | 38 | 9 | 34 | 6 | 4 | 18 | 15 | 1 | 21 | 19 | 42 | 20 | 12 | 13 | 30 | 26 | 14 | 2 | 10 | 35 | 28 |
| | 44 | 23 | 11 | 22 | 16 | 29 | 40 | 27 | 37 | 25 | 41 | 5 | 43 | 39 | 36 | 7 | 24 | 32 | 17 | 33 | 8 | 0 | |
| 3/15 | 5 | 22 | 23 | 26 | 29 | 27 | 16 | 1 | 4 | 25 | 41 | 21 | 12 | 2 | 6 | 8 | 7 | 19 | 44 | 42 | 39 | 40 | 43 |
| | 35 | 10 | 28 | 13 | 15 | 37 | 32 | 3 | 24 | 36 | 38 | 11 | 18 | 33 | 30 | 14 | 9 | 34 | 20 | 0 | 17 | 31 | |
| 4/15 | 38 | 20 | 0 | 34 | 33 | 41 | 14 | 30 | 44 | 7 | 37 | 8 | 4 | 9 | 43 | 15 | 19 | 32 | 23 | 5 | 22 | 26 | 10 |
| | 12 | 3 | 31 | 36 | 21 | 24 | 11 | 16 | 18 | 17 | 29 | 35 | 42 | 13 | 40 | 1 | 28 | 2 | 25 | 6 | 39 | 27 | |
| 5/15 | 4 | 23 | 3 | 6 | 18 | 5 | 0 | 2 | 7 | 26 | 21 | 27 | 39 | 42 | 38 | 31 | 1 | 34 | 20 | 37 | 40 | 24 | 43 |
| | 25 | 33 | 9 | 22 | 36 | 30 | 35 | 11 | 10 | 17 | 32 | 13 | 12 | 41 | 15 | 14 | 19 | 16 | 8 | 44 | 29 | 28 | |
| 6/15 | 17 | 13 | 25 | 24 | 14 | 21 | 1 | 37 | 2 | 3 | 11 | 22 | 18 | 5 | 10 | 23 | 12 | 4 | 26 | 16 | 38 | 36 | 33 |
| | 39 | 0 | 6 | 7 | 31 | 32 | 34 | 27 | 35 | 15 | 9 | 30 | 28 | 19 | 8 | 20 | 29 | 40 | 41 | 42 | 43 | 44 | |
| 7/15 | 13 | 16 | 4 | 12 | 44 | 15 | 8 | 14 | 0 | 3 | 30 | 20 | 35 | 21 | 10 | 6 | 19 | 17 | 26 | 39 | 7 | 24 | 9 |
| | 27 | 5 | 37 | 23 | 32 | 40 | 31 | 38 | 42 | 34 | 25 | 36 | 2 | 22 | 43 | 33 | 28 | 1 | 18 | 11 | 41 | 29 | |
| 8/15 | 41 | 2 | 12 | 6 | 33 | 1 | 13 | 11 | 26 | 10 | 39 | 43 | 36 | 23 | 42 | 7 | 44 | 20 | 8 | 38 | 18 | 22 | 24 |
| | 40 | 4 | 28 | 29 | 19 | 14 | 5 | 9 | 0 | 30 | 25 | 35 | 37 | 27 | 32 | 31 | 34 | 21 | 3 | 15 | 17 | 16 | |
| 9/15 | 5 | 7 | 9 | 22 | 10 | 12 | 3 | 43 | 6 | 4 | 24 | 13 | 14 | 11 | 15 | 18 | 19 | 17 | 16 | 41 | 25 | 26 | 20 |
| | 23 | 21 | 33 | 31 | 28 | 39 | 36 | 30 | 37 | 27 | 32 | 34 | 35 | 29 | 2 | 42 | 0 | 1 | 8 | 40 | 38 | 44 | |
| 10/15 | 28 | 20 | 18 | 38 | 39 | 2 | 3 | 30 | 19 | 4 | 14 | 36 | 7 | 0 | 25 | 17 | 10 | 6 | 33 | 15 | 8 | 26 | 42 |
| | 24 | 11 | 21 | 23 | 5 | 40 | 41 | 29 | 32 | 37 | 44 | 43 | 31 | 35 | 34 | 22 | 1 | 16 | 27 | 9 | 13 | 12 | |
| 11/15 | 8 | 13 | 0 | 11 | 9 | 4 | 36 | 37 | 16 | 3 | 10 | 14 | 24 | 20 | 33 | 34 | 25 | 2 | 21 | 31 | 12 | 19 | 7 |
| | 5 | 27 | 23 | 26 | 1 | 18 | 22 | 35 | 6 | 32 | 30 | 28 | 15 | 29 | 17 | 39 | 38 | 40 | 41 | 42 | 43 | 44 | |
| 12/15 | 28 | 21 | 10 | 15 | 8 | 22 | 26 | 2 | 14 | 1 | 27 | 3 | 39 | 20 | 34 | 25 | 12 | 6 | 7 | 40 | 30 | 29 | 38 |
| | 16 | 43 | 33 | 4 | 35 | 9 | 32 | 5 | 36 | 0 | 41 | 37 | 18 | 17 | 13 | 24 | 42 | 31 | 23 | 19 | 11 | 44 | |
| 13/15 | 9 | 13 | 10 | 7 | 11 | 6 | 1 | 14 | 12 | 8 | 21 | 15 | 4 | 36 | 25 | 30 | 24 | 28 | 29 | 20 | 27 | 5 | 18 |
| | 17 | 22 | 33 | 0 | 16 | 23 | 31 | 42 | 3 | 40 | 39 | 41 | 43 | 37 | 44 | 26 | 2 | 19 | 38 | 32 | 35 | 34 | |

Meanwhile, the scheme of performing the interleaving based on the above Tables will be described below.

For example, it is assumed that the LDPC encoder 410 encodes the LDPC information bits according to a code rate of 2/15 to generate the LDPC codeword having a length of 64800 and the constellation mapper 430 modulates bits by the QPSK.

In this case, the group interleaver 422 may perform the interleaving using $\pi(j)$ defined when the code rate is 2/15 in the Table 9.

In the case of the above Table 9, the above Equation 19 may be represented by $Y_0=X_{\pi(0)}=X_{70}$, $Y_1=X_{\pi(1)}=X_{149}$, $Y_2=X_{\pi(2)}=X_{136}, \ldots, Y_{178}=X_{\pi(178)}=X_{38}, Y_{179}=X_{\pi(179)}=X_{17}$. Therefore, the group interleaver 422 may interleave the order of the plurality of bit groups in the bits group wise by changing an order of the bit group such as a 70-th bit group to a 0-th bit group, a 149-th bit group to a 1-th bit group, a 136-th bit group to a 2-th bit group, . . . , a 38-th bit group to a 178-th bit group, and a 17-th bit group to a 179-th bit group.

The block interleaver 423 interleaves the plurality of bit groups of which the order is rearranged.

Specifically, the block interleaver 423 is configured of a plurality of columns each including a plurality of rows and thus may interleave the plurality of bit groups of which the order of the bit group is rearranged by the group interleaver 422 in the bits group wise.

Here, the number of columns may be the same as the modulation order. For example, when the modulation scheme is QPSK, 16-QAM, 256-QAM, 1024-QAM, and 4096-QAM, the modulation orders each are 2, 4, 6, 8, 10, and 12. In this case, the block interleaver 423 may perform the block interleaving using 2, 4, 6, 8, 10, and 12 columns according to the modulation scheme.

In this case, the block interleaver 423 may divide the plurality of bit groups rearranged using a first part (part 1) and a second part (part 2) depending on the modulation order and interleave the plurality of bit groups.

Specifically, the block interleaver 423 divides the plurality of columns into the first part and the second part, writes the plurality of bit groups in the plurality of columns configuring the first part in the bits group wise, divides bits configuring the remaining bit groups into a sub bit group formed of the number of preset bits based on the number of the plurality of columns, and writes the divided sub bit group in the plurality of columns configuring the second part, thereby performing the interleaving.

Here, the number of groups interleaved in the bit group wise may be determined according to at least one of the number of rows and columns configuring the block interleaver 423, the number of bit groups, and the number of bits included in each of the bit groups. That is, the block interleaver 423 may determine the bit group interleaved in the bit group wise among the plurality of bit groups in consideration of at least one of the number of rows and columns configuring the block interleaver 423, the number of bit groups, and the number of bits included in each bit group, interleave the corresponding bit group in the bits group wise, and divide the bits configuring the remaining bit groups into the sub bit group and interleave them. For example, the block interleaver 423 may interleave at least some of the plurality of bit groups in the bits group wise using the first part and divide the remaining bit groups using the second part and interleave them.

Meanwhile, interleaving in the bits group wise means that the bits included in the same bit group are written in the same column. That is, the block interleaver 423 does not divide the bits included in the same bit group in the case of the bit group interleaved in the bits group wise but is written in the same column and divides the bits included in the corresponding bit group in the case of the bit group that is not interleaved in the bits group wise and writes the divided bits in different columns, thereby performing the interleaving.

Therefore, the number of rows configuring the first part is a multiple of the number (for example, 360) of bits included in one bit group and the number of rows configuring the second part may be less than the number of bits included one group.

Meanwhile, the block interleaver 423 may perform the interleaving in different schemes based on a code length, a code rate, and a modulation order.

Specifically, the block interleaver 423 may perform the block interleaving using a block interleaving scheme according to type A or type B based on the code length, the code rate, and the modulation order, which is as following Table 19 and Table 20 in detail.

TABLE 19

| CR MOD | 2/15 | 3/15 | 4/15 | 5/15 | 6/15 | 7/15 | 8/15 | 9/15 | 10/15 | 11/15 | 12/15 | 13/15 |
|---|---|---|---|---|---|---|---|---|---|---|---|---|
| QPSK | A | A | A | A | A | A | A | A | A | A | A | A |
| 16-QAM | A | A | A | B | A | A | B | B | A | A | A | A |
| 64-QAM | A | A | A | A | A | B | A | B | B | A | A | B |
| 256-QAM | A | A | A | B | B | B | B | A | B | B | A | B |
| 1024-QAM | A | A | A | B | A | B | A | B | B | B | A | A |
| 4096-QAM | A | A | A | A | A | A | B | A | A | A | A | A |

TABLE 20

| CR MOD | 2/15 | 3/15 | 4/15 | 5/15 | 6/15 | 7/15 | 8/15 | 9/15 | 10/15 | 11/15 | 12/15 | 13/15 |
|---|---|---|---|---|---|---|---|---|---|---|---|---|
| QPSK | A | A | A | A | B | B | A | B | A | A | A | A |
| 16-QAM | A | A | A | A | B | B | A | B | A | B | A | B |
| 64-QAM | A | A | A | A | B | B | A | B | A | A | A | A |
| 256-QAM | A | A | A | A | B | A | A | A | A | B | A | A |

Above Table 19 shows a case in which the length $N_{inner}$ of the LDPC codeword is 64800 and above Table 20 shows a case in which the length $N_{inner}$ of f the LDPC codeword is 16200.

Meanwhile, the block interleaving scheme according to type A or type B is as follows.

Hereinafter, the block interleaving scheme according to type A will be described.

The block interleaver 423 may interleave the plurality of bit groups in the bits group wise using the plurality of columns each being formed of the plurality of rows.

In this case, the block interleaver 423 may divide the plurality of rows into at least two parts to interleave the LDPC codeword. For example, the block interleaver 423 may divide the plurality of rows into the first part and the second part to interleave the plurality of bit groups configuring the LDPC codeword.

Specifically, the block interleaver 423 may divide the plurality of columns into N (N is an integer equal to or greater than 2) parts depending on whether the number of bit groups configuring the LDPC codeword is an integer multiple of the number of columns configuring the block interleaver 423 to perform the interleaving.

First, when the number of bit groups configuring the LDPC codeword is an integer multiple of the number of columns configuring the block interleaver 423, the block interleaver 423 does not divide the parts of the plurality of columns but may interleave the plurality of bit groups configuring the LDPC codeword in the bits group wise.

Specifically, the block interleaver 124 may write the plurality of bit groups configuring the LDPC codeword in each of the columns in the column direction in the bits group wise and reads each row of the plurality of columns in which the plurality of bit groups are written in the bits group wise in a row direction to perform the interleaving.

In this case, the block interleaver 124 sequentially writes the bits included in the bit groups as many as a quotient obtained by dividing the number of bit groups configuring the LDPC codeword by the number of columns configuring the block interleaver 124 in each of the columns in the column direction and reads each row of the plurality of columns in which the bits are written in the row direction to perform the interleaving.

Hereinafter, for convenience of explanation, the bit group positioned at a j-th position after being interleaved in the group interleaver 422 is called a bit group $Y_j$.

For example, it is assumed that the block interleavers 423 each consist of $N_C$ columns including $N_r$ rows. Further, it is assumed that the LDPC codeword is formed of $N_{group}$ bit groups and the number $N_{group}$ of bit groups is a multiple of $N_C$.

In this case, when a quotient obtained by dividing the number $N_{group}$ of the bit group configuring the LDPC codeword by the number $N_C$ of columns configuring the block interleaver 423 is A ($=N_{group}/N_C$) (A is an integer larger than 0), the block interleaver 423 may sequentially write A ($=N_{group}/N_C$) bit groups in each column in the column direction and read the bits written in the plurality of columns in the row direction to perform the interleaving.

Figure 14:
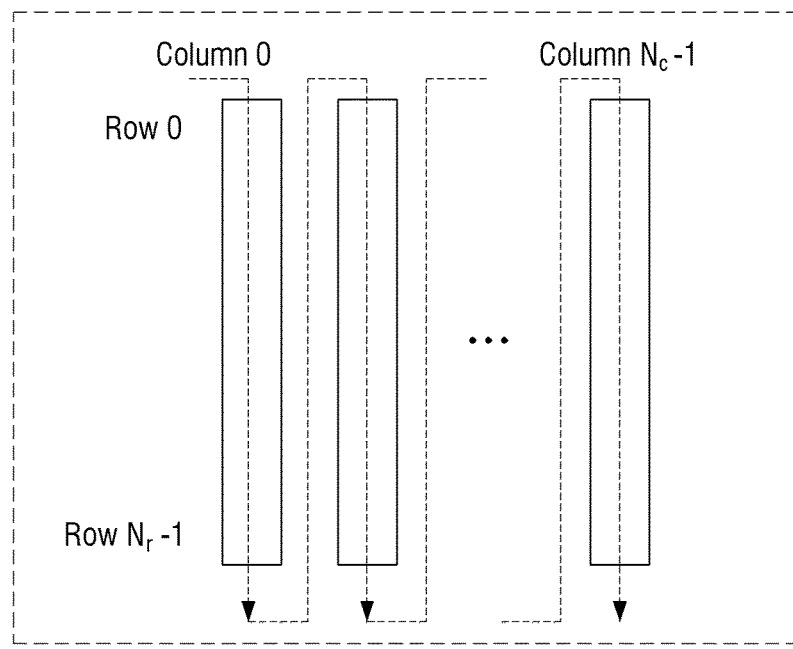
Figure 14:
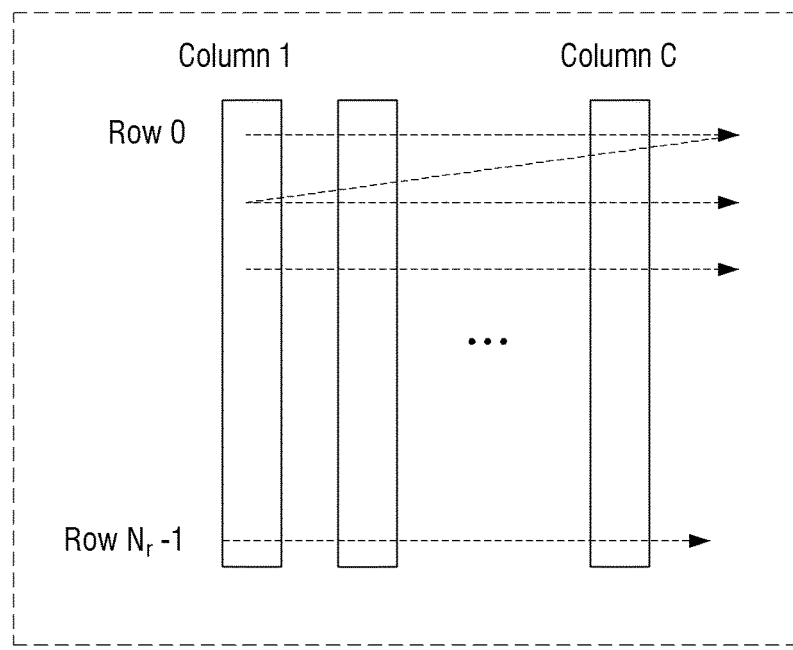

For example, as shown in FIG. 14, the block interleaver 423 may write bits included in each of the bit group $Y_0$, bit group $Y_1$, . . . , bit group $Y_{A-1}$ in 0-th row to ($N_r$−1)-th row of a 0-th column, write bits included in each of the bit group $Y_A$, bit group $Y_{A+1}$, . . . , bit group $Y_{2A-1}$ in 0-th row to ($N_r$−1)-th row of a first column, . . . , write bits included in each of the bit group $Y_{NC×A−A}$, bit group $Y_{NC×A−A+1}$, bit group $Y_{NC×A−1}$ in 0-th row to ($N_r$−1)-th row of an ($N_c$−1)-th column, and read the bits written in each row of the plurality of columns in the row direction.

Therefore, the block interleaver 423 interleaves all the bit groups configuring the LDPC codewords in the bits group wise.

However, when the number of bit groups configuring the LDPC codeword is not an integer multiple of the number of columns configuring the block interleaver 423, the block interleaver 423 may divide the plurality of columns into two parts to interleave some of the plurality of bit groups configuring the LDPC codeword in the bits group wise and collect the bits configuring the remaining bit groups and divides them into the sub bit group to perform the interleaving. In this case, bits included in the remaining bit groups, that is, bits included in the bit groups as many as the remainder obtained by dividing the number of groups configuring the LDPC codeword by the number of columns may not be interleaved in the bits group wise but may be divided in each column depending on the number of columns to be interleaved.

Specifically, the block interleaver 423 may divide the plurality of columns into two parts to interleave the LDPC codeword.

In this case, the block interleaver 423 may divide the plurality of columns into the first part and the second part based on the number of columns configuring the block interleaver 423, the number of bit groups configuring the LDPC codeword, and the number of bits configuring each of the plurality of bit groups.

Here, the plurality of bit groups may each consist of 360 bits. Further, the number of bit groups configuring the LDPC codeword is determined depending on the length of the LDPC codeword and the number of bits included in each bit group. For example, if the LDPC codeword having a length of 16200 is divided so that each of the bit groups is formed of 360 bits, the LDPC codeword may be divided into 45 bit groups and if the LDPC codeword having a length of 64800 is divided so that each of the bit groups is formed of 360 bits, the LDPC codeword may be divided into 180 bit groups. In this case, the number of columns configuring the block interleaver 423 may be determined according to the modulation scheme.

Therefore, the number of rows configuring each of the first part and the second part may be determined based on the number of columns configuring the block interleaver 423, the number of bit groups configuring the LDPC codeword, and the number of bits configuring each of the plurality of bit groups.

Specifically, the first part may be configured of rows as many as the number of bits included in at least one bit group that may be written in the bits group wise in each of the plurality of columns among the plurality of bit groups configuring the LDPC codeword depending on the number of columns configuring the block interleaver 423, the number of bit groups configuring the LDPC codeword, and the number of bits configuring each of the plurality of bit groups in each of the plurality of columns.

Further, the second part may be configured of rows other than rows as many as the number of bits included in at least some bit groups that may be written in each of the plurality of columns in the rows configuring each of the plurality of columns in the bits group wise, in each of the plurality of columns. Specifically, the number of rows of the second part may have the same value as the quotient obtained by dividing the number of bits included in all the bit groups other than the bit group corresponding to the first part by the number of columns configuring the block interleaver 423.

That is, the number of rows of the second part may have the same value as the quotient obtained by dividing the number of bits included in the remaining bits groups after being written in the first part among the bit groups configuring the LDPC codeword by the number of columns.

Meanwhile, the block interleaver 423 may divide the plurality of columns into the first part including the rows as many as the number of bits included in the bit groups that may be written in each column in the bits group wise and the second part including the remaining other rows. As a result, the first part may be configured of rows as many as the integer multiple of the number of bits included in the bit group, that is, 360.

In this case, the block interleaver 423 may write and read the LDPC codeword in the first part and the second part to perform the interleaving.

Specifically, the block interleaver 423 may write the LDPC codeword in the plurality of columns configuring the first part and the second part in the column direction and read the plurality of columns configuring each of the first part and the second part in which the LDPC codeword is written in the row direction to perform the interleaving.

That is, the block interleaver 423 may write bits included in at least some of the bit groups that may be written in the bits group wise in each of the plurality of columns in each of the plurality of columns configuring the first part, divide bits included in the remaining bit groups other than the at least some bits in the plurality of bit groups and write the bits in each of the plurality of columns configuring the second part in the column direction, and read the bits written in each of the plurality of columns configuring each of the first part and the second part in the row direction to perform the interleaving.

In this case, the block interleaver 423 may divide the remaining bit groups other than the at least some bit groups in the plurality of bit groups based on the number of columns configuring the block interleaver 423 to perform the interleaving.

Specifically, the block interleaver 423 may interleave by dividing the bits included in the other bit groups by the number of a plurality of columns, writing each of the divided bits in each of a plurality of columns configuring the second part in a row direction, and reading the plurality of columns configuring the second part, where the divided bits are written, in a row direction.

That is, the block interleaver 423 may divide the bits included in the other bit groups except the bit groups written in the first part from among the plurality of bit groups of the LDPC codeword, that is, the bits in the number of bit groups which correspond to the remainder when the number of bit groups configuring the LDPC codeword is divided by the number of columns, by the number of columns, and may write the divided bits in each column of the second part serially in a column direction.

For example, it is assumed that the block interleavers 423 each consist of $N_C$ columns including $N_r$ rows. In addition, it is assumed that the LDPC codeword is formed of the number $N_{group}$ of bit groups, the number $N_{group}$ of bit groups is not a multiple of $N_C$, and $A \times N_C+1=N_{group}$ (A is an integer greater than 0). In other words, it is assumed that when the number of bit groups configuring the LDPC codeword is divided by the number of columns, the quotient is A and the remainder is 1.

Figure 15:
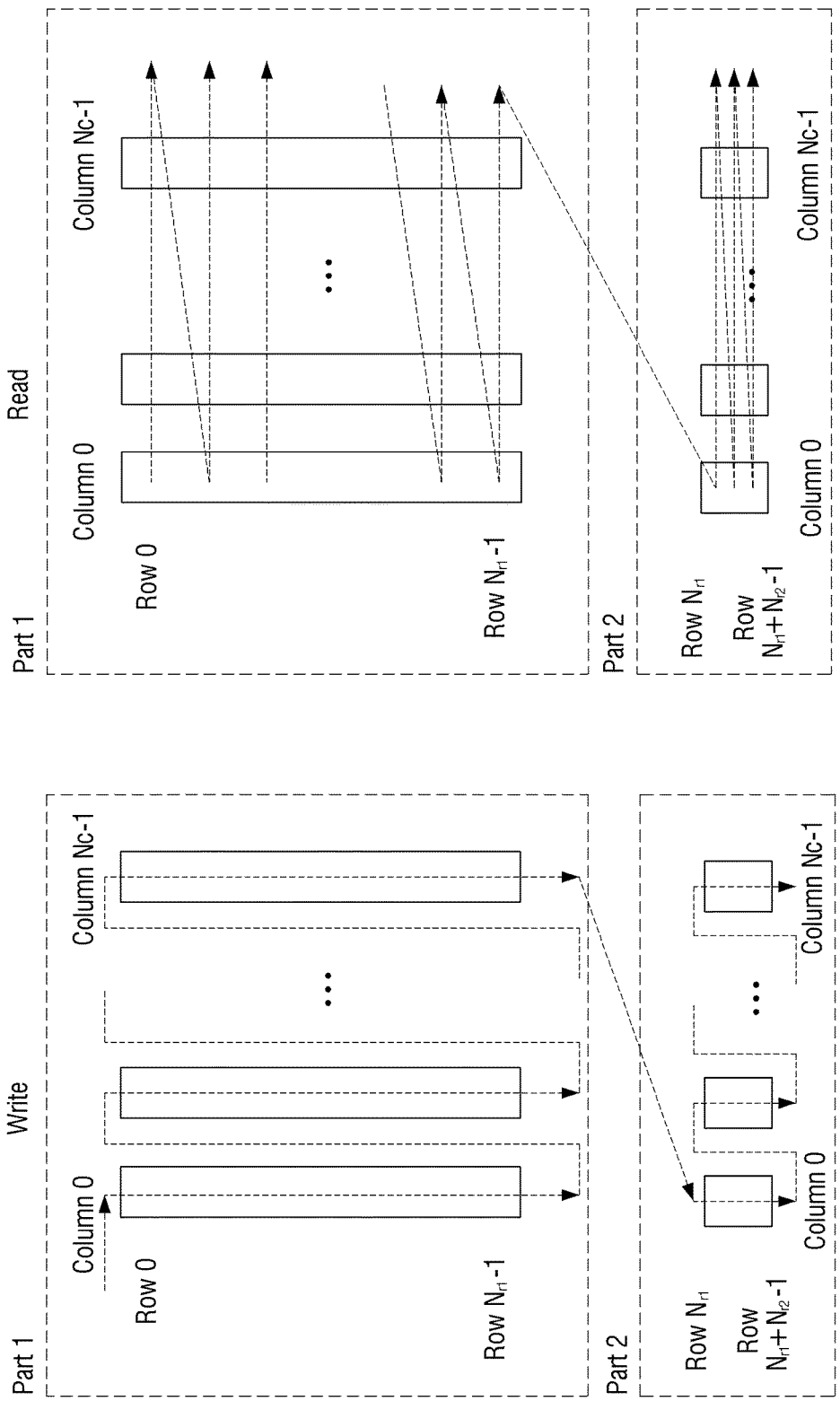
Figure 16:
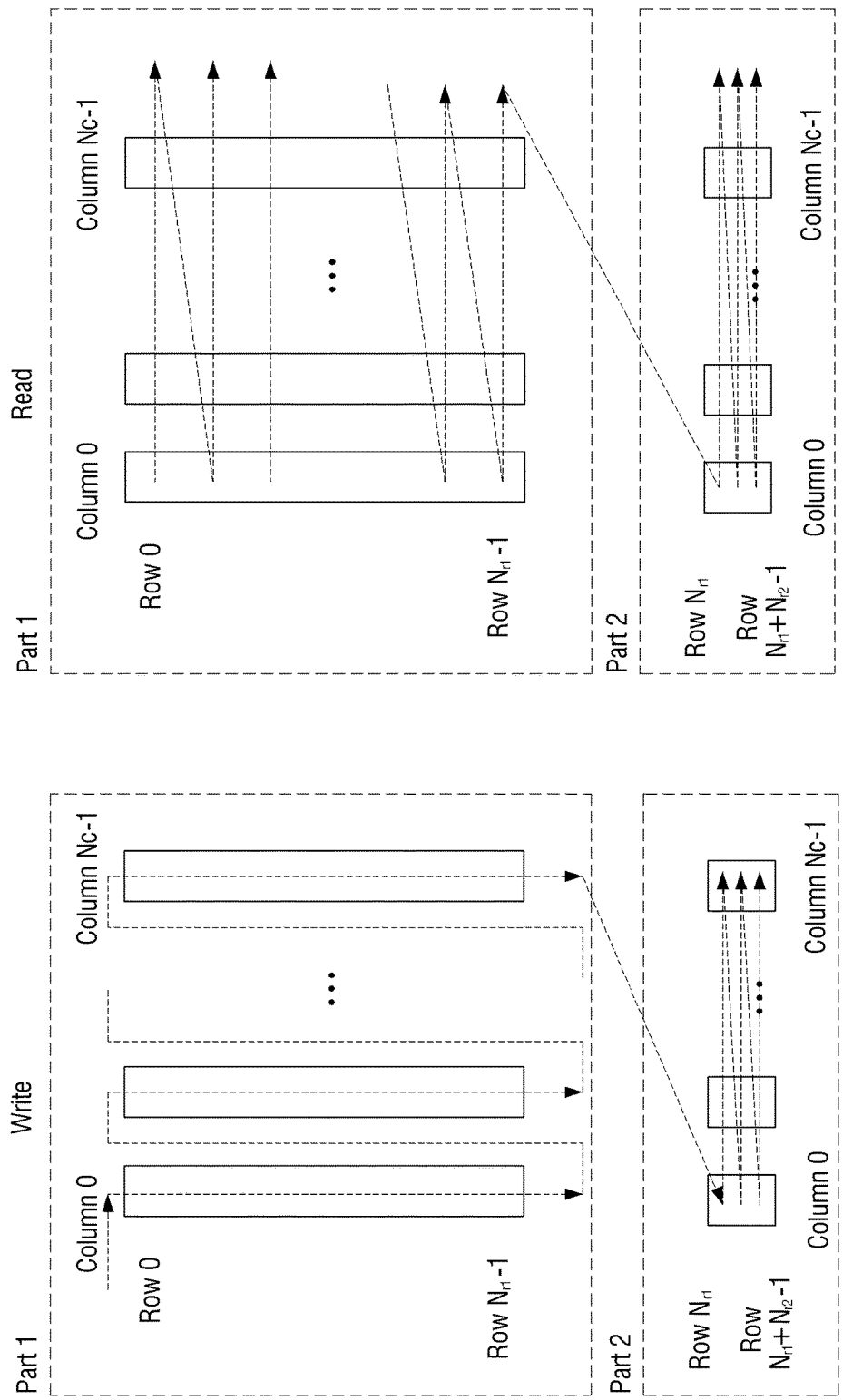

In this case, as shown in FIGS. 15 and 16, the block interleaver 423 may divide each column into a first part including $N_{r1}$ rows and a second part including $N_{r2}$ rows. In this case, $N_{r1}$ (=) may be the number of bits included in the bit group written in the bits group wise in each column and $N_{r2}$ may be a value excepting $N_{r1}$ from the number of columns configuring each column. That is, $N_{r1}+N_{r2}=N_r=N_{inner}/N_C$. Further, represents the largest integer that is equal to or less than $N_{group}/C$.

In this case, the block interleaver 423 writes the bits included in the bit groups which can be written in each column in bit group wise, that is, A bit groups, in the first part of each column in the column direction.

That is, as shown in FIGS. 15 and 16, the block interleaver 423 writes the bits included in each of bit group $Y_0$, bit group $Y_1$, ..., bit group $Y_{A-1}$ in the 0-th to $(N_{r1}-1)$-th rows of the first part of the 0-th column, writes bits included in each of bit group $Y_A$, bit group $Y_{A+1}$, ..., bit group $Y_{2A-1}$ in the 0-th to $(N_{r1}-1)$-th rows of the first part of the $1^{st}$ column, ..., writes bits included in each of bit group $Y_{NC \times A-A}$, bit group $Y_{NC \times A-A+1}$, ..., bit group $Y_{NC \times A-1}$ in the 0-th to $(N_{r1}-1)$-th rows of the first part of the $(N_C-1)$-th column.

As described above, the block interleaver 423 writes the bits included in the bit groups which can be written in each column in bit group wise in the first part of each column.

In other words, in the above exemplary embodiment, the bits included in each of bit group $Y_0$, bit group $Y_1$, ..., bit group $Y_{A-1}$ may not be divided and all of the bits may be written in the 0-th column, the bits included in each of bit group $Y_A$, bit group $Y_{A+1}$, ..., bit group $Y_{2A-1}$ may not be divided and all of the bits may be written in the first column, ..., and the bits included in each of bit group $Y_{CA-A}$, bit group $Y_{CA-A+1}$, ..., bit group $Y_{CA-1}$ may not be divided and all of the bits may be written in the $N_C-1$ column. As such, it may be considered that the bits included in the same bit groups in all bit groups interleaved by the first part are written in the same column of the first part.

Thereafter, the block interleaver 423 divides bits included in the other bit groups except the bit groups written in the first part of each column from among the plurality of bit groups, and writes the bits in the second part of each column in the column direction. In this case, the block interleaver 423 divides the bits included in the other bit groups except the bit groups written in the first part of each column by the number of columns, so that the same number of bits are written in the second part of each column, and writes the divided bits in the second part of each column in the column direction.

In the above-described example, since $A \times N_C+1=N_{group}$, when the bit groups configuring the LDPC codeword are written in the first part serially, the final bit group $Y_{Ngroup-1}$ of the LDPC codeword is not written in the first part and remains. Accordingly, the block interleaver 423 divides the bits included in the bit group $Y_{Ngroup-1}$ into the number $N_C$ of sub bit groups as shown in FIG. 15, and writes the divided bits (that is, the bits corresponding to the quotient when the bits included in the final group ($Y_{Ngroup-1}$) are divided by $N_C$) in the second part of each column serially.

The bits divided based on the number of columns may be referred to as sub bit groups. In this case, each of the sub bit groups may be written in each column of the second part. That is, the bits included in the bit groups may be divided and may form the sub bit groups.

That is, the block interleaver 423 writes the bits in the $N_{r1}$-th to $N_{r1}+N_{r2}-1$-th rows of the second part of the 0-th column, writes the bits in the $N_{r1}$-th to $N_{r1}+N_{r2}-1$-th rows of the second part of the first column, ..., and writes the bits in the $N_{r1}$-th to $N_{r1}+N_{r2}-1$-th rows of the second part of the $N_C-1$-th column. In this case, the block interleaver 423 may write the bits in the second part of each column in the column direction as shown in FIG. 15.

That is, in the second part, the bits configuring the bit group may not be written in the same column and may be written in the plurality of columns.

In the above example, the final bit group ($Y_{Ngroup-1}$) is formed of 360 bits and thus, the bits included in the final bit group ($Y_{Ngroup-1}$) may be divided by $360/N_C$ and written in each column in the column direction. That is, the bits included in the final bit group ($Y_{Ngroup-1}$) are divided by $360/N_C$, forming $360/N_C$ sub bit groups, and each of the sub bit groups may be written in each column of the second part in the column direction.

Accordingly, in at least one bit group which is interleaved by the second part, the bits included in the at least one bit group are divided and written in at least two columns configuring the second part.

In the above-described example, the block interleaver 423 writes the bits in the second part in the column direction. However, this is merely an example. That is, the block interleaver 423 may write the bits in the plurality of columns of the second part in the row direction. In this case, the block interleaver 423 may write the bits in the first part in the same method as described above.

Specifically, referring to FIG. 16, the block interleaver 423 writes the bits from the $N_{r1}$-th row of the second part in the 0-th column to $N_{r1}$-th row of the second part in the ($N_C$−1)-th column, writes the bits from the ($N_{r1}$+1)-th row of the second part in the 0-th column to $N_{r1}$+1-th row of the second part in the ($N_C$−1)-th column, . . . , and writes the bits from the ($N_{r1}$+$N_{r2}$−1)-th row of the second part in the 0-th column to ($N_{r1}$+$N_{r2}$−1)-th row of the second part in the ($N_C$−1)-th column.

On the other hand, the block interleaver 423 reads the bits written in each row of each part serially in the row direction. That is, as shown in FIGS. 15 and 16, the block interleaver 423 reads the bits written in each column of the first part of the plurality of columns serially in the row direction, and reads the bits written in each column of the second part of the plurality of columns serially in the row direction.

Accordingly, the block interleaver 423 may interleave a part of the plurality of bit groups configuring the LDPC codeword in bit group wise, and divide and interleave some of the remaining bit groups.

That is, the block interleaver 423 may interleave by writing the LDPC codeword configuring a predetermined number of bit groups from among the plurality of bit groups in the plurality of columns of the first part in bit group wise, dividing the bits of the other bit groups and writing the bits in each of the columns of the second part, and reading the plurality of columns of the first and second parts in the row direction.

As described above, in the case of type A, the block interleaver 423 may interleave the plurality of bit groups in the methods described above with reference to FIGS. 14 to 16.

Hereinafter, the block interleaving scheme according to type B will be described.

The block interleaver 423 may interleave the plurality of bit groups in a unit of a bit group using the plurality of columns each being formed of the plurality of rows.

In this case, the block interleaver 423 may divide the plurality of rows into at least two parts to interleave the LDPC codeword. For example, the block interleaver 423 may divide the plurality of rows into a first part and a second part to interleave the plurality of bit groups configuring the LDPC codeword.

Specifically, to perform the interleaving, the block interleaver 423 may divide the plurality of columns into N (N is an integer equal to or more than 2) parts depending on whether the number of bit groups configuring the LDPC codeword is an integer multiple of the number of columns configuring the block interleaver 423.

First, when the number of bit groups configuring the LDPC codeword is an integer multiple of the number of columns configuring the block interleaver 423, the block interleaver 423 does not divide the plurality of columns into N parts but may interleave the plurality of bit groups configuring the LDPC codeword in a unit of a bit group.

Specifically, the block interleaver 423 may write the plurality of bit groups configuring the LDPC codeword in each of the columns in the column direction in a unit of a bit group, and reads each row of the plurality of columns in which the plurality of bit groups are written a unit of a bit group in the row direction, to perform the interleaving.

When the bit groups are sequentially written in each column one by one, and a bit group is written in the final column, the block interleaver 423 may again write another bit group in the plurality of columns by the scheme of sequentially writing the bit groups in each column by one by one from the first column. Further, the block interleaver 423 may read each row of the plurality of columns in which the bit groups are written in the row direction to perform the interleaving.

In this case, bits included in bit groups the number of which is obtained by dividing the number of all bit groups configuring the LDPC codeword by the number of columns configuring the block interleaver 423 may be written in each column.

Hereinafter, for convenience of explanation, a bit group positioned at a j-th position after being interleaved in the group interleaver 422 is called a bit group $Y_j$.

For example, it is assumed that the block interleavers 423 is formed of $N_C$ columns including $N_r$ rows. Further, it is assumed that the LDPC codeword is formed of $N_{group}$ bit groups and the number $N_{group}$ is an integer multiple of $N_C$.

In this case, it is assumed that the quotient obtained by dividing $N_{group}$ number of bit groups configuring the LDPC codeword by the number $N_c$ of columns configuring the block interleaver 423 is A (=$N_{group}/N_C$).

Figure 17:
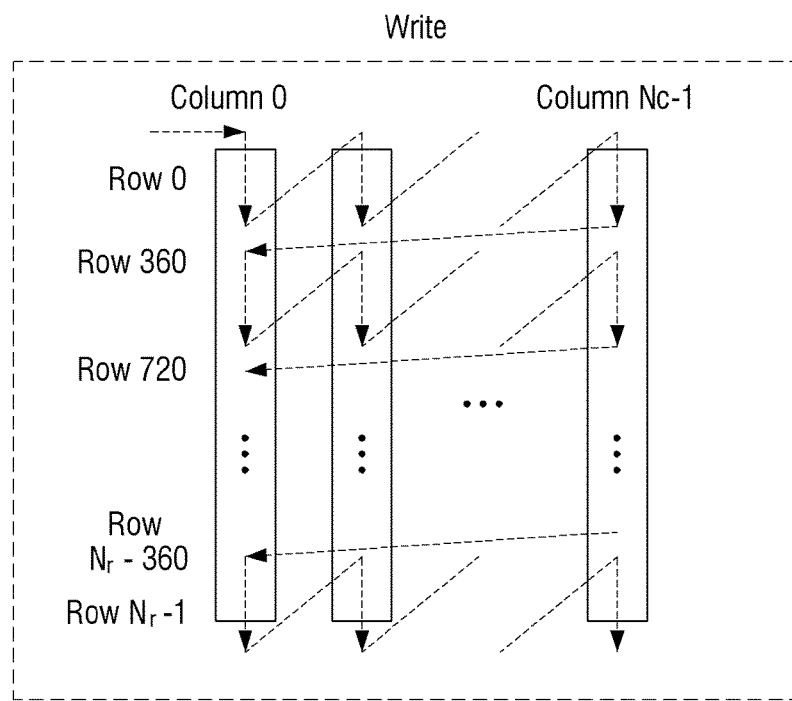
Figure 17:
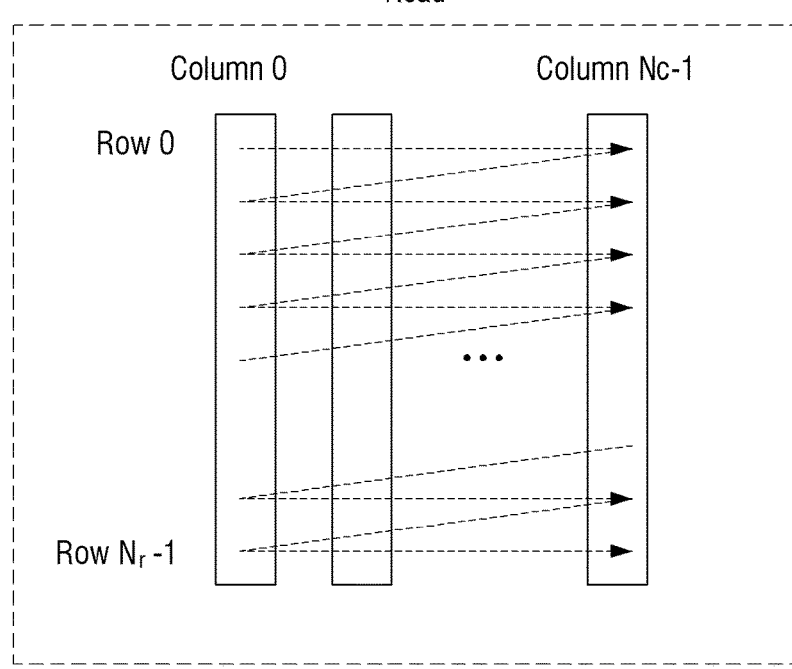

For example, as illustrated in FIG. 17, the block interleaver 423 may write a bit group $Y_0$ in a 0-th row to a 359-th row of a 0-th column, write a bit group $Y_1$ in a 0-th row to a 359-th row of a first column, . . . , write a bit group $Y_{Nc}$−1 in a 0-th row to a 359-th row of an ($N_c$−1)-th column. Further, the block interleaver 423 may write a bit group $Y_{Nc}$ in a 360-th row to a 719-th row of the 0-th column, write a bit group $Y_{Nc+1}$ in a 360-th row to a 719-th row of the first column, . . . , write a bit group $Y_{2Nc}$−1 in a 360-th row to a 719-th row of the ($N_c$−1)-th column. By the above scheme, the block interleaver 423 may write a bit group $Y_{(A-1) \times Nc}$ in an ($N_r$−360)-th row to an ($N_r$−1)-th row of the 0-th column, write a bit group $Y_{(A-1) \times Nc+1}$ in the ($N_r$−360)-th row to the ($N_r$−1)-th row of the first column, . . . , write a bit group $Y_{NC \times A-1}$ in the ($N_r$−360)-th row to the ($N_r$−1)-th row of the ($N_c$−1)-th column. Further, the block interleaver 423 may read bits of the bit groups written in each row of the plurality of columns in the row direction.

Therefore, the block interleaver 423 interleaves all bit groups configuring the LDPC codeword in a unit of a bit group.

However, when the number of bit groups configuring the LDPC codeword is not an integer multiple of the number of columns configuring the block interleaver 423, the block interleaver 423 may divide the plurality of columns into two parts to interleave some of the plurality of bit groups configuring the LDPC codeword in a unit of a bit group, and collect bits configuring the remaining bit groups and divides these bits into sub bit groups, to perform the interleaving. In this case, the bits included in the remaining bit groups, that is, the bits included in the bit groups as many as the remainder obtained by dividing the number of groups configuring the LDPC codeword by the number of columns may not be interleaved in a unit of a bit group but may be divided in each column depending on the number of columns used for the interleaving.

Specifically, the block interleaver 423 may divide the plurality of columns into two parts to interleave the LDPC codeword.

In this case, a method for dividing the plurality of columns into two parts and the number of bit groups interleaved in each part are the same as the block interleaving scheme of the type A.

Further, the block interleaver 423 may write and read the LDPC codeword in the first part and the second part to perform the interleaving.

Specifically, the block interleaver 423 may write the LDPC codeword in the plurality of columns configuring the first part and the second part in the column, and read the plurality of columns configuring each of the first part and the second part in which the LDPC codeword is written, to perform the interleaving.

That is, when bit groups are written in each column one by one and a bit group is written in the final column, the block interleaver 423 may again write another bit group in each column one by one from the first column in the first part. Further, the block interleaver 423 may divide the bits included in the remaining bit groups remaining after being written in the first part, write the divided bits in the plurality of columns configuring the second part in the row direction, and read the bits written in each of the first part and the second part in the row direction, to perform the interleaving.

In this case, the block interleaver 423 may divide the remaining bit groups remaining after being written in first part based on the number of columns configuring the block interleaver 423 to perform the interleaving.

Specifically, the block interleaver 423 may perform interleaving by dividing the bits included in the remaining bit groups by the number of a plurality of columns, writing each of the divided bits in each of a plurality of columns constituting the second part in the row direction, and reading the plurality of columns constituting the second part, where the divided bits are written, in the row direction.

That is, the block interleaver 423 may divide the bits included in the remaining bit groups, other than the bit groups written in the first part from among the plurality of bit groups of the LDPC codeword, that is, bits in the number of bit groups which correspond to the remainder when the number of bit groups configuring the LDPC codeword is divided by the number of columns, by the number of columns, and may write the divided bits in the plurality of columns of the second part serially in the row direction.

For example, it is assumed that the block interleavers 423 if formed of $N_C$ columns including $N_r$ rows. In addition, it is assumed that the LDPC codeword is formed of the number $N_{group}$ of bit groups, the number $N_{group}$ of bit groups is not an integer multiple of $N_C$, and $A \times N_C + 1 = N_{group}$ (A is an integer greater than 0). In other words, it is assumed that when the number of bit groups configuring the LDPC codeword is divided by the number of columns, the quotient is A and the remainder is 1.

Figure 18:
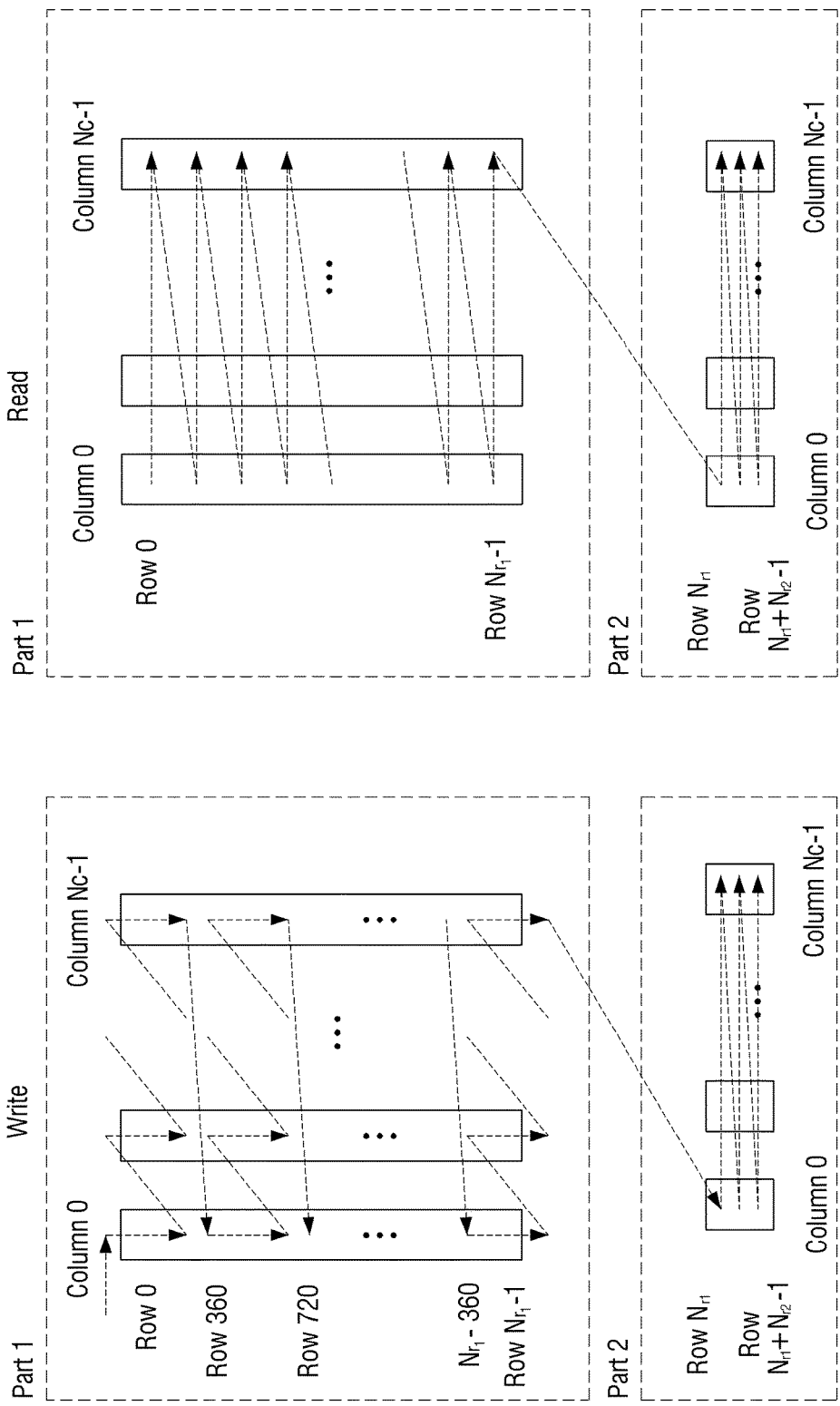
Figure 19:
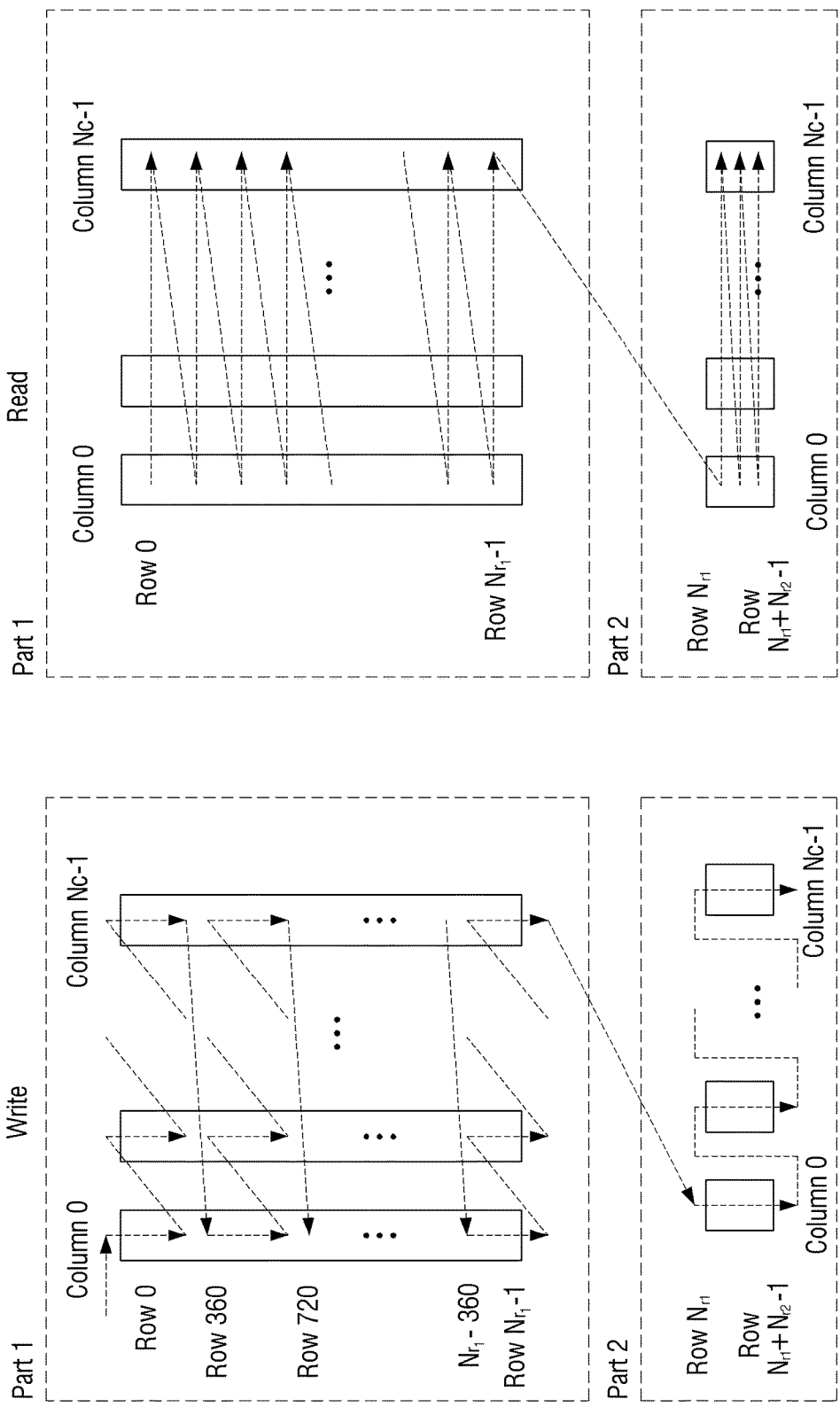

In this case, as shown in FIGS. 18 and 19, the block interleaver 423 may divide each column into a first part including $N_{r1}$ rows and a second part including $N_{r2}$ rows. In this case, $N_{r1}$ ($= \lfloor N_{group}/N_c \rfloor \times 360$) may be the number of bits included in the bit group written in a unit of a bit group in each column, and $N_{r2}$ may be a value subtracting $N_{r1}$ from the number of rows configuring each column. That is, $N_{r1} + N_{r2} = N_r = N_{inner}/N_C$. Further, $\lfloor N_{group}/C \rfloor$ represents the largest integer that is equal to or less than $N_{group}/C$.

For example, as illustrated in FIGS. 18 and 19, the block interleaver 423 may write a bit group $Y_0$ in a 0-th row to a 359-th row configuring the first part of a 0-th column, write a bit group $Y_1$ in a 0-th to a 359-th row configuring the first part of a first column, . . . , write a bit group $Y_{Nc-1}$ in a 0-th row to a 359-th row configuring the first part of an ($N_c$–1)-th column. Further, the block interleaver 423 may write a bit group $Y_{Nc}$ in a 360-th row to a 719-th row configuring the first part of the 0-th column, write a bit group $Y_{Nc+1}$ in a 360-th row to a 719-th row configuring the first part of the first column, . . . , and write a bit group $Y_{2Nc}$–1 in a 360-th row to a 719-th row configuring the first part of the ($N_c$–1)-th column. By the above scheme, the block interleaver 423 may write a bit group $Y_{(A-1) \times Nc}$ in an ($N_r$–360)-th row to an ($N_r$–1)-th row configuring the first part of the 0-th column, write a bit group $Y_{(A-1) \times Nc+1}$ in an ($N_r$–360)-th row to an ($N_r$–1)-th row configuring the first part of the first column, . . . , and write a bit group $Y_{NC \times A-1}$ in an ($N_r$–360)-th row to an ($N_r$–1)-th row configuring the first part of the ($N_c$–1)-th column.

Accordingly, the bits included in each of the bit groups $Y_0, Y_1, \ldots, Y_{Nc-1}$ may not be divided and are sequentially written in each column, the bits included in each of the bit groups $Y_{Nc}, Y_{Nc+1}, \ldots, Y_{2Nc-1}$ may also not be divided and are sequentially written in each column, . . . , and the bits included in each of the bit groups $Y_{(A-1) \times Nc}, Y_{(A-1) \times Nc+1}, \ldots, Y_{NC \times A-1}$ may also not be divided and are sequentially written in each column. As such, it may be considered that bits included in the same bit groups of all bit groups interleaved by the first part are written in the same column of the first part.

Thereafter, the block interleaver 423 divides bits included in the remaining bit groups, other than the bit groups written in the first part of each column from among the plurality of bit groups, and writes bits in the plurality of columns configuring the second part in the row direction. In this case, the block interleaver 423 divides the bits included in the remaining bit groups by the number of columns, so that the same number of bits are written in the second part of each column, and writes each of the divided bits in the plurality of columns of the second part in the row direction.

In the above-described example, since $A \times N_C + 1 = N_{group}$, when the bit groups configuring the LDPC codeword are written in the first part serially, the final bit group $Y_{Ngroup-1}$ of the LDPC codeword is not written in the first part and remains. Accordingly, the block interleaver 423 divides the bits included in the bit group $Y_{Ngroup-1}$ into $N_C$ number of sub bit groups as shown in FIG. 18, and writes the divided bits (that is, the bits corresponding to the quotient when the bits included in the last bit group ($Y_{Ngroup-1}$) are divided by $N_C$) in the second part of the plurality of columns.

The bits divided based on the number of columns may be referred to as a sub bit group. In this case, each of the sub bit groups may be written in each column of the second part. That is, the bits included in the remaining bit groups may be divided and may form the sub bit groups.

That is, the block interleaver 423 may write the bits from an $N_{r1}$-th row of the 0-th column to the $N_{r1}$-th row of the ($N_C$–1)-th column, writes the bits from an ($N_{r1}$+1)-th row of the 0-th column to the ($N_{r1}$+1)-th row of the ($N_C$–1)-th column, . . . , and writes the bits from an $(N_{r1}+N_{r2}-1)$-th row of the 0-th column to the $(N_{r1}+N_{r2}-1)$-th row of the $(N_C-1)$-th column.

In the above-described example, the block interleaver 423 writes the bits in the second part in the row direction. However, this is merely an example. That is, the block interleaver 423 may write the bits in the plurality of columns of the second part in the column direction. In this case, the block interleaver 423 may write the bits in the first part in the same method as described above.

Specifically, referring to FIG. 19, the block interleaver 423 writes the bits in the $N_{r1}$ to $(N_{r1}+N_{r2}-1)$-th rows of the second part of the 0-th column, writes the bits in the $N_{r1}$-th to $(N_{r1}+N_{r2}-1)$-th rows of the second part of the first column, . . . , and writes the bits in the $N_{r1}$-th to $(N_{r1}+N_{r2}-1)$-th rows of the second part of the $(N_C-1)$-th column.

On the other hand, the block interleaver 423 reads the bits written in each row of each part serially in the row direction. That is, as shown in FIGS. 18 and 19, the block interleaver 423 reads the bits written in each column of the first part of the plurality of columns serially in the row direction, and reads the bits written in each column of the second part of the plurality of columns serially in the row direction.

As described above, in the case of type B, the block interleaver 423 may interleave the plurality of bit groups in the methods described above with reference to FIGS. 17 to 19.

Meanwhile, as shown in Tables 19 and 20, the block interleaver 423 may perform the block interleaving using different schemes according to the code rate, the code length, and the modulation order.

For example, referring to above Table 19, when the code length is 64800, the code rate is 5/15, and the modulation scheme is QPSK, the block interleaver 423 may perform the interleaving using the block interleaver of type A and when the code length is 64800, the code rate is 5/15, and the modulation scheme is 16-QAM, the block interleaver 423 may perform the interleaving using the block interleaver of type B.

As another example, referring to above Table 20, when the code length is 16200, the code rate is 9/15, and the modulation scheme is 64-QAM, the block interleaver 423 may perform the interleaving using the block interleaver of type B and when the code length is 16200, the code rate is 9/15, and the modulation scheme is 256-QAM, the block interleaver 423 may perform the interleaving using the block interleaver of type A.

For this purpose, the block interleaver 423 may include components as shown in FIGS. 20 to 23.

Figure 20:
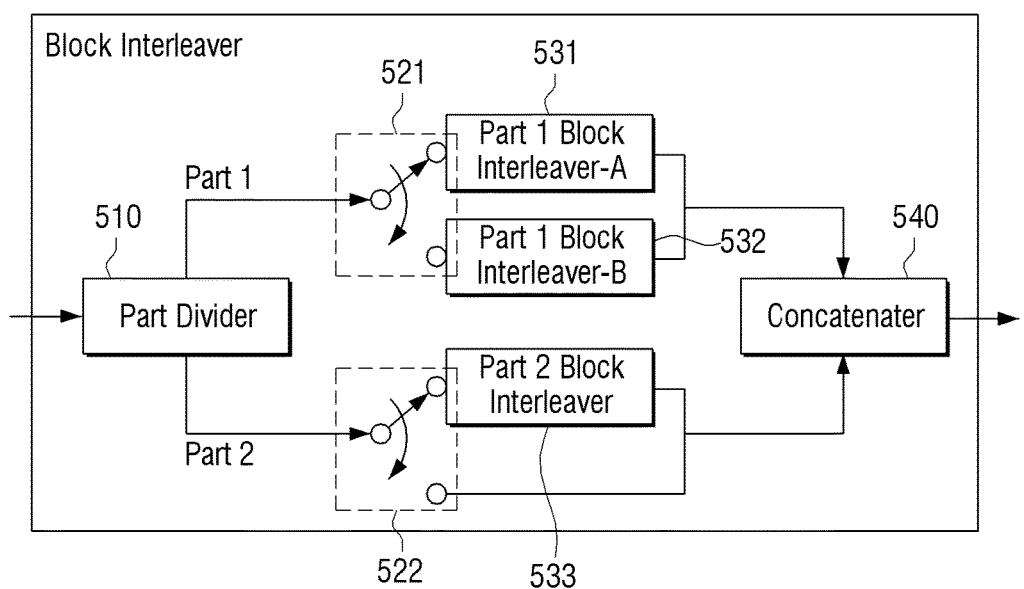
FIGS. 20 to 24 are block diagrams for describing a configuration of a block interleaver according to various exemplary embodiments.

First, FIG. 20 shows that the block interleaving of type A is performed by the scheme as shown in FIG. 15 and the block interleaving of type B is performed by the scheme as shown in FIG. 18.

Referring to FIG. 20, the block interleaver 423 may include a part divider 510, switches 521 and 522, a part 1 block interleaver-A 531, a part 1 block interleaver-B 532, a part 2 block interleaver 533, and a concatenator 540.

The part divider 510 divides an LDPC codeword into a part interleaved by part 1 and a part interleaved by part 2.

In this case, the part divider 510 may determine bit groups interleaved by part 1 and bit groups interleaved by part 2 among the plurality of bit groups configuring the LDPC codeword, based on at least one of the number of bit groups and the number of bits included in each of the bit groups.

Specifically, the part divider 510 may determine bit groups as many as the quotient obtained by dividing the number of bit groups configuring the LDPC codeword by the number of columns as the bit groups interleaved by part 1, and determine the bit groups as many as the remainder as the bit groups interleaved by part 1.

Further, the part divider 510 may divide the bit groups interleaved by part 1 and the bit groups interleaved by part 2 in the LDPC codeword, and output the bit groups interleaved by part 1 to the switch 521 and the bit groups interleaved by part 2 to the switch 522.

The part 1 block interleaver-A 531 may perform block interleaving on the bit groups interleaved by part 1 by the type A scheme, and the part 1 block interleaver-B 532 may perform block interleaving on the bit groups interleaved by part 1 by the type B scheme.

Specifically, the part 1 block interleaver-A 531 may interleave the bit groups interleaved by part 1 using part 1 of the block interleaver described with reference to FIG. 15 and the part 1 block interleaver-B 532 may interleave the bit groups interleaved by part 1 using part 1 of the block interleaver described with reference to FIG. 18.

The part 2 block interleaver 533 performs the block interleaving on the bit groups interleaved by part 2 by the scheme according to type A.

Specifically, the part 2 block interleaver 533 may interleave the bit groups interleaved by part 2 using part 2 of the block interleaver described with reference to FIG. 15.

The switches 521 and 522 may perform switching operation such that the LDPC codeword is interleaved by a specific scheme according to the code rate, the code length, and the modulation order.

Specifically, when the bits are interleaved by the type A scheme according to the code rate, the code length, and the modulation order with reference to above Tables 19 and 20, the switches 521 and 522 may perform the switching operations such that the bit groups interleaved by part 1 are output to the part 1 block interleaver-A 531 and the bit groups interleaved by part 2 are output to the part 2 block interleaver 533.

Further, when the bits are interleaved by the type B scheme according to the code rate, the code length, and the modulation order with reference to above Tables 19 and 20, the switches 521 and 522 may perform the switching operations such that the bit groups interleaved by part 1 are output to the part 1 block interleaver-B 532 and the bit groups interleaved by part 2 bypass the part 2 block interleaver 533.

Here, the reason of performing the switching operation to allow the bit groups interleaved by part 2 to bypass the part 2 block interleaver 533 is that the bits interleaved by part 2 in FIG. 18 are written and read in part 2 in the row direction, and thus, are not substantially interleaved.

The concatenator 540 again concatenates the bit groups divided by the part divider 510 to output the LDPC codeword having the code length before being divided.

Specifically, the concatenator 540 may add the bits output from the part 2 block interleaver 533 after the bits output from the part 1 block interleaver-A 531.

Further, the concatenator 540 may add the bits output from the part divider 510 after the bits output from the part 1 block interleaver-B 532.

Figure 21:
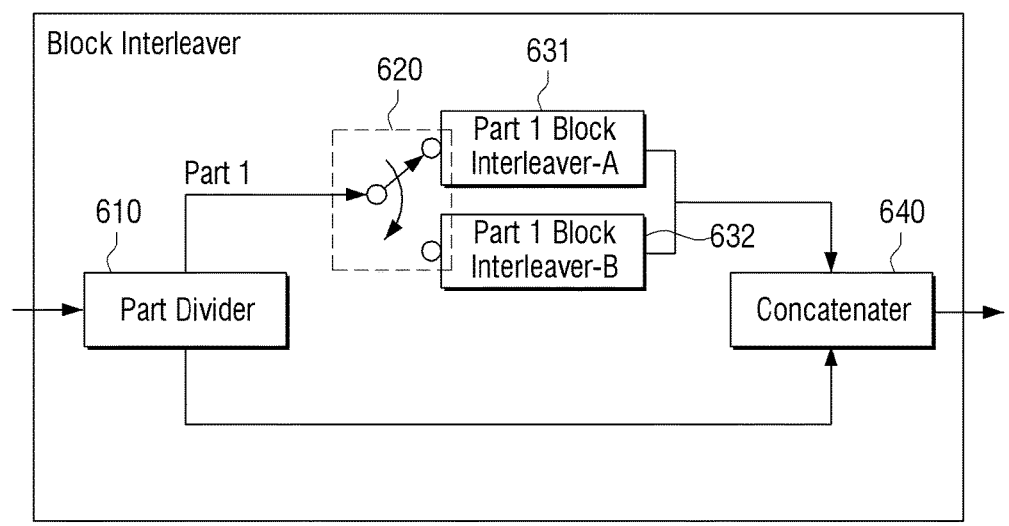

Meanwhile, FIG. 21 shows that the block interleaving of type A is performed by the scheme as shown in FIG. 16 and the block interleaving of type B is performed by the scheme as shown in FIG. 18.

Referring to FIG. 21, the block interleaver 423 may include a part divider 610, a switch 620, a part 1 block interleaver-A 631, a part 1 block interleaver-B 632, and a concatenator 640.

The part divider 610 divides an LDPC codeword into a part interleaved by part 1 and a part interleaved by part 2.

Meanwhile, a method for dividing bit groups interleaved by part 1 and bit groups interleaved by part 2 in the LDPC codeword was described with reference to FIG. 20.

The part 1 block interleaver-A 631 may perform block interleaving on the bit groups interleaved by part 1 by the type A scheme, and the part 1 block interleaver-B 632 may perform block interleaving on the bit groups interleaved by part 1 by the type B scheme.

Specifically, the part 1 block interleaver-A 631 may interleave the bit groups interleaved by part 1 using part 1 of the block interleaver described with reference to FIG. 16, and the part 1 block interleaver-B 632 may interleave the bit groups interleaved by part 1 using part 1 of the block interleaver described with reference to FIG. 18.

The switch 620 may perform a switching operation such that the LDPC codeword is interleaved by a specific scheme according to the code rate, the code length, and the modulation order.

Specifically, when the bits are interleaved by the type A scheme according to the code rate, the code length, and the modulation order based on above Tables 19 and 20, the switch 620 may perform the switching operation such that the bit groups interleaved by part 1 is output to part 1 block interleaver-A 631.

Further, when the bits are interleaved by the type B scheme according to the code rate, the code length, and the modulation order based on above Tables 19 and 20, the switch 620 may perform the switching operation such that the bit groups interleaved by part 1 is output to the part 1 block interleaver-B 632.

Meanwhile, referring to FIG. 21, it may be appreciated that the bit groups interleaved by part 2 output from the part divider 610 may be input to the concatenator 640 without passing through a separate interleaver. The reason is that in FIGS. 16 and 18, the bits interleaved by part 2 are written and read in part 2 in the row direction, and thus, are not substantially interleaved.

The concatenator 640 again concatenates the bit groups divided by the part divider 610 to output the LDPC codeword having the code length before being divided.

Specifically, the concatenator 640 may add the bits output from the part divider 610 after the bits output from the part 1 block interleaver-A 631.

Figure 22:
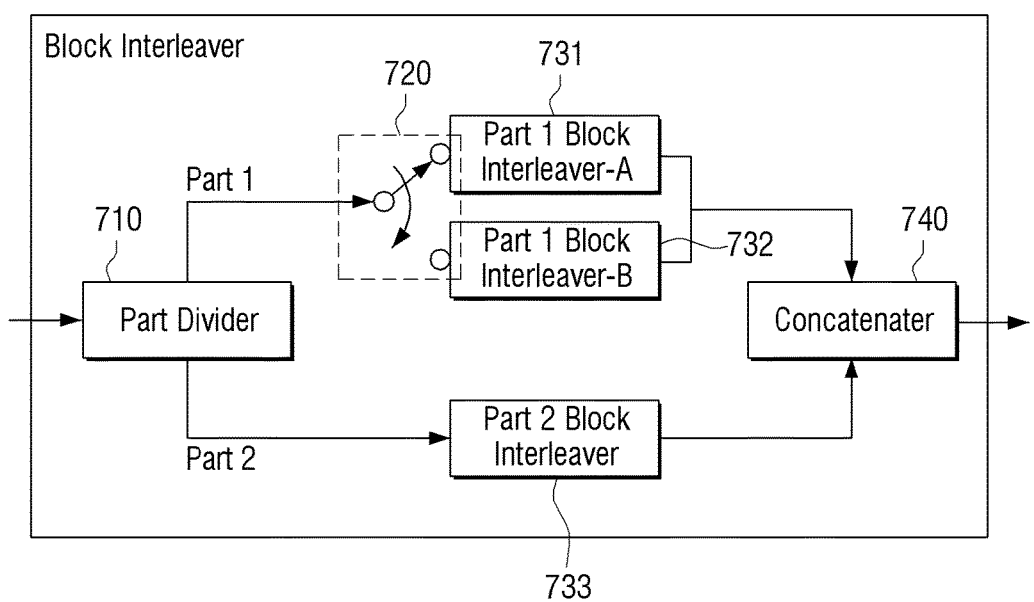

Meanwhile, FIG. 22 shows that block interleaving of type A is performed by the scheme as shown in FIG. 15 and block interleaving of type B is performed by the scheme as shown in FIG. 19.

Referring to FIG. 22, the block interleaver 423 may include a part divider 710, a switch 720, a part 1 block interleaver-A 731, a part 1 block interleaver-B 732, a part 2 block interleaver 733, and a concatenator 740.

The part divider 710 divides an LDPC codeword into a part interleaved by part 1 and a part interleaved by part 2.

Meanwhile, a method for dividing bit groups interleaved by part 1 and bit groups interleaved by part 2 in the LDPC codeword was described with reference to FIG. 20.

The part 1 block interleaver-A 731 may perform block interleaving on the bit groups interleaved by part 1 by the type A scheme, and the part 1 block interleaver-B 732 may perform block interleaving on the bit groups interleaved by part 1 by the type B scheme.

Specifically, the part 1 block interleaver-A 731 may interleave the bit groups interleaved by part 1 using part 1 of the block interleaver described with reference to FIG. 15, and the part 1 block interleaver-B 732 may interleave the bit groups interleaved by part 1 using part 1 of the block interleaver described with reference to FIG. 19.

The part 2 block interleaver 733 performs the block interleaving on the bit groups interleaved by part 2 by the type A and B schemes.

Specifically, since the bit groups interleaved by part 2 are interleaved by the same scheme of writing in the column direction and reading in the row direction in FIGS. 15 and 19, the part 2 block interleaver 733 may interleave the bit groups interleaved by part 2 using part 2 of the block interleaver described with reference to FIGS. 15 and 19.

The switch 720 may perform an switching operation such that the LDPC codeword is interleaved by a specific scheme according to the code rate, the code length, and the modulation order.

Specifically, when the bits are interleaved by the type A scheme according to the code rate, the code length, and the modulation order based on above Tables 19 and 20, the switch 720 may perform the switching operation such that the bit groups interleaved by part 1 is output to the part 1 block interleaver-A 731.

Further, when the bits are interleaved by the type B scheme according to the code rate, the code length, and the modulation order based on above Tables 19 and 20, the switch 720 may perform the switching operation such that the bit groups interleaved by part 1 is output to the part 1 block interleaver-B 732.

The concatenator 740 again concatenates the bit groups divided by the part divider 710 to output the LDPC codeword having the code length before being divided.

Specifically, the concatenator 740 may add the bits output from the part 2 block interleaver 733 after the bits output from the part 1 block interleaver-A 731.

Further, the concatenator 740 may add the bits output from the part 2 block interleaver 733 after the bits output from the part 1 block interleaver-B 732.

Figure 23:
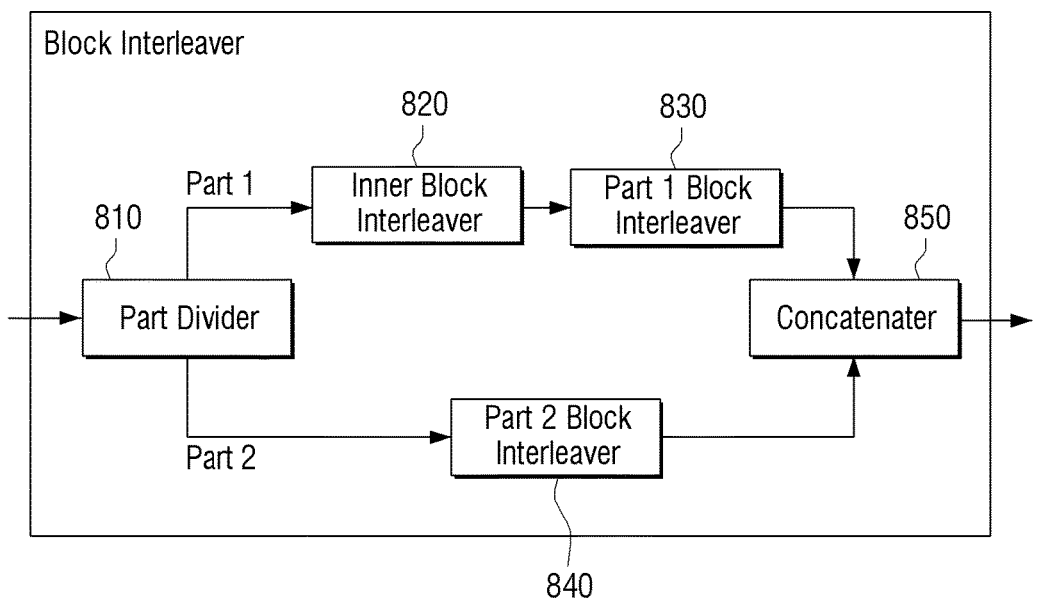

Meanwhile, FIG. 23 is a block diagram for describing components of a block interleaver according to another exemplary embodiment.

Referring to FIG. 23, the block interleaver 423 may include a part divider 810, an inner block interleaver 820, a part 1 block interleaver 830, a part 2 block interleaver 840, and a concatenator 850.

The part divider 810 divides an LDPC codeword into a part interleaved by part 1 and a part interleaved by part 2.

Meanwhile, a method for dividing bit groups interleaved by part 1 and bit groups interleaved by part 2 in the LDPC codeword was described with reference to FIG. 20.

The inner block interleaver 820 may interleave the bit groups interleaved by part 1.

Specifically, the block interleaver 820 may change the order of the bit groups interleaved by part 1.

That is, when the part 1 block interleaver 830 interleaves the bit groups corresponding to part 1 by the type A scheme, the inner block interleaver 820 may change the order of the bit group corresponding to part 1 before being interleaved by the part 1 block interleaver 830 such that a result obtained by interleaving the bit groups corresponding to part 1 by the part 1 block interleaver 830 is the same as a result obtained by interleaving the bit group corresponding to part 1 by the type B scheme.

That is, in the block interleaver of type B, the bit groups are sequentially written in the plurality of columns one by one and the bit groups are written in the final column and then the bit groups are sequentially written in the plurality of columns one by one from the first column. On the other hand, in a case of the block interleaver of type A, when the bit group is written in one column and all the bits are written in the corresponding column, the bit groups are written in the next column.

Therefore, when the part 1 block interleaver 830 writes the bit group by the type A scheme, the inner block interleaver 820 may change the order of the bit groups interleaved by part 1 so that like the case of writing by the type B scheme, the specific bit group is written in the specific position.

For example, as described with reference to FIGS. 18 and 19, in the case of the block interleaver of type B, the bit groups $Y_0, Y_{Nc}, \ldots, Y_{(A-1) \times Nc}$ are written in the 0-th column, and the bit groups $Y_1, Y_{Nc+1}, \ldots, Y_{(A-1) \times Nc+1}$ are written in the first column, and the bit groups $Y_{Nc-1}, Y_{2Nc-1}, \ldots, Y_{NC \times A-1}$ are written in the ($N_c$-1)-th column.

On the other hand, as described with reference to FIGS. 15 and 16, the block interleaver of type A writes bits in all the rows of one column and writes bits in the next column.

Therefore, the inner block interleaver 820 may change the order of the bit groups interleaved by part 1 so that the order of the bit groups are "$Y_0, Y_{Nc}, \ldots, Y_{(A-1) \times Nc}, Y_1, Y_{Nc+1}, \ldots, Y_{(A-1) \times Nc+1}, \ldots, Y_{Nc-1}, Y_{2Nc-1}, \ldots, Y_{NC \times A-1}$".

In this case, the inner block interleaver 820 may selectively interleave the bit groups interleaved by part 1.

That is, when the bit groups are interleaved by the type A scheme according to the code rate, the code length, and the modulation order based on above Tables 19 and 20, the inner block interleaver 820 does not interleave the bit group, and when the bit groups are interleaved by the type B scheme, the inner block interleaver 820 may interleave the bit group.

The part 1 block interleaver 830 performs the block interleaving on the bit groups interleaved by part 1 by the type A scheme.

Specifically, the part 1 block interleaver 830 may interleave the bit groups interleaved by part 1 using part 1 of the block interleaver described with reference to FIGS. 15 and 16.

The part 2 block interleaver 840 performs the block interleaving on the bit groups interleaved by part 2 by the type A and B schemes.

Specifically, when the bit group is interleaved by the type A scheme, the part 2 block interleaver 840 may interleave the bit group corresponding to part 2 by the above-mentioned method in FIG. 15 or 16, or when the bit group is interleaved by the type B scheme, the part 2 block interleaver 840 may interleave the bit group corresponding to part 2 by the above-mentioned method in FIG. 18 or 19.

The concatenator 850 again concatenates the bit groups divided by the part divider 810 to output the LDPC codeword having the code length before being divided.

Specifically, the concatenator 850 may add the bits output from the part 2 block interleaver 840 after the bits output from the part 1 block interleaver 830.

Meanwhile, the above-mentioned example describes that the block interleaver 423 interleaves the LDPC codeword using part 1 and part 2.

However, even when the block interleaver 423 interleaves the LDPC codeword without dividing the part, the block interleaver of type A or the block interleaver of type B may be selectively used by the switching operation to interleave the LDPC codeword.

Figure 24:
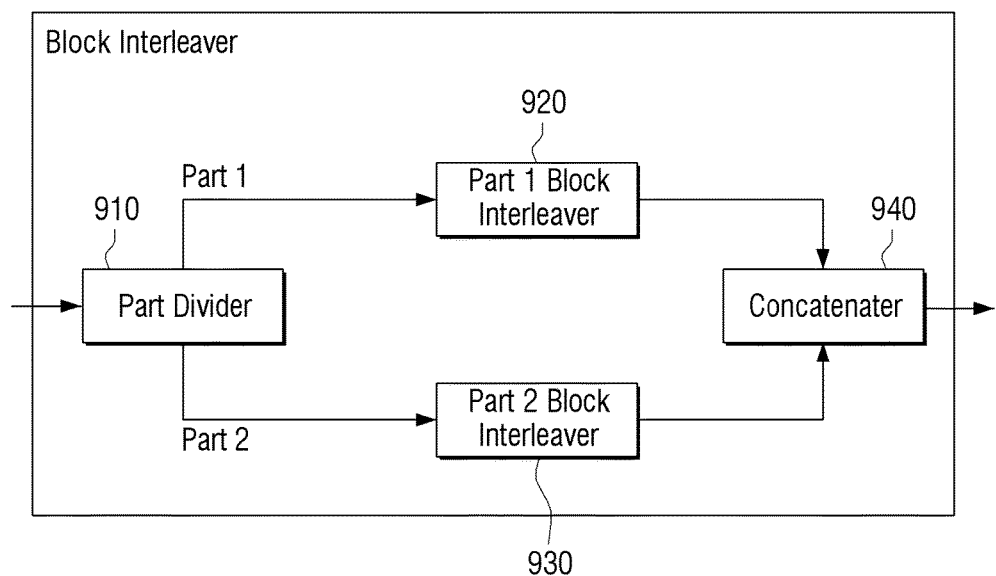

Meanwhile, FIG. 24 is a block diagram for describing components of a block interleaver according to another exemplary embodiment of the present invention.

Referring to FIG. 24, the block interleaver 423 may include a part divider 910, a part 1 block interleaver 920, a part 2 block interleaver 930, and a concatenator 940.

The part divider 910 divides a part interleaved by the part 1 in the LDPC codeword and a part interleaved by the part 2.

Meanwhile, a method for dividing the bit groups interleaved by the part 1 and the bit groups interleaved by the part 2 in the LDPC codeword was described with reference to FIG. 20.

The part 1 block interleaver 920 may interleave bits corresponding to the part 1.

Specifically, the part 1 block interleaver 920 may interleave the bits corresponding to the part 1 by the type A scheme or the type B scheme regardless of the schemes defined in the above Tables 19 and 20 according to the code rate, the code length, and the modulation order.

That is, the part 1 block interleaver 920 may interleave the bit groups interleaved by the part 1 using the part 1 of the interleaver described with reference to FIGS. 15 and 16.

Specifically, the part 1 block interleaver 920 writes the bit group in one column and when all the bits are written in the corresponding column, writes the bit group in the next column and reads the bits written in the plurality of columns, thereby performing the interleaving.

Alternatively, the part 1 block interleaver 920 may interleave the bit groups interleaved by the part 1 using the part 1 of the block interleaver described with reference to FIGS. 18 and 19.

Specifically, the part 1 block interleaver 920 writes the bit group in the plurality of columns one by one, writes the bit group in the final column, and again writes the bit groups in the plurality of columns from the first column one by one, and reads the bits written in the plurality of columns, thereby performing the interleaving.

Meanwhile, in the foregoing example, the bits corresponding to the part 1 are interleaved by the type A scheme or the type B scheme regardless of the schemes defined in the above Tables 19 and 20, which is only an example. That is, some cases perform the interleaving by the type A scheme or the type B scheme according to the schemes defined in the above Tables 19 and 20 based on the code rate, the code length, and the modulation order and the remaining cases may perform the interleaving by the type A or the type B regardless of the schemes defined in the above Tables 19 and 20.

The part 2 block interleaver 930 performs the interleaving on the bit groups interleaved by the part 2.

In this case, the part 2 block interleaver 930 may interleave the bit group interleaved by the part 2 according to the scheme of the same type as the type used in the part 1 block interleaver 920.

That is, the part 2 block interleaver 930 may interleave the bit group corresponding to the part 2 by the method described in FIG. 15 or 16 when the interleaving is performed by the type A scheme in the part 1 block interleaver 920.

Further, the part 2 block interleaver 930 may interleave the bit group corresponding to the part 2 by the method described in FIG. 18 or 19 when the interleaving is performed by the type B scheme in the part 1 block interleaver 920.

The concatenator 940 again concatenates the bit groups divided by the part divider 910 to output the LDPC codeword having the code length before being divided.

Specifically, the concatenator 940 may add the bits output from the part 2 block interleaver 930 after the bits output from the part 1 block interleaver 920.

The constellation mapper 430 may map the LDPC codeword to the constellation points.

For example, the constellation mapper 430 may modulate the interleaved LDPC codeword bits by various modulation schemes such as the QPSK, the 16-QAM, the 64-QAM, the 256-QAM, the 1024-QAM, and the 4096-QAM and map the modulated bits to the constellation points.

In this case, the scheme of modulating LDPC codeword bits may be established in advance. In these cases, the transmitter 1000 may map the constellation symbols corresponding to the constellation points to the frame, which may then be transmitted to the receiver 2000.

Meanwhile, as described above, the information bits are data and therefore the transmitter 1000 may map the data and the L1 signaling for processing data to the frame and transmit the data and the L1 signaling to the receiver 2000.

In detail, the transmitter 1000 may process the L1 signaling in a specific scheme to generate the constellation symbols and map the generated constellation symbols to data symbols of each frame. Further, the transmitter 1000 may map the L1 signaling for the data mapped to each frame to a preamble of the corresponding frame. For example, the transmitter 1000 may map the L1 signaling including the signaling information for the data mapped to the i-th frame to the i-th frame.

As a result, the receiver 2000 may use the signaling acquired from the frame to acquire and process the data from the corresponding frame.

FIGS. 25 and 26 are block diagrams for describing a configuration of a receiver according to an exemplary embodiment.

Specifically, as shown in FIG. 25, the receiver 2000 may include a constellation demapper 2510, a multiplexer 2520, an LLR inserter 2530, an LLR combiner 2540, a parity depermutator 2550, an LDPC decoder 2560, a zero remover 2570, a BCH decoder 2580, and a descrambler 2590 to process the L1-basic signaling.

Further, as shown in FIG. 26, the receiver 2000 may include constellation demappers 2611 and 2612, multiplexers 2621 and 2622, an LLR inserter 2630, an LLR combiner 2640, a parity depermutator 2650, an LDPC decoder 2660, a zero remover 2670, a BCH decoder 2680, a descrambler 2690, and a desegmenter 2695 to process the L1-detail signaling.

Here, components shown in FIGS. 25 and 26 are components performing the functions corresponding to components shown in FIGS. 3 and 4, which is only an example and in some cases, some of the components may be omitted and changed and other components may be added. For example, the receiver 2000 is a component for performing functions corresponding to component shown in FIG. 1 and may also include only a constellation demapper, an LLR inserter, an LLR combiner, and an LDPC decoder.

The receiver 2000 may acquire the frame synchronization using the bootstrap of the frame and receive the L1-basic signaling from the preamble of the frame using the information for processing the L1-basic signaling included in the bootstrap.

Further, the receiver 2000 may receive the L1-detail signaling from the preamble using the information for processing the L1-detail signaling included in the L1-basic signaling and receive broadcasting data required by the user from the data symbols of the frame using the L1-detail signaling.

Therefore, the receiver 2000 may determine the mode of processing, by the transmitter 1000, the L1-basic signaling and the L1-detail signaling and process the signal received from the transmitter 1000 depending on the determined mode to receive the L1-basic signaling and the L1-detail signaling. For this purpose, the receiver 2000 may pre-store the information on the parameters used for the transmitter 1000 to process the signaling depending on the mode.

As such, the L1-basic signaling and the L1-detail signaling may be sequentially acquired from the preamble and in describing FIGS. 25 and 26, components performing the common functions will be described together for convenience of explanation.

The constellation demappers 2510, 2611, and 2612 demodulate the signal received from the transmitter 1000.

Specifically, the constellation demappers 2510, 2611, and 2612 are components corresponding to the constellation mappers 221, 324, and 325 of the transmitter 1000 and may demodulate the signal received from the transmitter 1000 and generate values corresponding to the bits transmitted from the transmitter 1000.

That is, as described above, the transmitter 1000 maps the LDPC codeword including the L1-basic signaling and the LDPC codeword including the L1-detail signaling to the preamble of the frame and transmits the mapped LDPC codeword to the receiver 2000. Further, in some cases, the transmitter 1000 may map the additional parity bits to the preamble of the frame and transmit the mapped bits to the receiver 2000.

As a result, the constellation demappers 2510 and 2611 may generate values corresponding to the LDPC codeword bits including the L1-basic signaling and the LDPC codeword bits including the L1-detail signaling. Further, the constellation demapper 2612 may generate values corresponding to the additional parity bits.

For this purpose, the receiver 2000 may pre-store the information on the modulation scheme of, by the transmitter 1000, modulating the L1-basic signaling, the L1-detail signaling, and the additional parity bits depending on the mode. Therefore, the constellation demappers 2510, 2611, and 2612 may demodulate the signal received from the transmitter 1000 depending on the mode to generate the values corresponding to the LDPC codeword bits and the additional parity bits.

Meanwhile, the values corresponding to the bits transmitted from the transmitter 1000 are values calculated based on the probability that the received bit is normally 0 and 1 and each probability itself may also be used as values corresponding to each bit and may also be a likelihood ratio (LR) or a log likelihood ratio (LLR) value as another example.

Specifically, the LR value may represent a ratio of the probability that the bit transmitted from the transmitter 1000 is 0 and the probability that the bit is 1 and the LLR value may represent a value obtained by taking a log on the probability that the bit transmitted from the transmitter 1000 is 0 and the probability that the bit is 1.

Meanwhile, it is described that the foregoing example uses the LR value or the LLR value, which is only one example. Therefore, the received signal itself may also be used.

The multiplexers 2520, 2621, and 2622 perform the multiplexing on the LLR values output from the constellation demappers 2510, 2611, and 2612.

Specifically, the multiplexers 2520, 2621, and 2622 are components corresponding to the bit demultiplexers 219, 322, and 323 of the transmitter 1000 and may perform the operations corresponding to the bit demultiplexers 219, 322, and 323.

For this purpose, the receiver 2000 may pre-store the information on the parameters used for the transmitter 1000 to perform the demultiplexing and the block interleaving. Therefore, the multiplexers 2520, 2621, and 2622 may reversely perform the demultiplexing and the block interleaving operations of the bit demultiplexers 219, 322, and 323 on the LLR value corresponding to the cell word to multiplex the LLR value corresponding to the cell word in a bit unit.

The LLR inserters 2530 and 2630 may insert the LLR values for the puncturing and shortening bits into the LLR values output from the multiplexers 2520 and 2621. In this case, the LLR inserters 2530 and 2630 may insert previously appointed LLR values between the LLR values output from the multiplexers 2520 and 2621 or into a head portion or a tail portion thereof.

Specifically, the LLR inserters 2530 and 2630 are components corresponding to the zero removers 218 and 321 and the puncturers 217 and 317 of the transmitter 1000 and may perform the operations corresponding to the zero removers 218 and 321 and the puncturers 216 and 317.

First, the LLR inserters 2530 and 2630 may insert the LLR values corresponding to the zero bits into a position where the zero bits in the LDPC codeword are padded. In this case, the LLR values corresponding to the padded zero bits, that is, the shortened zero bits may be $\infty$ or $-\infty$. However, $\infty$ or $-\infty$ are a theoretical value but may actually be a maximum value or a minimum value of the LLR value used in the receiver 2000.

For this purpose, the receiver 2000 may pre-store information on parameters and/or patterns used for the transmitter 1000 to pad the zero bits depending on the mode. Therefore, the LLR inserters 2530 and 2630 may determine positions where the zero bits in the LDPC codeword are padded depending on the mode and insert the LLR values corresponding to the shortened zero bits into the corresponding positions.

Further, the LLR inserters 2530 and 2630 may insert the LLR values corresponding to the punctured bits into the positions of the punctured bits in the LDPC codeword. In this case, the LLR values corresponding to the punctured bits may be 0.

For this purpose, the receiver 2000 may pre-store information on parameters and/or patterns used for the transmitter 1000 to perform the puncturing depending on the mode. Therefore, the LLR inserters 2530 and 2630 may determine the lengths of the punctured LDPC parity bits depending on the mode and insert the corresponding LLR values into the positions where the LDPC parity bits are punctured.

Meanwhile, in the case of the additional parity bits selected from the punctured bits among the additional parity bits, the LLR inserter 2630 may insert the LLR values corresponding to the received additional parity bits, not the LLR value '0' for the punctured bit, into the positions of the punctured bits.

The LLR combiners 2540 and 2640 may combine, that is, sum the LLR values output from the LLR inserters 2530 and 2630 and the multiplexer 2622. However, the LLR combiners 2540 and 2640 serve to update LLR values for specific bits into better values. However, the LLR values for the specific bits may also be decoded from the received LLR values without the LLR combiners 2540 and 2640 and therefore in some cases, the LLR combiners 2440 and 2540 may be omitted.

Specifically, the LLR combiner 2540 is a component corresponding to the repeater 217 of the transmitter 1000 and may perform the operation corresponding to the repeater 217. Alternatively, the LLR combiner 2640 is a component corresponding to the repeater 318 and the additional parity generator 319 of the transmitter 1000 and may perform the operations corresponding to the repeater 317 and the additional parity generator 319.

First, the LLR combiners 2540 and 2640 may combine the LLR values corresponding to the repeated bits with other LLR values. Here, the other LLR values may be bits which are a basis of the generation of the repeated bits by the transmitter 1000, that is, the LLR values for the LDPC parity bits selected as the repeated object.

That is, as described above, the transmitter 1000 selects bits from the LDPC codeword and repeats the selected bits after the LPDC parity bits and transmits the repeated bits to the receiver 2000.

Therefore, the LLR values for the LDPC codeword bits may consist of the LLR values for the repeated bits and the LLR values for non-repeated bits. Therefore, the LLR combiners 2540 and 2640 may combine the LLR values for the same bits.

For this purpose, the receiver 2000 may pre-store the information on the parameters used for the transmitter 1000 to perform the repetition depending on the mode. As a result, the LLR combiners 2540 and 2640 may determine the lengths of the repeated LDPC parity bits, determine the positions of the bits which are a basis of the repetition, and combine the LLR values for the repeated bits with the LLR values for the bits which are a basis of the repetition.

Further, the LLR combiner 2640 may combine the LLR values corresponding to the additional parity bits with other LLR values. Here, the other LLR values may be the LDPC parity bits which are a basis of the generation of the additional parity bits by the transmitter 1000, that is, the LLR values for the LDPC parity bits selected for the generation of the additional parity bits.

For this purpose, the receiver 2000 may pre-store information on parameters used for the transmitter 1000 to generate the additional parity bits depending on the mode. As a result, the LLR combiner 2640 may determine the lengths of the additional parity bits, determine the positions of the LDPC parity bits which are a basis of the generation of the additional parity bits, and combine the LLR values for the additional parity bits with the LLR values for the LDPC parity bits which are a basis of the generation of the additional parity bits.

The parity depermutators 2550 and 2650 may depermutate the LLR values output from the LLR combiners 2640 and 2540.

Specifically, the parity depermutators 2550 and 2650 are components corresponding to the parity permutators 215 and 316 of the transmitter 1000 and may perform the operations corresponding to the parity permutators 215 and 316.

For this purpose, the receiver 2000 may pre-store information on parameters and/or patterns used for the transmitter 1000 to perform the group-wise interleaving and the parity interleaving depending on the mode. Therefore, the parity depermutators 2550 and 2650 may reversely perform the group-wise interleaving and parity interleaving operations of the parity permutators 215 and 316 on the LLR values corresponding to the LDPC codeword bits, that is, perform the deinterleaving and parity deinterleaving operations to perform the parity depermutation on the LLR values corresponding to the LDPC codeword bits.

The LDPC decoders 2560 and 2660 may perform the LDPC decoding based on the LLR values output from the parity depermutators 2650 and 2550.

Specifically, the LDPC decoders 2560 and 2660 are components corresponding to the LDPC encoders 214 and 315 of the transmitter 1000 and may perform the operations corresponding to the LDPC encoders 214 and 315.

For this purpose, the receiver 2000 may pre-store information on parameters used for the transmitter 1000 to perform the LDPC encoding depending on the mode. Therefore, the LDPC decoders 2560 and 2660 may perform the LDPC decoding based on the LLR values output from the parity depermutators 2550 and 2650 depending on the mode.

For example, the LDPC decoders 2560 and 2660 may perform the LDPC decoding based on the LLR values output from the parity depermutators 2550 and 2650 by iterative decoding based on a sum-product algorithm and output error-corrected bits depending on the LDPC decoding.

The zero removers 2570 and 2670 may remove the zero bits from the bits output from the LDPC decoders 2560 and 2660.

Specifically, the zero removers 2570 and 2670 are components corresponding to the zero padders 213 and 314 of the transmitter 1000 and may perform the operations corresponding to the zero padders 213 and 314.

For this purpose, the receiver 2000 may pre-store information on parameters and/or patterns used for the transmitter 1000 to pad the zero bits depending on the mode. As a result, the zero removers 2570 and 2670 may remove the zero bits padded by the zero padders 213 and 314 from the bits output from the LDPC decoders 2560 and 2660.

The BCH decoders 2580 and 2680 may perform the BCH decoding on the bits output from the zero removers 2570 and 2670.

Specifically, the BCH decoders 2580 and 2680 are components corresponding to the BCH encoders 212 and 313 of the transmitter 1000 and may perform the operations corresponding to the BCH encoders 212 and 313.

For this purpose, the receiver 2000 may pre-store the information on the parameters used to perform the BCH encoding. As a result, the BCH decoders 2580 and 2680 may correct errors by performing the BCH decoding on the bits output from the zero removers 2570 and 2670 and output the error-corrected bits.

The descramblers 2590 and 2690 may descramble the bits output from the BCH decoders 2580 and 2680.

Specifically, the descramblers 2590 and 2690 are components corresponding to the scramblers 211 and 312 of the transmitter 1000 and may perform the operations corresponding to the scramblers 211 and 312.

For this purpose, the receiver 2000 may pre-store the information on the parameters used for the transmitter 1000 to perform the scrambling. As a result, the descramblers 2590 and 2690 may descramble the bits output from the BCH decoders 2580 and 2680 and output them.

As a result, the L1-basic signaling transmitted from the transmitter 1000 may be recovered. Further, when the transmitter 1000 does not perform the segmentation on the L1-detail signaling, the L1-detail signaling transmitted from the transmitter 1000 may also be recovered.

However, when the transmitter 1000 performs the segmentation on the L1-detail signaling, the desegmenter 2695 may desegment the bits output from the descrambler 2690.

Specifically, the desegmenter 2695 is a component corresponding to the segmenter 311 of the transmitter 1000 and may perform the operation corresponding to the segmenter 311.

For this purpose, the receiver 2000 may pre-store the information on the parameters used for the transmitter 1000 to perform the segmentation. As a result, the desegmenter 2695 may combine the bits output from the descrambler 2690, that is, the segments for the L1-detail signaling to recover the non-segmented L1-detail signaling.

FIG. 27 is a block diagram for describing a configuration of a receiver according to an exemplary embodiment.

Referring to FIG. 27, a receiver 2000 includes a constellation demapper 2710, a deinterleaver 2720, and an LDPC decoder 2730.

The constellation demapper 2710 demodulates the signal received from the transmitter 1000.

Specifically, the constellation demapper 2710 is a component corresponding to the constellation mapper 430 of the transmitter 1000 and may demodulate the signal received from the transmitter 1000 and generate values corresponding to the bits transmitted from the transmitter 1000.

That is, as described above, the transmitter 1000 maps the LDPC codeword including data to the data symbol of the frame and transmits it to the receiver 2000. Therefore, the constellation demapper 2710 may generate values corresponding to the LDPC codeword bits including the data.

For this purpose, the receiver 2000 may pre-store the information on the modulation scheme modulating data in the transmitter 1000. Therefore, the constellation demapper 2710 may demodulate the signal received from the transmitter 1000 to generate values corresponding to the LDPC codeword bits including the data.

Meanwhile, the values corresponding to the bits transmitted from the transmitter 1000 are values calculated based on the probability that the received bit is normally 0 and 1 and each probability itself may also be used as values corresponding to each bit and may also be a likelihood ratio (LR) or a log likelihood ratio (LLR) value as another example.

Specifically, the LR value may represent a ratio of the probability that the bit transmitted from the transmitter 1000 is 0 and the probability that the bit is 1 and the LLR value may represent a value obtained by taking a log on the probability that the bit transmitted from the transmitter 1000 is 0 and the probability that the bit is 1.

Meanwhile, it is described that the foregoing example uses the LR value or the LLR value, which is only one example. Therefore, the received signal itself may also be used.

The deinterleaver 2720 deinterleaves values corresponding to the bits transmitted from the transmitter 1000 and outputs them to the decoder 2730.

Specifically, the deinterleaver 2720 is a component corresponding to the interleaver 420 of the transmitter 1000 and performs an operation corresponding to the interleaver 420. That is, the deinterleaver 2720 reversely performs the interleaving operation performed by the interleaver 420 to deinterleave the LLR value.

Figure 28:
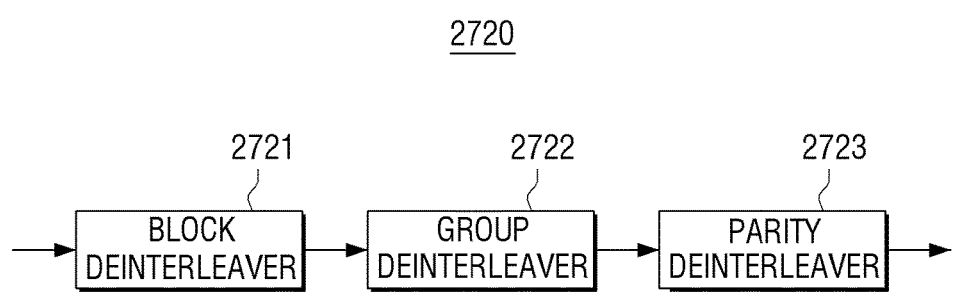
FIG. 28 is a block diagram for describing a configuration of a deinterleaver according to an exemplary embodiment.

For this purpose, as shown in FIG. 28, the deinterleaver 2720 may include a block deinterleaver 2721, a group deinterleaver 2722, and a parity deinterleaver 2723.

The block deinterleaver 2721 deinterleaves values corresponding to the bits transmitted from the transmitter 1000, for example, LLR values and outputs them to the group deinterleaver 2722.

Specifically, the block deinterleaver 2721 is a component corresponding to the block deinterleaver 423 included in the transmitter 1000 and may reversely perform the interleaving operation performed by the block interleaver 423.

That is, the block deinterleaver 2721 may use at least one row formed of the plurality of columns to write the LLR value in each row in the row direction and read each column of the plurality of rows in which the values corresponding to the bits are written in the column direction to perform the deinterleaving.

In this case, when the block interleaver 423 performs the interleaving by dividing the column into two parts, the block deinterleaver 2721 may perform the deinterleaving by dividing the row into the two parts.

Further, when the block interleaver 423 writes and reads the bit groups that do not belong to the first part in the row direction, the block deinterleaver 2721 may write and read the values corresponding to the groups that do not belong to the first part in the column direction to perform the deinterleaving.

For this purpose, the block deinterleaver 2721 may include components as shown in FIGS. 29 to 32.

Figure 29:
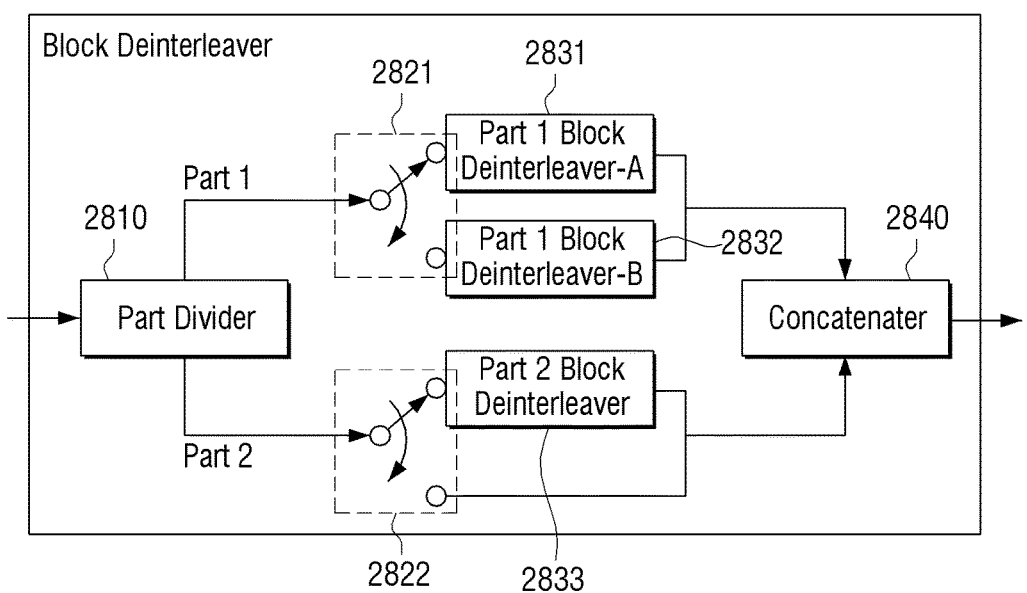
FIGS. 29 to 33 are block diagrams for describing a configuration of a block deinterleaver according to exemplary embodiments.

First, as shown in FIG. 29, the block deinterleaver 2721 may include a part divider 2810, switches 2821 and 2822, a part 1 block deinterleaver A 2831, a part 1 block interleaver B 2832, a part 2 block interleaver 2833, and a concatenator 2840.

Specifically, the block deinterleaver 2721 as shown in FIG. 29 may be used when the block interleaver 423 performs the block interleaving using the components as shown in FIG. 20.

For this purpose, the receiver 2000 may pre-store the information on the interleaving scheme performed in the transmitter 1000.

The part divider 2810 divides a part deinterleaved by part 1 and a part deinterleaved by part 2 in the LLR values.

For this purpose, the receiver 2000 may pre-store information on the number of bits interleaved by part 1 and part 2 in the transmitter 1000.

Therefore, the part divider 2810 may determine the LLR values deinterleaved by part 1 and the LLR values deinterleaved by part 2 and output the determined LLR values to the switches 2821 and 2822.

The part 1 block deinterleaver A 2831 deinterleaves the LLR values deinterleaved by part 1.

In detail, the part 1 block deinterleaver A 2831 may reversely perform the interleaving operation performed by the part 1 block interleaver A 531 illustrated in FIG. 20 to deinterleave the LLR values deinterleaved by part 1.

The part 1 block deinterleaver B 2832 deinterleaves the LLR values deinterleaved by part 1.

Specifically, the part 1 block deinterleaver B 2832 may reversely perform the interleaving operation performed by the part 1 block interleaver B 532 illustrated in FIG. 20 to deinterleave the LLR values deinterleaved by part 1.

The part 2 block deinterleaver 2833 deinterleaves the LLR values deinterleaved by part 2.

Specifically, the part 2 block deinterleaver B 2833 may reversely perform the interleaving operation performed by the part 2 block interleaver 533 illustrated in FIG. 20 to deinterleave the LLR values deinterleaved by part 2.

The switches 2821 and 2822 may perform the switching operation so that the LLR values are deinterleaved by the specific scheme.

In detail, when the transmitter 1000 interleaves the bits by the type A scheme, the switches 2821 and 2822 may perform the switching operation so that the LLR values deinterleaved by part 1 are output to the part 1 block deinterleaver A 2831 and the LLR values deinterleaved by part 2 are output to the part 2 block deinterleaver 2833.

Further, when the transmitter 1000 interleaves the bits by the type B scheme, the switches 2821 and 2822 may perform the switching operation so that the LLR values deinterleaved by part 1 are output to the part 1 block deinterleaver B 2832 and the LLR values deinterleaved by part 2 bypass the part 2 block deinterleaver 2833.

Here, the reason of performing the switching operation to allow the LLR values deinterleaved by part 2 to bypass the part 2 block deinterleaver 2833 is that as illustrated in FIG. 20, the bits corresponding to part 2 are not substantially interleaved.

The concatenator 2840 again concatenates the values divided by the part divider 2810 to output the values having the length before being divided.

Specifically, the concatenator 2840 may add the LLR values output from the part 2 block deinterleaver 2833 after the LLR values output from the part 1 block deinterleaver A 2831.

Further, the concatenator 2840 may add the values output from the part divider 2810 after the LLR values output from the part 1 block deinterleaver B 2832.

Figure 30:
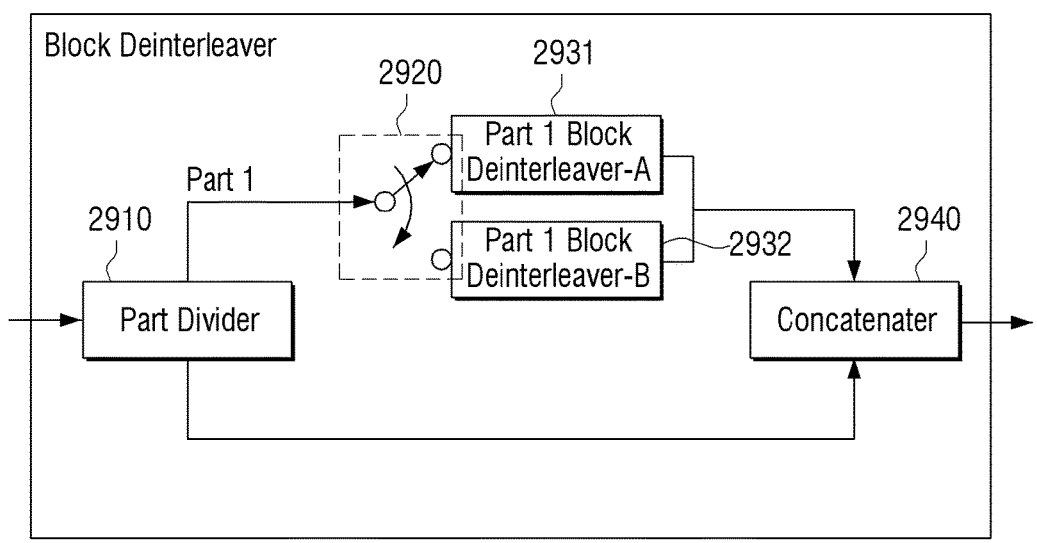

Meanwhile, as shown in FIG. 30, the block deinterleaver 2721 may include a part divider 2910, a switch 2920, a part 1 block deinterleaver A 2931, a part 1 block deinterleaver B 2932, and a concatenator 2940.

Specifically, the block deinterleaver 2721 as shown in FIG. 30 may be used when the block interleaver 423 performs the block interleaving using the components as shown in FIG. 21.

For this purpose, the receiver 2000 may pre-store the information on the interleaving scheme performed in the transmitter 1000.

The part divider 2910 divides a part deinterleaved by part 1 and a part deinterleaved by part 2 in the LLR values.

Meanwhile, a method for dividing LLR values deinterleaved by part 1 and LLR values deinterleaved by part 2 was described with reference to FIG. 29.

The part 1 block deinterleaver A 2921 deinterleaves the LLR values deinterleaved by part 1.

Specifically, the part 1 block deinterleaver A 2931 may reversely perform the interleaving operation performed by the part 1 block interleaver A 631 illustrated in FIG. 21 to deinterleave the LLR values deinterleaved by part 1.

The part 1 block deinterleaver B 2932 deinterleaves the LLR values deinterleaved by part 1.

Specifically, the part 1 block deinterleaver B 2932 may reversely perform the interleaving operation performed by the part 1 block interleaver B 632 illustrated in FIG. 21 to deinterleave the LLR values deinterleaved by part 1.

The switch 2921 may perform the switching operation so that the LLR values are deinterleaved by the specific scheme.

Specifically, when the transmitter 1000 interleaves the bits by the type A scheme, the switch 2921 may perform the switching operation so that the LLR values deinterleaved by part 1 are output to the part 1 block deinterleaver A 2931.

Specifically, when the transmitter 1000 interleaves the bits by the type B scheme, the switch 2921 may perform the switching operation so that the LLR values deinterleaved by part 1 are output to the part 1 block deinterleaver B 2932.

Meanwhile, referring to FIG. 30, it may be appreciated that the LLR values interleaved by part 2 output from the part divider 2910 may be input to the concatenator 2940 without passing through the separate deinterleaver. The reason is that in FIG. 21, the bits corresponding to part 2 are not substantially interleaved.

The concatenator 2940 again concatenates the values divided by the part divider 290 to output the values having the length before being divided.

Specifically, the concatenator 2940 may add the LLR values output from the part divider 2910 after the LLR values output from the part 1 block deinterleaver 2931 or the part 1 block deinterleaver B 2932.

Figure 31:
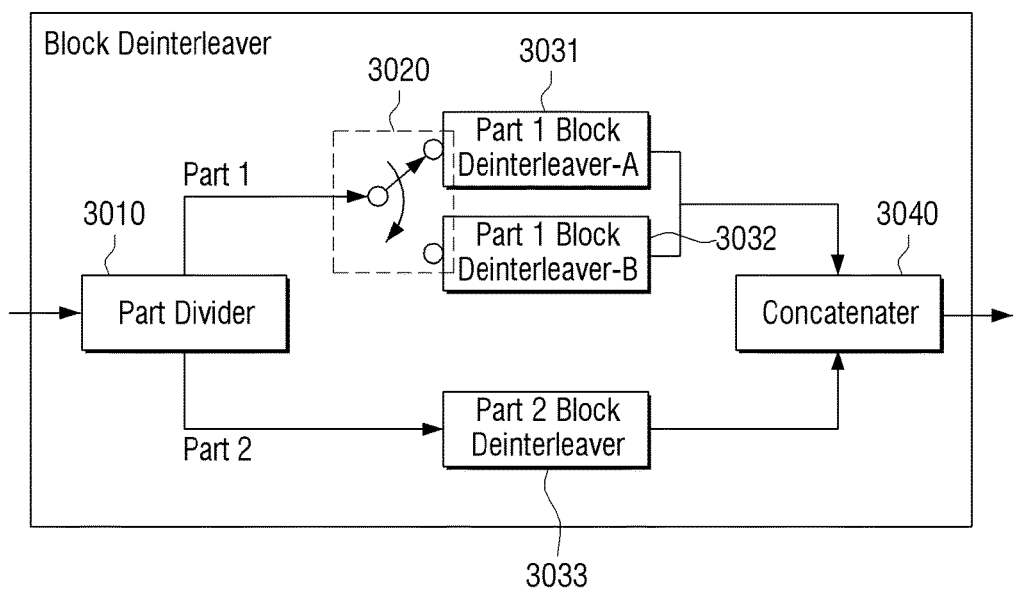

Meanwhile, as shown in FIG. 31, the block deinterleaver 2721 may include a part divider 3010, a switch 3020, a part 1 block deinterleaver A 3031, a part 1 block deinterleaver B 3032, a part 2 block deinterleaver 3033, and a concatenator 3040.

Specifically, the block deinterleaver 2721 as shown in FIG. 31 may be used when the block interleaver 423 performs the block interleaving using the components as shown in FIG. 22.

For this purpose, the receiver 2000 may pre-store the information on the interleaving scheme performed in the transmitter 1000.

The part divider 3010 divides a part deinterleaved by part 1 and a part deinterleaved by part 2 in the LLR values.

Meanwhile, a method for dividing LLR values deinterleaved by part 1 and LLR values deinterleaved by part 2 was described with reference to FIG. 29.

The part 1 block deinterleaver A 3031 deinterleaves the LLR values deinterleaved by part 1.

Specifically, the part 1 block deinterleaver A 3031 may reversely perform the interleaving operation performed by the part 1 block interleaver A 731 illustrated in FIG. 22 to deinterleave the LLR values deinterleaved by part 1.

The part 1 block deinterleaver B 3032 deinterleaves the LLR values deinterleaved by part 1.

Specifically, the part 1 block deinterleaver B 3032 may reversely perform the interleaving operation performed by the part 1 block interleaver B 732 illustrated in FIG. 22 to deinterleave the LLR values deinterleaved by part 1.

The part 2 block deinterleaver 3033 deinterleaves the LLR values deinterleaved by part 2.

Specifically, the part 2 block deinterleaver B 3033 may reversely perform the interleaving operation performed by part 2 block interleaver 733 illustrated in FIG. 22 to deinterleave the LLR values deinterleaved by part 2.

The switch 3020 may perform the switching operation so that the LLR values are deinterleaved by the specific scheme.

Specifically, when the transmitter 1000 interleaves the bits by the type A scheme, the switch 3020 may perform the switching operation so that the values corresponding to the bit groups deinterleaved by part 1 are output to the part 1 block deinterleaver A 3031.

Further, when the transmitter 1000 interleaves the bits by the type B scheme, the switch 3020 may perform the switching operation so that the values corresponding to the bit groups deinterleaved by part 1 are output to the part 1 block deinterleaver B 3032.

The concatenator 3040 again concatenates the values divided by the part divider 3010 to output the values having the length before being divided.

Specifically, the concatenator 3040 may add the LLR values output from the part 2 block deinterleaver 3033 after the LLR values output from the part 1 block deinterleaver A 3031.

Further, the concatenator 3040 may add the LLR values output from the part 2 block deinterleaver 3033 after the LLR values output from the part 1 block deinterleaver A 3031.

Figure 32:
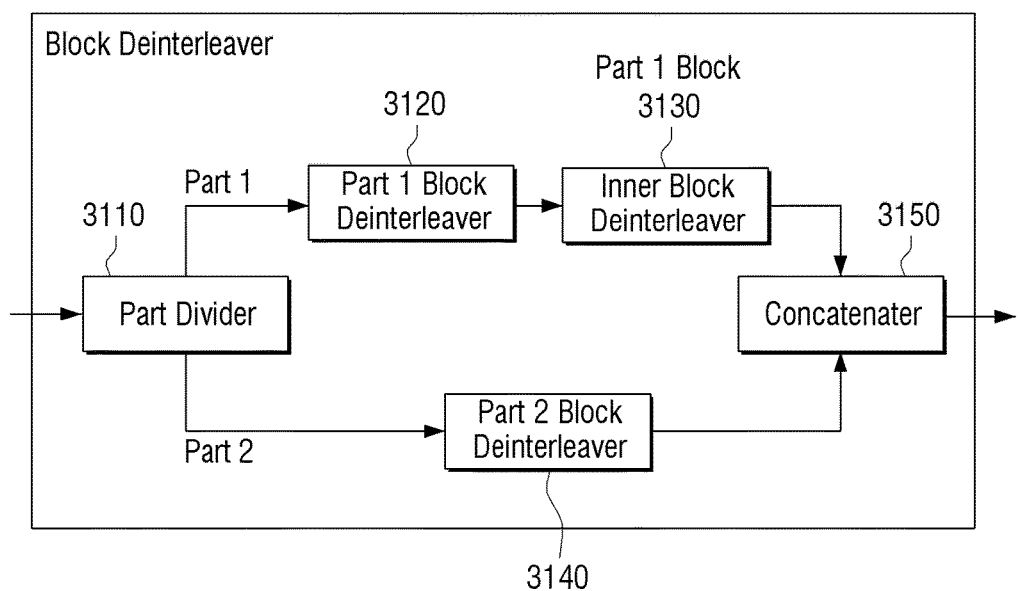

Meanwhile, as shown in FIG. 32, the block deinterleaver 2721 may include a part divider 3110, a part 1 block deinterleaver A 3120, an inner block interleaver 3130, a part 2 block interleaver 3140, and a concatenator 3150.

Specifically, the block deinterleaver 2721 as shown in FIG. 32 may be used when the block interleaver 423 performs the block interleaving using the components as shown in FIG. 23.

For this purpose, the receiver 2000 may pre-store the information on the interleaving scheme performed in the transmitter 1000.

The part divider 3110 divides a part deinterleaved by part 1 and a part deinterleaved by part 2 in the LLR values.

Meanwhile, a method for dividing LLR values deinterleaved by part 1 and LLR values deinterleaved by part 2 was described with reference to FIG. 29.

The part 1 block deinterleaver 3120 deinterleaves the LLR values deinterleaved by part 1.

Specifically, the part 1 block deinterleaver 3120 may reversely perform the interleaving operation performed by the part 1 block interleaver 830 illustrated in FIG. 23 to deinterleave the LLR values deinterleaved by part 1.

The inner block deinterleaver 3130 deinterleaves the LLR values corresponding to the deinterleaved part 1.

Specifically, the inner block deinterleaver 3130 may reversely perform the interleaving operation performed by the inner block interleaver 820 illustrated in FIG. 23 to deinterleave the LLR values corresponding to the deinterleaved part 1 in the bits group wise.

The part 2 block deinterleaver 3140 deinterleaves the LLR values deinterleaved by part 2.

Specifically, the part 2 block deinterleaver 3140 may reversely perform the interleaving operation performed by the part 2 block interleaver 840 illustrated in FIG. 23 to deinterleave the LLR values deinterleaved by part 2.

The concatenator 3150 again concatenates the values divided by the part divider 3110 to output the values having the length before being divided.

Specifically, the concatenator 3150 may add the LLR values output from the part 2 block deinterleaver 3140 after the LLR values output from the inner block deinterleaver 3130.

The group deinterleaver 2722 deinterleaves the output value of the block deinterleaver 2721 and outputs it to the parity deinterleaver 2723.

In detail, the group deinterleaver 2722 is a component corresponding to the group interleaver 422 included in the transmitter 1000 and may reversely perform the interleaving operation performed by the group interleaver 422.

That is, the group deinterleaver 2722 may reversely perform the interleaving operation performed by the group interleaver 422 to rearrange the order of the LLR values corresponding to the plurality of bit groups in the bits group wise.

Specifically, when the group interleaver 422 may perform the interleaving based on the above Tables 9 to 18, the group deinterleaver 2722 may reversely perform the interleaving operation based on the above Tables 9 to 18 to output the LLR values having the order of bits before the group interleaving.

For example, the case in which the LDPC information bits are encoded by using a code rate of 2/15 to generate the LDPC codeword having a length of 64800 and the LDPC codeword bits are modulated by the QPSK is assumed.

In this case, the group interleaver 422 may perform the interleaving using π(j) defined when the code rate is 2/15 in the Table 9.

As a result, the group deinterleaver 2722 may reversely perform the interleaving operation based on the above Table 9 to output the LLR values having the order of bits before the group interleaving.

For example, the group deinterleaver 2722 deinterleaves the LLR values corresponding to the 0-th bit group at the position corresponding to the 70-th bit group, the LLR values corresponding to the 1-th bit group at the position corresponding to the 149-th bit group, . . . , the values corresponding to the 178-th bit group at the position corresponding to the 38-th bit group, the LLR values corresponding to the 179-th bit group at the position corresponding to the 17-th bit group, thereby outputting the LLR values having the order of bits before the group interleaving.

For this purpose, the receiver 2000 may pre-store the information on the group interleaving scheme performed in the transmitter 1000.

Meanwhile, the foregoing example describes that the receiver 2000 includes the block interleaver corresponding to each of the types of the block interleaving types performed by the transmitter 1000, that is, the type A block deinterleaver for performing the deinterleaving according to the type A scheme and the type B deinterleaver for performing the deinterleaving according to the type B scheme, which is only an example.

That is, the receiver 2000 may include only one type block deinterleaver to process the signal transmitted from the transmitter 1000.

Figure 33:
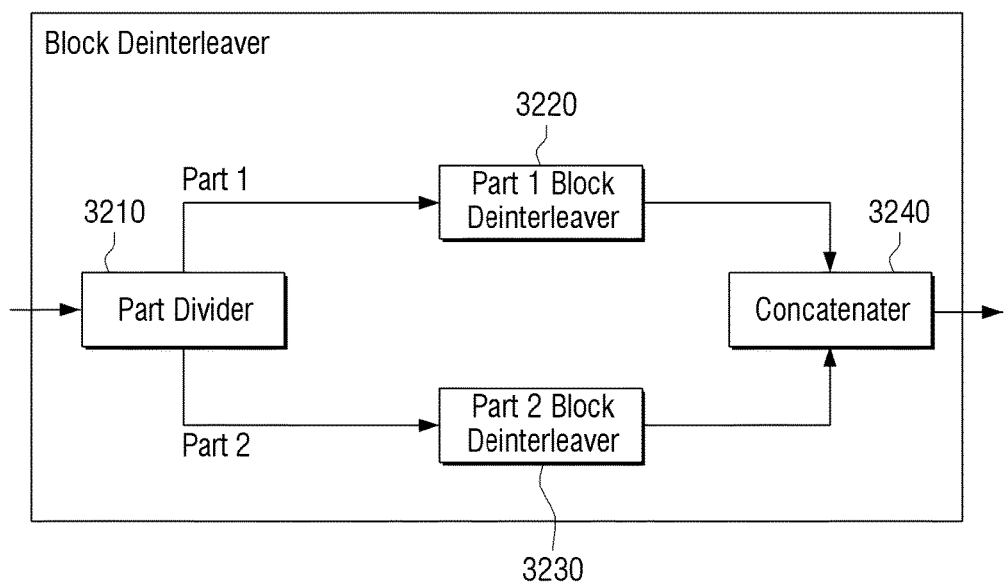

For this purpose, as shown in FIG. 33, the block deinterleaver 2721 may include a part divider 3210, a part 1 block deinterleaver 3220, a part 2 block interleaver B 3230, and a concatenator 3240.

The part divider 3210 divides a part deinterleaved by the part 1 and a part deinterleaved by the part 2 in the LLR values.

Meanwhile, a method for dividing LLR values deinterleaved by part 1 and LLR values deinterleaved by part 2 was described with reference to FIG. 29.

The part 1 block deinterleaver 3220 deinterleaves the LLR values deinterleaved by the part 1.

Specifically, the part 1 block deinterleaver 3220 may deinterleave the LLR values corresponding to the part 1 by the deinterleaving scheme corresponding to the type A interleaving scheme. That is, the part 1 block deinterleaver 3220 may deinterleave the LLR values corresponding to the part 1 by reversely performing the interleaving operation according to the type A scheme.

Alternatively, the part 1 block deinterleaver 3220 may deinterleave the LLR values corresponding to the part 1 by the deinterleaving scheme corresponding to the type B interleaving scheme. That is, the part 1 block deinterleaver 3220 may deinterleave the LLR values corresponding to the part 1 by reversely performing the interleaving operation according to the type B scheme.

The part 2 block deinterleaver 3230 deinterleaves the LLR values deinterleaved by the part 2.

In this case, the part 2 block deinterleaver 3230 may deinterleave the LLR values corresponding to the part 2 according to the scheme of the same type as the type used in the part 1 block deinterleaver 3220.

That is, the part 2 block deinterleaver 3230 may deinterleave the LLR values corresponding to the part 2 according to the type A scheme when the part 1 block deinterleaver 3220 performs the deinterleaving according to the type A scheme.

Further, the part 2 block deinterleaver 3230 may deinterleave the LLR values corresponding to the part 2 according to the type B scheme when the part 1 block deinterleaver 3220 performs the deinterleaving according to the type B scheme.

The concatenator 3240 again concatenates the values divided by the part divider 3210 to output the values having the length before being divided.

Specifically, the concatenator 3240 may add the LLR values output from the part 2 block deinterleaver 3230 after the LLR values output from the part 1 block deinterleaver 3220.

In this case, the group deinterleaver 2722 may refer to the interleaving scheme defined in the following Tables 21 to 30 in addition to the above Tables 9 to 18 to perform the deinterleaving.

Here, the following Table 21 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 64800 and when the bits are modulated by the QPSK, shows the group interleaving pattern used to define the π(j).

TABLE 21

| Code Rate | Order of group-wise interleaving π(j) (0 ≤ j < 180) | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 2/15 | 70 | 20 | 149 | 65 | 136 | 97 | 153 | 66 | 104 | 80 | 110 | 11 | 134 | 59 |
| | 147 | 177 | 28 | 168 | 50 | 78 | 160 | 71 | 102 | 120 | 55 | 60 | 139 | 155 |
| | 123 | 169 | 91 | 165 | 173 | 99 | 57 | 159 | 106 | 148 | 143 | 179 | 151 | 0 |
| | 74 | 31 | 117 | 7 | 48 | 23 | 75 | 51 | 135 | 5 | 41 | 121 | 137 | 83 |
| | 49 | 72 | 130 | 36 | 128 | 3 | 79 | 163 | 162 | 15 | 32 | 46 | 172 | 21 |
| | 140 | 96 | 127 | 39 | 158 | 68 | 94 | 105 | 67 | 85 | 122 | 109 | 1 | 13 |
| | 54 | 81 | 111 | 118 | 14 | 43 | 156 | 29 | 8 | 124 | 16 | 22 | 73 | 62 |
| | 166 | 63 | 82 | 88 | 95 | 25 | 10 | 52 | 144 | 170 | 141 | 24 | 132 | 69 |
| 3/15 | 75 | 42 | 170 | 105 | 132 | 12 | 174 | 158 | 7 | 81 | 111 | 20 | 30 | 66 |
| | 90 | 92 | 175 | 106 | 35 | 27 | 60 | 126 | 79 | 116 | 87 | 178 | 135 | 41 |
| | 153 | 89 | 103 | 73 | 51 | 113 | 58 | 52 | 107 | 109 | 167 | 134 | 39 | 36 |
| | 31 | 65 | 15 | 8 | 71 | 40 | 18 | 76 | 95 | 140 | 124 | 44 | 85 | 68 |
| | 152 | 72 | 102 | 13 | 38 | 122 | 28 | 21 | 86 | 63 | 162 | 137 | 171 | 120 |
| | 34 | 150 | 46 | 26 | 22 | 59 | 29 | 3 | 104 | 148 | 45 | 173 | 56 | 141 |
| | 172 | 99 | 115 | 64 | 118 | 138 | 127 | 101 | 6 | 23 | 16 | 11 | 0 | 17 |
| | 165 | 110 | 5 | 2 | 142 | 169 | 179 | 47 | 37 | 83 | 70 | 164 | 131 | 155 |
| 4/15 | 141 | 70 | 86 | 173 | 22 | 174 | 20 | 129 | 176 | 55 | 21 | 98 | 37 | 88 |
| | 111 | 62 | 132 | 44 | 71 | 24 | 140 | 117 | 136 | 8 | 10 | 145 | 115 | 36 |
| | 163 | 81 | 9 | 59 | 160 | 53 | 73 | 15 | 100 | 52 | 16 | 72 | 153 | 164 |
| | 101 | 4 | 14 | 168 | 38 | 54 | 35 | 177 | 66 | 158 | 64 | 113 | 7 | 57 |

TABLE 21-continued

|      |     |     |     |     |     |     |     |     |     |     |     |     |     |     |
|------|-----|-----|-----|-----|-----|-----|-----|-----|-----|-----|-----|-----|-----|-----|
|      |     | 18  | 68  | 103 | 121 | 1   | 28  | 41  | 65  | 104 | 106 | 144 | 78  | 39  | 47  |
|      |     | 27  | 159 | 74  | 61  | 48  | 45  | 133 | 156 | 43  | 0   | 116 | 83  | 137 | 157 |
|      |     | 109 | 107 | 75  | 162 | 67  | 32  | 142 | 99  | 96  | 85  | 51  | 175 | 139 | 80  |
|      |     | 11  | 23  | 26  | 34  | 76  | 60  | 95  | 93  | 87  | 165 | 155 | 128 | 58  | 90  |
| 5/15 |     | 39  | 141 | 47  | 175 | 96  | 56  | 176 | 74  | 33  | 95  | 75  | 29  | 165 | 45  |
|      |     | 150 | 17  | 7   | 46  | 162 | 10  | 153 | 91  | 137 | 133 | 108 | 69  | 159 | 171 |
|      |     | 146 | 57  | 101 | 37  | 36  | 70  | 0   | 134 | 138 | 40  | 25  | 21  | 77  | 149 |
|      |     | 110 | 93  | 142 | 130 | 152 | 2   | 15  | 104 | 154 | 102 | 145 | 128 | 12  | 4   |
|      |     | 35  | 123 | 127 | 72  | 156 | 177 | 55  | 131 | 82  | 116 | 85  | 44  | 66  | 158 |
|      |     | 119 | 5   | 174 | 31  | 34  | 100 | 83  | 106 | 53  | 48  | 24  | 52  | 42  | 67  |
|      |     | 50  | 41  | 9   | 148 | 143 | 109 | 28  | 87  | 160 | 144 | 71  | 135 | 79  | 20  |
|      |     | 6   | 3   | 19  | 166 | 30  | 105 | 163 | 103 | 61  | 118 | 179 | 63  | 136 | 51  |
| 6/15 |     | 0   | 4   | 14  | 5   | 19  | 10  | 21  | 12  | 2   | 20  | 11  | 6   | 22  | 18  |
|      |     | 29  | 26  | 28  | 24  | 23  | 27  | 25  | 80  | 67  | 100 | 116 | 121 | 66  | 107 |
|      |     | 49  | 76  | 75  | 65  | 93  | 130 | 127 | 56  | 95  | 128 | 119 | 77  | 73  | 39  |
|      |     | 88  | 129 | 74  | 52  | 35  | 111 | 110 | 124 | 131 | 48  | 98  | 122 | 60  | 82  |
|      |     | 103 | 34  | 102 | 118 | 81  | 38  | 113 | 72  | 101 | 108 | 97  | 58  | 33  | 43  |
|      |     | 86  | 126 | 79  | 85  | 96  | 123 | 32  | 40  | 114 | 83  | 64  | 53  | 55  | 69  |
|      |     | 138 | 139 | 140 | 141 | 142 | 143 | 144 | 145 | 146 | 147 | 148 | 149 | 150 | 151 |
|      |     | 161 | 162 | 163 | 164 | 165 | 166 | 167 | 168 | 169 | 170 | 171 | 172 | 173 | 174 |
| 7/15 |     | 152 | 91  | 172 | 24  | 113 | 78  | 167 | 5   | 100 | 69  | 163 | 175 | 159 | 8   |
|      |     | 43  | 99  | 93  | 89  | 160 | 179 | 108 | 123 | 164 | 149 | 12  | 177 | 140 | 1   |
|      |     | 57  | 82  | 166 | 80  | 81  | 173 | 133 | 105 | 112 | 9   | 33  | 66  | 151 | 65  |
|      |     | 74  | 124 | 4   | 143 | 36  | 28  | 94  | 59  | 67  | 130 | 158 | 31  | 10  | 157 |
|      |     | 155 | 86  | 111 | 118 | 153 | 73  | 55  | 79  | 54  | 121 | 176 | 148 | 17  | 95  |
|      |     | 115 | 147 | 135 | 7   | 25  | 174 | 168 | 6   | 11  | 90  | 136 | 15  | 18  | 56  |
|      |     | 122 | 97  | 110 | 22  | 154 | 165 | 76  | 40  | 64  | 19  | 75  | 60  | 84  | 46  |
|      |     | 101 | 150 | 39  | 87  | 116 | 27  | 127 | 42  | 30  | 3   | 98  | 23  | 50  | 96  |
| 8/15 |     | 0   | 1   | 2   | 3   | 4   | 5   | 6   | 7   | 8   | 9   | 10  | 11  | 12  | 13  |
|      |     | 23  | 24  | 25  | 26  | 27  | 28  | 29  | 30  | 31  | 32  | 33  | 34  | 35  | 36  |
|      |     | 46  | 47  | 48  | 49  | 50  | 51  | 52  | 53  | 54  | 55  | 56  | 57  | 58  | 59  |
|      |     | 69  | 70  | 71  | 72  | 73  | 74  | 75  | 76  | 77  | 78  | 79  | 80  | 81  | 82  |
|      |     | 92  | 93  | 94  | 95  | 96  | 97  | 98  | 99  | 100 | 101 | 102 | 103 | 104 | 105 |
|      |     | 115 | 116 | 117 | 118 | 119 | 120 | 121 | 122 | 123 | 124 | 125 | 126 | 127 | 128 |
|      |     | 138 | 139 | 140 | 141 | 142 | 143 | 144 | 145 | 146 | 147 | 148 | 149 | 150 | 151 |
|      |     | 161 | 162 | 163 | 164 | 165 | 166 | 167 | 168 | 169 | 170 | 171 | 172 | 173 | 174 |
| 9/15 |     | 0   | 1   | 2   | 3   | 4   | 5   | 6   | 7   | 8   | 9   | 10  | 11  | 12  | 13  |
|      |     | 23  | 24  | 25  | 26  | 27  | 28  | 29  | 30  | 31  | 32  | 33  | 34  | 35  | 36  |
|      |     | 46  | 47  | 48  | 49  | 50  | 51  | 52  | 53  | 54  | 55  | 56  | 57  | 58  | 59  |
|      |     | 69  | 70  | 71  | 72  | 73  | 74  | 75  | 76  | 77  | 78  | 79  | 80  | 81  | 82  |
|      |     | 92  | 93  | 94  | 95  | 96  | 97  | 98  | 99  | 100 | 101 | 102 | 103 | 104 | 105 |
|      |     | 115 | 116 | 117 | 118 | 119 | 120 | 121 | 122 | 123 | 124 | 125 | 126 | 127 | 128 |
|      |     | 138 | 139 | 140 | 141 | 142 | 143 | 144 | 145 | 146 | 147 | 148 | 149 | 150 | 151 |
|      |     | 161 | 162 | 163 | 164 | 165 | 166 | 167 | 168 | 169 | 170 | 171 | 172 | 173 | 174 |
| 10/15 |    | 0   | 1   | 2   | 3   | 4   | 5   | 6   | 7   | 8   | 9   | 10  | 11  | 12  | 13  |
|      |     | 23  | 24  | 25  | 26  | 27  | 28  | 29  | 30  | 31  | 32  | 33  | 34  | 35  | 36  |
|      |     | 46  | 47  | 48  | 49  | 50  | 51  | 52  | 53  | 54  | 55  | 56  | 57  | 58  | 59  |
|      |     | 69  | 70  | 71  | 72  | 73  | 74  | 75  | 76  | 77  | 78  | 79  | 80  | 81  | 82  |
|      |     | 92  | 93  | 94  | 95  | 96  | 97  | 98  | 99  | 100 | 101 | 102 | 103 | 104 | 105 |
|      |     | 115 | 116 | 117 | 118 | 119 | 120 | 121 | 122 | 123 | 124 | 125 | 126 | 127 | 128 |
|      |     | 138 | 139 | 140 | 141 | 142 | 143 | 144 | 145 | 146 | 147 | 148 | 149 | 150 | 151 |
|      |     | 161 | 162 | 163 | 164 | 165 | 166 | 167 | 168 | 169 | 170 | 171 | 172 | 173 | 174 |
| 11/15 |    | 0   | 4   | 14  | 5   | 19  | 10  | 21  | 12  | 2   | 20  | 11  | 6   | 22  | 18  |
|      |     | 29  | 26  | 28  | 24  | 23  | 27  | 25  | 80  | 67  | 100 | 116 | 121 | 66  | 107 |
|      |     | 49  | 76  | 75  | 65  | 93  | 130 | 127 | 56  | 95  | 128 | 119 | 77  | 73  | 39  |
|      |     | 88  | 129 | 74  | 52  | 35  | 111 | 110 | 124 | 131 | 48  | 98  | 122 | 60  | 82  |
|      |     | 103 | 34  | 102 | 118 | 81  | 38  | 113 | 72  | 101 | 108 | 97  | 58  | 33  | 43  |
|      |     | 86  | 126 | 79  | 85  | 96  | 123 | 32  | 40  | 114 | 83  | 64  | 53  | 55  | 69  |
|      |     | 138 | 139 | 140 | 141 | 142 | 143 | 144 | 145 | 146 | 147 | 148 | 149 | 150 | 151 |
|      |     | 161 | 162 | 163 | 164 | 165 | 166 | 167 | 168 | 169 | 170 | 171 | 172 | 173 | 174 |
| 12/15 |    | 0   | 1   | 2   | 3   | 4   | 5   | 6   | 7   | 8   | 9   | 10  | 11  | 12  | 13  |
|      |     | 23  | 24  | 25  | 26  | 27  | 28  | 29  | 30  | 31  | 32  | 33  | 34  | 35  | 36  |
|      |     | 46  | 47  | 48  | 49  | 50  | 51  | 52  | 53  | 54  | 55  | 56  | 57  | 58  | 59  |
|      |     | 69  | 70  | 71  | 72  | 73  | 74  | 75  | 76  | 77  | 78  | 79  | 80  | 81  | 82  |
|      |     | 92  | 93  | 94  | 95  | 96  | 97  | 98  | 99  | 100 | 101 | 102 | 103 | 104 | 105 |
|      |     | 115 | 116 | 117 | 118 | 119 | 120 | 121 | 122 | 123 | 124 | 125 | 126 | 127 | 128 |
|      |     | 138 | 139 | 140 | 141 | 142 | 143 | 144 | 145 | 146 | 147 | 148 | 149 | 150 | 151 |
|      |     | 161 | 162 | 163 | 164 | 165 | 166 | 167 | 168 | 169 | 170 | 171 | 172 | 173 | 174 |
| 13/15 |    | 0   | 1   | 2   | 3   | 4   | 5   | 6   | 7   | 8   | 9   | 10  | 11  | 12  | 13  |
|      |     | 23  | 24  | 25  | 26  | 27  | 28  | 29  | 30  | 31  | 32  | 33  | 34  | 35  | 36  |
|      |     | 46  | 47  | 48  | 49  | 50  | 51  | 52  | 53  | 54  | 55  | 56  | 57  | 58  | 59  |
|      |     | 69  | 70  | 71  | 72  | 73  | 74  | 75  | 76  | 77  | 78  | 79  | 80  | 81  | 82  |
|      |     | 92  | 93  | 94  | 95  | 96  | 97  | 98  | 99  | 100 | 101 | 102 | 103 | 104 | 105 |
|      |     | 115 | 116 | 117 | 118 | 119 | 120 | 121 | 122 | 123 | 124 | 125 | 126 | 127 | 128 |
|      |     | 138 | 139 | 140 | 141 | 142 | 143 | 144 | 145 | 146 | 147 | 148 | 149 | 150 | 151 |
|      |     | 161 | 162 | 163 | 164 | 165 | 166 | 167 | 168 | 169 | 170 | 171 | 172 | 173 | 174 |

TABLE 21-continued

| Code Rate | Order of group-wise interleaving $\pi(j)$ ($0 \leq j < 180$) | | | | | | | |
|---|---|---|---|---|---|---|---|---|
| | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |
| | 129 | 130 | 131 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 2/15 | 61 | 19 | 129 | 115 | 126 | 154 | 58 | 26 | 150 |
| | 125 | 175 | 116 | 9 | 138 | 161 | 167 | 103 | 53 |
| | 89 | 146 | 86 | 90 | 35 | 6 | 77 | 100 | 133 |
| | 76 | 64 | 92 | 176 | 164 | 119 | 113 | 98 | 152 |
| | 87 | 44 | 131 | 108 | 45 | 34 | 114 | 56 | 93 |
| | 27 | 33 | 171 | 145 | 30 | 18 | 157 | 12 | 112 |
| | 2 | 37 | 84 | 40 | 47 | 4 | 42 | 107 | 101 |
| | 174 | 142 | 38 | 178 | 17 | | | | |
| 3/15 | 4 | 57 | 49 | 121 | 133 | 25 | 50 | 1 | 160 |
| | 10 | 166 | 139 | 88 | 156 | 84 | 177 | 80 | 77 |
| | 108 | 176 | 24 | 54 | 145 | 69 | 96 | 146 | 74 |
| | 14 | 125 | 78 | 119 | 129 | 82 | 161 | 53 | 19 |
| | 61 | 144 | 93 | 91 | 147 | 157 | 117 | 48 | 32 |
| | 151 | 130 | 62 | 154 | 43 | 97 | 94 | 33 | 163 |
| | 143 | 136 | 9 | 128 | 100 | 114 | 67 | 112 | 98 |
| | 55 | 123 | 168 | 159 | 149 | | | | |
| 4/15 | 82 | 97 | 6 | 146 | 122 | 123 | 130 | 84 | 40 |
| | 63 | 79 | 46 | 172 | 42 | 149 | 50 | 127 | 138 |
| | 124 | 150 | 110 | 29 | 49 | 17 | 154 | 91 | 152 |
| | 125 | 2 | 151 | 102 | 56 | 161 | 126 | 147 | 171 |
| | 105 | 143 | 131 | 12 | 77 | 169 | 69 | 120 | 108 |
| | 94 | 119 | 3 | 112 | 25 | 118 | 134 | 92 | 13 |
| | 31 | 170 | 166 | 5 | 179 | 135 | 89 | 178 | 167 |
| | 30 | 19 | 148 | 33 | 114 | | | | |
| 5/15 | 38 | 129 | 27 | 120 | 58 | 168 | 90 | 92 | 76 |
| | 157 | 32 | 173 | 117 | 23 | 78 | 89 | 13 | 132 |
| | 122 | 80 | 49 | 1 | 14 | 121 | 125 | 59 | 140 |
| | 170 | 111 | 54 | 151 | 155 | 84 | 99 | 167 | 22 |
| | 114 | 73 | 8 | 11 | 147 | 65 | 115 | 164 | 113 |
| | 60 | 107 | 26 | 18 | 161 | 126 | 68 | 112 | 178 |
| | 43 | 62 | 98 | 81 | 86 | 169 | 94 | 124 | 64 |
| | 97 | 139 | 16 | 172 | 88 | | | | |
| 6/15 | 9 | 13 | 8 | 17 | 7 | 15 | 16 | 1 | 3 |
| | 104 | 31 | 44 | 36 | 50 | 42 | 47 | 46 | 84 |
| | 61 | 94 | 63 | 87 | 117 | 120 | 89 | 62 | 99 |
| | 37 | 106 | 45 | 91 | 78 | 92 | 125 | 71 | 41 |
| | 115 | 109 | 59 | 57 | 112 | 105 | 90 | 68 | 51 |
| | 30 | 70 | 54 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 7/15 | 144 | 29 | 114 | 106 | 47 | 137 | 161 | 131 | 125 |
| | 71 | 132 | 63 | 37 | 141 | 26 | 109 | 16 | 129 |
| | 117 | 92 | 83 | 32 | 52 | 41 | 178 | 72 | 85 |
| | 88 | 170 | 142 | 44 | 45 | 61 | 126 | 102 | 2 |
| | 68 | 70 | 169 | 51 | 20 | 53 | 104 | 21 | 38 |
| | 138 | 120 | 134 | 13 | 119 | 34 | 146 | 48 | 0 |
| | 162 | 14 | 77 | 49 | 103 | 139 | 156 | 58 | 128 |
| | 107 | 171 | 35 | 145 | 62 | | | | |
| 8/15 | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |
| | 129 | 130 | 131 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 9/15 | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |
| | 129 | 130 | 131 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 10/15 | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |

TABLE 21-continued

| | | | | | | | | | |
|---|---|---|---|---|---|---|---|---|---|
| | | 129 | 130 | 131 | 132 | 133 | 134 | 135 | 136 | 137 |
| | | 152 | 153 | 154 | 155 | 156 | 157 | 158 | 159 | 160 |
| | | 175 | 176 | 177 | 178 | 179 | | | | |
| 11/15 | | 9 | 13 | 8 | 17 | 7 | 15 | 16 | 1 | 3 |
| | | 104 | 31 | 44 | 36 | 50 | 42 | 47 | 46 | 84 |
| | | 61 | 94 | 63 | 87 | 117 | 120 | 89 | 62 | 99 |
| | | 37 | 106 | 45 | 91 | 78 | 92 | 125 | 71 | 41 |
| | | 115 | 109 | 59 | 57 | 112 | 105 | 90 | 68 | 51 |
| | | 30 | 70 | 54 | 132 | 133 | 134 | 135 | 136 | 137 |
| | | 152 | 153 | 154 | 155 | 156 | 157 | 158 | 159 | 160 |
| | | 175 | 176 | 177 | 178 | 179 | | | | |
| 12/15 | | 14 | 15 | 16 | 17 | 18 | 19 | 20 | 21 | 22 |
| | | 37 | 38 | 39 | 40 | 41 | 42 | 43 | 44 | 45 |
| | | 60 | 61 | 62 | 63 | 64 | 65 | 66 | 67 | 68 |
| | | 83 | 84 | 85 | 86 | 87 | 88 | 89 | 90 | 91 |
| | | 106 | 107 | 108 | 109 | 110 | 111 | 112 | 113 | 114 |
| | | 129 | 130 | 131 | 132 | 133 | 134 | 135 | 136 | 137 |
| | | 152 | 153 | 154 | 155 | 156 | 157 | 158 | 159 | 160 |
| | | 175 | 176 | 177 | 178 | 179 | | | | |
| 13/15 | | 14 | 15 | 16 | 17 | 18 | 19 | 20 | 21 | 22 |
| | | 37 | 38 | 39 | 40 | 41 | 42 | 43 | 44 | 45 |
| | | 60 | 61 | 62 | 63 | 64 | 65 | 66 | 67 | 68 |
| | | 83 | 84 | 85 | 86 | 87 | 88 | 89 | 90 | 91 |
| | | 106 | 107 | 108 | 109 | 110 | 111 | 112 | 113 | 114 |
| | | 129 | 130 | 131 | 132 | 133 | 134 | 135 | 136 | 137 |
| | | 152 | 153 | 154 | 155 | 156 | 157 | 158 | 159 | 160 |
| | | 175 | 176 | 177 | 178 | 179 | | | | |

Further, the following Table 22 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 64800 and when being modulated by the 16-QAM, shows the group interleaving pattern used to define the $\pi(j)$.

TABLE 22

| Code Rate | Order of group-wise interleaving $\pi(j)$ ($0 \leq j < 180$) | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 2/15 | 5 | 142 | 91 | 9 | 58 | 19 | 68 | 122 | 29 | 147 | 56 | 54 | 154 | 111 |
| | 131 | 0 | 79 | 107 | 127 | 169 | 10 | 85 | 164 | 80 | 132 | 20 | 102 | 59 |
| | 66 | 30 | 77 | 90 | 83 | 37 | 167 | 15 | 12 | 139 | 32 | 133 | 179 | 95 |
| | 84 | 78 | 53 | 124 | 28 | 157 | 89 | 143 | 160 | 72 | 106 | 114 | 117 | 130 |
| | 138 | 7 | 45 | 153 | 64 | 81 | 11 | 96 | 136 | 44 | 152 | 151 | 149 | 63 |
| | 6 | 101 | 158 | 2 | 123 | 119 | 148 | 137 | 134 | 35 | 82 | 140 | 31 | 33 |
| | 50 | 65 | 108 | 86 | 55 | 105 | 104 | 71 | 94 | 48 | 3 | 22 | 144 | 25 |
| | 40 | 98 | 67 | 159 | 126 | 174 | 88 | 129 | 170 | 178 | 46 | 62 | 177 | 17 |
| 3/15 | 52 | 98 | 90 | 46 | 92 | 9 | 128 | 150 | 175 | 93 | 83 | 109 | 26 | 166 |
| | 14 | 117 | 167 | 178 | 179 | 74 | 168 | 99 | 85 | 119 | 40 | 123 | 165 | 147 |
| | 159 | 64 | 144 | 156 | 151 | 173 | 87 | 177 | 145 | 10 | 3 | 171 | 61 | 102 |
| | 0 | 31 | 66 | 143 | 127 | 41 | 84 | 125 | 36 | 94 | 24 | 15 | 8 | 35 |
| | 174 | 75 | 82 | 107 | 79 | 13 | 80 | 54 | 16 | 105 | 4 | 12 | 176 | 55 |
| | 118 | 69 | 172 | 95 | 136 | 11 | 2 | 62 | 18 | 111 | 58 | 56 | 101 | 121 |
| | 163 | 103 | 88 | 77 | 148 | 106 | 50 | 158 | 23 | 38 | 76 | 17 | 161 | 70 |
| | 42 | 67 | 137 | 86 | 63 | 139 | 97 | 113 | 134 | 72 | 34 | 164 | 154 | 43 |
| 4/15 | 165 | 163 | 101 | 69 | 8 | 72 | 88 | 128 | 136 | 125 | 65 | 121 | 2 | 36 |
| | 100 | 127 | 48 | 43 | 161 | 64 | 1 | 15 | 143 | 38 | 149 | 18 | 119 | 164 |
| | 24 | 20 | 78 | 130 | 142 | 40 | 17 | 140 | 25 | 70 | 47 | 89 | 120 | 79 |
| | 171 | 0 | 13 | 124 | 139 | 174 | 177 | 147 | 112 | 93 | 131 | 148 | 113 | 167 |
| | 98 | 7 | 86 | 31 | 157 | 85 | 129 | 63 | 57 | 11 | 175 | 5 | 156 | 28 |
| | 42 | 12 | 62 | 106 | 160 | 172 | 44 | 82 | 115 | 29 | 135 | 179 | 71 | 9 |
| | 95 | 137 | 97 | 117 | 145 | 146 | 83 | 53 | 37 | 32 | 151 | 111 | 23 | 169 |
| | 81 | 49 | 84 | 39 | 68 | 103 | 74 | 50 | 114 | 108 | 60 | 104 | 173 | 56 |
| 5/15 | 129 | 32 | 177 | 134 | 122 | 31 | 133 | 167 | 124 | 123 | 179 | 176 | 125 | 170 |
| | 173 | 175 | 131 | 121 | 120 | 39 | 33 | 174 | 130 | 35 | 36 | 165 | 132 | 40 |
| | 50 | 57 | 104 | 46 | 92 | 99 | 101 | 71 | 69 | 96 | 52 | 59 | 63 | 61 |
| | 90 | 58 | 70 | 55 | 97 | 47 | 74 | 54 | 98 | 94 | 56 | 67 | 53 | 91 |
| | 157 | 24 | 17 | 163 | 18 | 110 | 107 | 108 | 113 | 117 | 15 | 112 | 106 | 152 |
| | 114 | 115 | 158 | 159 | 116 | 21 | 109 | 155 | 23 | 154 | 119 | 20 | 27 | 105 |
| | 7 | 77 | 148 | 0 | 135 | 5 | 141 | 83 | 81 | 137 | 88 | 3 | 87 | 4 |
| | 146 | 8 | 138 | 79 | 6 | 76 | 144 | 78 | 89 | 143 | 136 | 13 | 85 | 84 |

TABLE 22-continued

| | | | | | | | | | | | | | |
|---|---|---|---|---|---|---|---|---|---|---|---|---|---|
| 6/15 | 55 | 15 | 112 | 122 | 146 | 14 | 93 | 173 | 83 | 37 | 127 | 161 | 52 | 54 |
| | 175 | 160 | 43 | 105 | 166 | 68 | 18 | 31 | 131 | 53 | 47 | 19 | 119 | 56 |
| | 10 | 148 | 79 | 29 | 145 | 157 | 113 | 30 | 162 | 114 | 163 | 26 | 102 | 147 |
| | 41 | 95 | 121 | 133 | 45 | 73 | 164 | 108 | 36 | 152 | 104 | 66 | 0 | 129 |
| | 144 | 28 | 72 | 118 | 57 | 27 | 128 | 99 | 67 | 38 | 78 | 88 | 116 | 48 |
| | 165 | 156 | 49 | 178 | 84 | 172 | 51 | 154 | 168 | 65 | 60 | 85 | 124 | 149 |
| | 12 | 130 | 138 | 3 | 9 | 167 | 136 | 20 | 151 | 153 | 141 | 13 | 77 | 137 |
| | 24 | 80 | 100 | 90 | 40 | 106 | 5 | 140 | 17 | 134 | 76 | 64 | 42 | 98 |
| 7/15 | 174 | 58 | 66 | 173 | 148 | 75 | 28 | 18 | 56 | 67 | 82 | 11 | 168 | 5 |
| | 76 | 110 | 140 | 23 | 53 | 9 | 172 | 115 | 61 | 42 | 8 | 130 | 147 | 153 |
| | 102 | 32 | 46 | 159 | 24 | 59 | 21 | 86 | 129 | 166 | 121 | 87 | 150 | 179 |
| | 89 | 171 | 103 | 13 | 47 | 54 | 100 | 83 | 128 | 107 | 139 | 74 | 43 | 2 |
| | 27 | 101 | 69 | 133 | 119 | 163 | 10 | 96 | 118 | 116 | 117 | 49 | 144 | 94 |
| | 84 | 109 | 158 | 105 | 156 | 73 | 145 | 155 | 30 | 141 | 37 | 62 | 138 | 93 |
| | 127 | 12 | 77 | 1 | 14 | 0 | 108 | 113 | 165 | 20 | 57 | 64 | 26 | 63 |
| | 92 | 48 | 65 | 79 | 35 | 137 | 55 | 169 | 167 | 4 | 25 | 143 | 44 | 22 |
| 8/15 | 71 | 143 | 155 | 57 | 97 | 91 | 137 | 135 | 74 | 0 | 148 | 70 | 149 | 127 |
| | 144 | 146 | 59 | 39 | 58 | 141 | 139 | 87 | 69 | 145 | 60 | 46 | 49 | 147 |
| | 77 | 41 | 28 | 13 | 88 | 27 | 82 | 36 | 86 | 25 | 43 | 24 | 34 | 75 |
| | 42 | 76 | 85 | 44 | 35 | 80 | 90 | 32 | 23 | 38 | 21 | 78 | 89 | 31 |
| | 40 | 179 | 18 | 79 | 122 | 125 | 9 | 63 | 167 | 102 | 169 | 165 | 134 | 178 |
| | 4 | 12 | 132 | 176 | 6 | 173 | 8 | 177 | 171 | 5 | 2 | 166 | 14 | 16 |
| | 114 | 151 | 92 | 107 | 103 | 93 | 158 | 116 | 106 | 113 | 100 | 156 | 150 | 73 |
| | 72 | 47 | 104 | 95 | 163 | 154 | 111 | 62 | 153 | 109 | 152 | 131 | 117 | 159 |
| 9/15 | 23 | 19 | 68 | 114 | 107 | 55 | 110 | 111 | 71 | 29 | 72 | 156 | 65 | 16 |
| | 24 | 15 | 21 | 113 | 64 | 54 | 171 | 62 | 59 | 108 | 112 | 67 | 26 | 109 |
| | 41 | 87 | 92 | 97 | 174 | 128 | 78 | 52 | 30 | 85 | 154 | 76 | 130 | 98 |
| | 39 | 37 | 77 | 81 | 35 | 100 | 33 | 103 | 88 | 104 | 32 | 96 | 47 | 79 |
| | 9 | 121 | 166 | 126 | 172 | 82 | 5 | 132 | 17 | 131 | 125 | 129 | 0 | 173 |
| | 11 | 122 | 6 | 13 | 117 | 175 | 127 | 179 | 170 | 105 | 169 | 177 | 106 | 134 |
| | 69 | 162 | 149 | 28 | 120 | 141 | 148 | 160 | 164 | 50 | 143 | 42 | 49 | 147 |
| | 158 | 60 | 57 | 46 | 137 | 70 | 40 | 140 | 159 | 135 | 56 | 150 | 152 | 139 |
| 10/15 | 68 | 66 | 159 | 170 | 71 | 38 | 18 | 22 | 54 | 77 | 50 | 49 | 19 | 115 |
| | 160 | 102 | 113 | 51 | 178 | 32 | 100 | 131 | 133 | 105 | 75 | 106 | 142 | 29 |
| | 140 | 173 | 53 | 92 | 117 | 123 | 82 | 36 | 132 | 13 | 107 | 98 | 147 | 15 |
| | 6 | 161 | 139 | 85 | 44 | 10 | 151 | 48 | 20 | 39 | 163 | 83 | 86 | 126 |
| | 57 | 95 | 37 | 145 | 28 | 104 | 174 | 129 | 76 | 8 | 41 | 162 | 31 | 34 |
| | 137 | 65 | 111 | 12 | 149 | 119 | 35 | 52 | 167 | 114 | 30 | 99 | 1 | 109 |
| | 78 | 124 | 81 | 40 | 155 | 148 | 43 | 97 | 128 | 164 | 103 | 101 | 165 | 130 |
| | 63 | 150 | 122 | 89 | 74 | 157 | 23 | 112 | 62 | 171 | 166 | 61 | 118 | 143 |
| 11/15 | 21 | 20 | 2 | 19 | 11 | 18 | 17 | 5 | 12 | 10 | 1 | 3 | 9 | 13 |
| | 28 | 24 | 26 | 29 | 23 | 25 | 27 | 82 | 109 | 85 | 54 | 32 | 51 | 103 |
| | 121 | 33 | 71 | 87 | 92 | 84 | 101 | 113 | 130 | 88 | 41 | 115 | 127 | 64 |
| | 49 | 38 | 57 | 100 | 77 | 46 | 97 | 40 | 95 | 43 | 98 | 106 | 86 | 110 |
| | 80 | 81 | 70 | 37 | 128 | 56 | 91 | 72 | 68 | 125 | 69 | 39 | 129 | 53 |
| | 60 | 36 | 50 | 34 | 67 | 126 | 123 | 79 | 47 | 117 | 65 | 35 | 112 | 114 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 12/15 | 120 | 3 | 111 | 40 | 32 | 67 | 33 | 26 | 38 | 92 | 173 | 130 | 113 | 98 |
| | 117 | 65 | 28 | 169 | 115 | 109 | 121 | 174 | 84 | 36 | 87 | 159 | 57 | 106 |
| | 155 | 47 | 29 | 72 | 145 | 24 | 86 | 2 | 178 | 0 | 136 | 142 | 126 | 7 |
| | 50 | 156 | 19 | 79 | 8 | 179 | 127 | 81 | 90 | 157 | 17 | 105 | 139 | 46 |
| | 125 | 63 | 37 | 4 | 107 | 85 | 153 | 73 | 44 | 104 | 163 | 35 | 99 | 124 |
| | 55 | 78 | 118 | 103 | 23 | 51 | 34 | 160 | 25 | 95 | 5 | 147 | 11 | 88 |
| | 144 | 58 | 54 | 80 | 150 | 128 | 122 | 110 | 132 | 43 | 140 | 12 | 176 | 135 |
| | 53 | 162 | 141 | 129 | 116 | 170 | 6 | 82 | 123 | 138 | 22 | 164 | 96 | 151 |
| 13/15 | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |

| Code Rate | Order of group-wise interleaving $\pi(j)$ ($0 \leq j < 180$) | | | | | | | | |
|---|---|---|---|---|---|---|---|---|---|
| | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |
| | 129 | 130 | 131 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 2/15 | 110 | 38 | 125 | 70 | 21 | 156 | 34 | 74 | 93 |
| | 1 | 128 | 116 | 13 | 161 | 109 | 176 | 42 | 155 |
| | 87 | 47 | 141 | 43 | 24 | 112 | 97 | 135 | 92 |
| | 171 | 120 | 150 | 99 | 76 | 166 | 49 | 165 | 175 |

TABLE 22-continued

|      |     |     |     |     |     |     |     |     |     |
|------|----:|----:|----:|----:|----:|----:|----:|----:|----:|
|      | 168 | 115 |  57 | 118 |  14 |  52 |  18 |   4 |  16 |
|      |  69 | 121 | 103 | 113 |  36 | 173 | 163 |  75 | 162 |
|      |  27 |  26 |  73 |   8 |  39 |  61 |  51 |  60 | 172 |
|      |  41 | 146 |  23 | 100 | 145 |     |     |     |     |
| 3/15 |  60 | 115 |  45 |  78 | 146 |  32 |  81 |  73 | 124 |
|      | 131 | 108 | 112 | 120 |  27 | 133 |  25 | 135 |  89 |
|      |  51 | 116 |  53 | 114 |  20 | 152 |  68 |  71 | 170 |
|      | 141 |  39 | 153 |  21 |  29 |   5 |  59 |  49 | 104 |
|      | 155 |  91 |  44 | 122 |   7 |   1 |  19 | 132 |  57 |
|      | 126 |  65 | 149 |  37 | 162 | 140 | 130 | 160 |  30 |
|      | 129 |  96 | 169 |  48 | 138 | 100 |  47 |  28 | 157 |
|      |  22 | 142 |   6 | 110 |  33 |     |     |     |     |
| 4/15 |  99 |  96 |  58 |  14 | 126 | 133 |  30 |  55 | 141 |
|      |  33 |  90 | 102 | 123 | 110 |  35 |  59 |  45 |   6 |
|      | 105 |  77 |  19 |  80 | 159 |  22 | 154 |  51 | 134 |
|      | 132 | 109 | 152 | 150 | 176 |  67 |  16 | 107 | 155 |
|      |  87 | 162 | 170 | 153 |  21 |  76 |  46 |  73 |  66 |
|      | 116 | 118 | 158 |   3 |   4 |  41 |  54 | 144 |  61 |
|      |  26 | 178 | 168 | 122 |  52 |  94 | 166 | 138 |  10 |
|      |  34 |  92 |  75 |  91 |  27 |     |     |     |     |
| 5/15 |  34 |  42 | 171 | 178 | 128 |  41 | 168 |  38 |  44 |
|      | 172 | 127 |  30 |  37 | 166 | 169 | 126 |  43 |  65 |
|      | 100 |  72 |  64 |  49 | 102 |  93 |  45 |  66 |  51 |
|      |  73 | 103 |  48 |  60 |  95 |  68 |  62 | 160 | 162 |
|      | 161 | 150 |  26 |  28 | 156 | 151 |  25 |  29 | 164 |
|      |  19 | 153 | 111 | 118 |  22 |  16 | 140 |  86 |   9 |
|      |  10 |  75 |   2 |  12 | 142 | 139 | 147 |  80 | 145 |
|      |  11 |  14 |   1 | 149 |  82 |     |     |     |     |
| 6/15 | 101 | 150 |  62 |  44 |  94 | 110 | 176 |  63 | 115 |
|      |   7 | 177 | 103 |  81 |  25 |  74 | 139 |  97 |  34 |
|      |  61 |  39 | 120 |  87 |  58 |  16 | 126 | 158 |  69 |
|      |  89 |  71 |  23 | 174 | 179 |  86 |  32 | 125 | 123 |
|      | 171 |  11 |  59 |  33 |   8 |  92 |  70 |  22 | 142 |
|      |  46 | 107 | 169 | 155 |  21 |  75 |   2 |  82 |   4 |
|      | 111 |  50 | 117 | 143 |  96 |  35 | 109 |  91 | 170 |
|      | 132 | 159 |   6 |   1 | 135 |     |     |     |     |
| 7/15 | 178 | 111 |  38 | 104 | 176 | 106 |   7 | 125 | 152 |
|      |  39 |  98 |  97 | 160 |  17 | 123 | 175 |  15 |  29 |
|      |  88 |  41 |  34 | 135 | 114 |  99 | 136 | 177 |  85 |
|      |  50 |  81 | 161 |   3 | 146 |  70 | 154 |  60 | 134 |
|      |  91 | 126 |  31 | 120 | 157 | 151 |  80 |  71 |  33 |
|      | 112 | 162 | 164 |  45 |  68 |  40 | 132 |  16 |  95 |
|      |  36 |  72 |  52 | 170 |  78 |  90 |  19 | 142 | 124 |
|      |  51 |   6 | 149 | 122 | 131 |     |     |     |     |
| 8/15 | 136 |  96 | 140 |  68 |  53 |  11 | 161 |  55 |  67 |
|      | 138 |  50 |  66 | 142 |  51 |  52 |  45 |  56 |  81 |
|      |  84 |  20 | 130 |  22 |  33 |  29 |  26 |  15 |   1 |
|      |  37 |  19 | 105 |  83 |  17 | 133 |  30 | 170 | 128 |
|      | 126 | 121 | 129 | 124 | 123 | 168 |   7 |  61 | 172 |
|      |  10 |   3 | 174 |  64 | 175 | 120 | 101 | 112 |  54 |
|      |  48 |  99 | 157 | 160 |  98 |  94 |  65 | 115 | 162 |
|      | 164 | 108 | 119 | 110 | 118 |     |     |     |     |
| 9/15 | 133 |  63 |  74 |  61 |  27 | 115 |  73 | 118 |  66 |
|      | 116 |  25 |  22 |  20 |   7 |  58 |  53 |  18 |  89 |
|      |  83 |  43 |  36 |  86 |  99 | 101 |  90 |  93 |  44 |
|      |  94 |  84 |  34 |  91 |  95 |  75 |  31 |  10 |   1 |
|      |   8 | 167 | 102 |  38 |   4 | 124 | 123 | 168 | 178 |
|      | 176 | 165 |  12 |   2 |  14 |   3 | 142 | 146 |  51 |
|      | 119 |  48 | 163 | 153 | 151 | 157 |  80 |  45 | 136 |
|      | 138 | 145 | 144 | 155 | 161 |     |     |     |     |
| 10/15|  33 |  11 |  25 |  56 |   7 |  27 |  21 |  87 | 175 |
|      |  72 | 134 | 121 |  16 |  60 |  88 | 168 |  79 |  47 |
|      |  91 |   4 | 153 | 154 |  67 |  59 | 116 | 127 |  94 |
|      | 172 |  58 |   3 | 136 | 138 |  42 |  73 |  90 | 176 |
|      | 158 | 152 |  26 |   0 |   5 | 177 |  96 |  84 | 120 |
|      |  64 | 146 |  14 |   9 |  55 | 144 | 169 | 125 |  80 |
|      |  93 |   2 | 141 |  17 |  70 |  69 | 179 | 156 |  46 |
|      | 135 |  45 | 110 | 108 |  24 |     |     |     |     |
| 11/15|   4 |  14 |   0 |  16 |   7 |  22 |   6 |   8 |  15 |
|      | 111 | 102 | 108 | 118 |  52 |  76 | 131 | 122 |  44 |
|      |  93 |  58 |  62 |  63 |  55 | 116 | 107 |  59 |  73 |
|      |  48 | 119 |  30 |  75 |  31 |  45 |  78 | 104 |  99 |
|      |  96 |  74 |  61 |  89 | 120 |  66 | 124 |  94 |  42 |
|      |  83 | 105 |  90 | 132 | 133 | 134 | 135 | 136 | 137 |
|      | 152 | 153 | 154 | 155 | 156 | 157 | 158 | 159 | 160 |
|      | 175 | 176 | 177 | 178 | 179 |     |     |     |     |
| 12/15| 165 | 119 |  71 |  42 | 175 | 114 |  31 |  77 | 166 |
|      |  18 | 148 |  62 | 134 |  21 | 158 |  13 |  66 |  93 |
|      | 108 | 112 | 100 |  10 |  83 |   9 | 154 |  69 |  70 |
|      |  16 |  48 |  14 | 149 |  27 |  30 |  97 | 171 |  91 |

TABLE 22-continued

|  |  |  |  |  |  |  |  |  |
|---|---|---|---|---|---|---|---|---|
|  | 152 | 102 | 75 | 52 | 146 | 15 | 64 | 20 | 177 |
|  | 94 | 76 | 56 | 49 | 41 | 172 | 45 | 60 | 68 |
|  | 137 | 133 | 168 | 1 | 89 | 131 | 167 | 143 | 74 |
|  | 101 | 59 | 61 | 161 | 39 |  |  |  |  |
| 13/15 | 14 | 15 | 16 | 17 | 18 | 19 | 20 | 21 | 22 |
|  | 37 | 38 | 39 | 40 | 41 | 42 | 43 | 44 | 45 |
|  | 60 | 61 | 62 | 63 | 64 | 65 | 66 | 67 | 68 |
|  | 83 | 84 | 85 | 86 | 87 | 88 | 89 | 90 | 91 |
|  | 106 | 107 | 108 | 109 | 110 | 111 | 112 | 113 | 114 |
|  | 129 | 130 | 131 | 132 | 133 | 134 | 135 | 136 | 137 |
|  | 152 | 153 | 154 | 155 | 156 | 157 | 158 | 159 | 160 |
|  | 175 | 176 | 177 | 178 | 179 |  |  |  |  |

Further, the following Table 23 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 64800 and when being modulated by the 64-QAM, shows the group interleaving pattern used to define the π(j).

TABLE 23

| Code Rate | Order of group-wise interleaving π(j) (0 ≤ j < 180) | | | | | | | | | | | | | |
|---|---|---|---|---|---|---|---|---|---|---|---|---|---|---|
|  | 0 | 1 | 2 | 3 | 4 | 5 | 6 | 7 | 8 | 9 | 10 | 11 | 12 | 13 |
|  | 23 | 24 | 25 | 26 | 27 | 28 | 29 | 30 | 31 | 32 | 33 | 34 | 35 | 36 |
|  | 46 | 47 | 48 | 49 | 50 | 51 | 52 | 53 | 54 | 55 | 56 | 57 | 58 | 59 |
|  | 69 | 70 | 71 | 72 | 73 | 74 | 75 | 76 | 77 | 78 | 79 | 80 | 81 | 82 |
|  | 92 | 93 | 94 | 95 | 96 | 97 | 98 | 99 | 100 | 101 | 102 | 103 | 104 | 105 |
|  | 115 | 116 | 117 | 118 | 119 | 120 | 121 | 122 | 123 | 124 | 125 | 126 | 127 | 128 |
|  | 138 | 139 | 140 | 141 | 142 | 143 | 144 | 145 | 146 | 147 | 148 | 149 | 150 | 151 |
|  | 161 | 162 | 163 | 164 | 165 | 166 | 167 | 168 | 169 | 170 | 171 | 172 | 173 | 174 |
| 2/15 | 57 | 125 | 13 | 58 | 105 | 92 | 149 | 129 | 35 | 143 | 133 | 15 | 83 | 1 |
|  | 134 | 29 | 68 | 60 | 31 | 17 | 99 | 20 | 148 | 139 | 41 | 21 | 96 | 30 |
|  | 54 | 38 | 5 | 0 | 55 | 94 | 74 | 9 | 100 | 80 | 109 | 27 | 65 | 26 |
|  | 70 | 122 | 47 | 130 | 78 | 153 | 56 | 169 | 103 | 167 | 101 | 165 | 93 | 64 |
|  | 152 | 124 | 119 | 168 | 137 | 75 | 77 | 151 | 42 | 102 | 158 | 172 | 98 | 106 |
|  | 154 | 11 | 163 | 8 | 72 | 138 | 12 | 81 | 179 | 116 | 25 | 128 | 146 | 62 |
|  | 88 | 135 | 141 | 144 | 69 | 36 | 162 | 48 | 171 | 178 | 53 | 90 | 32 | 170 |
|  | 2 | 3 | 147 | 76 | 71 | 104 | 33 | 97 | 95 | 150 | 114 | 16 | 39 | 166 |
| 3/15 | 74 | 8 | 87 | 28 | 86 | 46 | 72 | 1 | 111 | 97 | 99 | 127 | 104 | 93 |
|  | 175 | 122 | 163 | 85 | 168 | 15 | 135 | 35 | 108 | 166 | 107 | 48 | 79 | 130 |
|  | 167 | 82 | 95 | 24 | 154 | 143 | 174 | 2 | 150 | 89 | 20 | 121 | 51 | 129 |
|  | 157 | 81 | 14 | 133 | 178 | 26 | 65 | 120 | 40 | 109 | 113 | 126 | 43 | 158 |
|  | 103 | 56 | 34 | 106 | 18 | 144 | 11 | 171 | 49 | 17 | 148 | 156 | 33 | 90 |
|  | 164 | 155 | 119 | 134 | 71 | 57 | 12 | 116 | 94 | 147 | 136 | 132 | 63 | 169 |
|  | 100 | 22 | 70 | 138 | 50 | 64 | 115 | 25 | 161 | 149 | 146 | 29 | 101 | 137 |
|  | 118 | 21 | 41 | 162 | 53 | 78 | 66 | 141 | 44 | 77 | 61 | 91 | 37 | 30 |
| 4/15 | 141 | 29 | 14 | 22 | 116 | 143 | 80 | 9 | 73 | 138 | 48 | 113 | 47 | 60 |
|  | 74 | 44 | 50 | 126 | 87 | 125 | 102 | 7 | 23 | 97 | 54 | 142 | 30 | 46 |
|  | 110 | 178 | 175 | 121 | 154 | 140 | 37 | 68 | 173 | 71 | 153 | 152 | 98 | 108 |
|  | 91 | 129 | 105 | 155 | 144 | 5 | 111 | 168 | 158 | 52 | 39 | 96 | 25 | 172 |
|  | 134 | 77 | 40 | 109 | 174 | 114 | 101 | 78 | 166 | 67 | 33 | 131 | 61 | 69 |
|  | 76 | 0 | 177 | 56 | 119 | 35 | 118 | 28 | 41 | 100 | 124 | 162 | 66 | 42 |
|  | 95 | 58 | 145 | 107 | 169 | 55 | 92 | 122 | 156 | 45 | 135 | 65 | 4 | 150 |
|  | 88 | 49 | 149 | 6 | 160 | 84 | 112 | 137 | 93 | 161 | 51 | 163 | 27 | 104 |
| 5/15 | 166 | 5 | 40 | 50 | 105 | 78 | 54 | 63 | 9 | 79 | 133 | 93 | 6 | 118 |
|  | 116 | 141 | 85 | 123 | 164 | 153 | 19 | 134 | 77 | 82 | 168 | 31 | 155 | 58 |
|  | 140 | 73 | 55 | 84 | 119 | 60 | 150 | 104 | 91 | 159 | 175 | 32 | 39 | 167 |
|  | 138 | 66 | 113 | 172 | 98 | 38 | 75 | 3 | 162 | 80 | 177 | 128 | 69 | 115 |
|  | 52 | 36 | 99 | 43 | 12 | 59 | 142 | 97 | 171 | 86 | 108 | 149 | 7 | 117 |
|  | 8 | 145 | 109 | 45 | 71 | 144 | 154 | 2 | 173 | 22 | 137 | 147 | 129 | 68 |
|  | 165 | 15 | 126 | 87 | 158 | 103 | 17 | 143 | 121 | 176 | 163 | 131 | 127 | 4 |
|  | 148 | 88 | 101 | 65 | 67 | 146 | 10 | 35 | 53 | 83 | 13 | 90 | 23 | 72 |
| 6/15 | 29 | 59 | 36 | 163 | 108 | 100 | 17 | 61 | 25 | 119 | 126 | 161 | 38 | 66 |
|  | 78 | 27 | 64 | 32 | 152 | 111 | 101 | 43 | 65 | 72 | 134 | 91 | 115 | 31 |
|  | 125 | 147 | 16 | 170 | 107 | 164 | 162 | 116 | 46 | 68 | 113 | 99 | 157 | 136 |
|  | 104 | 109 | 87 | 23 | 70 | 2 | 83 | 140 | 33 | 1 | 41 | 129 | 106 | 123 |
|  | 20 | 135 | 150 | 175 | 14 | 160 | 73 | 153 | 80 | 120 | 18 | 7 | 166 | 0 |
|  | 55 | 77 | 144 | 146 | 10 | 22 | 62 | 142 | 98 | 96 | 114 | 40 | 53 | 174 |
|  | 24 | 58 | 149 | 97 | 8 | 177 | 56 | 3 | 28 | 143 | 89 | 178 | 49 | 167 |
|  | 168 | 42 | 57 | 169 | 127 | 141 | 95 | 69 | 151 | 30 | 84 | 103 | 117 | 47 |
| 7/15 | 103 | 16 | 73 | 96 | 17 | 101 | 29 | 90 | 15 | 23 | 27 | 102 | 22 | 92 |
|  | 28 | 100 | 95 | 91 | 93 | 97 | 19 | 36 | 178 | 84 | 77 | 37 | 78 | 41 |
|  | 43 | 38 | 33 | 75 | 80 | 88 | 32 | 42 | 40 | 83 | 39 | 76 | 81 | 85 |
|  | 154 | 156 | 149 | 163 | 157 | 140 | 136 | 115 | 147 | 151 | 144 | 160 | 137 | 158 |
|  | 177 | 167 | 169 | 70 | 63 | 98 | 67 | 69 | 170 | 176 | 60 | 74 | 66 | 64 |

TABLE 23-continued

|  | | | | | | | | | | | | | | |
|---|---|---|---|---|---|---|---|---|---|---|---|---|---|---|
|  | 173 | 165 | 166 | 65 | 68 | 52 | 49 | 110 | 109 | 54 | 153 | 47 | 59 | 50 |
|  | 116 | 51 | 106 | 105 | 56 | 53 | 55 | 119 | 112 | 108 | 111 | 58 | 130 | 129 |
|  | 13 | 11 | 132 | 123 | 14 | 12 | 131 | 10 | 120 | 1 | 5 | 125 | 7 | 3 |
| 8/15 | 86 | 53 | 151 | 145 | 2 | 63 | 71 | 58 | 117 | 28 | 129 | 147 | 51 | 47 |
|  | 100 | 89 | 70 | 123 | 16 | 99 | 171 | 94 | 4 | 30 | 98 | 109 | 158 | 46 |
|  | 168 | 15 | 67 | 54 | 144 | 133 | 176 | 178 | 49 | 84 | 9 | 161 | 11 | 148 |
|  | 25 | 122 | 104 | 55 | 8 | 139 | 107 | 110 | 124 | 61 | 64 | 142 | 153 | 113 |
|  | 34 | 156 | 132 | 130 | 52 | 77 | 20 | 23 | 165 | 118 | 92 | 95 | 157 | 125 |
|  | 59 | 138 | 56 | 39 | 126 | 76 | 83 | 143 | 166 | 7 | 120 | 72 | 73 | 29 |
|  | 42 | 87 | 163 | 170 | 172 | 136 | 91 | 3 | 150 | 119 | 154 | 112 | 62 | 75 |
|  | 135 | 90 | 88 | 31 | 41 | 173 | 116 | 40 | 79 | 12 | 74 | 131 | 174 | 78 |
| 9/15 | 175 | 70 | 50 | 109 | 23 | 27 | 20 | 21 | 49 | 18 | 63 | 17 | 25 | 46 |
|  | 35 | 51 | 28 | 59 | 55 | 57 | 22 | 60 | 97 | 104 | 61 | 90 | 100 | 103 |
|  | 73 | 66 | 94 | 98 | 62 | 96 | 69 | 101 | 95 | 102 | 19 | 65 | 67 | 99 |
|  | 106 | 125 | 31 | 134 | 33 | 36 | 122 | 45 | 29 | 43 | 114 | 128 | 41 | 127 |
|  | 75 | 107 | 160 | 14 | 126 | 79 | 84 | 91 | 37 | 130 | 115 | 116 | 78 | 118 |
|  | 112 | 119 | 6 | 89 | 88 | 5 | 42 | 176 | 0 | 48 | 7 | 157 | 105 | 81 |
|  | 139 | 152 | 155 | 150 | 13 | 3 | 163 | 151 | 153 | 159 | 147 | 161 | 4 | 136 |
|  | 8 | 171 | 179 | 177 | 121 | 110 | 148 | 10 | 174 | 178 | 143 | 141 | 154 | 137 |
| 10/15 | 16 | 65 | 19 | 22 | 20 | 27 | 67 | 64 | 73 | 23 | 68 | 29 | 69 | 25 |
|  | 62 | 71 | 18 | 17 | 28 | 15 | 21 | 163 | 118 | 153 | 156 | 115 | 155 | 161 |
|  | 107 | 30 | 114 | 119 | 112 | 157 | 152 | 108 | 113 | 105 | 164 | 160 | 106 | 116 |
|  | 88 | 102 | 104 | 77 | 80 | 84 | 41 | 125 | 91 | 82 | 93 | 101 | 97 | 85 |
|  | 128 | 124 | 122 | 134 | 127 | 133 | 58 | 50 | 54 | 59 | 131 | 47 | 57 | 51 |
|  | 130 | 52 | 121 | 129 | 53 | 111 | 5 | 32 | 4 | 9 | 38 | 43 | 34 | 103 |
|  | 1 | 36 | 44 | 33 | 40 | 31 | 6 | 2 | 7 | 14 | 12 | 0 | 141 | 148 |
|  | 139 | 142 | 143 | 176 | 173 | 177 | 140 | 79 | 174 | 145 | 167 | 135 | 147 | 144 |
| 11/15 | 12 | 0 | 10 | 4 | 3 | 21 | 15 | 14 | 22 | 19 | 20 | 18 | 2 | 9 |
|  | 26 | 27 | 23 | 28 | 24 | 25 | 29 | 50 | 66 | 104 | 44 | 87 | 39 | 35 |
|  | 120 | 121 | 38 | 96 | 115 | 118 | 47 | 105 | 70 | 117 | 46 | 130 | 80 | 77 |
|  | 71 | 62 | 114 | 112 | 100 | 107 | 83 | 88 | 93 | 54 | 63 | 75 | 34 | 45 |
|  | 110 | 124 | 131 | 109 | 72 | 81 | 31 | 48 | 61 | 67 | 116 | 99 | 43 | 106 |
|  | 55 | 78 | 40 | 92 | 64 | 49 | 103 | 125 | 102 | 51 | 76 | 85 | 95 | 58 |
|  | 138 | 139 | 140 | 141 | 142 | 143 | 144 | 145 | 146 | 147 | 148 | 149 | 150 | 151 |
|  | 161 | 162 | 163 | 164 | 165 | 166 | 167 | 168 | 169 | 170 | 171 | 172 | 173 | 174 |
| 12/15 | 83 | 97 | 43 | 88 | 178 | 154 | 93 | 53 | 126 | 39 | 145 | 166 | 94 | 142 |
|  | 150 | 55 | 136 | 28 | 106 | 144 | 16 | 40 | 9 | 109 | 117 | 130 | 167 | 38 |
|  | 171 | 163 | 110 | 100 | 41 | 42 | 175 | 49 | 124 | 21 | 82 | 58 | 125 | 6 |
|  | 118 | 162 | 147 | 102 | 62 | 52 | 51 | 159 | 146 | 76 | 19 | 105 | 84 | 20 |
|  | 27 | 80 | 115 | 158 | 92 | 101 | 135 | 104 | 169 | 179 | 59 | 79 | 96 | 132 |
|  | 68 | 140 | 30 | 161 | 160 | 138 | 73 | 64 | 26 | 151 | 177 | 72 | 23 | 66 |
|  | 37 | 81 | 34 | 31 | 152 | 156 | 10 | 98 | 120 | 141 | 157 | 7 | 95 | 112 |
|  | 17 | 131 | 128 | 45 | 114 | 148 | 3 | 44 | 103 | 69 | 70 | 153 | 2 | 57 |
| 13/15 | 146 | 58 | 134 | 139 | 133 | 53 | 121 | 124 | 113 | 120 | 142 | 52 | 131 | 123 |
|  | 127 | 122 | 126 | 125 | 9 | 50 | 129 | 91 | 137 | 148 | 130 | 153 | 93 | 135 |
|  | 101 | 97 | 96 | 42 | 94 | 90 | 68 | 100 | 145 | 141 | 36 | 98 | 99 | 15 |
|  | 102 | 21 | 62 | 18 | 26 | 67 | 140 | 69 | 154 | 16 | 28 | 65 | 117 | 73 |
|  | 38 | 92 | 86 | 5 | 149 | 30 | 89 | 81 | 78 | 40 | 1 | 84 | 76 | 87 |
|  | 39 | 7 | 45 | 35 | 82 | 46 | 70 | 163 | 160 | 152 | 158 | 168 | 151 | 159 |
|  | 166 | 171 | 165 | 177 | 150 | 167 | 173 | 178 | 156 | 161 | 164 | 108 | 12 | 33 |
|  | 6 | 34 | 85 | 10 | 115 | 75 | 2 | 109 | 119 | 3 | 11 | 111 | 13 | 116 |

| Code Rate | Order of group-wise interleaving $\pi(j)$ ($0 \leq j < 180$) | | | | | | | |
|---|---|---|---|---|---|---|---|---|
|  | 14 | 15 | 16 | 17 | 18 | 19 | 20 | 21 | 22 |
|  | 37 | 38 | 39 | 40 | 41 | 42 | 43 | 44 | 45 |
|  | 60 | 61 | 62 | 63 | 64 | 65 | 66 | 67 | 68 |
|  | 83 | 84 | 85 | 86 | 87 | 88 | 89 | 90 | 91 |
|  | 106 | 107 | 108 | 109 | 110 | 111 | 112 | 113 | 114 |
|  | 129 | 130 | 131 | 132 | 133 | 134 | 135 | 136 | 137 |
|  | 152 | 153 | 154 | 155 | 156 | 157 | 158 | 159 | 160 |
|  | 175 | 176 | 177 | 178 | 179 | | | | |
| 2/15 | 127 | 37 | 84 | 159 | 142 | 6 | 61 | 63 | 86 |
|  | 40 | 44 | 140 | 28 | 117 | 52 | 87 | 59 | 118 |
|  | 156 | 49 | 157 | 10 | 110 | 164 | 22 | 24 | 177 |
|  | 113 | 121 | 43 | 66 | 176 | 111 | 136 | 126 | 112 |
|  | 85 | 14 | 132 | 23 | 131 | 46 | 73 | 45 | 82 |
|  | 4 | 79 | 50 | 89 | 19 | 175 | 18 | 120 | 34 |
|  | 51 | 161 | 115 | 160 | 107 | 123 | 155 | 145 | 67 |
|  | 91 | 174 | 7 | 173 | 108 | | | | |
| 3/15 | 145 | 124 | 75 | 27 | 62 | 92 | 23 | 6 | 36 |
|  | 52 | 83 | 60 | 177 | 125 | 0 | 159 | 55 | 76 |
|  | 139 | 117 | 84 | 42 | 176 | 153 | 151 | 88 | 58 |
|  | 32 | 31 | 98 | 170 | 173 | 123 | 114 | 59 | 179 |
|  | 128 | 110 | 9 | 54 | 172 | 131 | 10 | 140 | 105 |
|  | 5 | 96 | 112 | 102 | 39 | 142 | 68 | 160 | 45 |
|  | 47 | 73 | 16 | 69 | 7 | 13 | 3 | 67 | 38 |
|  | 80 | 19 | 4 | 152 | 165 | | | | |

TABLE 23-continued

| | | | | | | | | |
|---|---|---|---|---|---|---|---|---|
| 4/15 | 165 | 127 | 157 | 94 | 89 | 167 | 82 | 151 | 17 |
| | 43 | 59 | 20 | 83 | 38 | 11 | 176 | 133 | 139 |
| | 99 | 132 | 72 | 13 | 179 | 136 | 2 | 103 | 36 |
| | 117 | 86 | 12 | 120 | 123 | 1 | 34 | 128 | 90 |
| | 159 | 62 | 170 | 106 | 115 | 3 | 147 | 32 | 31 |
| | 81 | 63 | 171 | 64 | 24 | 18 | 19 | 26 | 8 |
| | 85 | 148 | 15 | 130 | 16 | 57 | 146 | 70 | 75 |
| | 53 | 10 | 21 | 79 | 164 | | | | |
| 5/15 | 111 | 37 | 64 | 178 | 27 | 1 | 130 | 74 | 76 |
| | 61 | 81 | 160 | 136 | 110 | 46 | 62 | 114 | 122 |
| | 56 | 92 | 157 | 24 | 96 | 44 | 100 | 102 | 41 |
| | 89 | 18 | 132 | 161 | 0 | 20 | 47 | 152 | 139 |
| | 49 | 48 | 170 | 11 | 26 | 14 | 25 | 107 | 29 |
| | 120 | 30 | 51 | 106 | 33 | 28 | 112 | 156 | 174 |
| | 70 | 124 | 135 | 179 | 57 | 95 | 16 | 151 | 21 |
| | 42 | 125 | 94 | 169 | 34 | | | | |
| 6/15 | 74 | 82 | 131 | 172 | 37 | 52 | 39 | 176 | 93 |
| | 67 | 85 | 139 | 4 | 179 | 35 | 54 | 86 | 148 |
| | 44 | 132 | 48 | 173 | 158 | 122 | 9 | 51 | 88 |
| | 130 | 34 | 21 | 137 | 112 | 154 | 124 | 45 | 5 |
| | 11 | 90 | 156 | 13 | 75 | 128 | 12 | 102 | 19 |
| | 171 | 81 | 159 | 50 | 63 | 15 | 94 | 165 | 76 |
| | 145 | 110 | 138 | 121 | 26 | 71 | 92 | 118 | 105 |
| | 60 | 133 | 79 | 6 | 155 | | | | |
| 7/15 | 24 | 104 | 99 | 26 | 94 | 25 | 20 | 21 | 18 |
| | 31 | 79 | 34 | 35 | 82 | 30 | 44 | 87 | 89 |
| | 155 | 141 | 142 | 139 | 146 | 135 | 143 | 152 | 164 |
| | 161 | 145 | 162 | 150 | 138 | 148 | 159 | 175 | 86 |
| | 71 | 62 | 172 | 179 | 174 | 61 | 72 | 168 | 171 |
| | 45 | 113 | 46 | 114 | 48 | 118 | 107 | 117 | 57 |
| | 8 | 2 | 134 | 6 | 124 | 133 | 128 | 9 | 127 |
| | 126 | 122 | 121 | 4 | 0 | | | | |
| 8/15 | 32 | 27 | 169 | 155 | 48 | 85 | 22 | 26 | 101 |
| | 69 | 33 | 102 | 127 | 160 | 81 | 43 | 162 | 103 |
| | 80 | 93 | 121 | 21 | 0 | 152 | 37 | 38 | 108 |
| | 177 | 36 | 6 | 24 | 45 | 146 | 97 | 57 | 18 |
| | 19 | 137 | 60 | 66 | 159 | 141 | 13 | 111 | 82 |
| | 5 | 164 | 105 | 44 | 17 | 140 | 1 | 106 | 115 |
| | 175 | 68 | 149 | 96 | 50 | 65 | 114 | 134 | 10 |
| | 14 | 35 | 179 | 167 | 128 | | | | |
| 9/15 | 52 | 24 | 16 | 30 | 111 | 56 | 47 | 26 | 58 |
| | 64 | 93 | 15 | 71 | 113 | 74 | 68 | 92 | 72 |
| | 133 | 131 | 32 | 39 | 54 | 129 | 38 | 44 | 1 |
| | 149 | 132 | 123 | 156 | 34 | 40 | 124 | 11 | 80 |
| | 53 | 76 | 83 | 117 | 85 | 82 | 86 | 108 | 135 |
| | 12 | 120 | 140 | 9 | 2 | 164 | 162 | 77 | 158 |
| | 87 | 172 | 173 | 142 | 144 | 146 | 145 | 169 | 138 |
| | 167 | 168 | 170 | 165 | 166 | | | | |
| 10/15 | 72 | 61 | 63 | 24 | 74 | 66 | 26 | 60 | 70 |
| | 162 | 154 | 117 | 39 | 150 | 110 | 158 | 151 | 46 |
| | 92 | 78 | 75 | 99 | 87 | 94 | 90 | 98 | 100 |
| | 95 | 89 | 83 | 81 | 136 | 86 | 96 | 56 | 55 |
| | 48 | 76 | 120 | 159 | 123 | 45 | 126 | 49 | 132 |
| | 13 | 37 | 3 | 42 | 35 | 8 | 10 | 11 | 109 |
| | 178 | 168 | 166 | 137 | 171 | 138 | 169 | 175 | 149 |
| | 172 | 179 | 146 | 170 | 165 | | | | |
| 11/15 | 13 | 6 | 7 | 1 | 16 | 5 | 11 | 8 | 17 |
| | 68 | 37 | 101 | 41 | 73 | 74 | 52 | 57 | 94 |
| | 108 | 84 | 65 | 69 | 59 | 42 | 32 | 128 | 129 |
| | 82 | 30 | 60 | 119 | 86 | 56 | 111 | 122 | 127 |
| | 126 | 79 | 36 | 53 | 97 | 89 | 113 | 123 | 90 |
| | 91 | 98 | 33 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 12/15 | 54 | 29 | 173 | 13 | 47 | 0 | 90 | 133 | 36 |
| | 143 | 46 | 127 | 176 | 174 | 77 | 86 | 91 | 32 |
| | 87 | 15 | 113 | 71 | 99 | 168 | 61 | 75 | 134 |
| | 1 | 33 | 65 | 78 | 85 | 164 | 149 | 35 | 129 |
| | 172 | 12 | 74 | 22 | 56 | 111 | 165 | 5 | 11 |
| | 48 | 119 | 60 | 67 | 18 | 89 | 50 | 122 | 24 |
| | 108 | 116 | 4 | 155 | 139 | 8 | 63 | 123 | 137 |
| | 25 | 121 | 107 | 170 | 14 | | | | |
| 13/15 | 56 | 51 | 4 | 49 | 132 | 54 | 55 | 47 | 59 |
| | 143 | 43 | 136 | 104 | 95 | 48 | 77 | 147 | 103 |
| | 63 | 25 | 66 | 72 | 128 | 61 | 44 | 27 | 138 |
| | 110 | 71 | 29 | 19 | 74 | 24 | 60 | 144 | 79 |
| | 80 | 83 | 37 | 32 | 20 | 88 | 41 | 31 | 22 |

TABLE 23-continued

| | | | | | | | | |
|---|---|---|---|---|---|---|---|---|
| 170 | 155 | 174 | 179 | 157 | 162 | 175 | 169 | 14 |
| 118 | 23 | 106 | 172 | 0 | 114 | 17 | 176 | 8 |
| 57 | 107 | 112 | 64 | 105 | | | | |

Further, the following Table 24 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 64800 and when being modulated by the 256-QAM, shows the group interleaving pattern used to define the π(j).

TABLE 24

| Code Rate | Order of group-wise interleaving π(j) (0 ≤ j < 180) | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 2/15 | 112 | 151 | 118 | 121 | 43 | 157 | 64 | 142 | 78 | 8 | 94 | 163 | 105 | 139 |
| | 178 | 6 | 176 | 35 | 135 | 65 | 32 | 158 | 153 | 59 | 117 | 55 | 123 | 13 |
| | 93 | 45 | 49 | 122 | 88 | 140 | 108 | 131 | 124 | 89 | 120 | 148 | 54 | 156 |
| | 155 | 171 | 28 | 27 | 73 | 15 | 33 | 70 | 14 | 141 | 126 | 113 | 7 | 19 |
| | 173 | 149 | 85 | 167 | 109 | 51 | 101 | 146 | 159 | 63 | 177 | 76 | 44 | 50 |
| | 150 | 128 | 134 | 26 | 130 | 164 | 66 | 138 | 147 | 172 | 53 | 160 | 110 | 91 |
| | 162 | 18 | 1 | 17 | 34 | 16 | 39 | 29 | 175 | 60 | 37 | 57 | 82 | 165 |
| | 22 | 62 | 81 | 102 | 30 | 48 | 84 | 127 | 154 | 161 | 168 | 103 | 98 | 10 |
| 3/15 | 136 | 24 | 0 | 116 | 102 | 95 | 50 | 6 | 28 | 66 | 5 | 20 | 31 | 177 |
| | 15 | 38 | 126 | 174 | 98 | 74 | 43 | 156 | 171 | 40 | 10 | 13 | 176 | 46 |
| | 4 | 57 | 133 | 70 | 76 | 68 | 80 | 91 | 79 | 49 | 117 | 157 | 88 | 168 |
| | 107 | 138 | 161 | 58 | 175 | 108 | 21 | 128 | 172 | 122 | 63 | 154 | 67 | 27 |
| | 111 | 36 | 160 | 139 | 14 | 32 | 12 | 131 | 134 | 164 | 81 | 166 | 179 | 42 |
| | 163 | 60 | 153 | 100 | 19 | 101 | 140 | 145 | 84 | 118 | 110 | 130 | 51 | 26 |
| | 125 | 123 | 170 | 146 | 121 | 167 | 37 | 92 | 112 | 65 | 135 | 82 | 132 | 106 |
| | 119 | 120 | 93 | 115 | 45 | 22 | 144 | 165 | 56 | 137 | 99 | 143 | 33 | 113 |
| 4/15 | 13 | 45 | 46 | 63 | 131 | 94 | 12 | 74 | 121 | 21 | 0 | 14 | 2 | 83 |
| | 128 | 29 | 52 | 78 | 17 | 148 | 175 | 158 | 24 | 27 | 90 | 166 | 150 | 144 |
| | 98 | 40 | 70 | 100 | 61 | 42 | 115 | 143 | 62 | 88 | 116 | 123 | 97 | 39 |
| | 130 | 48 | 154 | 132 | 112 | 103 | 153 | 172 | 84 | 163 | 6 | 109 | 155 | 4 |
| | 119 | 18 | 110 | 129 | 55 | 151 | 64 | 50 | 3 | 138 | 91 | 77 | 58 | 59 |
| | 176 | 133 | 72 | 80 | 165 | 67 | 179 | 134 | 34 | 99 | 47 | 105 | 20 | 136 |
| | 86 | 26 | 164 | 160 | 174 | 140 | 145 | 56 | 60 | 106 | 9 | 82 | 111 | 15 |
| | 65 | 126 | 43 | 68 | 168 | 113 | 104 | 107 | 170 | 53 | 85 | 149 | 30 | 108 |
| 5/15 | 39 | 43 | 55 | 37 | 41 | 60 | 62 | 33 | 34 | 36 | 58 | 63 | 38 | 42 |
| | 50 | 51 | 124 | 121 | 49 | 48 | 54 | 117 | 44 | 47 | 118 | 116 | 115 | 123 |
| | 133 | 99 | 96 | 134 | 129 | 132 | 92 | 101 | 91 | 100 | 131 | 98 | 94 | 97 |
| | 83 | 89 | 104 | 105 | 112 | 82 | 81 | 102 | 85 | 107 | 108 | 110 | 106 | 88 |
| | 30 | 139 | 146 | 145 | 136 | 141 | 32 | 26 | 138 | 24 | 28 | 144 | 31 | 29 |
| | 166 | 160 | 150 | 165 | 156 | 158 | 167 | 162 | 152 | 147 | 164 | 153 | 155 | 168 |
| | 16 | 9 | 4 | 3 | 13 | 1 | 8 | 17 | 19 | 5 | 10 | 15 | 11 | 21 |
| | 77 | 67 | 175 | 178 | 173 | 72 | 171 | 169 | 70 | 73 | 170 | 68 | 78 | 79 |
| 6/15 | 99 | 61 | 65 | 35 | 23 | 26 | 58 | 155 | 2 | 51 | 41 | 113 | 25 | 7 |
| | 0 | 98 | 93 | 16 | 59 | 55 | 167 | 96 | 21 | 30 | 39 | 33 | 27 | 102 |
| | 151 | 43 | 91 | 49 | 40 | 11 | 77 | 17 | 37 | 48 | 50 | 34 | 67 | 119 |
| | 90 | 5 | 56 | 103 | 52 | 86 | 45 | 64 | 140 | 84 | 92 | 63 | 87 | 148 |
| | 169 | 156 | 159 | 116 | 122 | 126 | 164 | 14 | 28 | 115 | 101 | 42 | 89 | 130 |
| | 136 | 83 | 142 | 6 | 12 | 78 | 60 | 105 | 147 | 18 | 170 | 81 | 104 | 146 |
| | 127 | 133 | 131 | 3 | 8 | 82 | 123 | 74 | 66 | 143 | 158 | 161 | 124 | 138 |
| | 1 | 29 | 168 | 118 | 134 | 145 | 10 | 129 | 121 | 171 | 75 | 157 | 125 | 163 |
| 7/15 | 24 | 32 | 23 | 79 | 84 | 29 | 85 | 28 | 26 | 80 | 82 | 25 | 77 | 87 |
| | 18 | 11 | 154 | 148 | 156 | 12 | 147 | 15 | 19 | 13 | 151 | 21 | 155 | 20 |
| | 4 | 3 | 113 | 7 | 117 | 2 | 112 | 6 | 121 | 9 | 119 | 5 | 111 | 115 |
| | 95 | 40 | 89 | 36 | 90 | 35 | 92 | 41 | 39 | 38 | 91 | 88 | 33 | 97 |
| | 164 | 132 | 122 | 131 | 128 | 129 | 127 | 159 | 167 | 166 | 165 | 161 | 123 | 130 |
| | 179 | 66 | 70 | 176 | 174 | 71 | 69 | 178 | 169 | 177 | 72 | 68 | 170 | 76 |
| | 107 | 144 | 106 | 99 | 139 | 142 | 101 | 146 | 108 | 102 | 100 | 133 | 134 | 136 |
| | 55 | 59 | 62 | 63 | 52 | 56 | 50 | 47 | 57 | 48 | 44 | 46 | 54 | 45 |
| 8/15 | 85 | 78 | 82 | 46 | 66 | 84 | 53 | 47 | 54 | 80 | 88 | 70 | 83 | 45 |
| | 160 | 1 | 10 | 89 | 157 | 2 | 4 | 163 | 164 | 8 | 9 | 165 | 159 | 162 |
| | 59 | 56 | 137 | 32 | 60 | 26 | 31 | 65 | 22 | 51 | 30 | 27 | 132 | 25 |

TABLE 24-continued

|  |  |  |  |  |  |  |  |  |  |  |  |  |  |
|---|---|---|---|---|---|---|---|---|---|---|---|---|---|
|  | 67 | 130 | 73 | 93 | 75 | 24 | 128 | 131 | 69 | 126 | 74 | 124 | 68 | 35 |
|  | 104 | 90 | 91 | 109 | 106 | 12 | 158 | 102 | 100 | 97 | 94 | 177 | 34 | 101 |
|  | 38 | 71 | 41 | 42 | 142 | 33 | 140 | 138 | 122 | 133 | 64 | 40 | 150 | 136 |
|  | 114 | 50 | 170 | 167 | 178 | 173 | 171 | 120 | 172 | 174 | 179 | 110 | 112 | 118 |
|  | 153 | 62 | 155 | 145 | 147 | 103 | 16 | 149 | 15 | 20 | 18 | 144 | 17 | 152 |
| 9/15 | 58 | 96 | 22 | 97 | 169 | 164 | 127 | 168 | 70 | 104 | 95 | 140 | 159 | 123 |
|  | 134 | 32 | 89 | 15 | 92 | 126 | 54 | 77 | 163 | 26 | 27 | 91 | 56 | 28 |
|  | 79 | 121 | 55 | 119 | 93 | 34 | 14 | 105 | 137 | 141 | 48 | 21 | 132 | 60 |
|  | 116 | 3 | 111 | 41 | 49 | 87 | 24 | 166 | 150 | 173 | 10 | 53 | 46 | 47 |
|  | 153 | 76 | 72 | 80 | 38 | 13 | 67 | 64 | 115 | 18 | 158 | 75 | 51 | 36 |
|  | 71 | 120 | 170 | 1 | 157 | 65 | 98 | 11 | 90 | 122 | 175 | 6 | 174 | 44 |
|  | 43 | 103 | 139 | 146 | 8 | 145 | 7 | 42 | 40 | 88 | 151 | 78 | 161 | 114 |
|  | 33 | 85 | 84 | 16 | 73 | 143 | 154 | 68 | 62 | 50 | 19 | 172 | 131 | 133 |
| 10/15 | 45 | 44 | 14 | 12 | 13 | 52 | 11 | 46 | 53 | 48 | 18 | 16 | 49 | 21 |
|  | 23 | 97 | 32 | 30 | 24 | 151 | 92 | 88 | 93 | 95 | 98 | 25 | 89 | 29 |
|  | 142 | 140 | 144 | 39 | 71 | 38 | 76 | 135 | 69 | 141 | 40 | 75 | 106 | 134 |
|  | 42 | 57 | 64 | 109 | 132 | 60 | 161 | 63 | 61 | 65 | 43 | 34 | 62 | 36 |
|  | 113 | 80 | 162 | 81 | 103 | 77 | 83 | 86 | 87 | 82 | 160 | 119 | 68 | 165 |
|  | 112 | 79 | 120 | 139 | 110 | 111 | 116 | 108 | 146 | 155 | 145 | 150 | 115 | 154 |
|  | 171 | 100 | 99 | 107 | 170 | 172 | 101 | 105 | 175 | 72 | 8 | 114 | 102 | 164 |
|  | 1 | 125 | 121 | 7 | 130 | 5 | 128 | 124 | 10 | 9 | 0 | 123 | 131 | 122 |
| 11/15 | 27 | 60 | 65 | 22 | 23 | 24 | 31 | 61 | 62 | 28 | 32 | 58 | 63 | 26 |
|  | 73 | 66 | 20 | 16 | 71 | 72 | 19 | 74 | 15 | 75 | 18 | 11 | 17 | 21 |
|  | 52 | 39 | 45 | 40 | 33 | 49 | 43 | 34 | 44 | 42 | 48 | 36 | 50 | 46 |
|  | 106 | 113 | 107 | 101 | 111 | 116 | 105 | 118 | 100 | 108 | 102 | 120 | 114 | 103 |
|  | 154 | 136 | 134 | 135 | 133 | 146 | 132 | 141 | 151 | 137 | 153 | 152 | 145 | 144 |
|  | 94 | 80 | 92 | 89 | 84 | 96 | 87 | 79 | 95 | 97 | 91 | 82 | 85 | 78 |
|  | 175 | 130 | 129 | 174 | 169 | 131 | 177 | 122 | 121 | 178 | 125 | 123 | 179 | 172 |
|  | 6 | 8 | 4 | 159 | 157 | 168 | 1 | 0 | 3 | 166 | 162 | 5 | 164 | 160 |
| 12/15 | 51 | 6 | 75 | 108 | 93 | 47 | 168 | 15 | 122 | 14 | 42 | 113 | 136 | 69 |
|  | 11 | 111 | 21 | 107 | 97 | 62 | 31 | 165 | 176 | 95 | 71 | 30 | 38 | 54 |
|  | 162 | 156 | 119 | 2 | 137 | 86 | 81 | 59 | 164 | 144 | 130 | 0 | 114 | 33 |
|  | 79 | 157 | 172 | 57 | 106 | 87 | 32 | 76 | 52 | 160 | 178 | 65 | 7 | 53 |
|  | 84 | 60 | 171 | 22 | 61 | 23 | 101 | 67 | 96 | 92 | 167 | 179 | 126 | 35 |
|  | 80 | 154 | 110 | 151 | 163 | 143 | 17 | 99 | 127 | 98 | 27 | 153 | 174 | 70 |
|  | 117 | 34 | 142 | 43 | 155 | 19 | 39 | 112 | 64 | 89 | 46 | 77 | 170 | 10 |
|  | 66 | 135 | 49 | 131 | 63 | 166 | 12 | 116 | 5 | 138 | 55 | 72 | 41 | 149 |
| 13/15 | 59 | 58 | 57 | 62 | 55 | 61 | 148 | 63 | 145 | 64 | 144 | 146 | 147 | 60 |
|  | 16 | 82 | 21 | 79 | 11 | 19 | 77 | 14 | 86 | 84 | 17 | 78 | 83 | 87 |
|  | 30 | 102 | 24 | 104 | 23 | 25 | 26 | 105 | 22 | 27 | 103 | 107 | 99 | 101 |
|  | 131 | 130 | 122 | 111 | 117 | 127 | 118 | 113 | 114 | 115 | 121 | 124 | 112 | 125 |
|  | 73 | 45 | 76 | 75 | 46 | 50 | 54 | 51 | 66 | 48 | 71 | 70 | 53 | 72 |
|  | 140 | 135 | 94 | 138 | 137 | 98 | 139 | 97 | 93 | 136 | 96 | 90 | 88 | 89 |
|  | 169 | 155 | 158 | 175 | 172 | 156 | 168 | 174 | 154 | 170 | 173 | 165 | 164 | 162 |
|  | 5 | 38 | 7 | 9 | 37 | 34 | 33 | 0 | 1 | 6 | 8 | 40 | 36 | 41 |

| Code Rate | Order of group-wise interleaving $\pi(j)$ $(0 \leq j < 180)$ | | | | | | | | |
|---|---|---|---|---|---|---|---|---|---|
|  | 14 | 15 | 16 | 17 | 18 | 19 | 20 | 21 | 22 |
|  | 37 | 38 | 39 | 40 | 41 | 42 | 43 | 44 | 45 |
|  | 60 | 61 | 62 | 63 | 64 | 65 | 66 | 67 | 68 |
|  | 83 | 84 | 85 | 86 | 87 | 88 | 89 | 90 | 91 |
|  | 106 | 107 | 108 | 109 | 110 | 111 | 112 | 113 | 114 |
|  | 129 | 130 | 131 | 132 | 133 | 134 | 135 | 136 | 137 |
|  | 152 | 153 | 154 | 155 | 156 | 157 | 158 | 159 | 160 |
|  | 175 | 176 | 177 | 178 | 179 | | | | |
| 2/15 | 40 | 125 | 104 | 47 | 24 | 115 | 36 | 179 | 87 |
|  | 144 | 77 | 72 | 80 | 68 | 38 | 25 | 5 | 92 |
|  | 145 | 75 | 46 | 52 | 114 | 79 | 2 | 58 | 23 |
|  | 119 | 20 | 9 | 133 | 143 | 3 | 166 | 67 | 111 |
|  | 74 | 129 | 100 | 11 | 132 | 86 | 69 | 116 | 169 |
|  | 152 | 41 | 97 | 170 | 99 | 42 | 174 | 137 | 61 |
|  | 31 | 107 | 136 | 4 | 83 | 90 | 96 | 56 | 21 |
|  | 95 | 0 | 106 | 12 | 71 | | | | |
| 3/15 | 41 | 152 | 85 | 109 | 90 | 178 | 64 | 73 | 52 |
|  | 11 | 34 | 17 | 89 | 155 | 47 | 29 | 94 | 114 |
|  | 129 | 78 | 141 | 151 | 3 | 105 | 86 | 124 | 142 |
|  | 35 | 148 | 25 | 53 | 55 | 77 | 158 | 18 | 150 |
|  | 8 | 159 | 173 | 149 | 16 | 97 | 96 | 147 | 61 |
|  | 30 | 75 | 23 | 2 | 44 | 71 | 72 | 169 | 7 |
|  | 83 | 59 | 69 | 103 | 1 | 127 | 9 | 48 | 162 |
|  | 87 | 104 | 62 | 54 | 39 | | | | |
| 4/15 | 173 | 157 | 137 | 127 | 124 | 122 | 147 | 16 | 156 |
|  | 73 | 125 | 118 | 1 | 22 | 8 | 76 | 54 | 38 |
|  | 146 | 159 | 178 | 177 | 35 | 69 | 120 | 23 | 101 |
|  | 95 | 114 | 169 | 117 | 162 | 51 | 92 | 19 | 66 |
|  | 79 | 141 | 96 | 102 | 37 | 36 | 11 | 5 | 28 |

TABLE 24-continued

|      |     |     |     |     |     |     |     |     |     |
|------|-----|-----|-----|-----|-----|-----|-----|-----|-----|
|      |     | 44  | 93  | 161 | 167 | 32  | 31  | 89  | 25  | 87  |
|      |     | 7   | 139 | 135 | 10  | 142 | 81  | 49  | 33  | 75  |
|      |     | 152 | 71  | 171 | 57  | 41  |     |     |     |     |
| 5/15 |     | 64  | 61  | 59  | 66  | 57  | 56  | 40  | 35  | 45  |
|      |     | 46  | 53  | 119 | 120 | 52  | 122 | 114 | 128 | 130 |
|      |     | 127 | 126 | 125 | 95  | 93  | 135 | 84  | 87  | 90  |
|      |     | 111 | 80  | 103 | 86  | 109 | 143 | 137 | 140 | 23  |
|      |     | 142 | 27  | 25  | 22  | 148 | 151 | 149 | 159 | 161 |
|      |     | 154 | 163 | 157 | 2   | 7   | 6   | 0   | 18  | 14  |
|      |     | 20  | 12  | 75  | 71  | 177 | 176 | 172 | 179 | 174 |
|      |     | 69  | 65  | 74  | 76  | 113 |     |     |     |     |
| 6/15 |     | 68  | 24  | 38  | 32  | 141 | 70  | 44  | 20  | 100 |
|      |     | 4   | 57  | 22  | 9   | 106 | 13  | 46  | 15  | 36  |
|      |     | 95  | 69  | 47  | 31  | 85  | 97  | 107 | 71  | 19  |
|      |     | 53  | 79  | 132 | 88  | 94  | 54  | 62  | 112 | 154 |
|      |     | 162 | 166 | 135 | 139 | 76  | 137 | 109 | 73  | 175 |
|      |     | 128 | 144 | 172 | 153 | 108 | 152 | 150 | 120 | 110 |
|      |     | 173 | 72  | 174 | 114 | 117 | 165 | 149 | 80  | 111 |
|      |     | 160 | 176 | 177 | 178 | 179 |     |     |     |     |
| 7/15 |     | 81  | 27  | 86  | 31  | 78  | 83  | 22  | 30  | 157 |
|      |     | 149 | 16  | 14  | 150 | 152 | 17  | 153 | 0   | 114 |
|      |     | 110 | 8   | 118 | 1   | 116 | 10  | 43  | 42  | 96  |
|      |     | 93  | 94  | 37  | 34  | 98  | 126 | 162 | 163 | 168 |
|      |     | 158 | 160 | 125 | 124 | 172 | 67  | 75  | 73  | 173 |
|      |     | 171 | 175 | 74  | 135 | 104 | 109 | 103 | 143 | 138 |
|      |     | 105 | 137 | 65  | 61  | 58  | 60  | 49  | 53  | 64  |
|      |     | 51  | 120 | 141 | 140 | 145 |     |     |     |     |
| 8/15 |     | 52  | 86  | 0   | 44  | 119 | 48  | 156 | 87  | 3   |
|      |     | 77  | 125 | 7   | 5   | 81  | 166 | 6   | 148 | 61  |
|      |     | 63  | 55  | 29  | 57  | 23  | 58  | 161 | 36  | 72  |
|      |     | 28  | 76  | 49  | 129 | 127 | 96  | 21  | 43  | 108 |
|      |     | 107 | 92  | 79  | 98  | 99  | 141 | 135 | 134 | 143 |
|      |     | 95  | 37  | 123 | 154 | 121 | 168 | 111 | 113 | 117 |
|      |     | 175 | 39  | 13  | 115 | 139 | 105 | 11  | 146 | 19  |
|      |     | 14  | 116 | 169 | 176 | 151 |     |     |     |     |
| 9/15 |     | 82  | 171 | 23  | 106 | 101 | 45  | 147 | 99  | 167 |
|      |     | 136 | 110 | 138 | 63  | 0   | 25  | 30  | 130 | 81  |
|      |     | 162 | 128 | 152 | 160 | 35  | 4   | 69  | 107 | 144 |
|      |     | 52  | 108 | 155 | 148 | 149 | 20  | 100 | 59  | 94  |
|      |     | 124 | 5   | 135 | 142 | 117 | 165 | 61  | 57  | 17  |
|      |     | 102 | 31  | 66  | 112 | 83  | 12  | 129 | 29  | 9   |
|      |     | 2   | 39  | 37  | 86  | 156 | 109 | 74  | 125 | 113 |
|      |     | 118 | 176 | 177 | 178 | 179 |     |     |     |     |
| 10/15 |    | 17  | 15  | 58  | 54  | 47  | 50  | 51  | 19  | 31  |
|      |     | 28  | 91  | 26  | 27  | 94  | 90  | 96  | 67  | 73  |
|      |     | 74  | 137 | 22  | 66  | 70  | 156 | 35  | 148 | 37  |
|      |     | 56  | 20  | 33  | 138 | 55  | 159 | 163 | 143 | 167 |
|      |     | 168 | 85  | 84  | 78  | 157 | 118 | 149 | 166 | 147 |
|      |     | 59  | 117 | 158 | 177 | 176 | 179 | 41  | 173 | 104 |
|      |     | 178 | 169 | 2   | 4   | 3   | 126 | 6   | 174 | 127 |
|      |     | 129 | 133 | 152 | 136 | 153 |     |     |     |     |
| 11/15 |    | 25  | 55  | 30  | 57  | 56  | 64  | 29  | 59  | 68  |
|      |     | 14  | 13  | 76  | 12  | 70  | 69  | 67  | 35  | 47  |
|      |     | 37  | 51  | 53  | 54  | 38  | 41  | 117 | 115 | 112 |
|      |     | 99  | 119 | 110 | 109 | 104 | 138 | 155 | 150 | 147 |
|      |     | 139 | 148 | 143 | 149 | 83  | 81  | 77  | 90  | 86  |
|      |     | 93  | 88  | 98  | 127 | 170 | 171 | 126 | 173 | 128 |
|      |     | 124 | 176 | 10  | 9   | 161 | 165 | 158 | 163 | 7   |
|      |     | 2   | 167 | 156 | 140 | 142 |     |     |     |     |
| 12/15 |    | 147 | 159 | 91  | 3   | 129 | 58  | 68  | 125 | 161 |
|      |     | 83  | 175 | 152 | 100 | 134 | 45  | 124 | 40  | 36  |
|      |     | 103 | 90  | 158 | 148 | 78  | 140 | 37  | 74  | 121 |
|      |     | 29  | 44  | 133 | 150 | 24  | 26  | 118 | 85  | 128 |
|      |     | 141 | 104 | 123 | 139 | 145 | 4   | 105 | 20  | 120 |
|      |     | 50  | 88  | 56  | 82  | 73  | 9   | 173 | 132 | 48  |
|      |     | 102 | 13  | 28  | 94  | 169 | 109 | 146 | 177 | 115 |
|      |     | 16  | 1   | 8   | 18  | 25  |     |     |     |     |
| 13/15 |    | 65  | 150 | 149 | 153 | 143 | 151 | 152 | 56  | 85  |
|      |     | 20  | 80  | 13  | 12  | 81  | 15  | 18  | 108 | 106 |
|      |     | 28  | 29  | 31  | 109 | 100 | 32  | 128 | 126 | 123 |
|      |     | 116 | 119 | 110 | 129 | 120 | 49  | 74  | 68  | 52  |
|      |     | 47  | 44  | 67  | 69  | 91  | 141 | 95  | 142 | 92  |
|      |     | 134 | 133 | 132 | 163 | 167 | 160 | 157 | 179 | 159 |
|      |     | 166 | 161 | 3   | 35  | 42  | 10  | 2   | 43  | 39  |
|      |     | 4   | 177 | 176 | 178 | 171 |     |     |     |     |

Further, the following Table 25 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 64800 and when being modulated by the 1024-QAM, shows the group interleaving pattern used to define the π(j).

TABLE 25

| Code Rate | Order of group-wise interleaving π(j) (0 ≤ j < 180) | | | | | | | | | | | | |
|---|---|---|---|---|---|---|---|---|---|---|---|---|---|
|  | 0 | 1 | 2 | 3 | 4 | 5 | 6 | 7 | 8 | 9 | 10 | 11 | 12 | 13 |
|  | 23 | 24 | 25 | 26 | 27 | 28 | 29 | 30 | 31 | 32 | 33 | 34 | 35 | 36 |
|  | 46 | 47 | 48 | 49 | 50 | 51 | 52 | 53 | 54 | 55 | 56 | 57 | 58 | 59 |
|  | 69 | 70 | 71 | 72 | 73 | 74 | 75 | 76 | 77 | 78 | 79 | 80 | 81 | 82 |
|  | 92 | 93 | 94 | 95 | 96 | 97 | 98 | 99 | 100 | 101 | 102 | 103 | 104 | 105 |
|  | 115 | 116 | 117 | 118 | 119 | 120 | 121 | 122 | 123 | 124 | 125 | 126 | 127 | 128 |
|  | 138 | 139 | 140 | 141 | 142 | 143 | 144 | 145 | 146 | 147 | 148 | 149 | 150 | 151 |
|  | 161 | 162 | 163 | 164 | 165 | 166 | 167 | 168 | 169 | 170 | 171 | 172 | 173 | 174 |
| 2/15 | 157 | 159 | 7 | 63 | 127 | 102 | 41 | 171 | 93 | 65 | 25 | 174 | 145 | 117 |
|  | 86 | 92 | 68 | 178 | 78 | 13 | 130 | 160 | 26 | 67 | 121 | 76 | 82 | 113 |
|  | 140 | 106 | 88 | 168 | 138 | 10 | 50 | 28 | 94 | 119 | 75 | 123 | 96 | 33 |
|  | 131 | 35 | 152 | 72 | 150 | 3 | 31 | 109 | 17 | 133 | 22 | 29 | 57 | 79 |
|  | 74 | 177 | 101 | 105 | 125 | 175 | 144 | 56 | 15 | 83 | 40 | 43 | 137 | 103 |
|  | 151 | 116 | 9 | 97 | 95 | 66 | 169 | 42 | 27 | 73 | 124 | 34 | 165 | 23 |
|  | 14 | 85 | 49 | 6 | 163 | 128 | 91 | 8 | 176 | 12 | 98 | 139 | 126 | 172 |
|  | 62 | 55 | 118 | 47 | 90 | 156 | 77 | 134 | 51 | 147 | 173 | 143 | 114 | 1 |
| 3/15 | 113 | 4 | 122 | 51 | 108 | 104 | 98 | 154 | 140 | 1 | 153 | 31 | 7 | 89 |
|  | 101 | 125 | 172 | 118 | 91 | 94 | 142 | 8 | 68 | 25 | 160 | 109 | 112 | 84 |
|  | 78 | 135 | 9 | 171 | 115 | 126 | 162 | 87 | 174 | 133 | 0 | 152 | 81 | 48 |
|  | 177 | 69 | 24 | 26 | 55 | 164 | 75 | 123 | 88 | 11 | 66 | 151 | 100 | 124 |
|  | 32 | 37 | 16 | 86 | 34 | 60 | 139 | 79 | 18 | 21 | 17 | 169 | 121 | 63 |
|  | 22 | 96 | 149 | 129 | 76 | 42 | 143 | 56 | 83 | 80 | 54 | 175 | 147 | 20 |
|  | 117 | 97 | 179 | 166 | 39 | 107 | 163 | 155 | 30 | 116 | 128 | 36 | 130 | 65 |
|  | 53 | 131 | 33 | 157 | 178 | 28 | 3 | 119 | 146 | 6 | 41 | 132 | 114 | 90 |
| 4/15 | 114 | 117 | 94 | 26 | 63 | 179 | 96 | 61 | 58 | 77 | 133 | 137 | 21 | 151 |
|  | 69 | 98 | 127 | 128 | 85 | 90 | 122 | 73 | 22 | 126 | 174 | 40 | 13 | 56 |
|  | 64 | 14 | 43 | 28 | 139 | 51 | 27 | 159 | 9 | 129 | 153 | 71 | 72 | 135 |
|  | 100 | 5 | 110 | 34 | 170 | 155 | 141 | 12 | 163 | 112 | 83 | 177 | 6 | 113 |
|  | 142 | 164 | 147 | 89 | 41 | 118 | 60 | 131 | 66 | 16 | 166 | 80 | 67 | 121 |
|  | 50 | 99 | 18 | 103 | 157 | 24 | 130 | 106 | 3 | 48 | 10 | 25 | 36 | 87 |
|  | 158 | 70 | 49 | 169 | 84 | 101 | 119 | 104 | 92 | 78 | 35 | 44 | 45 | 2 |
|  | 20 | 175 | 125 | 54 | 86 | 134 | 97 | 176 | 107 | 81 | 140 | 0 | 111 | 138 |
| 5/15 | 128 | 149 | 62 | 46 | 129 | 134 | 87 | 53 | 57 | 86 | 177 | 58 | 133 | 131 |
|  | 55 | 141 | 7 | 13 | 78 | 73 | 105 | 0 | 70 | 80 | 74 | 45 | 171 | 162 |
|  | 151 | 65 | 148 | 56 | 14 | 152 | 164 | 147 | 8 | 9 | 50 | 52 | 88 | 132 |
|  | 51 | 16 | 90 | 77 | 119 | 174 | 47 | 101 | 123 | 84 | 170 | 121 | 166 | 163 |
|  | 54 | 97 | 139 | 136 | 98 | 138 | 155 | 95 | 23 | 135 | 60 | 93 | 143 | 140 |
|  | 116 | 175 | 125 | 108 | 146 | 109 | 68 | 115 | 36 | 22 | 3 | 44 | 124 | 40 |
|  | 83 | 127 | 178 | 42 | 28 | 173 | 176 | 104 | 156 | 153 | 96 | 159 | 20 | 161 |
|  | 160 | 107 | 41 | 92 | 145 | 32 | 31 | 85 | 120 | 35 | 30 | 157 | 34 | 27 |
| 6/15 | 66 | 59 | 22 | 15 | 106 | 97 | 74 | 88 | 132 | 134 | 21 | 14 | 31 | 37 |
|  | 148 | 76 | 143 | 166 | 93 | 174 | 95 | 55 | 42 | 38 | 9 | 131 | 81 | 7 |
|  | 5 | 94 | 168 | 164 | 24 | 56 | 19 | 45 | 138 | 96 | 119 | 140 | 79 | 154 |
|  | 120 | 12 | 43 | 18 | 152 | 130 | 78 | 144 | 6 | 118 | 110 | 70 | 64 | 4 |
|  | 41 | 49 | 167 | 86 | 90 | 157 | 147 | 114 | 47 | 67 | 25 | 27 | 117 | 98 |
|  | 16 | 156 | 85 | 160 | 72 | 145 | 68 | 136 | 60 | 113 | 162 | 100 | 141 | 163 |
|  | 115 | 171 | 0 | 39 | 36 | 48 | 92 | 111 | 83 | 146 | 89 | 176 | 57 | 52 |
|  | 69 | 126 | 28 | 124 | 172 | 159 | 73 | 102 | 116 | 71 | 1 | 177 | 34 | 121 |
| 7/15 | 117 | 121 | 123 | 125 | 124 | 122 | 87 | 83 | 82 | 119 | 118 | 84 | 86 | 89 |
|  | 54 | 59 | 62 | 56 | 36 | 41 | 40 | 38 | 58 | 37 | 43 | 39 | 42 | 46 |
|  | 104 | 100 | 53 | 106 | 107 | 50 | 47 | 52 | 179 | 76 | 175 | 75 | 173 | 74 |
|  | 78 | 171 | 79 | 24 | 22 | 18 | 21 | 23 | 19 | 111 | 108 | 26 | 113 | 114 |
|  | 160 | 154 | 157 | 153 | 64 | 71 | 155 | 67 | 70 | 158 | 159 | 66 | 156 | 68 |
|  | 91 | 92 | 98 | 96 | 93 | 143 | 90 | 95 | 135 | 141 | 139 | 133 | 151 | 147 |
|  | 130 | 127 | 144 | 126 | 145 | 148 | 11 | 33 | 10 | 9 | 30 | 15 | 13 | 34 |
|  | 12 | 6 | 8 | 0 | 169 | 7 | 170 | 2 | 168 | 166 | 5 | 162 | 4 | 163 |
| 8/15 | 77 | 39 | 3 | 175 | 102 | 62 | 119 | 0 | 171 | 104 | 48 | 13 | 72 | 91 |
|  | 68 | 112 | 28 | 168 | 167 | 106 | 135 | 51 | 75 | 54 | 85 | 122 | 26 | 118 |
|  | 120 | 107 | 150 | 100 | 69 | 18 | 145 | 15 | 29 | 24 | 114 | 117 | 169 | 12 |
|  | 170 | 6 | 89 | 78 | 74 | 105 | 21 | 159 | 177 | 162 | 156 | 71 | 49 | 80 |
|  | 63 | 66 | 101 | 98 | 179 | 164 | 111 | 5 | 84 | 36 | 87 | 37 | 174 | 35 |
|  | 95 | 161 | 11 | 133 | 154 | 50 | 47 | 86 | 4 | 137 | 22 | 130 | 148 | 178 |
|  | 134 | 140 | 61 | 42 | 1 | 16 | 131 | 103 | 172 | 129 | 146 | 116 | 55 | 76 |
|  | 70 | 17 | 46 | 59 | 113 | 124 | 176 | 132 | 7 | 73 | 56 | 14 | 44 | 34 |
| 9/15 | 42 | 65 | 66 | 57 | 48 | 46 | 60 | 40 | 69 | 71 | 44 | 62 | 54 | 51 |
|  | 50 | 58 | 61 | 41 | 43 | 49 | 56 | 39 | 67 | 55 | 63 | 53 | 68 | 135 |
|  | 107 | 129 | 90 | 104 | 99 | 101 | 130 | 127 | 126 | 131 | 128 | 91 | 132 | 103 |
|  | 93 | 137 | 106 | 3 | 10 | 8 | 5 | 111 | 122 | 115 | 113 | 7 | 12 | 16 |

TABLE 25-continued

|  | | | | | | | | | | | | | | |
|---|---|---|---|---|---|---|---|---|---|---|---|---|---|---|
| | 9 | 110 | 124 | 4 | 118 | 112 | 109 | 13 | 2 | 123 | 11 | 117 | 114 | 15 |
| | 157 | 152 | 154 | 76 | 160 | 72 | 79 | 86 | 144 | 158 | 148 | 87 | 147 | 73 |
| | 153 | 80 | 88 | 145 | 84 | 156 | 172 | 31 | 162 | 18 | 177 | 175 | 28 | 23 |
| | 171 | 32 | 176 | 164 | 27 | 19 | 34 | 21 | 30 | 179 | 24 | 168 | 170 | 167 |
| 10/15 | 100 | 88 | 81 | 82 | 97 | 55 | 74 | 46 | 163 | 14 | 79 | 85 | 76 | 169 |
| | 38 | 23 | 51 | 47 | 77 | 107 | 37 | 50 | 25 | 95 | 105 | 70 | 18 | 60 |
| | 162 | 32 | 78 | 16 | 27 | 113 | 45 | 90 | 121 | 4 | 112 | 64 | 131 | 117 |
| | 30 | 165 | 12 | 40 | 21 | 132 | 179 | 154 | 65 | 123 | 83 | 122 | 29 | 118 |
| | 106 | 89 | 71 | 127 | 130 | 67 | 24 | 19 | 66 | 134 | 48 | 159 | 62 | 6 |
| | 156 | 86 | 104 | 54 | 41 | 133 | 167 | 102 | 103 | 36 | 115 | 170 | 145 | 56 |
| | 168 | 58 | 137 | 57 | 157 | 34 | 176 | 175 | 151 | 139 | 135 | 15 | 143 | 144 |
| | 177 | 101 | 174 | 147 | 17 | 146 | 136 | 161 | 148 | 152 | 1 | 9 | 138 | 13 |
| 11/15 | 33 | 12 | 125 | 85 | 93 | 28 | 119 | 81 | 101 | 84 | 89 | 67 | 82 | 104 |
| | 23 | 16 | 47 | 121 | 46 | 128 | 9 | 11 | 48 | 64 | 17 | 76 | 14 | 90 |
| | 27 | 110 | 25 | 129 | 54 | 52 | 13 | 26 | 107 | 58 | 62 | 70 | 35 | 148 |
| | 19 | 18 | 60 | 99 | 158 | 109 | 32 | 74 | 34 | 40 | 63 | 111 | 86 | 56 |
| | 75 | 41 | 45 | 61 | 57 | 105 | 65 | 169 | 43 | 78 | 163 | 55 | 79 | 97 |
| | 108 | 147 | 134 | 102 | 154 | 88 | 49 | 69 | 51 | 91 | 66 | 151 | 59 | 146 |
| | 36 | 145 | 38 | 168 | 179 | 120 | 124 | 123 | 118 | 113 | 173 | 171 | 172 | 3 |
| | 142 | 8 | 2 | 153 | 1 | 4 | 140 | 139 | 135 | 7 | 167 | 141 | 5 | 137 |
| 12/15 | 91 | 88 | 112 | 102 | 26 | 27 | 120 | 103 | 17 | 15 | 19 | 136 | 60 | 83 |
| | 64 | 98 | 29 | 126 | 164 | 167 | 5 | 106 | 121 | 73 | 86 | 37 | 62 | 143 |
| | 149 | 54 | 179 | 163 | 40 | 133 | 92 | 39 | 44 | 139 | 74 | 166 | 3 | 172 |
| | 175 | 67 | 2 | 48 | 125 | 25 | 109 | 178 | 123 | 160 | 151 | 32 | 21 | 47 |
| | 110 | 119 | 34 | 59 | 18 | 0 | 161 | 176 | 31 | 38 | 80 | 6 | 114 | 127 |
| | 142 | 42 | 10 | 156 | 153 | 78 | 69 | 138 | 35 | 128 | 96 | 165 | 63 | 177 |
| | 24 | 158 | 79 | 81 | 85 | 71 | 84 | 99 | 134 | 162 | 170 | 168 | 141 | 82 |
| | 58 | 130 | 45 | 28 | 13 | 140 | 66 | 159 | 8 | 95 | 46 | 57 | 94 | 97 |
| 13/15 | 49 | 56 | 3 | 62 | 103 | 136 | 150 | 148 | 18 | 159 | 2 | 38 | 75 | 64 |
| | 74 | 101 | 88 | 146 | 113 | 164 | 161 | 47 | 32 | 65 | 70 | 143 | 94 | 130 |
| | 27 | 124 | 140 | 17 | 35 | 23 | 71 | 149 | 89 | 8 | 108 | 135 | 160 | 163 |
| | 21 | 39 | 54 | 67 | 4 | 128 | 96 | 112 | 109 | 162 | 165 | 59 | 1 | 69 |
| | 83 | 84 | 137 | 92 | 29 | 28 | 155 | 179 | 45 | 44 | 85 | 80 | 133 | 132 |
| | 142 | 134 | 117 | 178 | 167 | 55 | 40 | 63 | 66 | 13 | 100 | 116 | 105 | 22 |
| | 174 | 173 | 51 | 122 | 77 | 72 | 91 | 12 | 127 | 111 | 172 | 156 | 37 | 46 |
| | 42 | 5 | 60 | 87 | 152 | 123 | 107 | 16 | 169 | 43 | 30 | 26 | 154 | 11 |

| Code Rate | Order of group-wise interleaving $\pi(j)\ (0 \leq j < 180)$ | | | | | | | | |
|---|---|---|---|---|---|---|---|---|---|
| | 14 | 15 | 16 | 17 | 18 | 19 | 20 | 21 | 22 |
| | 37 | 38 | 39 | 40 | 41 | 42 | 43 | 44 | 45 |
| | 60 | 61 | 62 | 63 | 64 | 65 | 66 | 67 | 68 |
| | 83 | 84 | 85 | 86 | 87 | 88 | 89 | 90 | 91 |
| | 106 | 107 | 108 | 109 | 110 | 111 | 112 | 113 | 114 |
| | 129 | 130 | 131 | 132 | 133 | 134 | 135 | 136 | 137 |
| | 152 | 153 | 154 | 155 | 156 | 157 | 158 | 159 | 160 |
| | 175 | 176 | 177 | 178 | 179 | | | | |
| 2/15 | 135 | 58 | 45 | 122 | 104 | 0 | 107 | 142 | 4 |
| | 87 | 5 | 32 | 37 | 146 | 115 | 2 | 19 | 59 |
| | 111 | 164 | 39 | 69 | 179 | 64 | 148 | 149 | 141 |
| | 24 | 52 | 61 | 100 | 99 | 154 | 38 | 44 | 110 |
| | 11 | 18 | 48 | 80 | 162 | 167 | 132 | 158 | 84 |
| | 71 | 20 | 16 | 30 | 21 | 108 | 70 | 36 | 153 |
| | 161 | 46 | 120 | 155 | 170 | 81 | 53 | 129 | 89 |
| | 166 | 136 | 60 | 112 | 54 | | | | |
| 3/15 | 82 | 23 | 40 | 61 | 67 | 156 | 13 | 44 | 29 |
| | 85 | 27 | 170 | 103 | 145 | 136 | 49 | 95 | 19 |
| | 137 | 106 | 158 | 14 | 62 | 102 | 99 | 15 | 43 |
| | 127 | 144 | 45 | 5 | 165 | 167 | 161 | 111 | 93 |
| | 71 | 52 | 92 | 73 | 38 | 35 | 168 | 110 | 58 |
| | 173 | 150 | 57 | 12 | 134 | 2 | 105 | 10 | 59 |
| | 176 | 46 | 159 | 77 | 72 | 120 | 50 | 141 | 148 |
| | 70 | 74 | 64 | 47 | 138 | | | | |
| 4/15 | 124 | 156 | 148 | 32 | 116 | 79 | 4 | 46 | 91 |
| | 102 | 168 | 47 | 8 | 165 | 172 | 59 | 145 | 152 |
| | 7 | 68 | 162 | 161 | 39 | 123 | 95 | 146 | 15 |
| | 52 | 149 | 109 | 105 | 173 | 93 | 65 | 88 | 1 |
| | 154 | 57 | 38 | 75 | 11 | 132 | 115 | 108 | 76 |
| | 62 | 74 | 143 | 160 | 23 | 120 | 37 | 171 | 42 |
| | 136 | 33 | 53 | 144 | 17 | 31 | 29 | 30 | 167 |
| | 178 | 19 | 55 | 150 | 82 | | | | |
| 5/15 | 110 | 59 | 94 | 130 | 4 | 1 | 5 | 11 | 2 |
| | 150 | 118 | 17 | 12 | 167 | 15 | 39 | 76 | 10 |
| | 61 | 117 | 6 | 103 | 169 | 26 | 89 | 48 | 49 |
| | 122 | 168 | 64 | 82 | 137 | 113 | 144 | 29 | 99 |
| | 79 | 165 | 91 | 71 | 111 | 179 | 114 | 112 | 37 |

TABLE 25-continued

|  | | | | | | | | |
|---|---:|---:|---:|---:|---:|---:|---:|---:|
|  | 24 | 69 | 102 | 63 | 126 | 38 | 172 | 43 | 72 |
|  | 158 | 67 | 81 | 142 | 18 | 21 | 154 | 19 | 66 |
|  | 75 | 100 | 25 | 106 | 33 | | | | |
| 6/15 | 127 | 149 | 142 | 87 | 125 | 82 | 51 | 40 | 161 |
|  | 103 | 169 | 133 | 54 | 62 | 30 | 13 | 105 | 32 |
|  | 33 | 2 | 17 | 46 | 75 | 3 | 20 | 165 | 84 |
|  | 50 | 101 | 107 | 151 | 137 | 179 | 170 | 63 | 58 |
|  | 11 | 10 | 91 | 153 | 65 | 53 | 44 | 77 | 173 |
|  | 109 | 8 | 61 | 29 | 35 | 108 | 150 | 175 | 129 |
|  | 26 | 178 | 135 | 158 | 155 | 122 | 80 | 99 | 23 |
|  | 139 | 128 | 112 | 104 | 123 | | | | |
| 7/15 | 85 | 81 | 120 | 88 | 61 | 44 | 60 | 57 | 55 |
|  | 103 | 105 | 49 | 48 | 99 | 51 | 45 | 102 | 101 |
|  | 80 | 176 | 72 | 178 | 177 | 174 | 77 | 73 | 172 |
|  | 110 | 115 | 20 | 116 | 109 | 112 | 25 | 161 | 63 |
|  | 69 | 65 | 142 | 136 | 138 | 140 | 97 | 94 | 137 |
|  | 150 | 129 | 128 | 146 | 131 | 132 | 152 | 134 | 149 |
|  | 31 | 14 | 32 | 27 | 35 | 16 | 17 | 29 | 28 |
|  | 3 | 165 | 167 | 1 | 164 | | | | |
| 8/15 | 30 | 125 | 173 | 109 | 8 | 115 | 82 | 79 | 2 |
|  | 128 | 144 | 121 | 57 | 41 | 52 | 94 | 110 | 45 |
|  | 65 | 38 | 19 | 43 | 20 | 23 | 149 | 147 | 108 |
|  | 60 | 138 | 157 | 155 | 96 | 143 | 126 | 90 | 93 |
|  | 160 | 152 | 141 | 127 | 81 | 64 | 67 | 92 | 33 |
|  | 97 | 88 | 40 | 10 | 9 | 136 | 32 | 123 | 158 |
|  | 58 | 83 | 166 | 27 | 139 | 163 | 99 | 165 | 53 |
|  | 31 | 153 | 151 | 142 | 25 | | | | |
| 9/15 | 37 | 59 | 52 | 38 | 36 | 70 | 47 | 64 | 45 |
|  | 143 | 97 | 139 | 133 | 102 | 136 | 140 | 94 | 92 |
|  | 100 | 138 | 96 | 105 | 98 | 141 | 95 | 134 | 142 |
|  | 116 | 121 | 0 | 108 | 119 | 125 | 14 | 17 | 1 |
|  | 6 | 120 | 82 | 85 | 146 | 150 | 89 | 74 | 81 |
|  | 83 | 78 | 161 | 75 | 151 | 149 | 159 | 155 | 77 |
|  | 33 | 178 | 35 | 25 | 169 | 26 | 166 | 165 | 20 |
|  | 29 | 163 | 22 | 174 | 173 | | | | |
| 10/15 | 68 | 87 | 80 | 20 | 22 | 26 | 28 | 49 | 63 |
|  | 35 | 72 | 91 | 116 | 166 | 98 | 94 | 92 | 7 |
|  | 43 | 61 | 2 | 10 | 0 | 114 | 84 | 8 | 110 |
|  | 53 | 172 | 124 | 93 | 119 | 111 | 59 | 44 | 173 |
|  | 73 | 39 | 164 | 140 | 42 | 160 | 109 | 120 | 69 |
|  | 52 | 96 | 129 | 99 | 33 | 75 | 128 | 153 | 158 |
|  | 108 | 142 | 141 | 178 | 125 | 5 | 126 | 31 | 171 |
|  | 11 | 150 | 149 | 3 | 155 | | | | |
| 11/15 | 98 | 114 | 83 | 15 | 73 | 117 | 157 | 10 | 162 |
|  | 21 | 50 | 131 | 20 | 127 | 126 | 164 | 68 | 22 |
|  | 39 | 92 | 6 | 103 | 31 | 159 | 80 | 87 | 100 |
|  | 133 | 130 | 95 | 37 | 30 | 115 | 29 | 94 | 77 |
|  | 71 | 116 | 53 | 72 | 42 | 24 | 149 | 96 | 165 |
|  | 143 | 161 | 144 | 106 | 170 | 150 | 44 | 156 | 176 |
|  | 122 | 175 | 160 | 174 | 166 | 178 | 177 | 132 | 112 |
|  | 0 | 136 | 138 | 155 | 152 | | | | |
| 12/15 | 116 | 89 | 115 | 72 | 147 | 148 | 11 | 52 | 33 |
|  | 93 | 174 | 146 | 14 | 1 | 53 | 100 | 55 | 50 |
|  | 20 | 4 | 75 | 49 | 70 | 56 | 41 | 43 | 173 |
|  | 108 | 7 | 77 | 129 | 113 | 155 | 169 | 22 | 122 |
|  | 131 | 154 | 152 | 150 | 23 | 12 | 76 | 118 | 135 |
|  | 171 | 68 | 111 | 87 | 61 | 137 | 105 | 101 | 107 |
|  | 65 | 30 | 51 | 90 | 36 | 157 | 9 | 144 | 117 |
|  | 124 | 132 | 104 | 16 | 145 | | | | |
| 13/15 | 95 | 90 | 106 | 151 | 170 | 171 | 57 | 48 | 73 |
|  | 126 | 20 | 118 | 31 | 50 | 145 | 82 | 9 | 10 |
|  | 24 | 34 | 79 | 76 | 141 | 14 | 153 | 129 | 166 |
|  | 78 | 97 | 104 | 114 | 25 | 119 | 19 | 0 | 36 |
|  | 110 | 158 | 168 | 177 | 41 | 52 | 147 | 86 | 7 |
|  | 138 | 53 | 58 | 81 | 68 | 99 | 98 | 15 | 115 |
|  | 61 | 6 | 93 | 102 | 125 | 131 | 176 | 144 | 33 |
|  | 139 | 120 | 121 | 157 | 175 | | | | |

Further, the following Table 26 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 64800 and when being modulated by the 4096-QAM, shows the group interleaving pattern used to define the π(j).

TABLE 26

| Code Rate | Order of group-wise interleaving π(j) (0 ≤ j < 180) | | | | | | | | | | | | | |
|---|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | 23 | 24 | 25 | 26 | 27 | 28 | 29 | 30 | 31 | 32 | 33 | 34 | 35 | 36 |
| | 46 | 47 | 48 | 49 | 50 | 51 | 52 | 53 | 54 | 55 | 56 | 57 | 58 | 59 |
| | 69 | 70 | 71 | 72 | 73 | 74 | 75 | 76 | 77 | 78 | 79 | 80 | 81 | 82 |
| | 92 | 93 | 94 | 95 | 96 | 97 | 98 | 99 | 100 | 101 | 102 | 103 | 104 | 105 |
| | 115 | 116 | 117 | 118 | 119 | 120 | 121 | 122 | 123 | 124 | 125 | 126 | 127 | 128 |
| | 138 | 139 | 140 | 141 | 142 | 143 | 144 | 145 | 146 | 147 | 148 | 149 | 150 | 151 |
| | 161 | 162 | 163 | 164 | 165 | 166 | 167 | 168 | 169 | 170 | 171 | 172 | 173 | 174 |
| 2/15 | 14 | 129 | 71 | 96 | 171 | 36 | 144 | 64 | 162 | 4 | 86 | 128 | 113 | 7 |
| | 118 | 158 | 126 | 17 | 55 | 45 | 111 | 138 | 84 | 6 | 52 | 167 | 38 | 20 |
| | 154 | 15 | 146 | 116 | 63 | 1 | 114 | 83 | 124 | 109 | 39 | 75 | 123 | 57 |
| | 99 | 34 | 147 | 166 | 56 | 155 | 176 | 95 | 102 | 119 | 161 | 37 | 159 | 97 |
| | 87 | 103 | 179 | 172 | 66 | 59 | 8 | 145 | 88 | 132 | 110 | 54 | 47 | 153 |
| | 24 | 19 | 53 | 136 | 48 | 76 | 35 | 151 | 173 | 149 | 142 | 160 | 94 | 117 |
| | 60 | 135 | 168 | 23 | 100 | 134 | 90 | 98 | 125 | 85 | 137 | 81 | 41 | 156 |
| | 139 | 93 | 46 | 12 | 175 | 130 | 51 | 178 | 92 | 115 | 174 | 27 | 70 | 58 |
| 3/15 | 136 | 20 | 44 | 36 | 17 | 120 | 89 | 142 | 66 | 35 | 42 | 116 | 14 | 119 |
| | 175 | 41 | 145 | 100 | 131 | 173 | 179 | 16 | 77 | 112 | 40 | 58 | 23 | 82 |
| | 79 | 137 | 53 | 96 | 33 | 70 | 19 | 38 | 121 | 90 | 118 | 126 | 165 | 109 |
| | 134 | 177 | 139 | 3 | 113 | 172 | 9 | 50 | 138 | 61 | 93 | 94 | 88 | 132 |
| | 101 | 155 | 95 | 54 | 85 | 13 | 39 | 15 | 76 | 130 | 97 | 110 | 174 | 72 |
| | 28 | 160 | 149 | 133 | 104 | 81 | 69 | 84 | 4 | 6 | 147 | 48 | 115 | 169 |
| | 171 | 135 | 52 | 5 | 141 | 65 | 75 | 163 | 43 | 144 | 167 | 159 | 129 | 46 |
| | 32 | 18 | 51 | 87 | 114 | 64 | 22 | 164 | 24 | 123 | 27 | 62 | 124 | 152 |
| 4/15 | 91 | 52 | 36 | 30 | 35 | 6 | 121 | 29 | 150 | 47 | 163 | 2 | 89 | 39 |
| | 129 | 10 | 9 | 15 | 162 | 21 | 171 | 43 | 44 | 132 | 158 | 104 | 4 | 72 |
| | 161 | 88 | 148 | 42 | 160 | 109 | 100 | 126 | 138 | 108 | 38 | 25 | 3 | 112 |
| | 178 | 68 | 26 | 130 | 140 | 115 | 152 | 139 | 37 | 22 | 102 | 14 | 118 | 11 |
| | 93 | 7 | 79 | 5 | 137 | 165 | 59 | 77 | 55 | 80 | 117 | 13 | 173 | 144 |
| | 142 | 27 | 136 | 18 | 111 | 175 | 123 | 147 | 114 | 19 | 125 | 166 | 149 | 113 |
| | 170 | 128 | 97 | 16 | 60 | 110 | 156 | 45 | 82 | 105 | 62 | 99 | 23 | 92 |
| | 116 | 75 | 127 | 81 | 67 | 179 | 174 | 70 | 12 | 58 | 87 | 176 | 0 | 51 |
| 5/15 | 146 | 89 | 57 | 16 | 164 | 138 | 91 | 78 | 90 | 66 | 122 | 12 | 9 | 157 |
| | 56 | 61 | 168 | 18 | 161 | 95 | 99 | 139 | 22 | 65 | 130 | 166 | 118 | 150 |
| | 88 | 47 | 0 | 58 | 105 | 43 | 80 | 64 | 107 | 21 | 55 | 151 | 8 | 145 |
| | 3 | 13 | 34 | 160 | 102 | 125 | 114 | 152 | 84 | 32 | 97 | 33 | 60 | 62 |
| | 127 | 132 | 104 | 53 | 162 | 103 | 120 | 54 | 155 | 116 | 48 | 77 | 76 | 73 |
| | 143 | 178 | 108 | 39 | 140 | 106 | 40 | 5 | 25 | 81 | 176 | 101 | 124 | 126 |
| | 170 | 35 | 175 | 137 | 15 | 24 | 69 | 96 | 30 | 117 | 67 | 171 | 149 | 169 |
| | 131 | 85 | 110 | 94 | 135 | 172 | 148 | 50 | 154 | 42 | 70 | 115 | 26 | 83 |
| 6/15 | 66 | 21 | 51 | 55 | 117 | 24 | 33 | 12 | 70 | 63 | 47 | 65 | 145 | 8 |
| | 56 | 2 | 43 | 64 | 58 | 67 | 53 | 68 | 61 | 39 | 52 | 69 | 1 | 22 |
| | 25 | 44 | 136 | 29 | 36 | 26 | 126 | 177 | 62 | 37 | 148 | 9 | 13 | 45 |
| | 178 | 28 | 34 | 106 | 127 | 76 | 131 | 105 | 138 | 75 | 130 | 101 | 167 | 54 |
| | 143 | 81 | 32 | 96 | 3 | 78 | 107 | 86 | 98 | 16 | 162 | 150 | 111 | 158 |
| | 144 | 151 | 90 | 11 | 156 | 100 | 175 | 83 | 155 | 159 | 128 | 88 | 87 | 93 |
| | 141 | 129 | 146 | 122 | 73 | 112 | 132 | 125 | 174 | 169 | 168 | 79 | 84 | 118 |
| | 104 | 134 | 82 | 95 | 133 | 164 | 154 | 120 | 110 | 170 | 114 | 153 | 72 | 109 |
| 7/15 | 59 | 60 | 0 | 48 | 87 | 30 | 29 | 146 | 142 | 8 | 150 | 171 | 20 | 121 |
| | 108 | 165 | 174 | 16 | 85 | 58 | 43 | 161 | 34 | 13 | 92 | 79 | 82 | 175 |
| | 120 | 61 | 73 | 104 | 10 | 38 | 45 | 7 | 173 | 75 | 24 | 77 | 137 | 21 |
| | 140 | 64 | 117 | 158 | 114 | 136 | 112 | 31 | 70 | 134 | 163 | 98 | 91 | 33 |
| | 40 | 66 | 170 | 41 | 74 | 138 | 99 | 179 | 81 | 157 | 32 | 19 | 26 | 62 |
| | 55 | 164 | 153 | 155 | 14 | 42 | 149 | 127 | 133 | 83 | 96 | 139 | 89 | 36 |
| | 101 | 44 | 49 | 177 | 88 | 11 | 105 | 151 | 12 | 132 | 25 | 128 | 119 | 65 |
| | 56 | 124 | 17 | 141 | 72 | 9 | 28 | 5 | 110 | 100 | 47 | 80 | 169 | 116 |
| 8/15 | 77 | 48 | 82 | 51 | 57 | 69 | 65 | 6 | 71 | 90 | 84 | 81 | 50 | 88 |
| | 18 | 38 | 89 | 49 | 93 | 36 | 64 | 47 | 40 | 42 | 76 | 70 | 56 | 3 |
| | 87 | 67 | 86 | 10 | 1 | 58 | 17 | 14 | 175 | 91 | 68 | 85 | 94 | 15 |
| | 83 | 46 | 44 | 102 | 30 | 112 | 122 | 110 | 29 | 20 | 105 | 138 | 101 | 174 |
| | 28 | 26 | 45 | 24 | 23 | 21 | 157 | 98 | 35 | 95 | 22 | 32 | 103 | 27 |
| | 159 | 155 | 179 | 160 | 161 | 130 | 123 | 172 | 139 | 124 | 153 | 0 | 109 | 167 |
| | 148 | 158 | 129 | 163 | 176 | 151 | 171 | 8 | 106 | 144 | 150 | 169 | 108 | 162 |
| | 142 | 104 | 115 | 135 | 121 | 100 | 12 | 170 | 156 | 126 | 5 | 127 | 154 | 97 |
| 9/15 | 67 | 79 | 72 | 175 | 1 | 92 | 63 | 65 | 36 | 73 | 18 | 3 | 43 | 78 |
| | 91 | 93 | 54 | 58 | 60 | 2 | 19 | 66 | 44 | 85 | 48 | 0 | 50 | 166 |
| | 39 | 141 | 34 | 74 | 33 | 45 | 99 | 46 | 10 | 69 | 94 | 101 | 56 | 9 |
| | 62 | 100 | 13 | 32 | 88 | 57 | 127 | 53 | 68 | 146 | 61 | 7 | 107 | 71 |

TABLE 26-continued

|  |  |  |  |  |  |  |  |  |  |  |  |  |  |
|---|---|---|---|---|---|---|---|---|---|---|---|---|---|
|  | 126 | 87 | 22 | 47 | 27 | 171 | 102 | 6 | 132 | 77 | 90 | 38 | 167 | 4 |
|  | 159 | 42 | 110 | 21 | 105 | 148 | 142 | 134 | 23 | 117 | 122 | 160 | 12 | 154 |
|  | 155 | 178 | 138 | 176 | 147 | 121 | 136 | 165 | 170 | 133 | 149 | 150 | 174 | 168 |
|  | 173 | 112 | 144 | 172 | 123 | 137 | 16 | 120 | 131 | 111 | 135 | 163 | 17 | 130 |
| 10/15 | 36 | 21 | 117 | 71 | 38 | 108 | 42 | 61 | 13 | 88 | 97 | 68 | 2 | 67 |
|  | 78 | 31 | 18 | 103 | 39 | 119 | 25 | 40 | 28 | 72 | 11 | 73 | 86 | 131 |
|  | 93 | 56 | 69 | 96 | 35 | 57 | 116 | 130 | 55 | 74 | 41 | 169 | 54 | 14 |
|  | 101 | 8 | 115 | 118 | 85 | 48 | 112 | 80 | 90 | 32 | 173 | 76 | 33 | 16 |
|  | 7 | 110 | 99 | 53 | 133 | 70 | 87 | 106 | 145 | 4 | 113 | 27 | 59 | 34 |
|  | 155 | 136 | 94 | 43 | 49 | 152 | 161 | 66 | 3 | 121 | 135 | 147 | 17 | 157 |
|  | 177 | 134 | 143 | 176 | 179 | 105 | 172 | 47 | 146 | 160 | 23 | 175 | 141 | 91 |
|  | 151 | 125 | 139 | 150 | 15 | 129 | 162 | 120 | 166 | 156 | 62 | 158 | 178 | 128 |
| 11/15 | 77 | 97 | 3 | 44 | 119 | 72 | 83 | 116 | 40 | 0 | 111 | 8 | 68 | 43 |
|  | 76 | 89 | 118 | 70 | 87 | 15 | 67 | 22 | 59 | 95 | 46 | 38 | 125 | 48 |
|  | 80 | 63 | 62 | 45 | 9 | 25 | 114 | 19 | 82 | 54 | 150 | 121 | 130 | 123 |
|  | 101 | 78 | 5 | 128 | 148 | 57 | 12 | 107 | 36 | 2 | 109 | 52 | 39 | 66 |
|  | 144 | 10 | 94 | 64 | 100 | 86 | 71 | 27 | 30 | 32 | 110 | 33 | 113 | 131 |
|  | 41 | 117 | 69 | 172 | 96 | 149 | 127 | 124 | 173 | 13 | 74 | 105 | 53 | 161 |
|  | 145 | 170 | 135 | 158 | 154 | 162 | 7 | 169 | 99 | 106 | 137 | 165 | 143 | 4 |
|  | 176 | 179 | 142 | 11 | 177 | 153 | 151 | 159 | 132 | 20 | 164 | 6 | 157 | 178 |
| 12/15 | 110 | 16 | 64 | 100 | 55 | 70 | 48 | 26 | 60 | 71 | 93 | 1 | 59 | 88 |
|  | 92 | 9 | 35 | 37 | 113 | 101 | 111 | 8 | 52 | 56 | 19 | 134 | 151 | 84 |
|  | 22 | 116 | 172 | 38 | 95 | 36 | 46 | 141 | 114 | 4 | 106 | 149 | 85 | 86 |
|  | 47 | 123 | 39 | 10 | 148 | 43 | 131 | 147 | 45 | 143 | 5 | 108 | 81 | 2 |
|  | 17 | 30 | 32 | 156 | 133 | 78 | 91 | 161 | 104 | 174 | 53 | 61 | 50 | 74 |
|  | 102 | 20 | 167 | 99 | 122 | 117 | 24 | 98 | 115 | 124 | 42 | 7 | 79 | 75 |
|  | 129 | 142 | 107 | 73 | 175 | 14 | 83 | 150 | 165 | 118 | 89 | 130 | 15 | 163 |
|  | 145 | 0 | 178 | 155 | 157 | 179 | 144 | 158 | 152 | 13 | 25 | 176 | 162 | 169 |
| 13/15 | 87 | 50 | 6 | 42 | 82 | 54 | 96 | 0 | 62 | 124 | 109 | 126 | 23 | 64 |
|  | 128 | 107 | 7 | 28 | 14 | 125 | 136 | 154 | 10 | 92 | 99 | 84 | 86 | 151 |
|  | 35 | 61 | 102 | 132 | 95 | 70 | 40 | 129 | 101 | 36 | 51 | 150 | 142 | 152 |
|  | 112 | 113 | 57 | 77 | 32 | 93 | 49 | 58 | 117 | 78 | 1 | 149 | 37 | 11 |
|  | 91 | 46 | 146 | 21 | 143 | 44 | 110 | 75 | 138 | 16 | 76 | 45 | 114 | 144 |
|  | 71 | 115 | 105 | 90 | 56 | 25 | 103 | 147 | 73 | 60 | 47 | 118 | 27 | 69 |
|  | 3 | 164 | 106 | 134 | 5 | 67 | 80 | 141 | 120 | 98 | 155 | 8 | 156 | 162 |
|  | 127 | 22 | 173 | 157 | 171 | 178 | 158 | 17 | 174 | 179 | 167 | 12 | 172 | 166 |

| Code Rate | Order of group-wise interleaving $\pi(j)$ ($0 \leq j < 180$) |  |  |  |  |  |  |  |  |
|---|---|---|---|---|---|---|---|---|---|
|  |  | 14 | 15 | 16 | 17 | 18 | 19 | 20 | 21 | 22 |
|  |  | 37 | 38 | 39 | 40 | 41 | 42 | 43 | 44 | 45 |
|  |  | 60 | 61 | 62 | 63 | 64 | 65 | 66 | 67 | 68 |
|  |  | 83 | 84 | 85 | 86 | 87 | 88 | 89 | 90 | 91 |
|  |  | 106 | 107 | 108 | 109 | 110 | 111 | 112 | 113 | 114 |
|  |  | 129 | 130 | 131 | 132 | 133 | 134 | 135 | 136 | 137 |
|  |  | 152 | 153 | 154 | 155 | 156 | 157 | 158 | 159 | 160 |
|  |  | 175 | 176 | 177 | 178 | 179 |  |  |  |  |
| 2/15 |  | 105 | 131 | 2 | 133 | 106 | 79 | 11 | 152 | 26 |
|  |  | 101 | 31 | 120 | 5 | 112 | 74 | 69 | 121 | 9 |
|  |  | 49 | 30 | 21 | 40 | 43 | 77 | 157 | 44 | 13 |
|  |  | 68 | 122 | 163 | 89 | 61 | 107 | 22 | 10 | 127 |
|  |  | 25 | 32 | 73 | 42 | 148 | 150 | 28 | 91 | 18 |
|  |  | 169 | 165 | 141 | 80 | 67 | 170 | 164 | 82 | 65 |
|  |  | 50 | 3 | 29 | 16 | 72 | 177 | 0 | 78 | 62 |
|  |  | 33 | 104 | 140 | 108 | 143 |  |  |  |  |
| 3/15 |  | 117 | 29 | 47 | 125 | 11 | 158 | 74 | 25 | 37 |
|  |  | 168 | 106 | 83 | 34 | 49 | 122 | 2 | 157 | 107 |
|  |  | 154 | 140 | 10 | 178 | 143 | 92 | 63 | 176 | 146 |
|  |  | 105 | 151 | 170 | 86 | 12 | 1 | 7 | 56 | 59 |
|  |  | 150 | 55 | 73 | 99 | 111 | 162 | 26 | 21 | 156 |
|  |  | 127 | 161 | 71 | 68 | 80 | 91 | 98 | 8 | 57 |
|  |  | 31 | 30 | 166 | 0 | 148 | 128 | 102 | 103 | 60 |
|  |  | 78 | 108 | 67 | 153 | 45 |  |  |  |  |
| 4/15 |  | 65 | 157 | 64 | 122 | 101 | 40 | 84 | 69 | 90 |
|  |  | 169 | 177 | 103 | 76 | 28 | 78 | 53 | 1 | 151 |
|  |  | 17 | 124 | 155 | 172 | 134 | 86 | 119 | 94 | 145 |
|  |  | 98 | 154 | 61 | 146 | 164 | 107 | 131 | 159 | 63 |
|  |  | 85 | 153 | 66 | 106 | 49 | 34 | 48 | 41 | 143 |
|  |  | 46 | 31 | 141 | 120 | 57 | 74 | 8 | 20 | 96 |
|  |  | 32 | 50 | 73 | 56 | 167 | 95 | 24 | 168 | 33 |
|  |  | 135 | 83 | 133 | 54 | 71 |  |  |  |  |
| 5/15 |  | 14 | 68 | 112 | 128 | 74 | 45 | 28 | 87 | 158 |
|  |  | 49 | 142 | 44 | 36 | 1 | 121 | 6 | 46 | 29 |
|  |  | 163 | 7 | 98 | 123 | 17 | 11 | 153 | 136 | 52 |
|  |  | 79 | 37 | 129 | 38 | 165 | 71 | 75 | 59 | 144 |
|  |  | 113 | 119 | 179 | 177 | 41 | 19 | 92 | 109 | 31 |

TABLE 26-continued

|      | | | | | | | | | |
|---|---|---|---|---|---|---|---|---|---|
|       | 72  | 111 | 4   | 173 | 156 | 134 | 86  | 174 | 2   |
|       | 63  | 23  | 20  | 167 | 27  | 147 | 51  | 10  | 82  |
|       | 141 | 100 | 133 | 93  | 159 |     |     |     |     |
| 6/15  | 0   | 57  | 23  | 71  | 59  | 14  | 40  | 42  | 15  |
|       | 31  | 161 | 38  | 30  | 19  | 17  | 18  | 4   | 41  |
|       | 46  | 152 | 50  | 49  | 27  | 77  | 60  | 35  | 48  |
|       | 173 | 113 | 108 | 92  | 135 | 124 | 121 | 97  | 149 |
|       | 172 | 139 | 74  | 142 | 166 | 7   | 5   | 119 | 20  |
|       | 103 | 94  | 140 | 165 | 6   | 137 | 157 | 10  | 85  |
|       | 179 | 147 | 91  | 160 | 163 | 115 | 89  | 80  | 102 |
|       | 171 | 176 | 99  | 116 | 123 |     |     |     |     |
| 7/15  | 23  | 122 | 144 | 76  | 162 | 106 | 50  | 39  | 63  |
|       | 86  | 69  | 68  | 15  | 113 | 84  | 118 | 27  | 93  |
|       | 37  | 46  | 3   | 6   | 168 | 148 | 109 | 123 | 103 |
|       | 115 | 95  | 176 | 154 | 107 | 97  | 131 | 111 | 129 |
|       | 172 | 78  | 160 | 57  | 22  | 159 | 51  | 135 | 2   |
|       | 125 | 130 | 143 | 147 | 67  | 18  | 102 | 94  | 35  |
|       | 145 | 4   | 54  | 90  | 71  | 167 | 166 | 1   | 156 |
|       | 53  | 152 | 52  | 126 | 178 |     |     |     |     |
| 8/15  | 61  | 55  | 53  | 73  | 39  | 13  | 79  | 75  | 41  |
|       | 72  | 2   | 54  | 52  | 145 | 19  | 78  | 80  | 63  |
|       | 43  | 74  | 60  | 66  | 37  | 92  | 4   | 9   | 16  |
|       | 33  | 137 | 136 | 131 | 166 | 59  | 34  | 62  | 125 |
|       | 113 | 31  | 119 | 173 | 168 | 118 | 120 | 114 | 149 |
|       | 128 | 107 | 117 | 147 | 177 | 96  | 164 | 152 | 11  |
|       | 143 | 111 | 141 | 133 | 178 | 134 | 146 | 99  | 132 |
|       | 140 | 116 | 165 | 7   | 25  |     |     |     |     |
| 9/15  | 5   | 40  | 82  | 20  | 15  | 76  | 28  | 84  | 59  |
|       | 89  | 41  | 24  | 83  | 75  | 55  | 64  | 52  | 98  |
|       | 97  | 96  | 37  | 14  | 31  | 70  | 106 | 113 | 80  |
|       | 51  | 161 | 81  | 49  | 86  | 95  | 103 | 30  | 25  |
|       | 35  | 26  | 118 | 140 | 104 | 128 | 179 | 124 | 109 |
|       | 114 | 156 | 151 | 145 | 169 | 11  | 139 | 177 | 129 |
|       | 125 | 116 | 115 | 164 | 29  | 119 | 153 | 157 | 162 |
|       | 152 | 108 | 8   | 158 | 143 |     |     |     |     |
| 10/15 | 50  | 64  | 95  | 63  | 100 | 9   | 82  | 51  | 45  |
|       | 84  | 111 | 24  | 58  | 60  | 81  | 37  | 89  | 1   |
|       | 26  | 65  | 83  | 165 | 107 | 0   | 52  | 144 | 75  |
|       | 77  | 164 | 104 | 46  | 20  | 98  | 109 | 29  | 114 |
|       | 5   | 102 | 148 | 142 | 79  | 19  | 44  | 159 | 174 |
|       | 30  | 153 | 154 | 137 | 168 | 92  | 149 | 171 | 10  |
|       | 140 | 163 | 132 | 6   | 126 | 124 | 12  | 170 | 167 |
|       | 127 | 22  | 122 | 123 | 138 |     |     |     |     |
| 11/15 | 24  | 102 | 49  | 92  | 65  | 31  | 93  | 60  | 17  |
|       | 58  | 140 | 104 | 73  | 47  | 14  | 120 | 1   | 50  |
|       | 37  | 55  | 23  | 98  | 81  | 122 | 103 | 85  | 126 |
|       | 115 | 42  | 156 | 90  | 51  | 91  | 29  | 84  | 18  |
|       | 35  | 34  | 112 | 26  | 108 | 16  | 61  | 56  | 75  |
|       | 146 | 174 | 79  | 88  | 28  | 129 | 134 | 139 | 136 |
|       | 175 | 138 | 133 | 171 | 168 | 147 | 167 | 141 | 163 |
|       | 21  | 166 | 155 | 160 | 152 |     |     |     |     |
| 12/15 | 97  | 136 | 67  | 94  | 90  | 72  | 49  | 23  | 41  |
|       | 126 | 159 | 63  | 44  | 65  | 139 | 31  | 57  | 103 |
|       | 66  | 51  | 121 | 105 | 109 | 87  | 6   | 135 | 127 |
|       | 140 | 120 | 132 | 76  | 58  | 137 | 18  | 29  | 125 |
|       | 77  | 33  | 171 | 138 | 28  | 69  | 112 | 119 | 12  |
|       | 128 | 82  | 68  | 80  | 3   | 11  | 54  | 96  | 40  |
|       | 34  | 166 | 173 | 146 | 168 | 153 | 154 | 177 | 62  |
|       | 164 | 27  | 21  | 160 | 170 |     |     |     |     |
| 13/15 | 53  | 20  | 41  | 111 | 145 | 135 | 68  | 2   | 122 |
|       | 108 | 24  | 94  | 148 | 29  | 123 | 13  | 88  | 52  |
|       | 121 | 131 | 116 | 97  | 104 | 31  | 59  | 137 | 83  |
|       | 100 | 85  | 79  | 72  | 66  | 130 | 18  | 63  | 55  |
|       | 119 | 38  | 140 | 65  | 30  | 133 | 153 | 33  | 89  |
|       | 9   | 74  | 48  | 19  | 39  | 43  | 34  | 81  | 139 |
|       | 163 | 165 | 26  | 161 | 168 | 176 | 159 | 170 | 4   |
|       | 160 | 177 | 169 | 175 | 15  |     |     |     |     |

Further, the following Table 27 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 16200 and when being modulated by the QPSK, shows the group interleaving pattern used to define the π(j).

TABLE 27

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 2/15 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 3/15 | 15 | 27 | 22 | 39 | 34 | 29 | 19 | 33 | 7 | 8 | 17 | 2 | 28 | 40 | 43 | 21 | 30 | 20 | 32 | 36 | 14 | 44 | 1 |
| | 12 | 11 | 37 | 0 | 13 | 3 | 35 | 9 | 6 | 10 | 31 | 38 | 26 | 24 | 16 | 4 | 25 | 23 | 42 | 18 | 5 | 41 | |
| 4/15 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 5/15 | 35 | 21 | 7 | 5 | 29 | 13 | 11 | 34 | 14 | 37 | 32 | 23 | 38 | 15 | 28 | 36 | 20 | 18 | 17 | 42 | 25 | 16 | 39 |
| | 33 | 19 | 31 | 4 | 27 | 1 | 22 | 12 | 3 | 10 | 6 | 30 | 40 | 0 | 24 | 44 | 41 | 43 | 9 | 2 | 26 | 8 | |
| 6/15 | 7 | 0 | 27 | 25 | 31 | 34 | 17 | 8 | 15 | 18 | 20 | 22 | 1 | 24 | 33 | 26 | 32 | 2 | 36 | 38 | 40 | 42 | 4 |
| | 5 | 30 | 13 | 9 | 10 | 11 | 12 | 16 | 19 | 21 | 23 | 35 | 29 | 6 | 14 | 28 | 3 | 37 | 39 | 41 | 43 | 44 | |
| 7/15 | 3 | 1 | 18 | 22 | 9 | 17 | 13 | 10 | 8 | 16 | 0 | 2 | 24 | 26 | 28 | 30 | 32 | 34 | 36 | 38 | 40 | 42 | 7 |
| | 4 | 21 | 6 | 5 | 14 | 15 | 20 | 19 | 12 | 11 | 23 | 25 | 27 | 29 | 31 | 33 | 35 | 37 | 39 | 41 | 43 | 44 | |
| 8/15 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 9/15 | 0 | 2 | 4 | 6 | 8 | 10 | 12 | 14 | 16 | 18 | 20 | 22 | 24 | 26 | 28 | 30 | 32 | 34 | 36 | 38 | 40 | 42 | 1 |
| | 3 | 5 | 7 | 9 | 11 | 13 | 15 | 17 | 19 | 21 | 23 | 25 | 27 | 29 | 31 | 33 | 35 | 37 | 39 | 41 | 43 | 44 | |
| 10/15 | 1 | 0 | 3 | 4 | 2 | 6 | 8 | 7 | 5 | 21 | 23 | 16 | 13 | 10 | 12 | 15 | 18 | 9 | 19 | 11 | 17 | 22 | 20 |
| | 14 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 11/15 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 12/15 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 13/15 | 26 | 25 | 10 | 7 | 12 | 5 | 38 | 37 | 28 | 27 | 15 | 4 | 0 | 16 | 44 | 43 | 34 | 33 | 24 | 23 | 14 | 2 | 8 |
| | 18 | 40 | 39 | 30 | 29 | 20 | 19 | 13 | 6 | 42 | 41 | 32 | 31 | 22 | 21 | 11 | 3 | 9 | 17 | 36 | 35 | 1 | |

Further, the following Table 28 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 16200 and when being modulated by the 16-QAM, shows the group interleaving pattern used to define the π(j).

TABLE 28

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 2/15 | 5 | 23 | 13 | 32 | 33 | 27 | 0 | 1 | 18 | 4 | 15 | 3 | 8 | 7 | 42 | 41 | 29 | 6 | 17 | 37 | 10 | 24 | 2 |
| | 9 | 21 | 44 | 20 | 25 | 14 | 38 | 12 | 19 | 30 | 31 | 40 | 22 | 26 | 34 | 39 | 16 | 11 | 43 | 35 | 28 | 36 | |
| 3/15 | 18 | 19 | 35 | 32 | 16 | 37 | 33 | 20 | 5 | 2 | 4 | 40 | 29 | 27 | 17 | 25 | 26 | 3 | 30 | 8 | 43 | 10 | 31 |
| | 34 | 23 | 15 | 21 | 38 | 6 | 36 | 9 | 28 | 1 | 39 | 11 | 14 | 24 | 22 | 41 | 44 | 7 | 12 | 0 | 13 | 42 | |
| 4/15 | 34 | 40 | 18 | 14 | 3 | 27 | 30 | 4 | 19 | 10 | 32 | 31 | 35 | 7 | 33 | 20 | 25 | 43 | 29 | 39 | 2 | 21 | 22 |
| | 42 | 17 | 28 | 12 | 11 | 36 | 15 | 13 | 9 | 26 | 6 | 5 | 16 | 38 | 1 | 23 | 41 | 0 | 37 | 44 | 8 | 24 | |
| 5/15 | 3 | 21 | 22 | 15 | 33 | 44 | 13 | 5 | 39 | 37 | 12 | 18 | 2 | 8 | 28 | 9 | 38 | 34 | 26 | 36 | 29 | 20 | 43 |
| | 6 | 0 | 1 | 30 | 19 | 10 | 4 | 14 | 32 | 25 | 31 | 16 | 40 | 17 | 11 | 23 | 41 | 7 | 42 | 24 | 35 | 27 | |
| 6/15 | 12 | 27 | 9 | 6 | 17 | 10 | 18 | 8 | 14 | 36 | 40 | 13 | 25 | 4 | 32 | 3 | 33 | 5 | 16 | 0 | 37 | 41 | 15 |
| | 11 | 31 | 7 | 1 | 19 | 28 | 29 | 20 | 38 | 42 | 30 | 34 | 22 | 21 | 26 | 2 | 35 | 23 | 24 | 39 | 43 | 44 | |
| 7/15 | 19 | 16 | 14 | 20 | 12 | 31 | 36 | 0 | 5 | 7 | 8 | 3 | 17 | 10 | 15 | 22 | 13 | 24 | 9 | 35 | 28 | 18 | 32 |
| | 29 | 6 | 40 | 23 | 44 | 37 | 4 | 26 | 11 | 1 | 38 | 33 | 2 | 39 | 34 | 43 | 42 | 21 | 41 | 25 | 30 | 27 | |
| 8/15 | 36 | 20 | 37 | 43 | 5 | 35 | 4 | 14 | 22 | 10 | 2 | 34 | 26 | 17 | 38 | 32 | 1 | 41 | 44 | 25 | 13 | 30 | 0 |
| | 40 | 3 | 15 | 18 | 12 | 33 | 21 | 19 | 16 | 9 | 42 | 8 | 24 | 6 | 29 | 31 | 39 | 23 | 11 | 28 | 27 | 7 | |
| 9/15 | 4 | 5 | 22 | 36 | 26 | 16 | 7 | 40 | 33 | 21 | 8 | 6 | 30 | 12 | 37 | 14 | 13 | 10 | 17 | 31 | 3 | 9 | 19 |
| | 20 | 15 | 38 | 34 | 18 | 25 | 41 | 23 | 27 | 29 | 2 | 11 | 0 | 39 | 35 | 42 | 43 | 24 | 32 | 28 | 1 | 44 | |
| 10/15 | 27 | 18 | 19 | 2 | 11 | 25 | 44 | 40 | 20 | 28 | 24 | 30 | 1 | 6 | 37 | 36 | 7 | 13 | 4 | 39 | 5 | 17 | 31 |
| | 43 | 29 | 0 | 8 | 21 | 35 | 23 | 32 | 3 | 9 | 16 | 14 | 22 | 10 | 41 | 42 | 26 | 34 | 15 | 12 | 33 | 38 | |
| 11/15 | 2 | 13 | 3 | 10 | 29 | 20 | 15 | 27 | 17 | 26 | 18 | 4 | 7 | 22 | 9 | 11 | 21 | 1 | 30 | 28 | 31 | 19 | 41 |
| | 0 | 5 | 36 | 25 | 35 | 6 | 33 | 23 | 38 | 42 | 8 | 24 | 32 | 37 | 16 | 34 | 14 | 12 | 40 | 39 | 43 | 44 | |
| 12/15 | 3 | 20 | 33 | 41 | 6 | 37 | 40 | 38 | 7 | 21 | 5 | 17 | 27 | 4 | 8 | 25 | 2 | 14 | 44 | 43 | 23 | 11 | 34 |
| | 35 | 10 | 42 | 18 | 36 | 30 | 16 | 0 | 13 | 22 | 9 | 32 | 39 | 28 | 15 | 29 | 12 | 24 | 26 | 19 | 1 | 31 | |
| 13/15 | 12 | 29 | 25 | 9 | 6 | 16 | 15 | 2 | 10 | 26 | 21 | 7 | 13 | 0 | 1 | 33 | 11 | 4 | 24 | 8 | 36 | 31 | 20 |
| | 32 | 17 | 41 | 28 | 39 | 23 | 22 | 19 | 37 | 3 | 43 | 30 | 18 | 42 | 14 | 40 | 5 | 38 | 34 | 27 | 35 | 44 | |

Further, the following Table 29 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 16200 and when being modulated by the 64-QAM, shows the group interleaving pattern used to define the π(j).

TABLE 29

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 2/15 | 7 | 43 | 44 | 12 | 3 | 22 | 11 | 15 | 32 | 6 | 31 | 30 | 4 | 26 | 0 | 36 | 20 | 39 | 38 | 18 | 5 | 21 | 16 |
| | 13 | 19 | 14 | 35 | 33 | 40 | 24 | 25 | 9 | 10 | 37 | 23 | 17 | 2 | 29 | 1 | 34 | 41 | 42 | 28 | 8 | 27 | |
| 3/15 | 19 | 36 | 11 | 17 | 1 | 21 | 34 | 7 | 35 | 15 | 39 | 42 | 22 | 8 | 5 | 38 | 31 | 18 | 6 | 24 | 28 | 20 | 41 |
| | 14 | 29 | 16 | 13 | 0 | 44 | 32 | 25 | 27 | 4 | 26 | 30 | 10 | 23 | 43 | 3 | 12 | 9 | 2 | 37 | 33 | 40 | |
| 4/15 | 41 | 15 | 23 | 43 | 35 | 19 | 34 | 30 | 17 | 7 | 4 | 18 | 32 | 31 | 1 | 29 | 14 | 36 | 37 | 22 | 40 | 33 | 28 |
| | 10 | 5 | 25 | 44 | 16 | 21 | 38 | 8 | 42 | 12 | 11 | 3 | 26 | 13 | 20 | 6 | 0 | 24 | 2 | 39 | 27 | 9 | |
| 5/15 | 25 | 7 | 43 | 27 | 19 | 5 | 44 | 0 | 21 | 18 | 20 | 35 | 8 | 12 | 26 | 17 | 32 | 30 | 39 | 4 | 13 | 34 | 36 |
| | 22 | 37 | 31 | 28 | 3 | 40 | 15 | 2 | 33 | 29 | 42 | 9 | 16 | 11 | 38 | 1 | 10 | 41 | 6 | 24 | 23 | 14 | |
| 6/15 | 31 | 28 | 0 | 11 | 10 | 8 | 22 | 12 | 15 | 6 | 4 | 7 | 5 | 9 | 39 | 38 | 17 | 40 | 13 | 14 | 44 | 32 | 23 |
| | 37 | 2 | 25 | 36 | 16 | 30 | 27 | 42 | 3 | 1 | 35 | 34 | 24 | 41 | 20 | 26 | 18 | 33 | 19 | 21 | 29 | 43 | |
| 7/15 | 2 | 38 | 18 | 15 | 6 | 17 | 4 | 14 | 40 | 16 | 19 | 7 | 1 | 8 | 10 | 24 | 20 | 9 | 31 | 13 | 23 | 0 | 29 |
| | 27 | 43 | 32 | 5 | 22 | 37 | 28 | 41 | 25 | 26 | 39 | 11 | 42 | 35 | 30 | 3 | 36 | 33 | 34 | 44 | 12 | 21 | |
| 8/15 | 36 | 22 | 21 | 35 | 4 | 37 | 6 | 23 | 1 | 16 | 34 | 30 | 2 | 25 | 19 | 5 | 15 | 39 | 20 | 13 | 26 | 29 | 42 |
| | 24 | 43 | 0 | 8 | 40 | 32 | 41 | 17 | 10 | 14 | 11 | 28 | 3 | 33 | 7 | 31 | 9 | 18 | 38 | 27 | 12 | 44 | |
| 9/15 | 21 | 3 | 9 | 7 | 6 | 34 | 13 | 5 | 17 | 15 | 18 | 19 | 31 | 4 | 43 | 11 | 25 | 20 | 8 | 33 | 24 | 38 | 37 |
| | 44 | 35 | 22 | 30 | 26 | 40 | 10 | 14 | 16 | 29 | 32 | 36 | 1 | 41 | 27 | 0 | 28 | 42 | 2 | 23 | 12 | 39 | |
| 10/15 | 14 | 38 | 29 | 43 | 9 | 31 | 22 | 10 | 16 | 34 | 35 | 21 | 18 | 0 | 39 | 33 | 40 | 41 | 11 | 5 | 13 | 27 | 32 |
| | 44 | 28 | 12 | 23 | 15 | 30 | 3 | 26 | 24 | 8 | 7 | 20 | 42 | 2 | 17 | 25 | 1 | 36 | 6 | 19 | 37 | 4 | |
| 11/15 | 31 | 3 | 6 | 22 | 42 | 41 | 20 | 17 | 19 | 27 | 2 | 0 | 21 | 24 | 8 | 14 | 37 | 36 | 25 | 5 | 15 | 23 | 44 |
| | 7 | 4 | 10 | 13 | 34 | 39 | 40 | 16 | 12 | 11 | 26 | 33 | 38 | 9 | 28 | 29 | 18 | 35 | 1 | 30 | 32 | 43 | |
| 12/15 | 17 | 26 | 20 | 5 | 24 | 3 | 11 | 0 | 28 | 8 | 6 | 36 | 14 | 32 | 27 | 13 | 1 | 30 | 7 | 29 | 39 | 38 | 9 |
| | 40 | 31 | 22 | 37 | 18 | 16 | 35 | 10 | 33 | 15 | 23 | 44 | 43 | 2 | 12 | 4 | 34 | 21 | 42 | 25 | 19 | 41 | |
| 13/15 | 9 | 6 | 25 | 18 | 39 | 28 | 7 | 21 | 32 | 5 | 43 | 33 | 15 | 17 | 34 | 27 | 41 | 22 | 10 | 14 | 23 | 29 | 42 |
| | 16 | 11 | 20 | 2 | 3 | 40 | 19 | 12 | 26 | 4 | 38 | 44 | 24 | 13 | 8 | 31 | 36 | 1 | 0 | 30 | 35 | 37 | |

Further, the following Table 30 shows that the LDPC information bits are encoded according to the code rate of 2/15, 3/15, 4/15, 5/15, 6/15, 7/15, 8/15, 9/15, 10/15, 11/15, 12/15, and 13/15 to generate the LDPC codeword having a length of 16200 and when being modulated by the 256-QAM, shows the group interleaving pattern used to define the π(j).

TABLE 30

| Code Rate | Order of group-wise interleaving π(j) (0 ≤ j < 44) | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 2/15 | 31 | 6 | 21 | 13 | 10 | 11 | 27 | 43 | 3 | 4 | 19 | 30 | 35 | 22 | 37 | 39 | 38 | 18 | 42 | 26 | 28 | 16 | 25 |
| | 36 | 9 | 15 | 20 | 14 | 44 | 29 | 41 | 7 | 34 | 1 | 12 | 2 | 23 | 40 | 5 | 24 | 32 | 17 | 33 | 8 | 0 | |
| 3/15 | 5 | 27 | 41 | 8 | 39 | 28 | 3 | 18 | 22 | 16 | 21 | 7 | 40 | 13 | 24 | 33 | 23 | 1 | 12 | 19 | 43 | 15 | 36 |
| | 30 | 26 | 4 | 2 | 44 | 35 | 37 | 38 | 14 | 29 | 25 | 6 | 42 | 10 | 32 | 11 | 9 | 34 | 20 | 0 | 17 | 31 | |
| 4/15 | 38 | 41 | 37 | 15 | 22 | 31 | 16 | 42 | 20 | 14 | 8 | 19 | 26 | 36 | 18 | 13 | 0 | 30 | 4 | 32 | 10 | 21 | 17 |
| | 40 | 34 | 44 | 9 | 23 | 12 | 24 | 29 | 1 | 33 | 7 | 43 | 5 | 3 | 11 | 35 | 28 | 2 | 25 | 6 | 39 | 27 | |
| 5/15 | 4 | 5 | 21 | 31 | 40 | 9 | 11 | 12 | 23 | 0 | 27 | 1 | 24 | 22 | 10 | 41 | 3 | 2 | 39 | 34 | 43 | 36 | 17 |
| | 15 | 6 | 7 | 42 | 20 | 25 | 30 | 32 | 14 | 18 | 26 | 38 | 37 | 33 | 35 | 13 | 19 | 16 | 8 | 44 | 29 | 28 | |
| 6/15 | 17 | 2 | 12 | 0 | 15 | 13 | 3 | 4 | 6 | 9 | 25 | 11 | 26 | 7 | 30 | 24 | 22 | 16 | 31 | 28 | 14 | 18 | 38 |
| | 32 | 19 | 21 | 5 | 36 | 34 | 8 | 1 | 10 | 33 | 27 | 20 | 37 | 23 | 39 | 35 | 29 | 40 | 41 | 42 | 43 | 44 | |
| 7/15 | 13 | 15 | 30 | 6 | 7 | 37 | 38 | 2 | 16 | 8 | 20 | 19 | 24 | 23 | 42 | 22 | 4 | 14 | 35 | 17 | 9 | 32 | 34 |
| | 43 | 12 | 0 | 21 | 26 | 27 | 40 | 25 | 33 | 44 | 3 | 10 | 39 | 5 | 31 | 36 | 28 | 1 | 18 | 11 | 41 | 29 | |
| 8/15 | 41 | 1 | 39 | 7 | 18 | 28 | 9 | 37 | 2 | 13 | 43 | 44 | 22 | 29 | 0 | 27 | 12 | 11 | 36 | 20 | 24 | 19 | 30 |
| | 32 | 6 | 26 | 23 | 8 | 40 | 14 | 25 | 31 | 33 | 10 | 42 | 38 | 4 | 5 | 35 | 34 | 21 | 3 | 15 | 17 | 16 | |
| 9/15 | 5 | 12 | 24 | 18 | 25 | 33 | 30 | 35 | 7 | 3 | 13 | 19 | 26 | 31 | 37 | 29 | 9 | 43 | 14 | 17 | 20 | 28 | 27 |
| | 2 | 22 | 6 | 11 | 16 | 23 | 39 | 32 | 42 | 10 | 4 | 15 | 41 | 21 | 36 | 34 | 0 | 1 | 8 | 40 | 38 | 44 | |
| 10/15 | 28 | 2 | 14 | 17 | 8 | 21 | 29 | 31 | 20 | 3 | 36 | 10 | 26 | 23 | 32 | 35 | 18 | 30 | 7 | 6 | 42 | 5 | 37 |
| | 34 | 38 | 19 | 0 | 33 | 24 | 40 | 44 | 22 | 39 | 4 | 25 | 15 | 11 | 41 | 43 | 1 | 16 | 27 | 9 | 13 | 12 | |
| 11/15 | 8 | 16 | 25 | 27 | 32 | 13 | 3 | 2 | 23 | 30 | 0 | 10 | 21 | 26 | 28 | 11 | 14 | 31 | 1 | 15 | 9 | 24 | 12 |
| | 18 | 29 | 4 | 20 | 19 | 22 | 17 | 36 | 33 | 7 | 35 | 39 | 37 | 34 | 5 | 6 | 38 | 40 | 41 | 42 | 43 | 44 | |
| 12/15 | 28 | 22 | 27 | 25 | 30 | 33 | 5 | 18 | 21 | 26 | 3 | 12 | 29 | 4 | 36 | 17 | 10 | 2 | 39 | 6 | 38 | 35 | 0 |
| | 13 | 15 | 14 | 20 | 7 | 16 | 9 | 41 | 24 | 8 | 1 | 34 | 40 | 43 | 32 | 37 | 42 | 31 | 23 | 19 | 11 | 44 | |
| 13/15 | 9 | 6 | 21 | 30 | 27 | 33 | 42 | 43 | 13 | 1 | 15 | 24 | 5 | 0 | 3 | 37 | 10 | 14 | 4 | 28 | 18 | 16 | 40 |
| | 44 | 7 | 12 | 36 | 29 | 17 | 23 | 39 | 26 | 11 | 8 | 25 | 20 | 22 | 31 | 41 | 2 | 19 | 38 | 32 | 35 | 34 | |

Specifically, when the block deinterleaver 2721 performs the deinterleaving by the scheme according to one type, the group deinterleaver 2722 may reversely perform the interleaving schemes based on the above Tables 9 to 18 when the corresponding deinterleaving scheme matches the scheme defined in the Tables 19 and 20.

However, when the block deinterleaver 2721 performs the deinterleaving by the scheme according to one type, the group deinterleaver 2722 may reversely perform the interleaving schemes based on the above Tables 21 to 30 when the corresponding deinterleaving scheme does not match the scheme defined in the Tables 19 and 20.

For example, the case in which the block deinterleaver 2721 performs the deinterleaving by the scheme corresponding to the type A scheme is assumed.

Further, the case in which the LDPC information bits are encoded according to a code rate of 5/15 to generate the LDPC codeword having a length of 64800 and the LDPC codeword bits are modulated by the QPSK is assumed.

In this case, the block interleaver 423 interleaves bits according to the type A scheme.

Therefore, the block deinterleaver 2721 may perform the deinterleaving according to the type A scheme and the group deinterleaver 2722 may reversely perform the interleaving operation based on the above Table 9 to output the LLR values having the order before the group interleaving.

Meanwhile, the case in which the LDPC information bits are encoded according to a code rate of 5/15 to generate the LDPC codeword having a length of 64800 and the LDPC codeword bits are modulated by the 16-QAM is assumed.

In this case, the block interleaver 423 interleaves bits according to the type B scheme.

In this case, since the block deinterleaver 2721 performs the deinterleaving according to the type A scheme, the result of deinterleaving the LLR values according to the type A scheme is different from the result of deinterleaving the LLR values according to the type B scheme.

In this case, the group deinterleaver 2722 may reversely perform the interleaving operation based on the above Table 22 to deinterleave the LLR values.

That is, to output the same LLR value as the case in which the block deinterleaver 2721 performs the deinterleaving according to the type B scheme and the group deinterleaver 2722 performs the deinterleaving based on the above Table 10, the group deinterleaver 2722 may reversely perform the interleaving operation based on the above Table 22 to output the LLR values having the order before the group interleaving.

The parity deinterleaver 2723 performs the parity deinterleaving on the output value of the group deinterleaver 2722 and outputs it to the LDPC decoder 2730.

Specifically, the parity deinterleaver 2723 is a component corresponding to the parity interleaver 421 included in the transmitter 1000 and may reversely perform the interleaving operation performed by the parity interleaver 421.

That is, the parity deinterleaver 2723 may deinterleave the LLR values corresponding to the parity bits among the LLR values output from the group deinterleaver 2722. However, the parity deinterleaver 2723 may be omitted according to the decoding method and the implementation of the LDPC decoder 2730.

The LDPC decoder 2730 may perform the LDPC decoding based on the LLR value output from the parity deinterleaver 2723.

Specifically, the LDPC decoder 2730 is components corresponding to the LDPC encoder 410 of the transmitter 1000 and may perform the operation corresponding to the LDPC encoder 410. For this purpose, the receiver 2000 may pre-store information on parameters used to perform the LDPC encoding in the transmitter 1000.

For example, the LDPC decoder 2730 may perform the LDPC decoding based on the LLR valued output from the parity deinterleaver 2723 based on the iterative decoding scheme based on a sum-product algorithm and output the information bits error-corrected depending on the LDPC decoding.

However, in some cases, when the transmitter 1000 outer-encodes the information bits before the LDPC encoding, the receiver 2000 may further include an outer decoder (not shown) for correcting an error on the information bits using the parity check bits included in the LDPC information bits recovered depending on the LDPC decoding.

Figure 34:
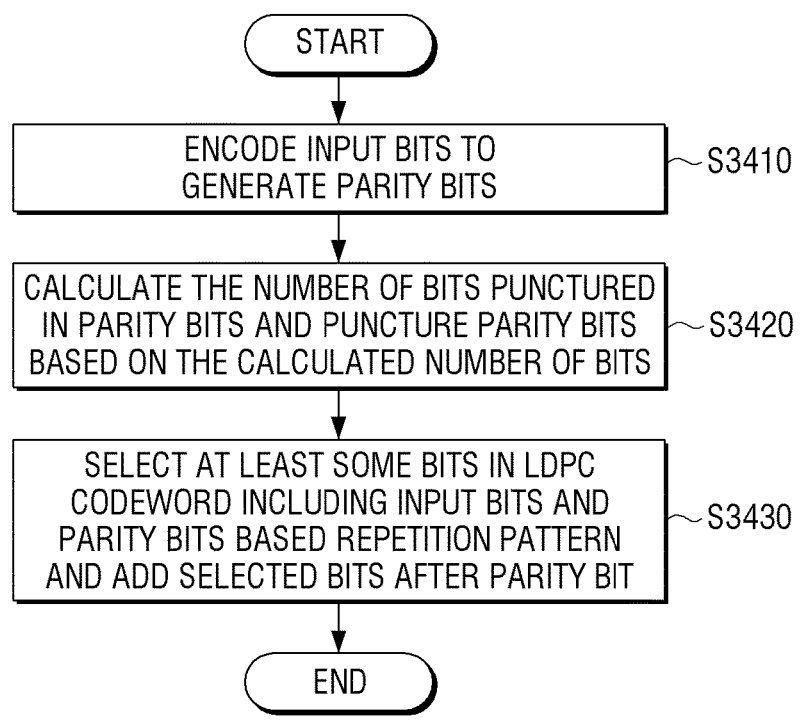
FIG. 34 is a flow chart for describing a repetition method according to an exemplary embodiment.

FIG. 34 is a flow chart for describing a repetition method according to an exemplary embodiment.

First, the parity bits are generated by encoding the input bits (S3410).

Next, the number of bits punctured in the parity bits is calculated and the parity bits are punctured based on the calculated number of bits (S3420).

Further, at least some bits are selected from the LDPC codewords including the input bits and the parity bits based on the repetition pattern and the selected some bits are added after the parity bits (S3430). Here, the repetition pattern is a pattern for selecting the repeated bit group among the plurality of bit groups configuring the LDPC codeword.

Meanwhile, in step S3340, when the calculated number $N_{punc}$ of punctured bits is a positive integer, the bits as many as the number calculated in the parity bits are punctured and when the calculated number $N_{punc}$ of punctured bits is a negative integer, the puncturing is not performed.

In this case, in step S3420, when the $N_{punc}$ is a negative integer, $-N_{punc}$ bits are determined as the number of repeated bits and the bits as many as the determined number may be selected in the LDPC codeword.

Specifically, the number $N_{rep}$ of bit groups formed of bits in which all the bits are repeated among the plurality of bit groups configuring the LDPC codeword may be calculated based on above Equation 4.

Further, the repetition pattern may be defined in above Table 1.

In this case, in step S3430, the bits included in the $\pi_R(0)$-th bit group, the $\pi_R(1)$-th bit group, ..., the $\pi_R(N_{rep}-1)$-th bit group among the plurality of bit groups may be selected as the repeated bits and the $N_{repeat}-360 \times N_{rep}$ bits from the first bit of the $\pi_R(N_{rep})$-th bit group may be additionally selected as the repeated bits based on the repetition patter.

Meanwhile, the detailed repetition method is described above.

Meanwhile, a non-transitory computer readable medium in which a program sequentially executing the repetition method according to the present disclosure is stored may be provided.

The non-transitory computer readable medium in which a program performing the method for generating an additional parity according to the above exemplary embodiments is stored may be provided. The non-transitory computer readable medium is not a medium that stores data therein for a while, such as a register, a cache, a memory, or the like, but means a medium that at least semi-permanently stores data therein and is readable by a device such as a microprocessor. In detail, various applications or programs described above may be stored and provided in the non-transitory computer readable medium such as a compact disk (CD), a digital versatile disk (DVD), a hard disk, a Blu-ray disk, a universal serial bus (USB), a memory card, a read only memory (ROM), or the like.

At least one of the components, elements, modules or units represented by a block as illustrated in FIGS. 1, 3, 4, 10, 11, and 20-33 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

Although the exemplary embodiments of inventive concept have been illustrated and described hereinabove, the inventive concept is not limited to the above-mentioned exemplary embodiments, but may be variously modified by those skilled in the art to which the inventive concept pertains without departing from the scope and spirit of the inventive concept as disclosed in the accompanying claims. For example, the exemplary embodiments are described in relation with BCH encoding and decoding and LDPC encoding and decoding. However, these embodiments do not limit the inventive concept to only a particular encoding and decoding, and instead, the inventive concept may be applied to different types of encoding and decoding with necessary modifications. These modifications should also be understood to fall within the scope of the inventive concept.

What is claimed is:

1. A television (TV) broadcasting signal transmitting apparatus for transmitting signaling information for TV broadcasting, the TV broadcasting transmitting apparatus comprising:
    an encoder which encodes input bits to generate a codeword comprising the input bits and parity bits, wherein the input bits are based on the signaling information;
    a puncturer which calculates a number of bits to be punctured and punctures bits among the parity bits according to the calculated number;
    a repeater which selects bits to be repeated among the codeword based on a repetition pattern, and appends the selected bits to non-punctured parity bits among the codeword;
    a mapper which maps the input bits, the appended bits and the non-punctured parity bits onto constellation points;
    a signal generator configured to generate a TV broadcasting signal based on the constellation points; and
    a transmitter which transmits the TV broadcasting signal,
    wherein the codeword comprises a plurality of bit groups,
    wherein the repetition pattern comprises bit group indices for selecting at least one bit group comprising the bits to be repeated among the plurality of bit groups, and
    wherein a number of the bits to be repeated is determined based on the number of the bits to be punctured.

2. The TV broadcasting signal transmitting apparatus of claim 1, wherein the puncturer punctures the parity bits as many as the calculated number ($N_{punc}$) of the bits to be punctured in the parity bits when $N_{punc}$ is a positive integer and does not perform the puncturing when $N_{punc}$ is a negative integer.

3. The TV broadcasting signal transmitting apparatus of claim 2, wherein the repeater determines $-N_{punc}$ bits as the number of the bits to be repeated when $N_{punc}$ is a negative integer, and selects bits as many as the determined number from the codeword as the bits to be repeated in the codeword.

4. The TV broadcasting signal transmitting apparatus of claim 3, wherein the repeater calculates a number $N_{rep}$ of bit groups, of which all bits are to be repeated, from among the plurality of bit groups configuring the codeword based on a following equation:

| $\pi_R(j)$ | | | | | | | | |
|---|---|---|---|---|---|---|---|---|
| $\pi_R(0)$ | $\pi_R(1)$ | $\pi_R(2)$ | $\pi_R(3)$ | $\pi_R(4)$ | $\pi_R(5)$ | $\pi_R(6)$ | $\pi_R(7)$ | $\pi_R(8)$ |
| $\pi_R(9)$ | $\pi_R(10)$ | $\pi_R(11)$ | $\pi_R(12)$ | $\pi_R(13)$ | $\pi_R(14)$ | $\pi_R(15)$ | $\pi_R(16)$ | $\pi_R(17)$ |
| $\pi_R(18)$ | $\pi_R(19)$ | $\pi_R(20)$ | $\pi_R(21)$ | . . . | | | | |
| 5 | 6 | 0 | 1 | 3 | 7 | 8 | 2 | 10 |
| 9 | 11 | 0 | 1 | 2 | 3 | 22 | 31 | 15 |
| 4 | 5 | 6 | 7 | . . . | | | | | where $N_{repeat}$ represents the bits to be repeated by the repeater, and $N_{repeat}=-N_{punc}$.

5. The TV broadcasting signal transmitting apparatus of claim 1, wherein the repetition pattern specifies that bit groups are to be repeated in an order of $5^{th}$, $6^{th}$, $0^{th}$, $1^{st}$, $3^{rd}$, $7^{th}$, $8^{th}$, $2^{nd}$, $10^{th}$, $9^{th}$, $11^{th}$, $0^{th}$, $1^{st}$, $2^{nd}$, $3^{rd}$, $22^{nd}$, $31^{st}$, $15^{th}$, $4^{th}$, $5^{th}$, $6^{th}$, and $7^{th}$ bit groups among the plurality of bit groups.

6. The TV broadcasting signal transmitting apparatus of claim 5, wherein the repeater selects bits included in a $\pi_R(0)$-th bit group, a $\pi_R(1)$-th bit group, . . . , a $\pi_R(\text{Nrep}-1)$-th bit group among the plurality of bit groups as at least a part of the bits to be repeated, based on the repetition pattern.

7. The TV broadcasting signal transmitting apparatus of claim 6, wherein the repeater selects $N_{repeat}-360\times N_{rep}$ bits from a first bit of the $\pi_R(\text{Nrep})$-th bit group as another part of the bits to be repeated.

8. A TV broadcasting signal transmission method of a transmitting apparatus for transmitting signaling information for TV broadcasting, the method comprising:
    encoding input bits to generate a codeword comprising the input bits and parity bits, wherein the input bits are based on the signaling information;
    calculating a number of bits to be punctured and puncturing bits among the parity bits according to the calculated number;
    selecting bits to be repeated among the codeword based on a repetition pattern, and appending the selected bits to non-punctured parity bits among the codeword; and
    mapping the input bits, the appended bits and the non-punctured parity bits onto constellation points;
    generating a TV broadcasting signal based on the constellation points; and
    transmitting, using a transmitter, the TV broadcasting signal,
    wherein the repetition pattern comprises bit group indices for selecting at least one bit group comprising the bits to be repeated among a plurality of bit groups,
    wherein a number of the bits to be repeated is determined based on the number of the bits to be punctured.

9. The method of claim 8, wherein in the puncturing, when the calculated number ($N_{punc}$) of bits to be punctured is a positive integer, the parity bits as many as $N_{punc}$ are punctured, and when $N_{punc}$ is a negative integer, the puncturing is not performed.

10. The method of claim 9, wherein in the appending, when $N_{punc}$ is a negative integer, $-N_{punc}$ bits are determined as the number of the bits to be repeated, and bits as many as the determined number are selected from the codeword as the bits to be repeated in the codeword.

11. The method of claim 10, wherein in the appending, a number $N_{rep}$ of bit groups, of which all bits are to be repeated, from among the plurality of bit groups configuring the codeword is calculated based on a following equation:

$$N_{rep} = \left\lfloor \frac{N_{repeat}}{360} \right\rfloor,$$

where $N_{repeat}$ represents the bits to be repeated, and $N_{repeat}=-N_{punc}$.

12. The method of claim 8, wherein the repetition pattern specifies that bit groups are to be repeated in an order of $5^{th}$, $6^{th}$, $0^{th}$, $1^{st}$, $3^{rd}$, $7^{th}$, $8^{th}$, $2^{nd}$, $10^{th}$, $9^{th}$, $11^{th}$, $0^{th}$, $1^{st}$, $2^{nd}$, $3^{rd}$, $22^{nd}$, $31^{st}$, $15^{th}$, $4^{th}$, $5^{th}$, $6^{th}$, and $7^{th}$ bit groups among the plurality of bit groups.

13. The method of claim 12, wherein in the appending, bits included in a $\pi_R(0)$-th bit group, a $\pi_R(1)$-th bit group, . . . , a $\pi_R(\text{Nrep}-1)$-th bit group among the plurality of bit groups are selected as at least a part of the bits to be repeated, based on the repetition pattern.

14. The method of claim 13, wherein in the appending, $N_{repeat}-360\times N_{rep}$ bits from a first bit of the $\pi_R(\text{Nrep})$-th bit group are selected as another part of the bits to be repeated.

* * * * *